(12) United States Patent
Dokania et al.

(10) Patent No.: US 11,646,071 B1
(45) Date of Patent: May 9, 2023

(54) READING SCHEME FOR MULTI-ELEMENT GAIN FERROELECTRIC MEMORY BIT-CELL WITH PLATE-LINE PARALLEL TO BIT-LINE AND WITH INDIVIDUAL SWITCHES AND CONTROL ON PLATE-LINES OF THE BIT-CELL

(71) Applicant: Kepler Computing Inc., San Francisco, CA (US)

(72) Inventors: Rajeev Kumar Dokania, Beaverton, OR (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 17/532,657

(22) Filed: Nov. 22, 2021

Related U.S. Application Data

(63) Continuation of application No. 17/529,258, filed on Nov. 17, 2021, now Pat. No. 11,482,270.

(51) Int. Cl.
 *G11C 11/22* (2006.01)
(52) U.S. Cl.
 CPC ...... *G11C 11/2273* (2013.01); *G11C 11/2255* (2013.01); *G11C 11/2257* (2013.01); *G11C 11/2275* (2013.01); *G11C 11/2297* (2013.01)
(58) Field of Classification Search
 CPC ............ G11C 11/2273; G11C 11/2255; G11C 11/2257; G11C 11/2275; G11C 11/2297

(Continued)

(56) References Cited

U.S. PATENT DOCUMENTS 4,809,225 A 2/1989 Dimmler et al.
4,853,893 A 8/1989 Eaton, Jr. et al.
(Continued)

FOREIGN PATENT DOCUMENTS

EP 0798736 A2 10/1997
JP H10255484 A 9/1998
(Continued)

OTHER PUBLICATIONS

Final Office Action dated Aug. 15, 2022 for U.S. Appl. No. 17/346,083.

(Continued)

*Primary Examiner* — Viet Q Nguyen
(74) *Attorney, Agent, or Firm* — Mughal IP P.C.

(57) ABSTRACT

A memory is provided which comprises a capacitor including non-linear polar material. The capacitor may have a first terminal coupled to a node (e.g., a storage node) and a second terminal coupled to a plate-line. The capacitors can be a planar capacitor or non-planar capacitor (also known as pillar capacitor). The memory includes a transistor coupled to the node and a bit-line, wherein the transistor is controllable by a word-line, wherein the plate-line is parallel to the bit-line. The memory includes a refresh circuitry to refresh charge on the capacitor periodically or at a predetermined time. The refresh circuit can utilize one or more of the endurance mechanisms. When the plate-line is parallel to the bit-line, a specific read and write scheme may be used to reduce the disturb voltage for unselected bit-cells. A different scheme is used when the plate-line is parallel to the word-line.

20 Claims, 66 Drawing Sheets

(58) Field of Classification Search
USPC .......................................................... 365/145
See application file for complete search history.

(56) References Cited

U.S. PATENT DOCUMENTS

| | | | |
|---|---|---|---|
| 5,086,412 | A | 2/1992 | Jaffe et al. |
| 5,218,566 | A | 6/1993 | Papaliolios |
| 5,270,967 | A | 12/1993 | Moazzami et al. |
| 5,381,364 | A | 1/1995 | Chern et al. |
| 5,383,150 | A | 1/1995 | Nakamura et al. |
| 5,539,279 | A | 7/1996 | Takeuchi et al. |
| 5,541,872 | A | 7/1996 | Lowrey et al. |
| 5,638,318 | A | 6/1997 | Seyyedy |
| 5,640,030 | A | 6/1997 | Kenney |
| 5,917,746 | A | 6/1999 | Seyyedy |
| 5,926,413 | A | 7/1999 | Yamada et al. |
| 5,969,380 | A | 10/1999 | Seyyedy |
| 6,002,608 | A | 12/1999 | Tanabe |
| 6,028,784 | A | 2/2000 | Mori et al. |
| 6,031,754 | A | 2/2000 | Derbenwick et al. |
| 6,147,895 | A | 11/2000 | Kamp |
| 6,483,737 | B2 | 11/2002 | Takeuchi et al. |
| 6,515,957 | B1 | 2/2003 | Newns et al. |
| 6,538,914 | B1 | 3/2003 | Chung |
| 6,590,245 | B2* | 7/2003 | Ashikaga ................ G11C 11/22 257/295 |
| 6,643,163 | B2 | 11/2003 | Takashima |
| 6,646,906 | B2 | 11/2003 | Salling |
| 6,656,301 | B2 | 12/2003 | Kirby |
| 6,717,838 | B2 | 4/2004 | Hosoi |
| 6,795,331 | B2 | 9/2004 | Noro |
| 6,798,686 | B2* | 9/2004 | Takashima ........... G11C 11/4094 365/230.06 |
| 6,809,949 | B2* | 10/2004 | Ho ......................... G11C 11/22 365/145 |
| 6,819,584 | B2 | 11/2004 | Noh |
| 6,856,534 | B2 | 2/2005 | Rodriguez et al. |
| 6,873,536 | B2 | 3/2005 | Komatsuzaki |
| 6,906,944 | B2* | 6/2005 | Takeuchi ................ G11C 11/22 365/65 |
| 6,924,997 | B2 | 8/2005 | Chen et al. |
| 7,173,844 | B2 | 2/2007 | Lee et al. |
| 7,405,959 | B2* | 7/2008 | Koide ..................... G11C 11/22 365/117 |
| 7,426,130 | B2 | 9/2008 | Jeon |
| 7,791,922 | B2* | 9/2010 | Doumae ................. G11C 11/22 365/145 |
| 8,129,200 | B2 | 3/2012 | Kang |
| 8,300,446 | B2* | 10/2012 | Qidwai ............... G11C 11/2273 365/189.14 |
| 8,508,974 | B2 | 8/2013 | Clinton et al. |
| 8,665,628 | B2 | 3/2014 | Kawashima |
| 8,717,800 | B2 | 5/2014 | Clinton et al. |
| 8,865,628 | B2* | 10/2014 | Manabe ................. C01G 3/006 106/1.23 |
| 9,472,560 | B2 | 10/2016 | Ramaswamy et al. |
| 9,786,348 | B1 | 10/2017 | Kawamura et al. |
| 9,812,204 | B1* | 11/2017 | Yan .................... G11C 14/0072 |
| 9,818,468 | B2 | 11/2017 | Müller |
| 9,830,969 | B2 | 11/2017 | Slesazeck et al. |
| 10,043,567 | B2 | 8/2018 | Slesazeck et al. |
| 10,354,712 | B2 | 7/2019 | Derner et al. |
| 10,600,808 | B2 | 3/2020 | Schröder |
| 10,847,201 | B2 | 11/2020 | Manipatruni et al. |
| 10,872,905 | B2 | 12/2020 | Müller |
| 10,963,776 | B2 | 3/2021 | Mulaosmanovic et al. |
| 10,998,025 | B2 | 5/2021 | Manipatruni et al. |
| 11,423,967 | B1* | 8/2022 | Dokania ............. G11C 11/2293 |
| 11,482,270 | B1 | 10/2022 | Dokania et al. |
| 11,521,668 | B1 | 12/2022 | Dokania et al. |
| 11,532,344 | B1 | 12/2022 | Dokania et al. |
| 11,538,514 | B1 | 12/2022 | Dokania et al. |
| 2002/0079520 | A1 | 6/2002 | Nishihara et al. |
| 2003/0112650 | A1 | 6/2003 | Kang |
| 2003/0141528 | A1 | 7/2003 | Ito |
| 2004/0027873 | A1 | 2/2004 | Nishihara |
| 2004/0233696 | A1 | 11/2004 | Kang |
| 2004/0245547 | A1 | 12/2004 | Stipe |
| 2006/0002170 | A1 | 1/2006 | Kumura et al. |
| 2008/0101107 | A1 | 5/2008 | Shiga et al. |
| 2012/0127776 | A1 | 5/2012 | Kawashima |
| 2012/0307545 | A1 | 12/2012 | McAdams et al. |
| 2017/0277459 | A1 | 9/2017 | Rodriguez et al. |
| 2017/0345831 | A1 | 11/2017 | Chavan et al. |
| 2020/0051607 | A1 | 2/2020 | Pan et al. |
| 2020/0273867 | A1* | 8/2020 | Manipatruni ...... G11C 14/0027 |
| 2021/0090662 | A1 | 3/2021 | Mennenga et al. |
| 2021/0111179 | A1 | 4/2021 | Shivaraman et al. |
| 2021/0142837 | A1* | 5/2021 | Yu .......................... G11C 15/04 |
| 2021/0193209 | A1* | 6/2021 | Swami ............... G11C 11/2297 |
| 2021/0398580 | A1 | 12/2021 | Yuh |

FOREIGN PATENT DOCUMENTS

| | | |
|---|---|---|
| JP | 2003123465 A | 4/2003 |
| JP | 2006164321 A | 6/2006 |
| JP | 3959341 B2 | 8/2007 |

OTHER PUBLICATIONS

Final Office Action dated Sep. 12, 2022 for U.S. Appl. No. 17/367,217.
Non-Final Office Action dated Aug. 16, 2022 for U.S. Appl. No. 17/367,217.
Non-Final Office Action dated Nov. 4, 2022 for U.S. Appl. No. 17/530,362.
Non-Final Office Action dated Oct. 12, 2022 for U.S. Appl. No. 17/530,365.
Non-Final Office Action dated Oct. 26, 2022 for U.S. Appl. No. 17/531,577.
Non-Final Office Action dated Sep. 1, 2022 for U.S. Appl. No. 17/339,850.
Non-Final Office Action dated Sep. 7, 2022 for U.S. Appl. No. 17/530,360.
Notice of Allowance dated Aug. 8, 2022 for U.S. Appl. No. 17/529,258.
Notice of Allowance dated Aug. 17, 2022 for U.S. Appl. No. 17/346,087.
Notice of Allowance dated Aug. 22, 2022 for U.S. Appl. No. 7/390,791.
Notice of Allowance dated Aug. 25, 2022 for U.S. Appl. No. 17/367,101.
Notice of Allowance dated Aug. 31, 2022 for U.S. Appl. No. 17/359,325.
Notice of Allowance dated Oct. 31, 2022 for U.S. Appl. No. 17/390,796.
Notice of Allowance dated Sep. 13, 2022 for U.S. Appl. No. 17/530,364.
Notice of Allowance dated Sep. 14, 2022 for U.S. Appl. No. 17/530,360.
Notice of Allowance dated Sep. 21, 2022 for U.S. Appl. No. 17/530,366.
Notice of Allowance dated Sep. 23, 2022 for U.S. Appl. No. 17/339,850.
Notice of Allowance dated Sep. 26, 2022 for U.S. Appl. No. 17/367,217.
Notice of Allowance dated Sep. 27, 2022 for U.S. Appl. No. 17/346,083.
Restriction Requirement dated Aug. 5, 2022 for U.S. Appl. No. 17/359,325.
Restriction Requirement dated Aug. 26, 2022 for U.S. Appl. No. 17/390,796.
Advisory Action dated Jul. 25, 2022 for U.S. Appl. No. 17/339,850.
Non-Final Office Action dated Jun. 15, 2022 for U.S. Appl. No. 17/367,101.
Notice of Allowance dated Jun. 15, 2022 for U.S. Appl. No. 17/367,083.
Notice of Allowance dated Jun. 23, 2022 for U.S. Appl. No. 17/367,172.

(56) References Cited

OTHER PUBLICATIONS

Notice of Allowance dated Jun. 23, 2022 for U.S. Appl. No. 17/367,210.
Non-Final Office Action dated Mar. 7, 2022 for U.S. Appl. No. 17/339,850.
Non-Final Office Action dated Mar. 30, 2022 for U.S. Appl. No. 17/346,083.
Non-Final Office Action dated Mar. 31, 2022 for U.S. Appl. No. 17/346,087.
Notice of Allowance dated Apr. 20, 2022 for U.S. Appl. No. 17/359,311.
Non-Final Office Action notified Nov. 28, 2022 for U.S. Appl. No. 17/532,552.
Notice of Allowance notified Jan. 30, 2023 for U.S. Appl. No. 17/531,535.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.

* cited by examiner

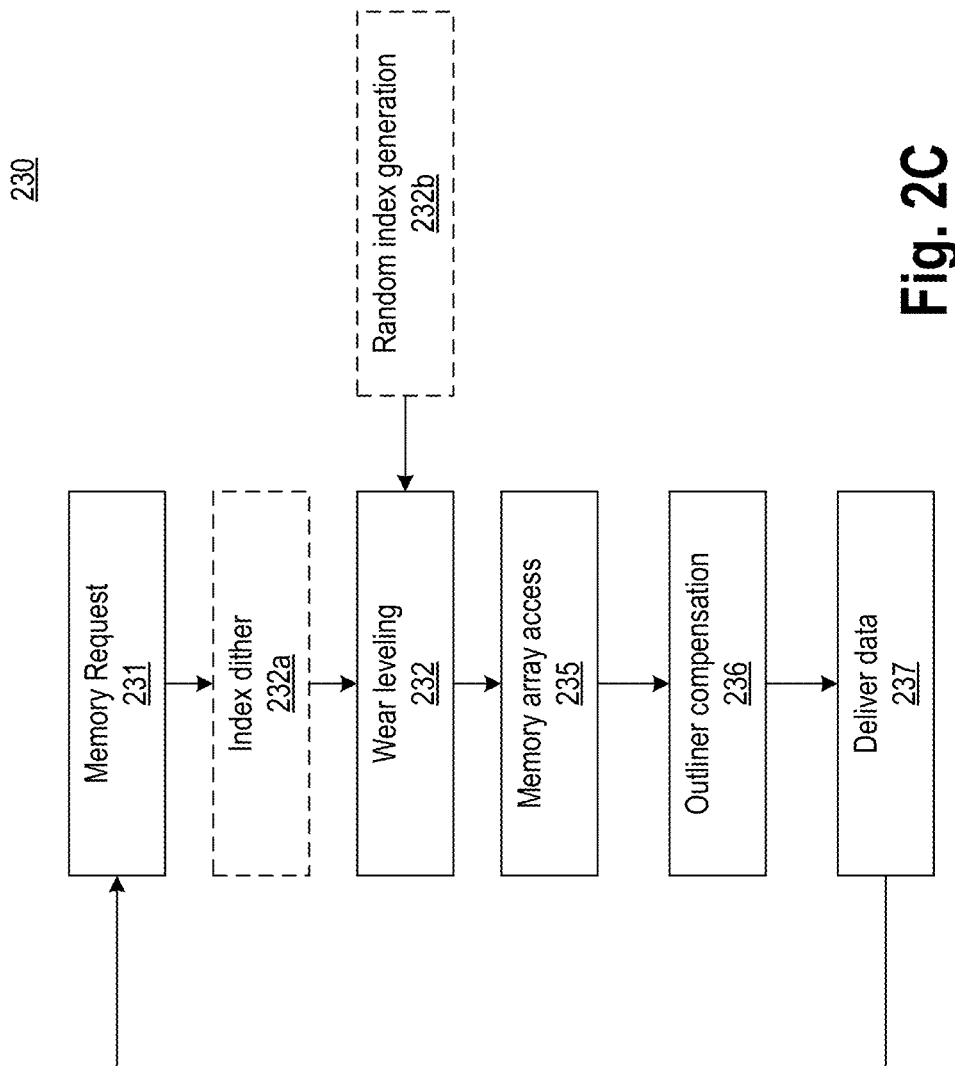

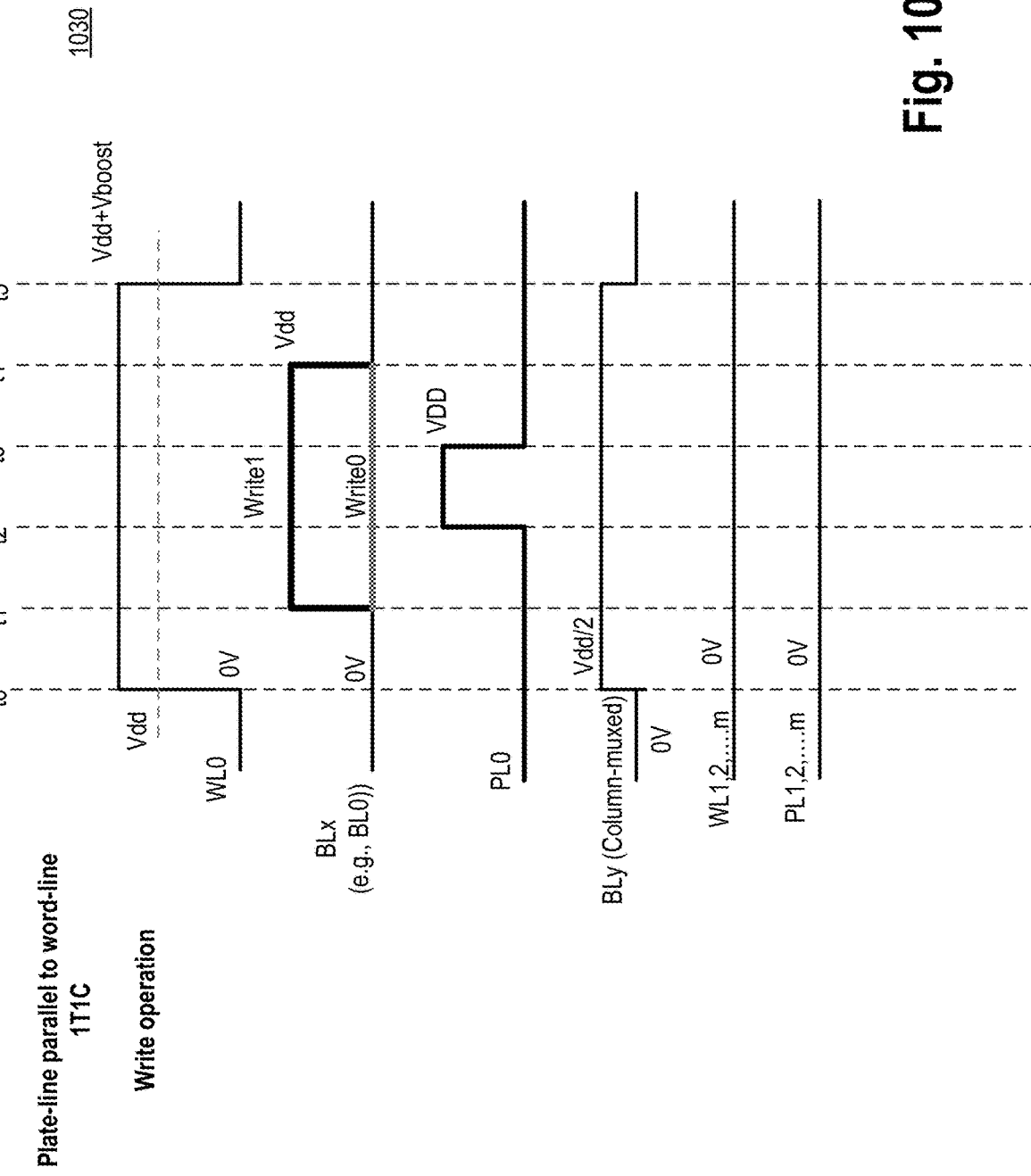

Plate-lines parallel to word-line
Read operation for multi-element FE gain bit-cells

READING SCHEME FOR MULTI-ELEMENT GAIN FERROELECTRIC MEMORY BIT-CELL WITH PLATE-LINE PARALLEL TO BIT-LINE AND WITH INDIVIDUAL SWITCHES AND CONTROL ON PLATE-LINES OF THE BIT-CELL

CLAIM OF PRIORITY

This application is a Continuation Application of, and claims the benefit of priority to, U.S. patent application Ser. No. 17/529,258, filed on Nov. 17, 2021, and now issued as U.S. Pat. No. 11,482,270 on Oct. 25, 2022, and titled, "Pulsing Scheme for a Ferroelectric Memory Bit-Cell to Minimize Read or Write Disturb Effect and Refresh Logic," which is incorporated by reference in its entirety for all purposes.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted being prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2C illustrates a flowchart of memory endurance for the FE memory, in accordance with some embodiments.

FIG. 10C illustrates a timing diagram for write operation for 1T1C FE memory bit-cells with plate-line parallel to the word-line, where the write operation involves word-line boosting, in accordance with some embodiments.

DETAILED DESCRIPTION

Figure 1:
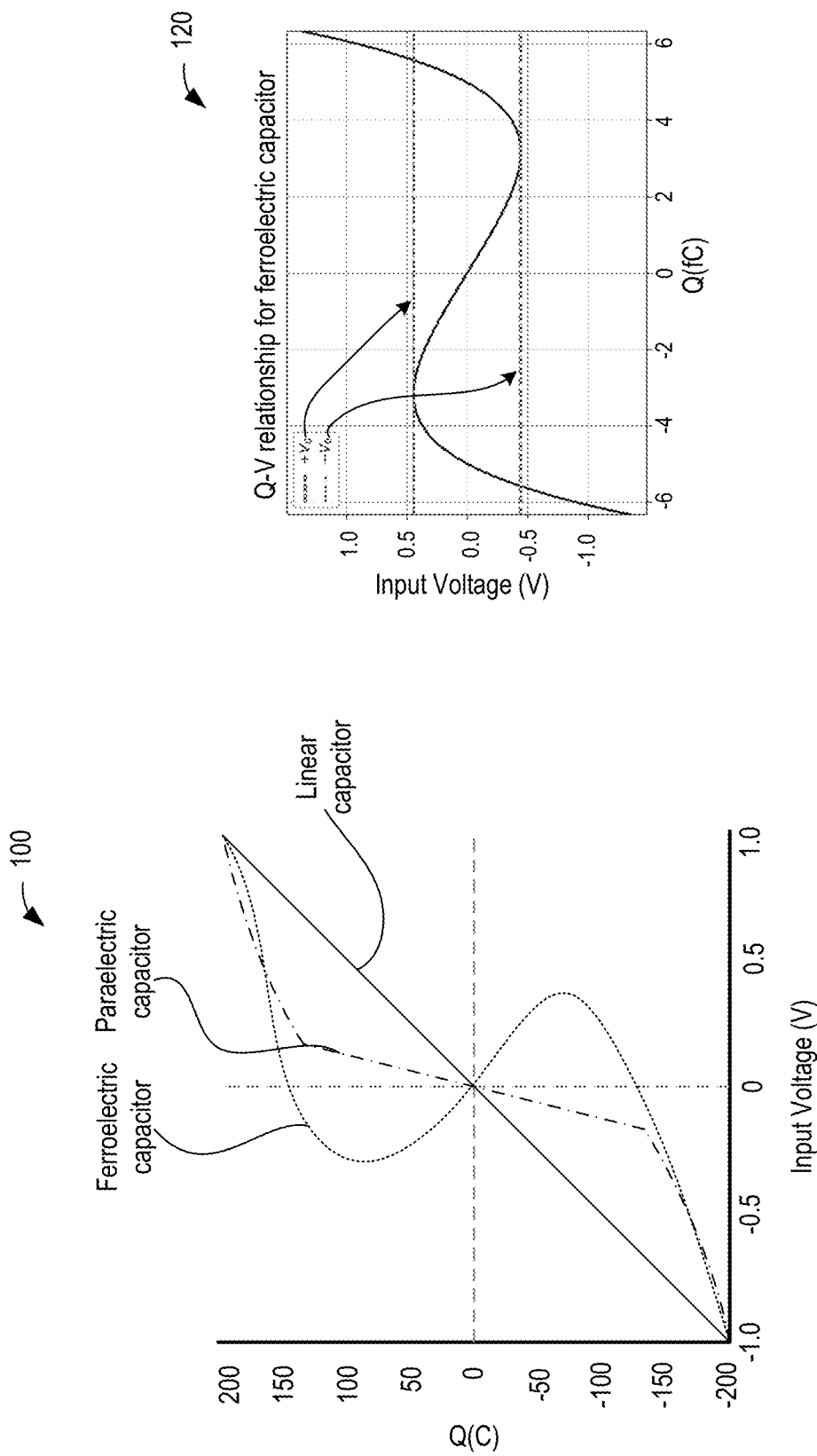
FIG. 1 illustrates a set of plots showing behavior of a ferroelectric capacitor, a paraelectric capacitor, and a linear capacitor.

Memory bit-cells comprising ferroelectric material provide a new class of non-volatile memories. However, such memories suffer from charge degradation over time, for example, during read operations. Such memories also suffer from charge disturbance when neighboring bit-cell cells are accessed. Such disturbance may be a function of routing configuration of plate-line(s), relative to bit-lines and word-lines. Further, leakage from transistors coupled to ferroelectric capacitor(s) may further degrade charge on a storage node connected to the capacitor.

Consider the case for an unselected memory bit-cell where word-line to a gate of an n-type transistor of the bit-cell is at logic low. Continuing with this example, when the plate-line coupled to the capacitor is parallel to a bit-line, which is coupled to a source terminal or a drain terminal of the n-type transistor, transitions from logic low to logic high on the plate line results in a field across the ferroelectric capacitor of this unselected memory bit-cell. This field causes polarization decay for a ferroelectric material in the ferroelectric capacitor. The polarization decay causes the charge on the storage node to rise, which in turn weakens the disturb electric field across the ferroelectric material of the unselected bit-cell. The weakened disturb electric field causes the n-type transistor to leak, which in turn causes the disturb field to increase. As such, the unselected bit-cell suffers from charge disturb when the plate-line is parallel to the bit-line. Depending on the charge stored in the ferroelectric capacitor, this disturb field can either disturb or reinforce the stored value in the ferroelectric capacitor.

Parasitic capacitance (Cp) from the transistor and a dielectric component (Cde) of the ferroelectric capacitor also results in a capacitor divider. This capacitor divider causes a voltage drop across the ferroelectric capacitor of the unselected bit-cell. The voltage drop across the unselected ferroelectric capacitor can be approximately one-third to one-fourth of a voltage on the plate-line. In one example, when the plate-line voltage is twice the coercive voltage (Vc) of the ferroelectric capacitor, the disturb voltage can be two-thirds to one-half of the Vc for the unselected cell. Depending on the charge stored in the ferroelectric capacitor, this disturb voltage can either disturb or reinforce the stored value in the ferroelectric capacitor.

To mitigate such charge disturbance, the memory bit-cells may be refreshed, in accordance with some embodiments. For example, ferroelectric based random access memory (FeRAM) may apply a refresh scheme to make sure the contents in its capacitor remain valid. The refresh may be applied periodically or on an as needed basis. For instance, refresh may be applied every 1 second, or applied when a sensor determines that the contents on a storage node may have been disturbed. While various embodiments are described with reference to an FeRAM, the embodiments are applicable to other non-volatile memories (NVMs) such as magnetic random-access memory (MRAM), resistive RAM (ReRAM), ferroelectric RAM (FeRAM), paraelectric RAM (PeRAM), phase-change memory (PCM), etc.

In some embodiments, the NVM is integrated on a die which includes compute logic. In some embodiments, the NVM is a separate die which is packaged in a single package with a compute die. In some embodiments, the NVM is on a different package than the compute die. Here, examples of compute die include a die that is used for computations such as an inference logic, graphics processing unit (GPU), central processing unit (CPU), application specific integrated circuit (ASIC), digital signal processor (DSP), etc. In some embodiments, features of endurance mechanisms (e.g., randomizing mechanisms) are applicable to volatile memories such as static random-access memory (SRAM), and dynamic random-access memory (DRAM).

The endurance mechanisms (or refresh logic) of some embodiments include a wear leveling scheme that uses index rotation, outlier compensation to handle weak bits, and random swap injection (which is an example of a randomizing mechanism) to mitigate wear out attacks. In some embodiments, an index rotation logic is provided, which rotates the addresses throughout a memory bank to perform a wear leveling function. Index rotation logic ensures that memory requests are spread across memory locations rather than a single memory location. In some embodiments, a randomizing mechanism is used to randomize a mapping of an incoming address to an intermediate index. One example of a randomizing mechanism includes a random invertible bit matrix. This intermediate index is used by an index rotation logic to map to an actual physical index. In some embodiments, the rotation of gap words in the memory bank is randomized. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult. In some embodiments, random invertible bit matrix enables random swap injection which randomizes index rotation to obfuscate the mapping from addresses to rotated indexes. In some embodiments, bit repair logic is provided, which includes double error correcting, or triple error detecting error correction code (ECC) to discover new bit errors and spare disable which eliminates memory words with particularly high error rates.

Continuing with the example of a ferroelectric based memory bit-cell, the memory bit-cell is coupled to one or more plate-lines, a word-line, and a bit-line. The routing of the plate-line(s) relative to the word-line or the bit-line impacts the performance of the bit-cell. Some embodiments describe a read and write scheme (herein referred to as a pulsing scheme) for memory arrays where plate-line(s) is/are parallel to a bit-line. Some embodiments describe a pulsing scheme for memory arrays where plate-line(s) is/are parallel to a word-line. The pulsing schemes described with reference to various embodiments depend on a structure or configuration of a memory bit-cell. Some embodiments describe a pulsing scheme for a one-transistor, one-capacitor (1T1C) bit-cell configuration. Some embodiments describe a pulsing scheme for a two-transistor, one-capacitor (2T1C) bit-cell configuration. Some embodiments describe a pulsing scheme for a one-transistor, n-capacitors (1TnC) bit-cell configuration. Some embodiments describe a pulsing scheme for multi-element FE gain bit-cell configuration.

In some embodiments, a memory is provided which comprises a capacitor including non-linear polar material. The capacitor may have a first terminal coupled to a node (e.g., a storage node) and a second terminal coupled to a plate-line. The capacitors can be a planar capacitor or non-planar capacitor (also known as pillar capacitor). In various embodiments, the memory comprises a transistor coupled to the node and a bit-line (BL), wherein the transistor is controllable by a word-line (WL), and wherein the plate-line (PL) is parallel to the bit-line. In some embodiments, the memory comprises a refresh circuitry (e.g., wear-leveling logic) to refresh charge on the capacitor periodically or at a predetermined time. The refresh circuit can utilize one or more of the endurance mechanisms described herein. When the plate-line is parallel to the bit-line, a specific read and write scheme may be used to reduce the disturb voltage for unselected bit-cells, in accordance with some embodiments. In some embodiments, a transistor switch is coupled to the plate-line to remove the effect of PL toggles on an unselected bit-line.

In some embodiments, the memory comprises one or more circuitries to boost the word-line above a voltage supply level (Vdd) during a write operation and a read operation. The boost level may range from 5% to 30% of Vdd, in some examples. In some embodiments, the one or more circuitries generate a first pulse on the bit-line after the word-line is boosted and before an end of the boost on the word-line during a first write operation (e.g., Write 0). These one or more circuitries can be circuitries on the periphery of the memory. In some embodiments, the one or more circuitries generate a second pulse on the plate-line after the word-line is boosted and before the end of the boost on the word-line during a second write operation (e.g., Write 1) different from the first write operation.

In some embodiments, the one or more circuitries force a first voltage (e.g., 0V) on the plate-line during the first write operation. In some embodiments, the one or more circuitries force the first voltage on the bit-line during the first write operation. In some embodiments, the one or more circuitries initially force a voltage on the bit-line and subsequently allow the bit-line to float during the read operation, wherein the one or more circuitries boost the word-line above the voltage supply level during the read operation. In some embodiments, the one or more circuitries generate a third pulse on the plate-line after the word-line is boosted and before an end of the boost on the word-line during the read operation. The pulsing scheme of various embodiments avoid high voltage on the node (storage node) when the plate-line is parallel to the bit-line. While the pulsing scheme is described for a one transistor, one capacitor (herein 1T1C), based memory bit-cell, the scheme is applicable to other memory bit cells such as 1TnC, 2T1C, 1TnC, and multi-element FE gain configurations as described herein. In some embodiments, the transistor is a low leakage transistor. For example, the transistor is a high-threshold transistor in a dual threshold CMOS process technology node. The lower leakage transistor limits the effective field across the ferroelectric based capacitor by lowering the effective field, and as such delays the process of refreshing the capacitor. In some embodiments, by having the plate-line(s) parallel to the bit-lines, the memory layout allows for introducing word-line drivers or repeaters to drive signals on the word-lines, which run orthogonal to the plate-line(s) and the bit-lines.

Other ways to reduce the effect of the disturb charge when the plate-line is parallel to the bit-line is to lower the thickness (along the z-axis for a planar capacitor) of the ferroelectric material, in accordance with some embodiments. Reducing the thickness may reduce a relative impact of a parasitic capacitance (Cp) on a storage or internal node of the memory cell relative to a dielectric capacitance (Cdie). Here, the dielectric capacitance is of a dielectric component of the ferroelectric based capacitor of the memory bit-cell. The thickness of the ferroelectric material of the ferroelectric based capacitor along a z-axis can be in the range of 5 nm to 30 nm, in accordance with some embodiments.

In some embodiments, the effect of the disturb charge is mitigated by using a higher dielectric constant for the ferroelectric material. For example, ferroelectric based capacitor of higher dielectric constant can have a dielectric constant between 100 and 600. The higher dielectric constant and/or lower film thickness reduces the effective field for an unselected bit-cell coupled to the same PL in proportion to Cp/(Cdie+Cp) as the dielectric capacitance component of the ferroelectric capacitor increases relative to the parasitic component on the storage or internal node.

In some embodiments, the disturb voltage is reduced by lowering the parasitics on the storage or internal node. Lowering the parasitics (Cp) improves the ratio Cp/Cdie+ Cp) to lower the effective disturb field seen across the ferroelectric capacitor for an unselected bit-cell. In some embodiments, replacing the 1T1C memory bit-cell topology with a 2T1C topology can isolate the plate-line signal visibility for the unselected bit-cells as activity seen on the PL can be masked to other unselected bit-cells by controlling a switch (a transistor) on the PL to be in off-state. As such, the effect of the disturb voltage reduces. In some embodiments, the effect of the disturb charge is mitigated by changing the read mechanism. For example, changing the pattern of read 1 relative to read 0 periodically reduces the effect of the disturb charge. As such, read disturbances are averaged and thus reduced from their peak values.

In some embodiments, for a multi-element gain memory bit-cell, when the plate-line is parallel to the bit-line, read operation may result in reading all the memory bit-cells since the charge on the storage node may flip for all bit-cells. The charge on the storage node may flip because of excessive parasitic capacitance on the storage or internal node which is shared by multiple ferroelectric capacitors of the same multi-element gain memory bit-cell. Since the parasitic capacitance is greater than the dielectric capacitance, the field is applied to all the ferroelectric capacitors that are shared on the same plate-line, even if the bit-cell was unselected.

A multi-element FE gain memory bit-cell comprises a plurality of ferroelectric capacitors, where an individual ferroelectric capacitor is coupled to an individual plate-line. Two transistors are coupled to the storage node, which is also coupled to the ferroelectric capacitors. One of the transistors is controlled by the word-line and coupled to the bit-line, while the other transistor is controlled by the voltage on the storage node. This other transistor has a source terminal, or a drain terminal coupled to the bit-line. In some embodiments, the issue that results in reading all the memory bit-cells is resolved by introducing an individual transistor between an individual plate-line and an individual ferroelectric capacitor. This individual transistor is controlled by an individual word-line. These individual transistors on the plate-line ensure that the plate-line signal toggle is not seen by other bit-cells on the same column when the bit-cells share the same bit-line. In some embodiments, the area usage from the additional transistors on the individual plate-lines is mitigated by fabricating the additional transistors (also referred to as switches) in the backend of a die while the other two transistors of the bit-cell are fabricated on the front-end of the die.

In some cases, the plate-line is parallel to the word-line. In that case, a write operation without appropriate signaling may inherently mean writing the same value to each bit-cell. For example, writing a value by controlling the plate-line, which is shared across all selected bit-cells since the plate-line is parallel to the word-line, may result in writing the same value to all the bit-cells. To control this effect, in some embodiments, the one or more circuitries carry out a different pulsing scheme for read or write operations when the plate-line is parallel to the word-line. In some embodiments, the one or more circuitries boost the word-line above a voltage supply level during a write operation and a read operation. In some embodiments, the one or more circuitries generates a first pulse on the bit-line after the word-line is boosted and before an end of the boost on the word-line during a first write operation (Write 1). In some embodiments, the one or more circuitries generates a second pulse on the plate-line after the word-line is boosted and before the end of the boost on the word-line during a second write operation (e.g., Write 0) different from the first write operation. In some embodiments, the one or more circuitries generate a third pulse on the plate-line after the word-line is boosted and after the first pulse begins during the first write operation, wherein the third pulse ends about a time when the first pulse ends. In some embodiments, in the case where the plate-line is parallel to the word-line, the memory comprises a refresh circuitry to refresh charge on the capacitor periodically or at a predetermined time. The refresh circuit can utilize one or more of the endurance mechanisms described herein.

Referring back to the 1T1C example, where the plate-line is parallel to the bit-line, in some embodiments, the one or more circuitries force a first voltage (e.g., 0V) on the bit-line during the second write operation. In some embodiments, the one or more circuitries generates a fourth pulse on the plate-line after the word-line is boosted, wherein the fourth pulse ends before the end of the boost on the word-line. In some embodiments, the one or more circuitries initially force a voltage on the bit-line and subsequently allow the bit-line to float during the read operation, wherein the one or more circuitries is to boost the word-line above the voltage supply level during the read operation. In some embodiments, the one or more circuitries generates a fifth pulse on the plate-line after the word-line is boosted and before an end of the boost on the word-line during the read operation, wherein the fifth pulse starts when the bit-line is allowed to float. In some embodiments, the one or more circuitries boost the word-line by about 0.3V above a voltage on the bit-line or the plate-line. In some embodiments, the one or more circuitries boost the word-line by about 1.5× of a threshold voltage of the transistor (herein also referred to as a select transistor). In some embodiments, the transistor is a low leakage transistor. In some embodiments, by having the plate-line(s) parallel to the word-lines, the memory layout allows for introducing plate-line drivers or repeaters to drive signals on the plate-lines, which run orthogonal to the bit-lines. In addition to plate-line repeaters, the memory layout allows for introducing word-line drivers or repeaters to drive signals on the word-lines, which run orthogonal to the bit-lines.

In a multi-element FE gain memory bit-cell configuration, multiple capacitors are coupled to the node (storage node) and two transistors, where one transistor (e.g., the select transistor) is controllable by word-line and the other transistor is a gain element. In some embodiments, a pulsing scheme is described which avoids writing the same value to all multi-element FE gain memory bit-cells. In some embodiments, the memory, with multi-element FE gain memory bit-cell, comprises a refresh circuitry to refresh charge on the capacitor periodically or at a predetermined time. The refresh circuit can utilize one or more of the endurance mechanisms described herein. When the plate-line is parallel to the bit-line, column multiplexing is enabled which lowers the number of sense amplifiers needed to sense the values stored in the memory bit-cells, in accordance with some embodiments. As such, lower periphery area overhead is achieved. In the case where the plate-line is parallel to the bit-line, a plate-line driver switches one memory bit-cell (and thus one ferroelectric capacitor). As such, the plate-line driver size can be reduced, which improves power and area, in accordance with some embodiments. In the case where the plate-line is parallel to the word-line, column multiplexing may be relatively challenging.

However, in the case where the plate-line is parallel to the word-line, the energy cost on the plate-line is lower than that in the case where the plate-line is parallel to the bit-line. This is because parasitic capacitance on the plate-line is amortized over multiple bit-cells, as opposed to the case where the plate-line is parallel to the bit-line where multiple plate-lines are toggled. Likewise, in the case where the plate-line is parallel to the word-line, the disturb effects are lower than that in the case where the plate-line is parallel to the bit-line. This is because merely the bits that are intended to be read or written are the ones that get exposed to the plate-line, word-line, and bit-line signals. A disturb effect generally refers to an unintentional application of field on the ferroelectric capacitor(s) coupled to unselected bit-cells during read or write operations of adjacent bit-cells on the same row or column. Such a disturb effect can cause the ferroelectric capacitors of the unselected bit-cells to lose their polar state slowly over time.

When the bit-cells that are getting programmed to (e.g., either read/write) are the bit-cells that see the voltages on the plate-line and the word-line directly, the transistor on the bit-line masks the unselected bits, unlike the case when the plate-line is parallel to the bit-line where the unselected bit-cells within the 1T1C bit-cell see activities on the plate-line without any transistor masking the signal. As discussed herein, the pulsing schemes for the various memory bit-cell configurations reduces disturb effect and allows for realization of a reliable non-volatile memory. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots 100 and 120 showing behavior of a ferroelectric capacitor, a paraelectric capacitor, and a linear capacitor. Plot 100 compares the transfer function for a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of the switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\text{ nm})^2$ and thickness 20 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 2A:
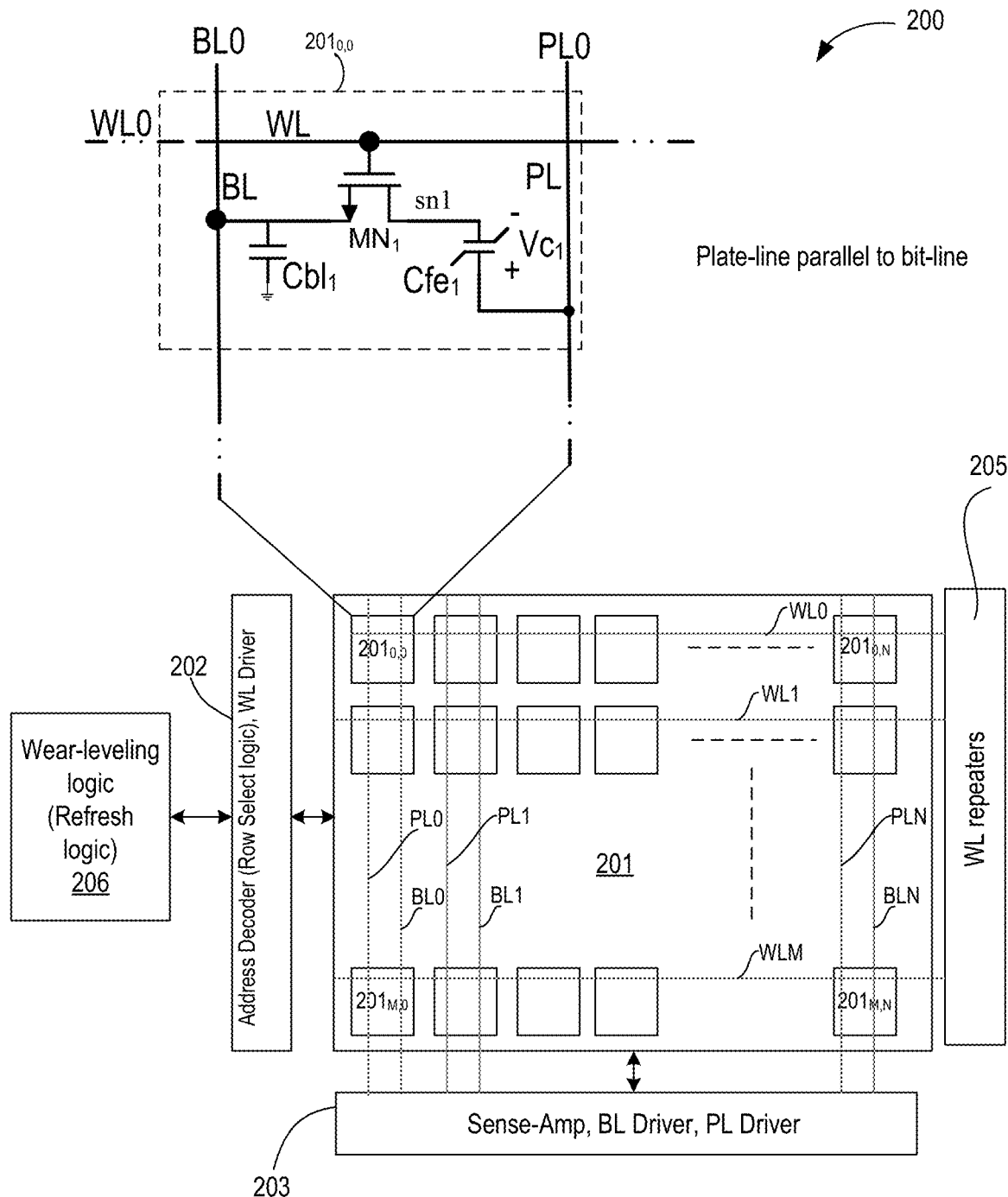
FIG. 2A illustrates an apparatus comprising memory and corresponding logic, wherein the memory comprises ferroelectric (FE) memory bit-cell, where an individual memory bit-cell includes one transistor and one capacitor (1T1C) with a plate-line (PL) parallel to a bit-line (PL), where the corresponding logic is to apply word-line boosting, in accordance with some embodiments.

FIG. 2A illustrates apparatus 200 comprising memory and corresponding logic, wherein the memory comprises ferroelectric (FE) memory bit-cell, where an individual memory bit-cell includes one transistor and one capacitor (1T1C) with plate-line parallel to a bit-line, where the corresponding logic is to apply word-line boosting, in accordance with some embodiments. Apparatus 200 comprises M×N memory array 201 of bit-cells, logic circuitry 202 for address decoding, and logic circuitry 203 for sense amplifier, write drivers, and plate-line (PL) drivers. Plate-lines PL0, PL1 through PLN are parallel to bit-lines BL0, BL1 through BLN, while word-lines WL0, WL1, through WLM are orthogonal to the plate-lines and the bit-lines, where 'N' is a number greater than 1.

In some embodiments, bit-cell $201_{0,0}$ comprises a word-line (WL) coupled to WL0, a plate-line (PL) coupled to PL0, and a bit-line (BL) coupled to BL. In some embodiments, bit-cell $201_{0,0}$ comprises an n-type transistor $MN_1$, and FE capacitive structure $Cfe_1$. The gates of transistors $MN_1$ of bit-cells in a row are coupled to a common WL. In various embodiments, one terminal of the FE capacitive structure $Cfe_1$ is coupled to a PL. The second terminal of the FE capacitive structure Cfe1 is coupled to a source terminal or a drain terminal (also referred to as storage node sn1) of the n-type transistor $MN_1$. In various embodiments, bit-line (BL) is coupled to the source or drain terminal of transistor $MN_1$. In some embodiments, BL parasitic capacitor $Cbl_1$ is coupled to the source or drain terminal of transistor $MN_1$ and to a reference node (e.g., ground) such that the FE capacitor is not coupled to the same source or drain terminal. In some embodiments, the PL is parallel to the BL and orthogonal to the word-line (WL). In some embodiments, the FE capacitor is a planar capacitor. In some embodiments, the FE capacitor is a pillar or non-planar capacitor.

Logic circuitry 202 comprises address decoders for selecting a row of bit-cells and/or a particular bit-cell from M×N array 201, where M and N are integers of same or different values. In some embodiments, logic circuitry 202 includes word-line drivers. In some embodiments, logic circuitry 203 comprises sense-amplifiers (SAs) for reading the values from the selected bit-cell. Since the PL is parallel to the BL, in some embodiments, PL drivers and BL drivers are part of logic circuitry 203. In other embodiments, PL drivers and BL drivers may be placed across logic circuitry 203 on the other side of memory array 201. In various embodiments, write drivers are used to write a particular value to a selected bit-cell. Here, a schematic of FE bit-cell $201_{0,0}$ is illustrated. The same embodiments apply to other bit-cells of the M×N array. In this example, a one-transistor one-capacitor (1T1C) bit-cell is shown, but the embodiments are applicable to 2T1C, 1TnC bit-cell and multi-element FE gain bit-cell as described herein. As the PL is parallel to the bit-line, the WL drivers can be placed orthogonal to the region where the plate-line drivers and bit-line drivers are placed, in accordance with some embodiments. In some embodiments, WL repeaters 205 are added to buffer the word-line signals along different memory arrays. In some embodiments, apparatus 200 comprises wear-leveling logic 206 (also referred to as refresh logic) to refresh the contents of the memory bit-cells periodically or on a need-by-need basis.

Figure 2B:
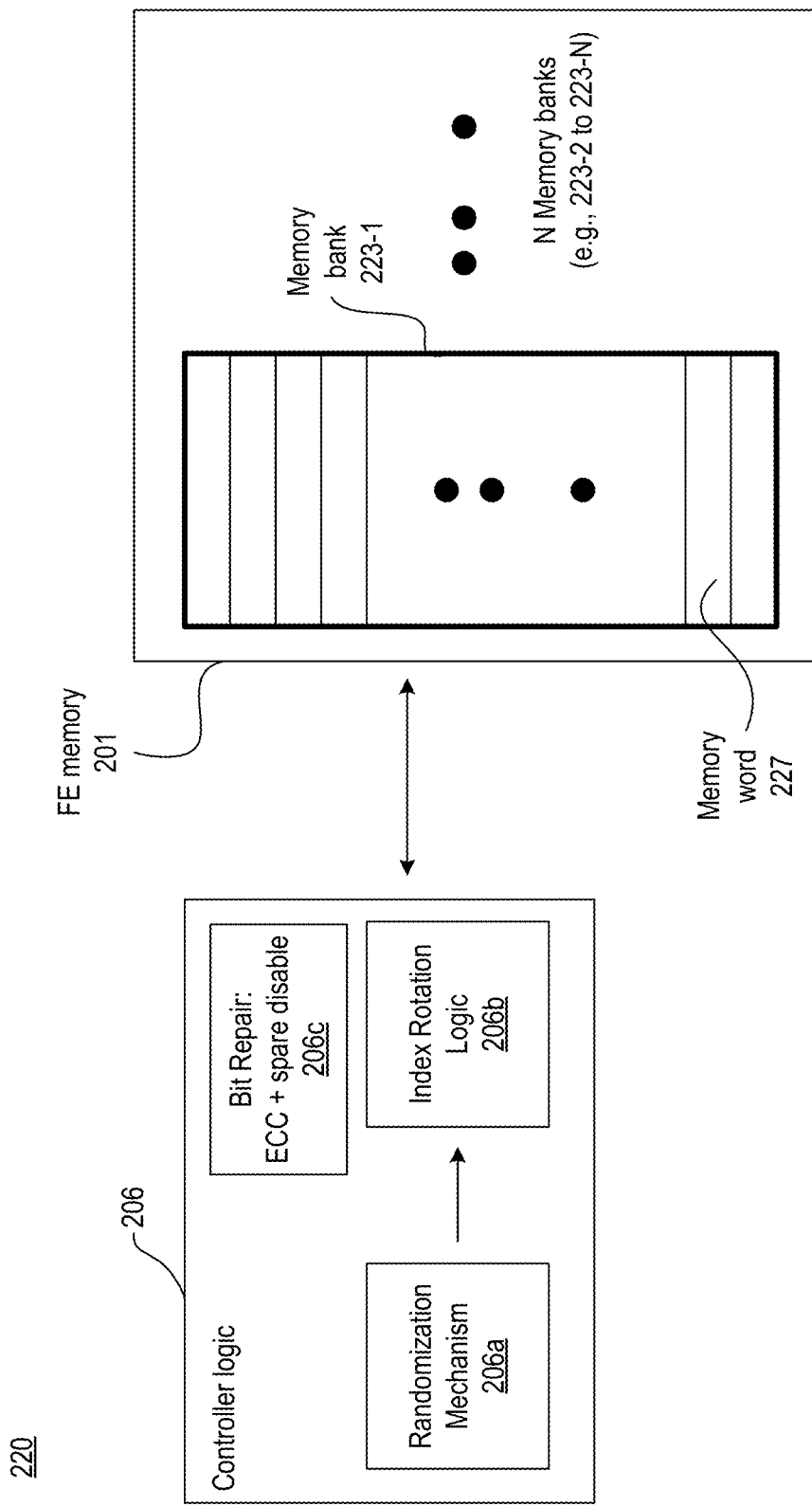
FIG. 2B illustrates a high-level endurance enhancement architecture for the FE memory, in accordance with some embodiments.

FIG. 2B illustrates a high-level endurance enhancement architecture 220 (e.g., wear-leveling logic 206) for the FE memory, in accordance with some embodiments. High-level endurance enhancement architecture 220 comprises memory array 201 and -wear-leveling logic 206. In various embodiments, memory array 201 is memory with non-linear polar material. For example, memory array 201 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In various embodiments, the FE material can be any suitable low voltage FE material that allows the FE material to switch its state by a low voltage (e.g., 100 mV). Threshold in FE material has a highly non-linear transfer function in the polarization vs. voltage response. The threshold is related to: a) non-linearity of switching transfer function; and b) the squareness of the FE switching. The non-linearity of the switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves spontaneous distortion in the range of 0.3-2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3. In some embodiments, perovskite includes one of: BaTiO3, PbTiO3, KNbO3, or NaTaO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for the FE material, conductive oxides can include one or more of: IrO$_2$, RuO$_2$, PdO$_2$, OsO$_2$, or ReO$_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, the ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, FE material includes one or more of: Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric, which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1−x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxyfluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' number of octahedral layers in thickness can be used. In some embodiments, FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. While various embodiments here are described with reference to ferroelectric material for storing the charge state, the embodiments are also applicable for paraelectric material. For example, the capacitor of various embodiments can be formed using paraelectric material instead of ferroelectric material.

While various embodiments here are described with reference to ferroelectric material for storing the charge state, the embodiments are also applicable for paraelectric material. For example, non-linear paraelectric material of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

In some embodiments, FE memory array 201 includes a plurality of memory banks (e.g., 223-1 through 223-N, where 'N' is a number). Each memory bank (e.g., 223-1) includes a plurality of memory words (e.g., memory word 227). Each memory word includes a plurality of memory bit-cells. For the sake of simplicity, other memory components are not shown such as write drivers, column multiplexers, sense-amplifiers, etc.

In various embodiments, -wear-leveling logic 206 comprises endurance hardware and/or software to provide memory endurance to memory array 201. In general, memory endurance is needed to ensure write and/or read operations from memory array 201 are reliable. Write endurance is a number of programs and erase cycles that, when applied to a memory block, bank, or word before the memory block, bank, or word, becomes unreliable. The endurance mechanisms of some embodiments include a wear leveling scheme that uses index rotation, outlier compensation to handle weak bits, and random swap injection to mitigate wear out attacks. For the sake of simplicity, memory banks are generally referred by their reference 223 instead of a particular memory bank reference (e.g., 223-1, 223-2, etc.). Embodiments described to the general reference are applicable to an individual particular reference. For example, description of memory bank 223 is applicable for memory banks 223-1, 223-2, through 223-N.

In some embodiments, wear-leveling logic 206 (also referred to as controller or refresh logic) comprises random invertible bit matrix 206a, index rotation logic 206b, and bit repair logic 206c. In some embodiments, index rotation logic 206b enables random swap injection which randomizes index rotation to obfuscate the mapping from addresses to rotated indexes. In some embodiments, index rotation logic 206b randomizes the rotation of gap words in memory bank 223. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In some embodiments, index rotation logic 206b is used for implementing the wear leveling scheme. In some embodiments, index rotation logic 206b rotates the addresses throughout memory bank 223 to perform a wear leveling function. In various embodiments, index rotation logic 206b ensures that memory requests are spread across memory locations rather than a single memory location.

In some embodiments, bit repair logic 206c includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 206c addresses the problem of weak memory bits. In some embodiments, each cache line or memory word 227 in memory bank 223 includes a valid bit. The valid bit indicates whether the data associated with that line/word is stored in the memory or the redundant word array. The redundant word array comprises spares that can be used to compensate for defective words in memory. When accessing memory, wear-leveling logic 206 checks the valid bit, if the valid bit is set then the data is stored in the redundant memory rather than the memory array or bank 223. In various embodiments, ECC is used to identify and/or correct bit errors in both the memory array and the redundant memory. As the ECC discovers bit errors, additional lines may be marked valid and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for FE memory array 201. These endurance mechanisms are applied to FE memory array 201 to maximize usage of such memory.

FIG. 2C illustrates flowchart 230 of memory endurance for the FE memory, in accordance with some embodiments. While the blocks in flowchart 230 are illustrated in a particular order, the order can be modified. For example, some blocks may be performed before others based on whether read or write operations are being performed. As described herein, the various blocks can be implemented in hardware, software, or a combination of them.

At block 231, wear-leveling logic 206 sends a memory request to memory array 201. This request may be a read request or a write request. If it is a write request, wear-leveling logic 206 applies the wear leveling scheme at block 232. In some embodiments, the wear leveling scheme is linear in that a gap word or gap cache line is swapped with an adjacent word or cache line. In some embodiments, wear leveling is dithered as indicated by block 232a. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 232b. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 235), outlier compensation is applied as indicated by block 236. At block 236, wear-leveling logic 206 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, wear-leveling logic 206 checks the valid bit, if the valid bit is set then the data is stored in the redundant memory rather than the memory array or bank 223. In various embodiments, ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to wear-leveling logic 206 as indicated by block 237. The memory endurance for non-linear polar material based memory is enhanced by the endurance mechanisms of various embodiments. This allows more read and writes to memory before any memory block, bank, or word becomes unreliable.

Figure 2D:
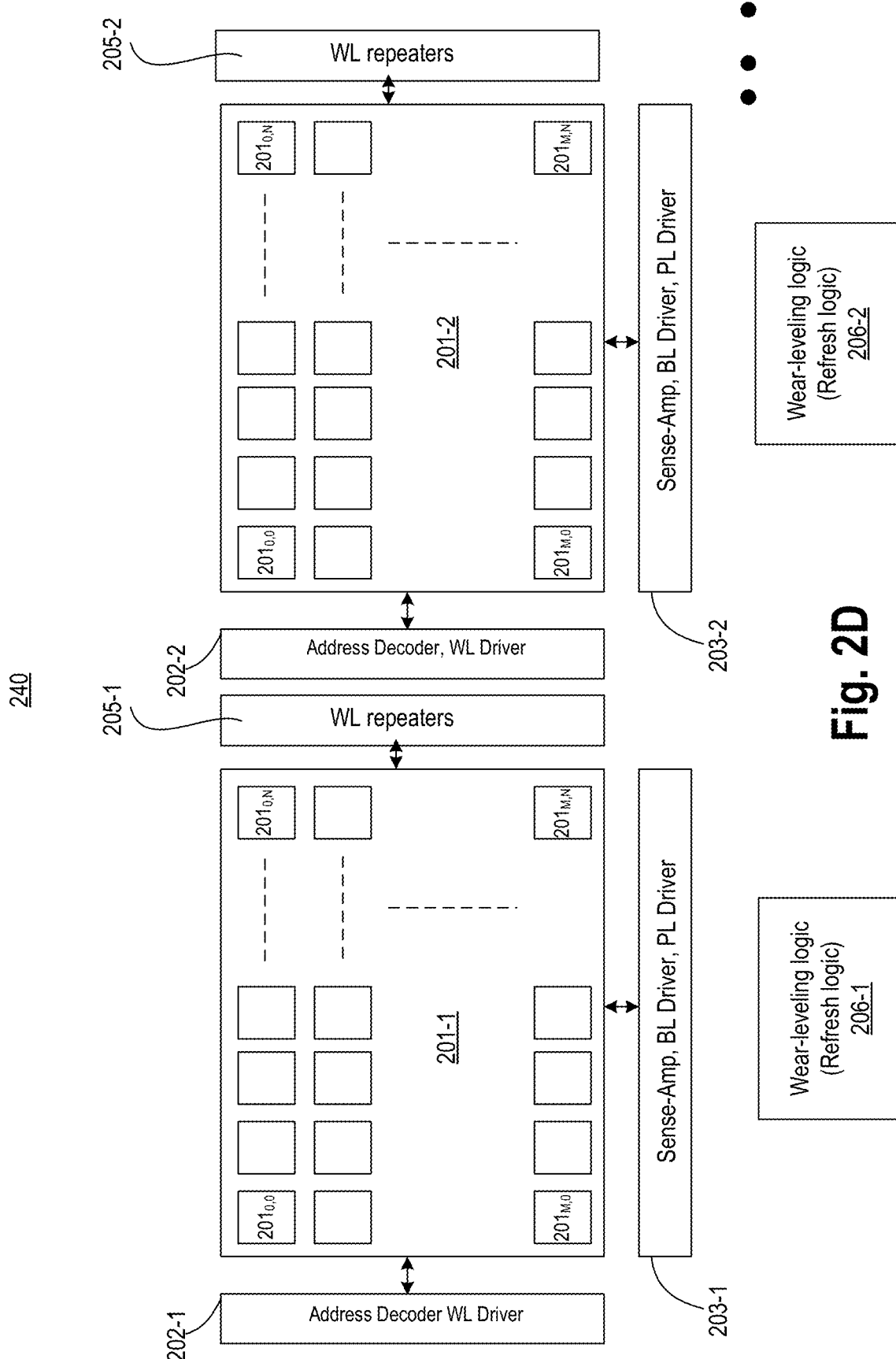
FIG. 2D illustrates an FE memory with word-line repeaters, wherein memory arrays of the FE memory have 1T1C bit-cells with the PL parallel to the BL, in accordance with some embodiments.

FIG. 2D illustrates apparatus 240 having FE memory with word-line repeaters, wherein memory arrays of the FE memory have 1T1C bit-cells with the plate-line parallel to the bit-line, in accordance with some embodiments. Apparatus 240 illustrates two instances of apparatus 200. The two instances include first memory array 201-1, logic circuitry 202-1 having first address decoder and/or WL driver, and logic circuitry 203-1 having first sense amplifier, BL driver, PL driver; and WL repeaters 205-1; and second memory array 201-2, logic circuitry 202-2 having address decoder and/or WL driver, and logic circuitry 203-2 having first sense amplifier, BL driver, PL driver; and WL repeaters 205-2. In some embodiments, an individual instance of apparatus 200 includes a corresponding wear-leveling logic 206 (e.g., wear-leveling logic 206-1 and wear-leveling logic 206-2). In some embodiments, wear-leveling logic 206 is shared by multiple instances of apparatus 200. In some embodiments, when the pulsing scheme described herein is combined with the refresh function by wear-leveling logic 206-1 and wear-leveling logic 206-2, disturb issues on unselected bit-cells are mitigated. While two memory arrays are shown (e.g., array 201-1 and 201-2), any number of arrays may be part of apparatus 240. With PL parallel to the BL and orthogonal to the WL, WL repeaters 205-1, 205-2, etc. are added to improve the driving strength of the word-line signals. In some embodiments, WL repeaters 205-1 and 205-2 operate on a higher power supply level (e.g., Vdd+Vboost) to implement WL boosting.

Timing diagrams of various embodiments here show timepoints t1, t2, t3, t4, and onwards. These time points are shown as equally spaced. However, the time points can be separated by any time period.

Figure 2E:
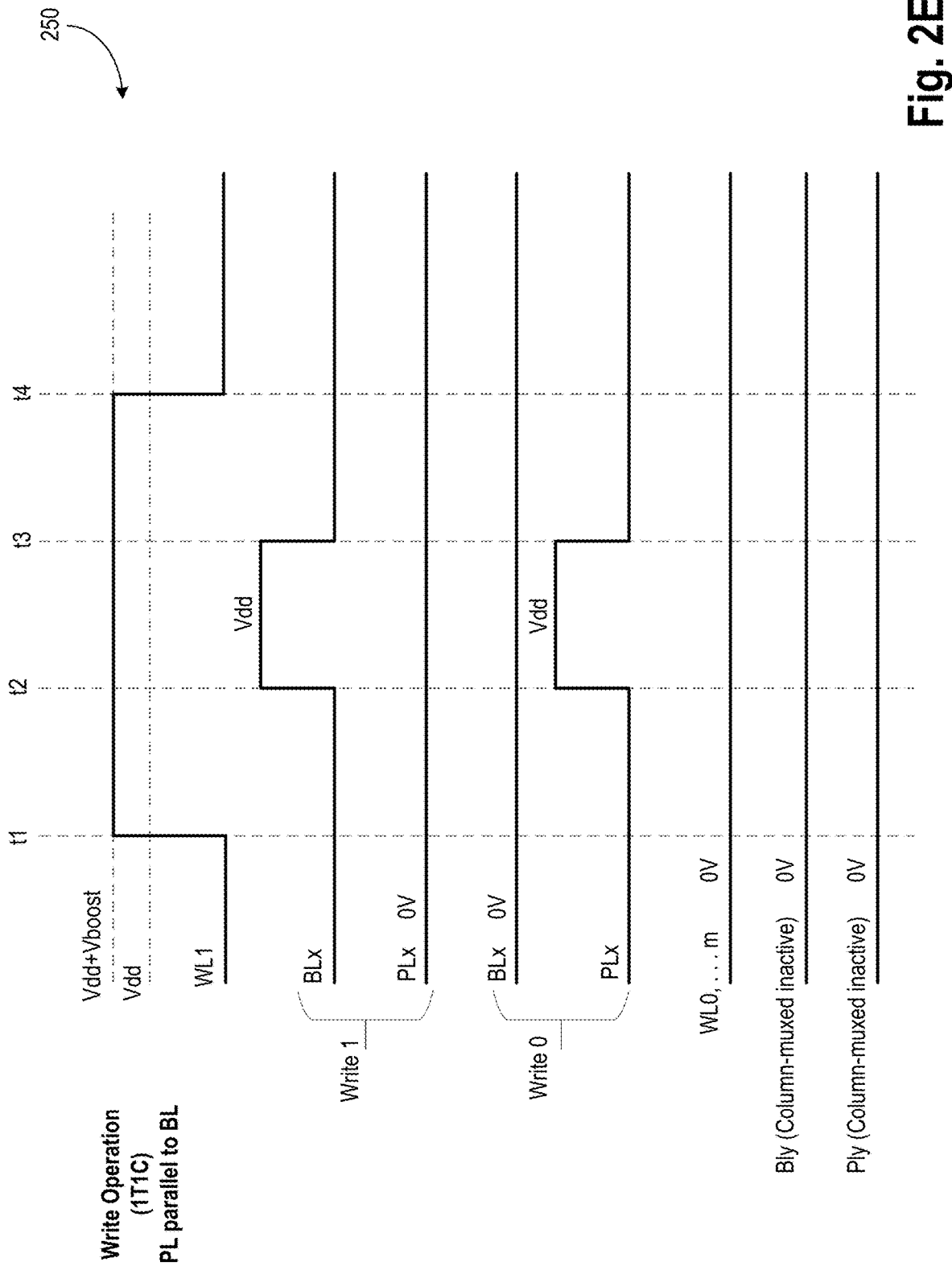
FIG. 2E illustrates a timing diagram for write operation for 1T1C FE memory bit-cells, where the write operation involves word-line boosting, in accordance with some embodiments.

FIG. 2E illustrates timing diagram 250 for write operation for 1T1C FE memory bit-cells, where the write operation involves word-line boosting, in accordance with some embodiments. In this case, PL is parallel to the BL. Depending on whether logic 1 (Write 1) or logic 0 (Write 0) is being written to the capacitor with non-linear polar material, BL or PL for that bit-cell is asserted from 0V to Vdd (power supply level). In various embodiments, write operation begins when WL is asserted and boosted above Vdd. The boost level is Vboost which may be 10% to 50% of Vdd. In one example, Vboost is about 1× to 1.5× of a threshold voltage (Vt) of the select transistor $MN_1$ of the 1T1C bit-cell (e.g., $201_{0,0}$).

Since, the select transistor $MN_1$ in these configurations is an n-channel device, it is good at passing the 0V and signals closer to it. The signal applied through the BL however, when it is at Vdd, may not pass through the transistor $MN_1$ in completeness. As such, there is a Vt drop across the select transistor $MN_1$ if the WL is driven to Vdd. To help get the full range of signaling across the FE capacitor Cfe1, WL-boosting helps negate the Vt drop across the select transistor $MN_1$ such that BL when driven to Vdd, internal node sn1 will also see Vdd, as opposed to Vdd-Vt.

When a particular bit-cell (e.g., $201_{0,0}$) is being written to, the WL for unselected bit-cells (e.g., on WL0 through WLm) remains at 0V. Same is done for unselected BLy and PLy by column multiplexers. In this example, the selected WL is WL1 and selected BL and PL are BLx and PLx. In various embodiments, the BL and PL are asserted and de-asserted within a pulse width of the boosted WL. In some embodiments, the voltage swing for BL and PL is 0V to Vdd. In some embodiments, BL or PL pulse is generated after a predetermined or programmable time from when WL boost starts.

Figure 2F:
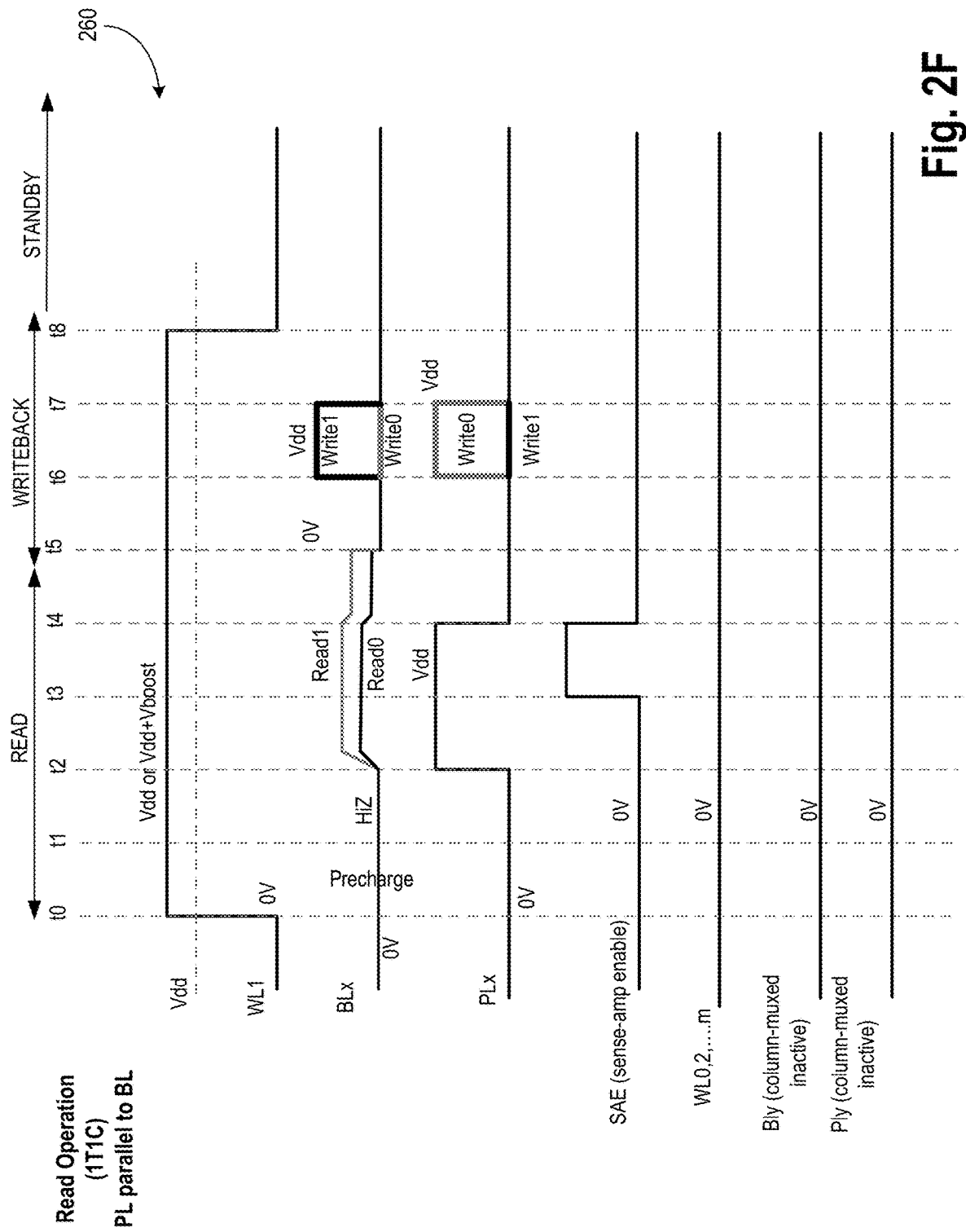
FIG. 2F illustrates a timing diagram for read operation for 1T1C FE memory bit-cells, where the read operation involves word-line boosting, in accordance with some embodiments.

FIG. 2F illustrates timing diagram 260 for read operation for 1T1C FE memory bit-cells, where the read operation involves word-line boosting, in accordance with some embodiments. In this case, PL is parallel to the BL. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read. PL is asserted for a time period long enough for the sense amplifier to sense the value stored on the storage node coupled to the capacitor. In various embodiments, sense amplifier enable signal (SAE) is asserted within the pulse width of the PL.

In some embodiments, to read data from the storage node sn1, BL is first set or forced to zero volts and then allowed to float (e.g., BL driver goes into high impedance state Z (HiZ)). In some embodiments, BL is precharged to a certain voltage or a programmable voltage so when the WL is selected, in conjunction with the PL voltage, a field is created across the FE capacitor Cfe1. Thereafter, the BL driver is configured in high impedance state, the selected BL is floated, which allows the sense amplifier to sense the voltage on the storage node via the BL. In some embodiments, the sense amplifier is configured to sense the voltage on the BL by comparing it to one or more thresholds. In some embodiments, when the BL charges to a first voltage level, a logic 0 is read (Read0). In some embodiments, when the BL charges to a second voltage level (higher than the first voltage level), a logic 1 is read (Read1). In some embodiments, after the sense amplifier is disabled (SAE is set to 0), the voltage on the selected BL is forced to zero volts. In some embodiments, after the selected BL is forced to 0V, the write back process begins.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 2E. In various embodiments, the WL for the unselected bit-cells is set to 0V (e.g., WL0, WL2, . . . WLm is set to 0 when WL1 is selected). In various embodiments, the BL for the unselected bit-cells (e.g., BLy) is set to 0V during read and writeback operations. In some embodiments, the PL for the unselected bit-cell (e.g., PLy) is set to 0V during read and writeback operations. In some embodiments, the WLs for the unselected bit-cell (e.g., WL0, WL2, . . . WLm) is set to 0V during read and writeback operations.

Figure 3A:
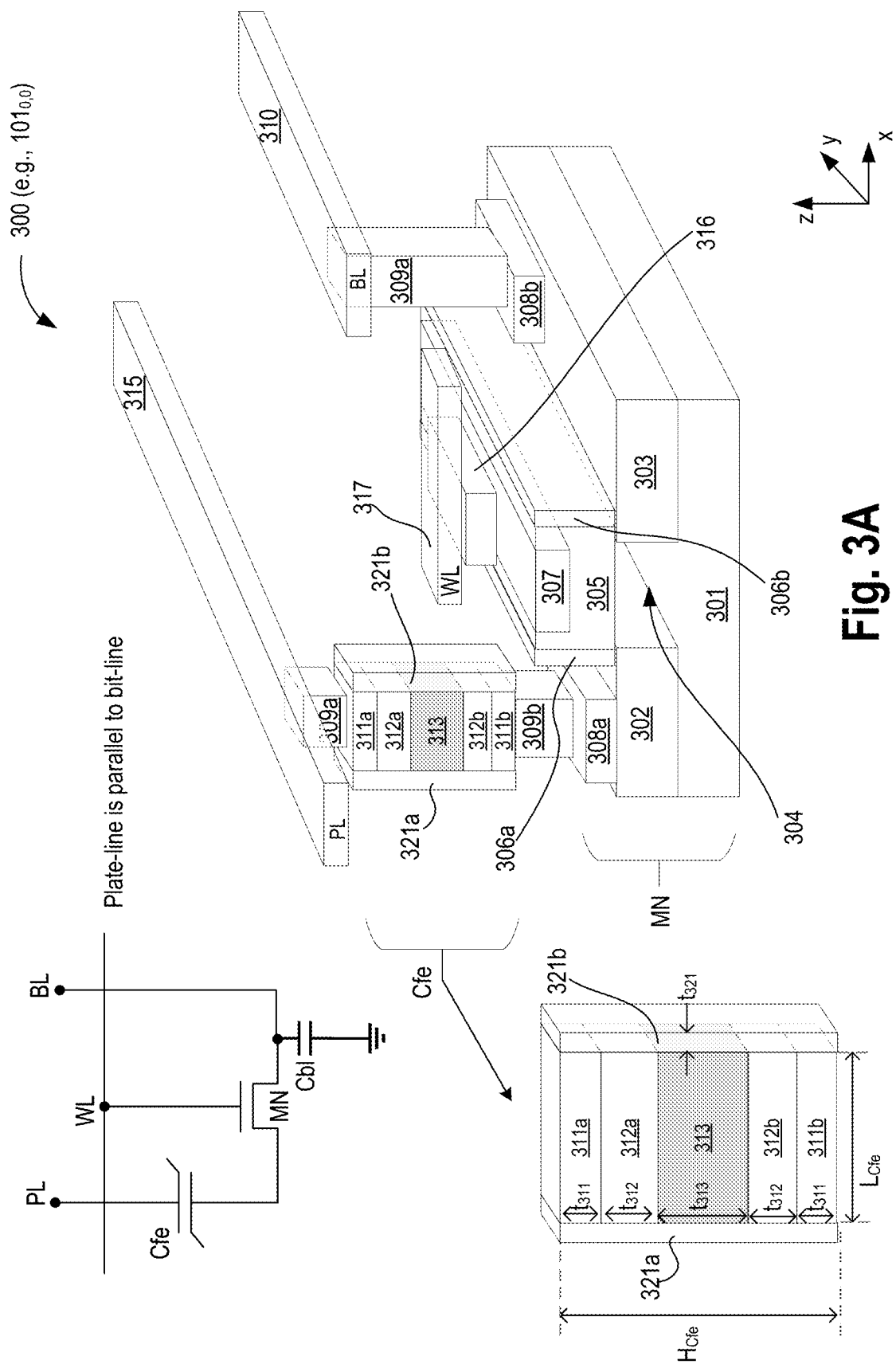
FIG. 3A illustrates a three-dimensional (3D) view of a 1T1C FE bit-cell with the PL parallel to the BL, where the transistor is a planar transistor and where the capacitor is a planar capacitor, in accordance with some embodiments.

FIG. 3A illustrates a three-dimensional (3D) view of a 1T1C FE bit-cell 300 with the plate-line parallel to the bit-line, where the transistor is a planar transistor and where the capacitor is a planar capacitor, in accordance with some embodiments. In some embodiments, memory bit-cell 300 includes a planar transistor MN having substrate 301, source region 302, drain region 303, channel region 304, a gate comprising gate dielectric 305, gate spacers 306a and 306b; gate metal 307, source contact 308a, and drain contact 308b. In some embodiments, substrate 301 includes a suitable semiconductor material such as single crystal silicon, polycrystalline silicon or silicon on insulator (SOI). In some embodiments, substrate 301 includes other semiconductor materials such as: Si, Ge, SiGe, or a suitable group III-V or group III-N compound. In some embodiments, substrate 301 may also include semiconductor materials, metals, dopants, and other materials commonly found in semiconductor substrates.

In some embodiments, source region 302 and drain region 303 are formed within substrate 301 adjacent to the gate stack of the transistor. In various embodiments, source region 302 and drain region 303 are generally formed using either an etching/deposition process or an implantation/diffusion process. In some embodiments, in the etching and deposition process, substrate 301 may first be etched to form recesses at the locations of the source region 302 and drain region 303. An epitaxial deposition process may then be carried out to fill the recesses with material that is used to fabricate the source region 302 and drain region 303. In the implantation/diffusion process, dopants such as boron, aluminum, antimony, phosphorous, or arsenic may be ion-implanted into the substrate to form the source region 302 and drain region 303. An annealing process that activates the dopants and causes them to diffuse further into substrate 301 typically the ion-implantation process, in accordance with some embodiments. In some embodiments, one or more layers of metal and/or metal alloys are used to form source region 302 and drain region 303. In some embodiments, source region 302 and drain region 303 are formed using one or more alternate semiconductor materials such as germanium or a suitable group III-V compound. In some embodiments, source region 302 and drain region 303 are fabricated using a silicon alloy such as silicon germanium or silicon carbide. In some embodiments, the epitaxially deposited silicon alloy is doped in-situ with dopants such as boron, arsenic, or phosphorous. In some embodiments, semiconductor material for channel region 304 may have the same material as substrate 301, in accordance with some embodiments. In some embodiments, channel region 304 includes one of: Si, SiGe, Ge, or GaAs.

In some embodiments, gate dielectric 305 may include one layer or a stack of layers. The one or more layers may include high-k dielectric material, silicon oxide, and/or silicon dioxide ($SiO_2$). The high-k dielectric material may include elements such as zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric 305 to improve its quality.

In some embodiments, a pair of spacer layers (sidewall spacers) 306a/b are formed on opposing sides of the gate stack that bracket the gate stack. The pair of spacer layers 306a/b are formed from a material such as silicon oxynitride, silicon nitride, silicon nitride doped with carbon, or silicon carbide. Processes for forming sidewall spacers include deposition and etching process operations. In some embodiments, a plurality of spacer pairs may be used. For example, two pairs, three pairs, or four pairs of sidewall spacers may be formed on opposing sides of the gate stack.

In some embodiments, depending on whether the transistor is to be a p-type or an n-type transistor, gate metal layer 307 may comprise at least one P-type work-function metal or N-type work-function metal. In some embodiments, gate metal layer 307 may comprise a stack of two or more metal layers. In some embodiments, the two or more metal layers are work-function metal layers and at least one metal layer is a conductive fill layer. In some embodiments, for an n-type transistor, metals that may be used for the gate metal layer 307 include aluminum carbide, tantalum carbide, zirconium carbide, and/or hafnium carbide. In some embodiments, metal for gate metal layer 307 for n-type transistor include aluminum, hafnium, zirconium, titanium, tantalum, and their alloys. An n-type metal layer may enable the formation of an n-type gate metal layer 307 with a work function that is between about 3.9 eV and about 4.2 eV. In some embodiments, metal of layer 307 includes one of TiN, TiSiN, TaN, Cu, Al, Au, W, TiSiN, and/or Co. In some embodiments, metal of layer 307 includes one or more of Ti, N, Si, Ta, Cu, Al, Au, W, or Co. In some embodiments, for a p-type transistor, metals that are used for gate metal layer 307 include, but are not limited to, ruthenium, palladium, platinum, cobalt, nickel, and conductive metal oxides. An example of conductive oxide includes ruthenium oxide. A p-type metal layer may enable the formation of a p-type gate metal layer 307 with a work function that is between about 4.9 eV and about 5.2 eV.

In some embodiments, drain contact 308b is coupled to vias 309a/b, which are coupled to metal layer 310. Metal layer 310 is the bit-line, which extends along the y-axis. In some embodiments, source contact 308a is coupled to via 309b. Any suitable material can be used for source and drain contacts 308a/b and vias 309a/b. For example, one or more of Ti, N, Si, Ta, Cu, Al, Au, W, and/or Co can be used for source and drain contacts 308a/b and vias 309a/b. In some embodiments, via 309b is coupled to FE capacitor Cfe that comprises a number of layers stacked together to form a planar capacitor. These layers may be extending in an x-plane when the capacitor is a planar capacitor, in accordance with some embodiments. In some embodiments, the stack of layers includes refractive inter-metallic 311a/b as a barrier material; conductive oxides 312a/b, and FE material 313. In some embodiments, refractive inter-metallic 311a/b are removed and vias 390a/b are in direct contact with conductive oxides 312a/b.

In some embodiments, refractive inter-metallic 311a/b maintains the FE properties of the FE capacitor Cfe. In the absence of refractive inter-metallic 311a/b, the ferroelectric material or the paraelectric material 313 of the capacitor may lose its potency. In some embodiments, refractive inter-metallic 311a/b comprises Ti and Al (e.g., TiAl compound). In some embodiments, refractive inter-metallic 311a/b comprises one or more of Ta, W, and/or Co. For example, refractive inter-metallic 311a/b includes a lattice of Ta, W, and Co. In some embodiments, refractive inter-metallic 311a/b includes one of: Ti—Al such as Ti3Al, TiAl, and/or TiAl3. In some embodiments, refractive inter-metallic 311a/b includes one of: Ni—Al such as Ni3Al, NiAl3, and/or NiAl. In some embodiments, refractive inter-metallic 311a/b includes Ni—Ti, Ni—Ga, and/or Ni2MnGa. In some embodiments, refractive inter-metallic 311a/b includes FeGa, and/or Fe3Ga. In some embodiments, refractive inter-metallic 311a/b includes borides, carbides, or nitrides. In some embodiments, TiAl material comprises Ti-(45-48)Al-(1-10)M (at X trace amount %), with M being at least one element from V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. In some embodiments, barrier layer 311a is coupled to plate-line or powerline (PL) 315. In some embodiments, sidewall barrier seal 321a/b (insulating material) is placed around layers 311a, 312a, 313, 312b, and 311b along the sides, while the top and bottom surfaces of 311a and 311b are exposed for coupling to metal layers, vias, or a metallic pedestal.

In some embodiments, PL metal layer 315 extends along the y-direction and parallel to the BL metal layer 310. Having the BL and the PL parallel to one another further improves the density of the memory because the memory array footprint is reduced, allowing column multiplexing (muxing), and sharing of sense-amplifier, and PL driver size reduction, in comparison to having BL and PL orthogonal to each other. In some embodiments, gate metal 307 is coupled to a gate contact 316, which is coupled to WL metal layer 317. WL metal layer 317 is used as the word-line (WL). In some embodiments, WL metal layer 317 extends orthogonal to BL metal layer 310 and PL metal layer 315. In some embodiments, WL metal layer 317 is also parallel to BL 310 and PL metal layer 315. Any suitable metal can be used for BL metal layer 310, PL metal layer 315, and/or WL metal layer 317. For example, Al, Cu, Co, Au, or Ag can be used for BL metal layer 310, PL metal layer 315, and WL metal layer 317.

In various embodiments, FE material 313 can be any suitable low voltage FE material that allows the FE material to switch its state by a low voltage (e.g., 100 mV). FE material 313 is listed with reference to FIG. 2A. While various embodiments here are described with reference to ferroelectric material for storing the charge state, the embodiments are also applicable for paraelectric material. For example, FE material 313 of various embodiments can be formed using paraelectric material instead of ferroelectric material. In some embodiments, paraelectric material includes one of: SrTiO3, Ba(x)Sr(y)TiO3 (where x is −0.5, and y is 0.95); HfZrO2; Hf—Si—O; La-substituted PbTiO3; or PMN-PT based relaxor ferroelectrics.

In some embodiments, thickness $t_{311}$ of refractive inter-metallic layer 311a/b is in a range of 1 nm to 20 nm. In some embodiments, thickness $t_{312}$ of the conductive oxide layers 312a/b is in a range of 1 nm to 20 nm. In some embodiments, thickness $t_{313}$ of the FE material (e.g., perovskite, hexagonal ferroelectric, or improper ferroelectric) 313a/b is in a range of 1 nm to 20 nm. In some embodiments, the lateral thickness $t_{321}$ of the sidewall barrier seal 321a/b (insulating material) is in a range of 0.1 nm to 40 nm. In some embodiments, the lateral thickness $L_{Cfe}$ of the capacitive structure (without sidewall barrier) is in a range of 5 nm to 200 nm. In some embodiments, the height $H_{Cfe}$ of the capacitive structure is in a range of 10 nm to 200 nm. In some embodiments, the FE capacitive structure is without refractive inter-metallic layers 311a/b. In that case, conductive oxides layers 312a/b are in direct contact with the contacts, vias, or metals (e.g., PL, source/drain region contact of transistor MN). In some embodiments, sidewall barrier seal 321a/b is not present. In one such embodiment, the sidewalls of the layers 311a/b, 312a/b, and 313 are in direct contact with ILD (interlayer dielectric) such as SiO2.

Figure 3B:
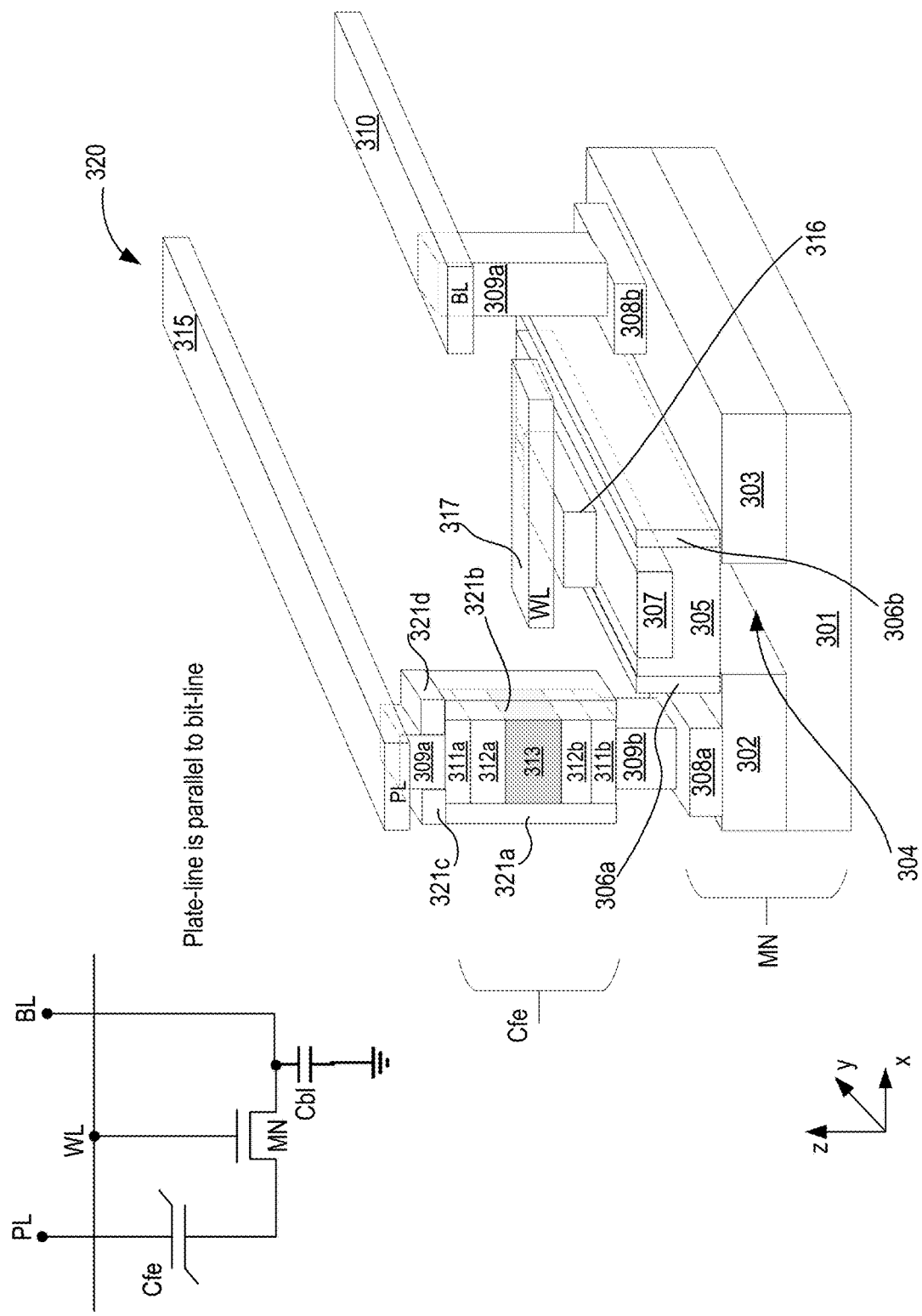
FIG. 3B illustrates a 3D view of a 1T1C FE bit-cell with PL parallel to the BL, where the transistor is a planar transistor and where the capacitor is a planar capacitor with partially wrapped encapsulation, in accordance with some embodiments.

FIG. 3B illustrates a 3D view of a 1T1C FE bit-cell 320 with plate-line parallel to the bit-line, where the transistor is a planar transistor and where the capacitor is a planar capacitor with partially wrapped encapsulation, in accordance with some embodiments. 1T1C FE bit-cell 320 is like bit-cell 300 but with encapsulation portions 321c and 321d that are partially adjacent to sidewall barrier seal 321a and 321b, and refractive inter-metallic layers 311a. In various embodiments, encapsulation portions 321c and 321d terminate into via 309a. The material for encapsulation portions 321c and 321d is same as those for sidewall barrier seal 321a and 321b.

Figure 3C:
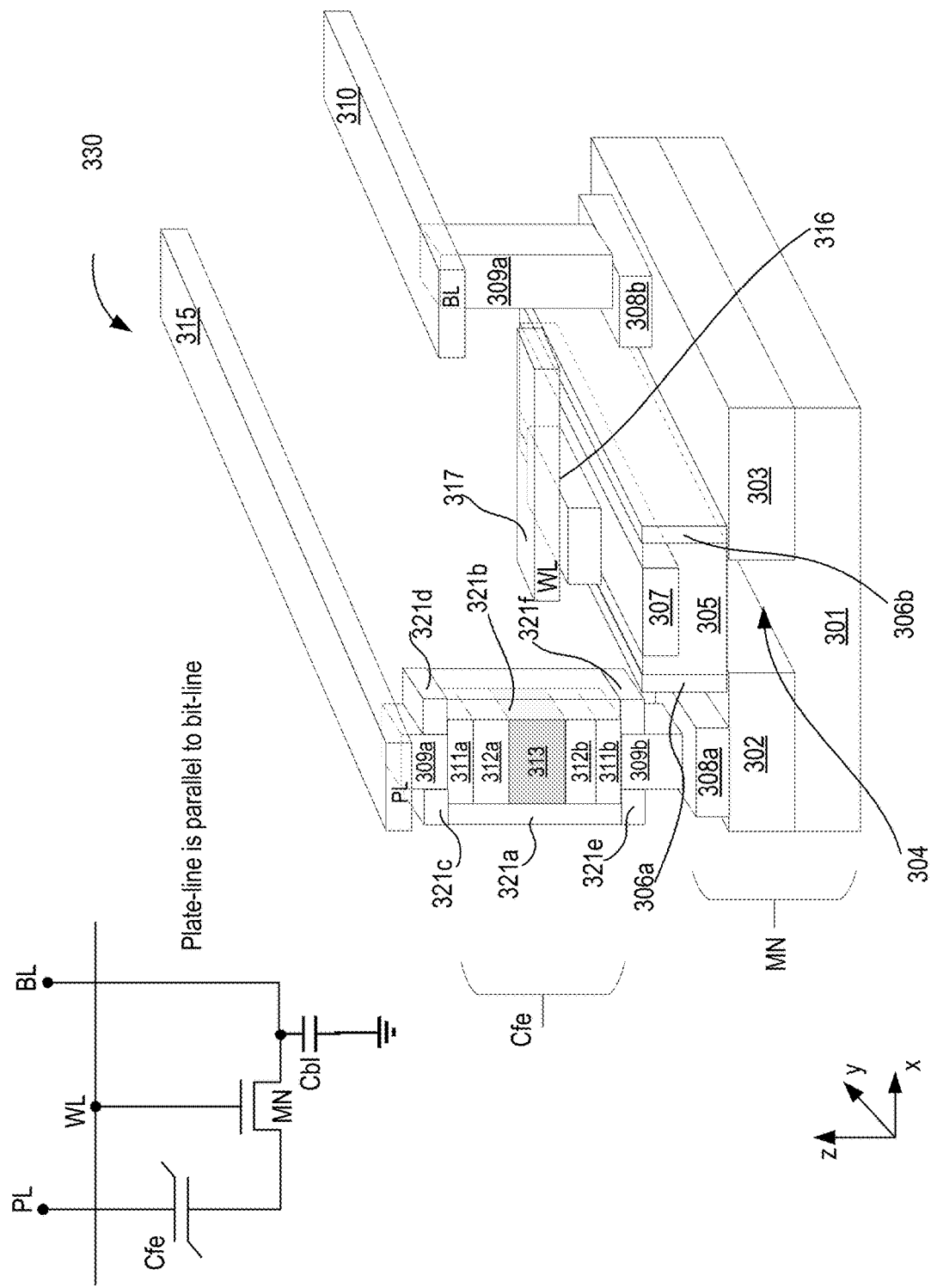
FIG. 3C illustrates a 3D view of a 1T1C FE bit-cell with PL parallel to the BL, where the transistor is a planar transistor and where the capacitor is a planar capacitor with wrapped encapsulation, in accordance with some embodiments.

FIG. 3C illustrates a 3D view of a 1T1C FE bit-cell 330 with plate-line parallel to the bit-line, where the transistor is a planar transistor and where the capacitor is a planar capacitor with wrapped encapsulation, in accordance with some embodiments. 1T1C FE bit-cell 330 is like 1T1C FE bit-cell 320 but with encapsulation portions 321e and 321f that are partially adjacent to sidewall barrier seal 321a and 321b, and refractive inter-metallic layers 311b. In various embodiments, encapsulation portions 321e and 321f terminate into via 309b. The material for encapsulation portions 321e and 321f is the same as those for sidewall barrier seal 321a and 321b.

Figure 3D:
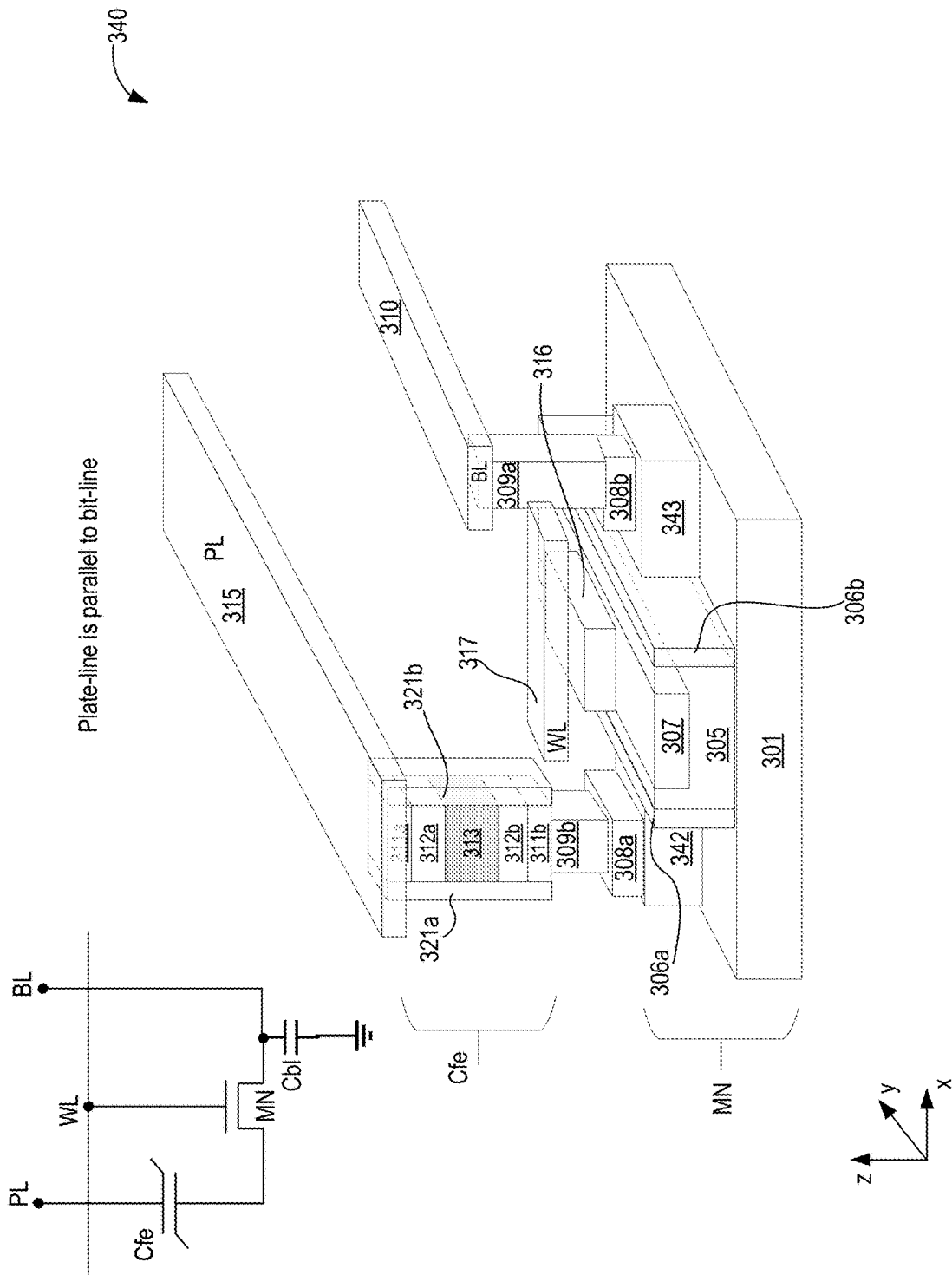
FIG. 3D illustrates a 3D view of a 1T1C FE bit-cell with the PL parallel to the BL, where the transistor is a non-planar transistor and where the capacitor is a planar capacitor, in accordance with some embodiments.

FIG. 3D illustrates a 3D view of a 1T1C FE bit-cell 340 with the plate-line parallel to the bit-line, where the transistor is a non-planar transistor and where the capacitor is a planar capacitor, in accordance with some embodiments. In this example, BL 310 is on a metal layer below the metal layer for PL metal layer 315. FinFET is an example of a non-planar transistor. FinFET comprises a fin that includes source 342 and drain 343 regions. A channel resides between the source and regions 342 and 343, respectively. The transistor MN can have multiple fins parallel to one another that are coupled to the same gate stack. The fins pass through the gate stack forming source and drain regions 342 and 343, respectively. Other examples of non-planar transistors include nano-wire transistors or nano-sheet transistors.

Figure 3E:
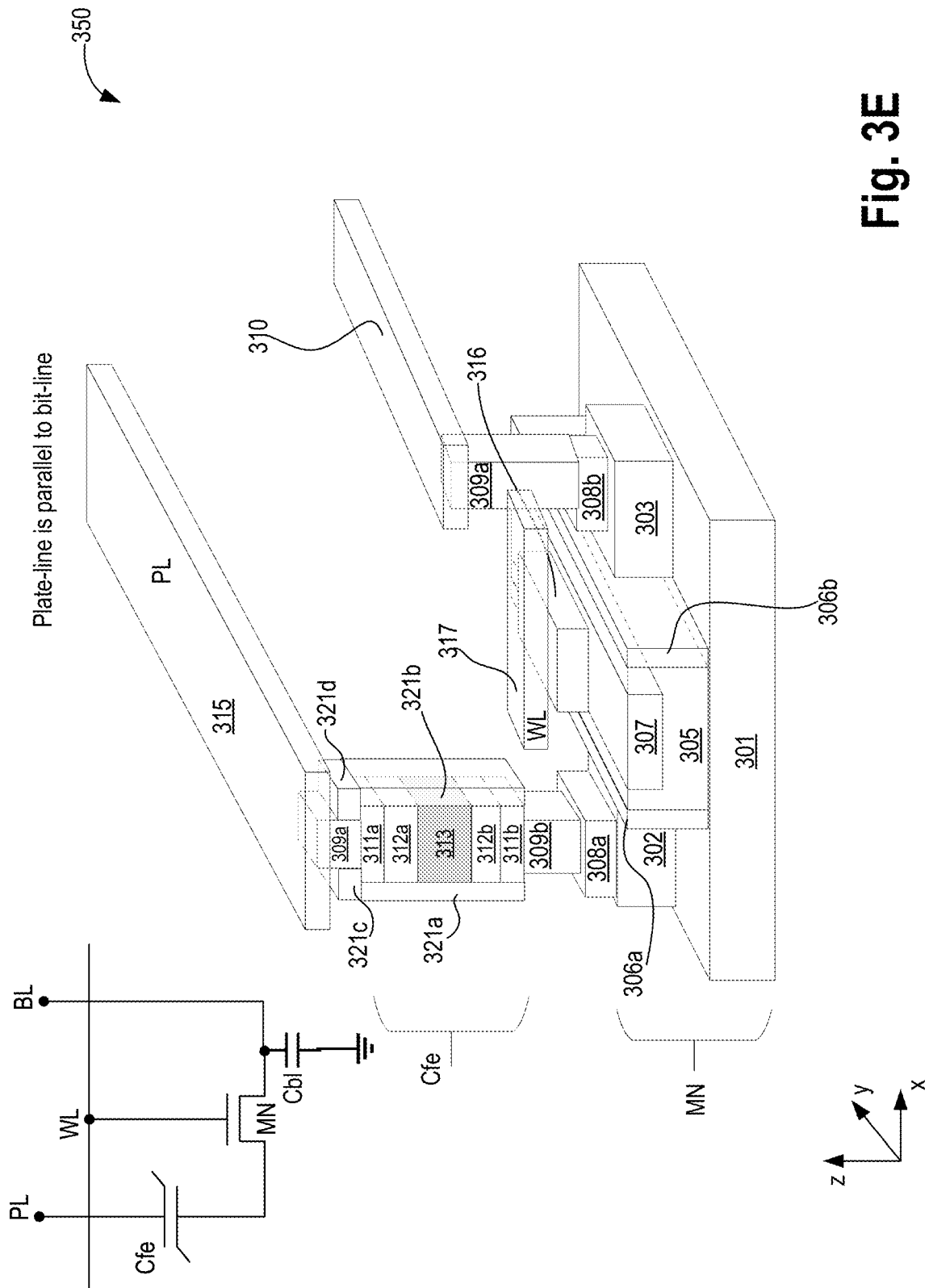
FIG. 3E illustrates a 3D view of a 1T1C FE bit-cell with the PL parallel to the BL, where the transistor is a non-planar transistor and where the capacitor is a planar capacitor with partially wrapped encapsulation, in accordance with some embodiments.

FIG. 3E illustrates a 3D view of a 1T1C FE bit-cell 350 with the plate-line parallel to the bit-line, where the transistor is a non-planar transistor and where the capacitor is a planar capacitor with partially wrapped encapsulation, in accordance with some embodiments. 1T1C FE bit-cell 350 is like 1T1C FE bit-cell 340 but with encapsulation portions 321c and 321d that are partially adjacent to sidewall barrier seal 321a and 321b, and refractive inter-metallic layers 311a. As discussed with reference to various embodiments, refractive inter-metallic layers 311a/b can be removed. In that case, encapsulation portions 321c and 321d are partially adjacent to sidewall barrier seal 321a and 321b and conductive oxide layer 312a.

Figure 3F:
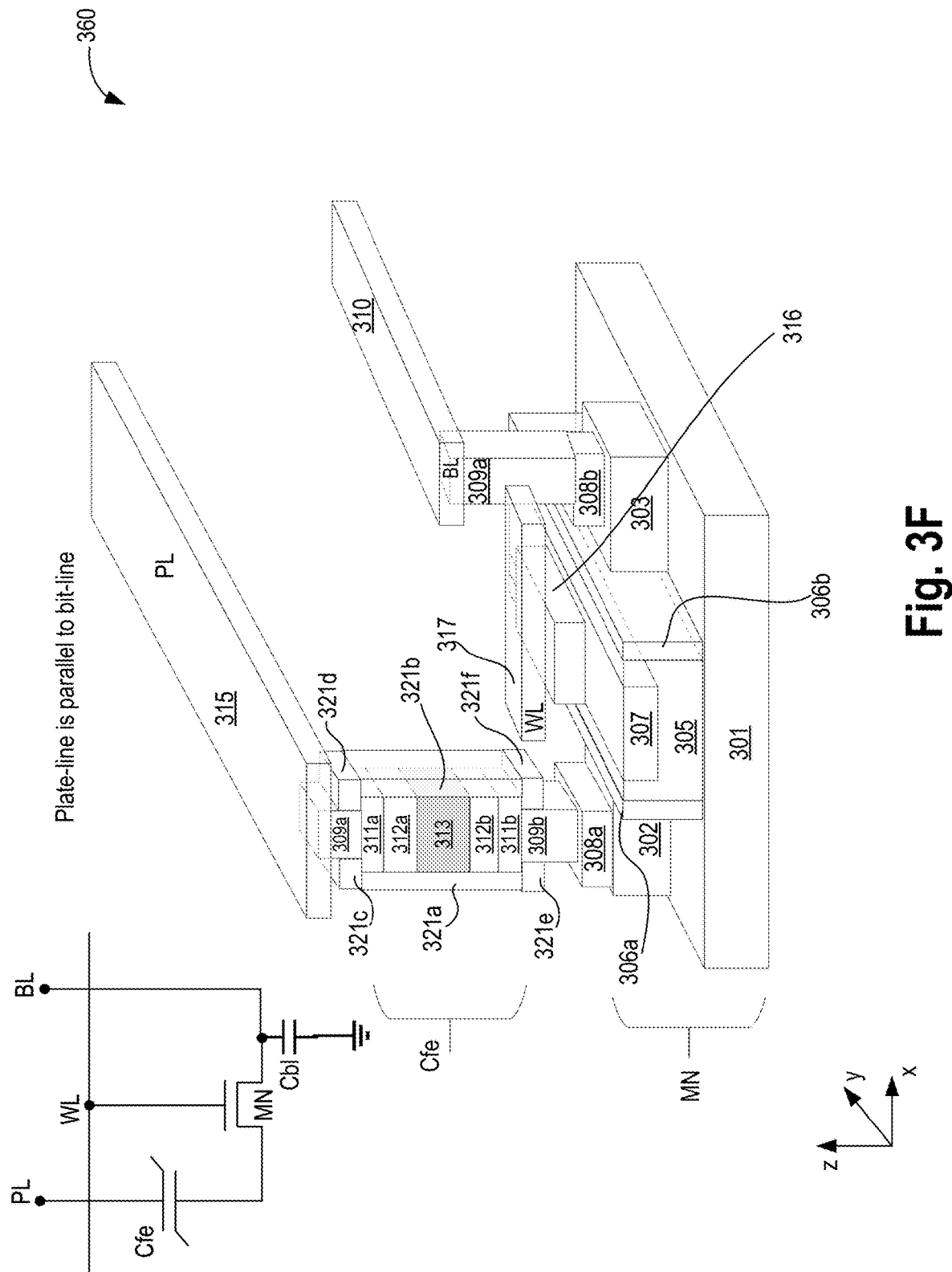
FIG. 3F illustrates a 3D view of a 1T1C FE bit-cell with the PL parallel to the BL, where the transistor is a non-planar transistor and where the capacitor is a planar capacitor with wrapped encapsulation, in accordance with some embodiments.

FIG. 3F illustrates a 3D view of a 1T1C FE bit-cell 360 with the plate-line parallel to the bit-line, where the transistor is a non-planar transistor and where the capacitor is a planar capacitor with wrapped encapsulation, in accordance with some embodiments. 1T1C FE bit-cell 360 is like 1T1C FE bit-cell 350, but with encapsulation portions 321e and 321f that are partially adjacent to sidewall barrier seal 321a and 321b, and refractive inter-metallic layers 311b. As discussed with reference to various embodiments, refractive inter-metallic layers 311a/b can be removed. In that case, encapsulation portions 321c and 321d are partially adjacent to sidewall barrier seal 321a and 321b and conductive oxide layers 312a and 312b.

In some embodiments, the memory bit-cells are laid out such that they share diffusion regions. In some embodiments, sharing the diffusion region may not be necessary. However, for denser and improved performance sharing diffusion may be preferred. In some embodiments, bit-cells along a given row or column receive their respective shared PL along the row or column, where the row or column-based sharing is dependent on PL being parallel to WL or PL being parallel to BL.

In some embodiments, when PL is parallel to WL, bit-cells having 1T1C configuration that share the same WL also share the same PL connection. In some embodiments, in the case where PL is parallel to WL, bit-cells that share the same WL connection, also share the same PL connections. Here, pitch refers to the x and y dimensions of the bit-cell. Because of the small pitch, many bit cells can be packed in an array fashion leading to a high-density memory array. While the capacitive structure of various embodiments is shown as a rectangular structure, it can have other shapes too. For example, the capacitive structure of various embodiments can have a cylindrical shape with dimensions like the one described with reference to the rectangular capacitive structure. In some embodiments, the capacitive structure is a planar capacitor. In some embodiments, the capacitive structure is a non-planar structure.

Figure 4A:
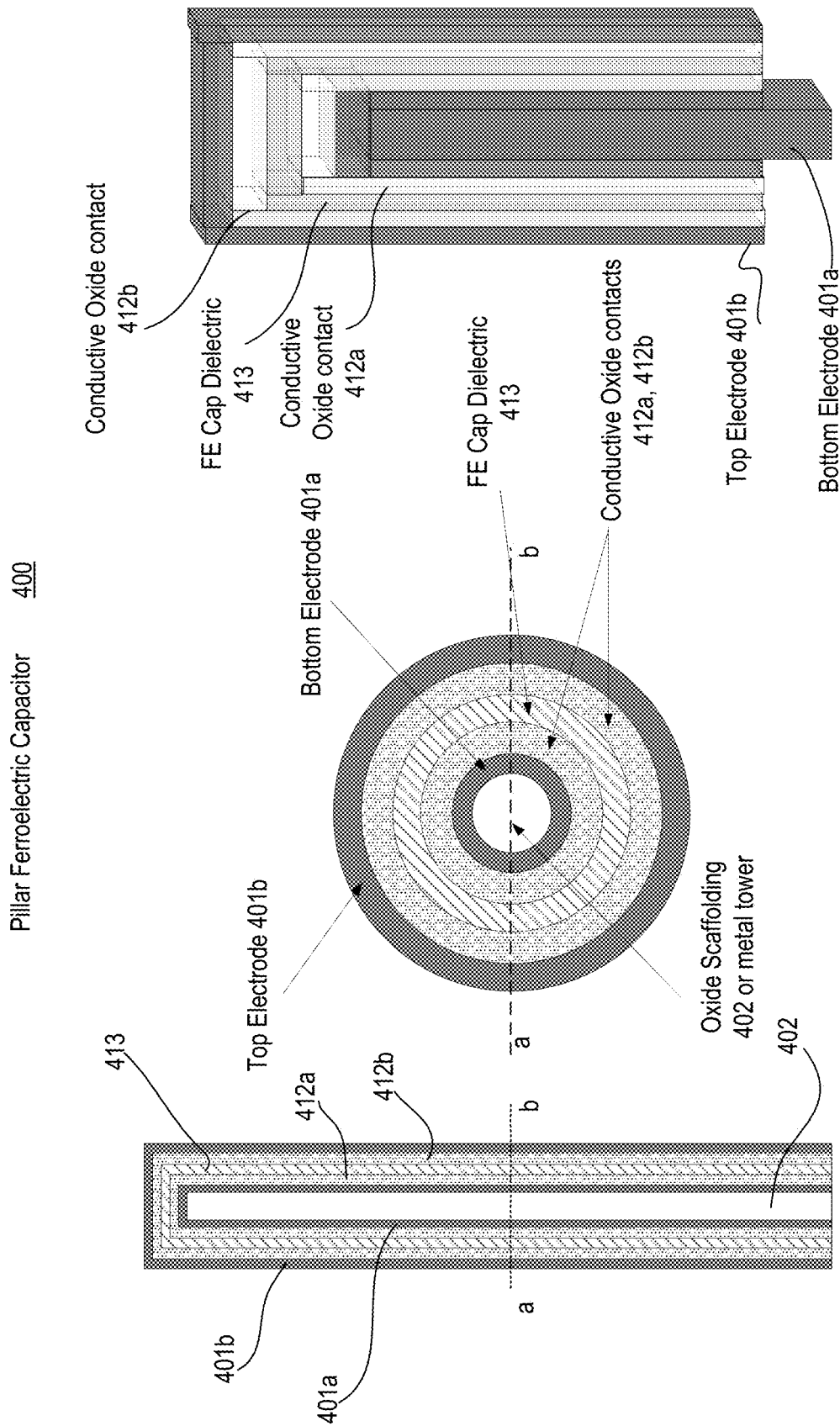
FIG. 4A illustrates a pillar FE capacitor including cross-sectional views and a 3D view, in accordance with some embodiments.

FIG. 4A illustrates pillar FE capacitor 400 including cross-sectional views and a 3D view, in accordance with some embodiments. In various embodiments, FE pillar capacitor 400 is cylindrical in shape. In some embodiments, FE pillar capacitor 400 is rectangular in shape. Taking the cylindrical shaped case for example, in some embodiments, the layers of FE pillar capacitor 400 from the center going outwards include oxide scaffolding 402, bottom electrode 401a, first conductive oxide 412a, FE material 413, second conductive oxide 412b, and top electrode 401b. A cross-sectional view along the "ab" dashed line is illustrated in the middle of FIG. 4A. In some embodiments, bottom electrode 401a is conformally deposited over oxide scaffolding 402 (e.g., SiO2 or any other suitable dielectric). In some embodiments, first conductive oxide 412a is conformally deposited over bottom electrode 401a. In some embodiments, FE material 413 is conformally deposited over first conductive oxide 412a. In some embodiments, second conductive oxide 412b is conformally deposited over FE material 413. In some embodiments, top electrode 401b is conformally deposited over second conductive oxide 412b. In some embodiments, the oxide scaffolding is etched, and metal is deposited into it which becomes part of bottom electrode 401a. In some embodiments, a top section of FE pillar capacitor 400 that forms an upside-down 'U' shape is chopped off (e.g., by etching). This allows bottom electrode 401a to be accessible from the top and bottom of FE pillar capacitor 400, where bottom electrode 401a is in the center, while top electrode 401b is on an outer circumference of FE pillar capacitor 400.

In some embodiments, wherein bottom electrode 401a (herein first layer) has a first circumference, wherein first conductive oxide 412a (herein second layer) has a second circumference, wherein FE material 413 (herein third layer) has a third circumference, wherein second conductive oxide 412b (herein fourth layer) has a fourth circumference, and wherein the top electrode 401b (herein fifth layer) has a fifth circumference. In some embodiments, the fourth circumference is larger than the third circumference, wherein the third circumference is larger than the second circumference, and wherein the second circumference is larger than the first circumference.

Figure 4B:
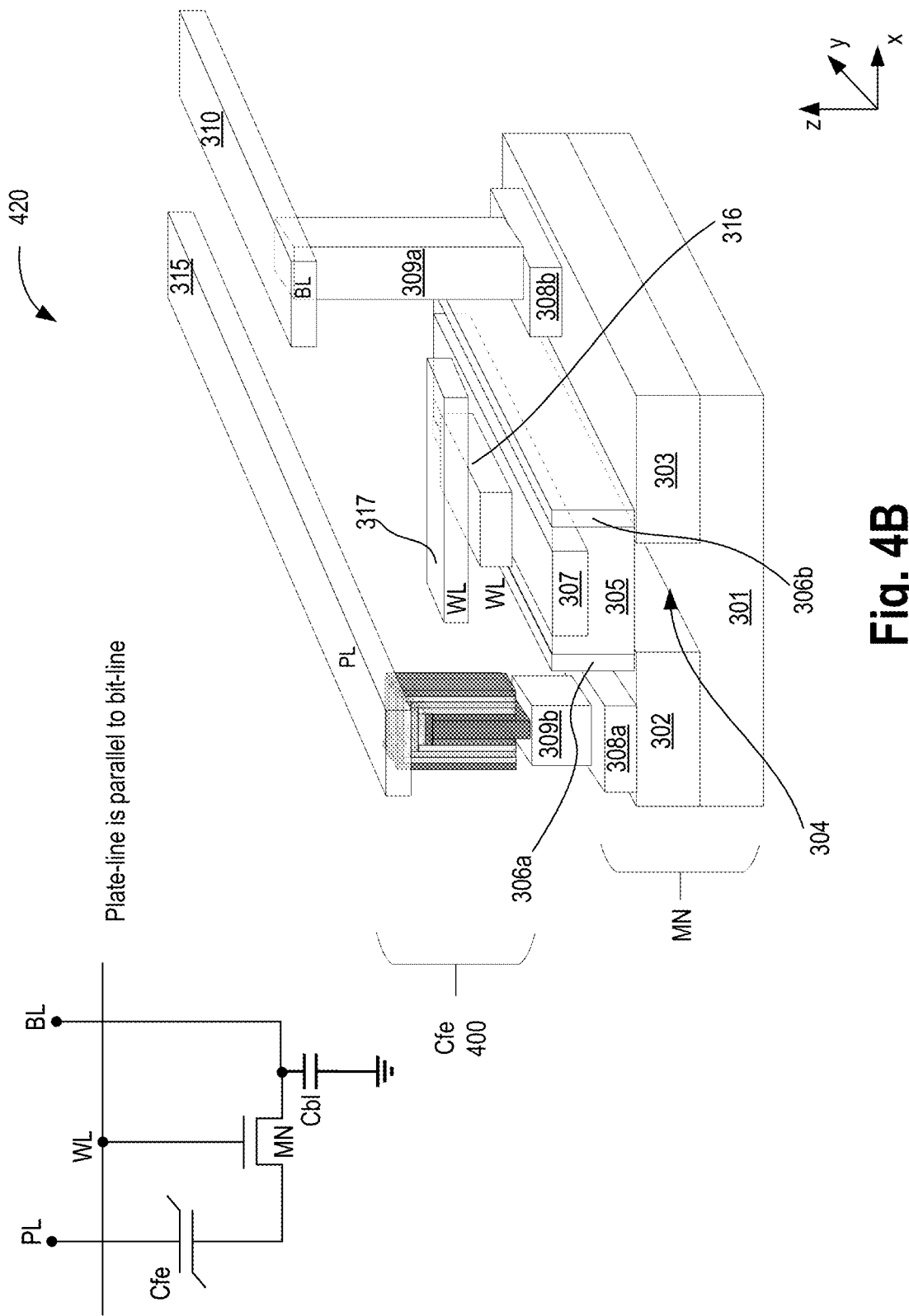
FIG. 4B illustrates a 3D view of a 1T1C FE bit-cell with the PL parallel to the BL, where the transistor is a planar transistor and where the capacitor is a non-planar capacitor, where the BL is at a higher metal level than the PL, in accordance with some embodiments.
Figure 4C:
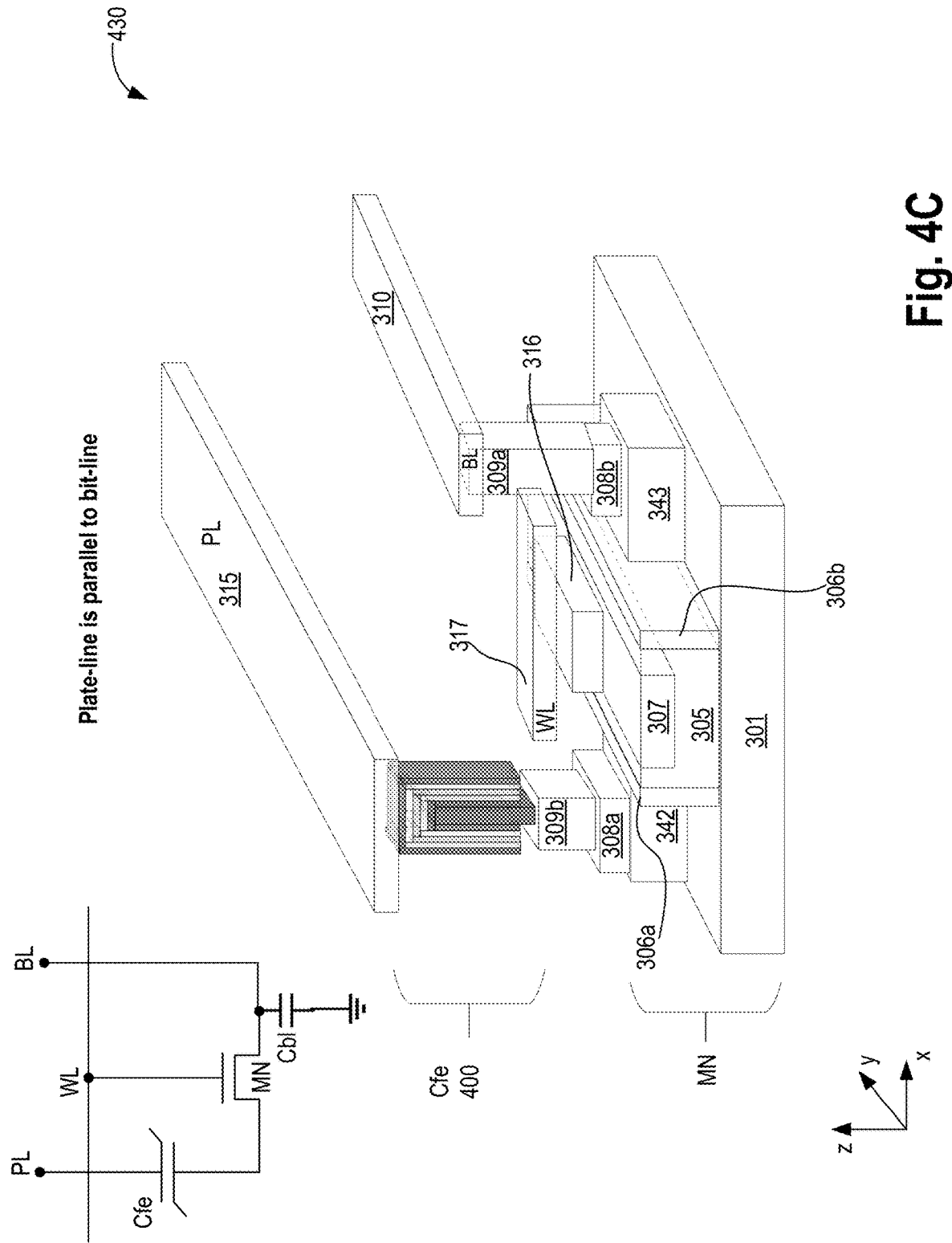
FIG. 4C illustrates a 3D view of a 1T1C FE bit-cell with the PL parallel to the BL, where the transistor is a non-planar transistor and where the capacitor is a non-planar capacitor, where the BL is at a lower metal level than the PL, in accordance with some embodiments.
Figure 4D:
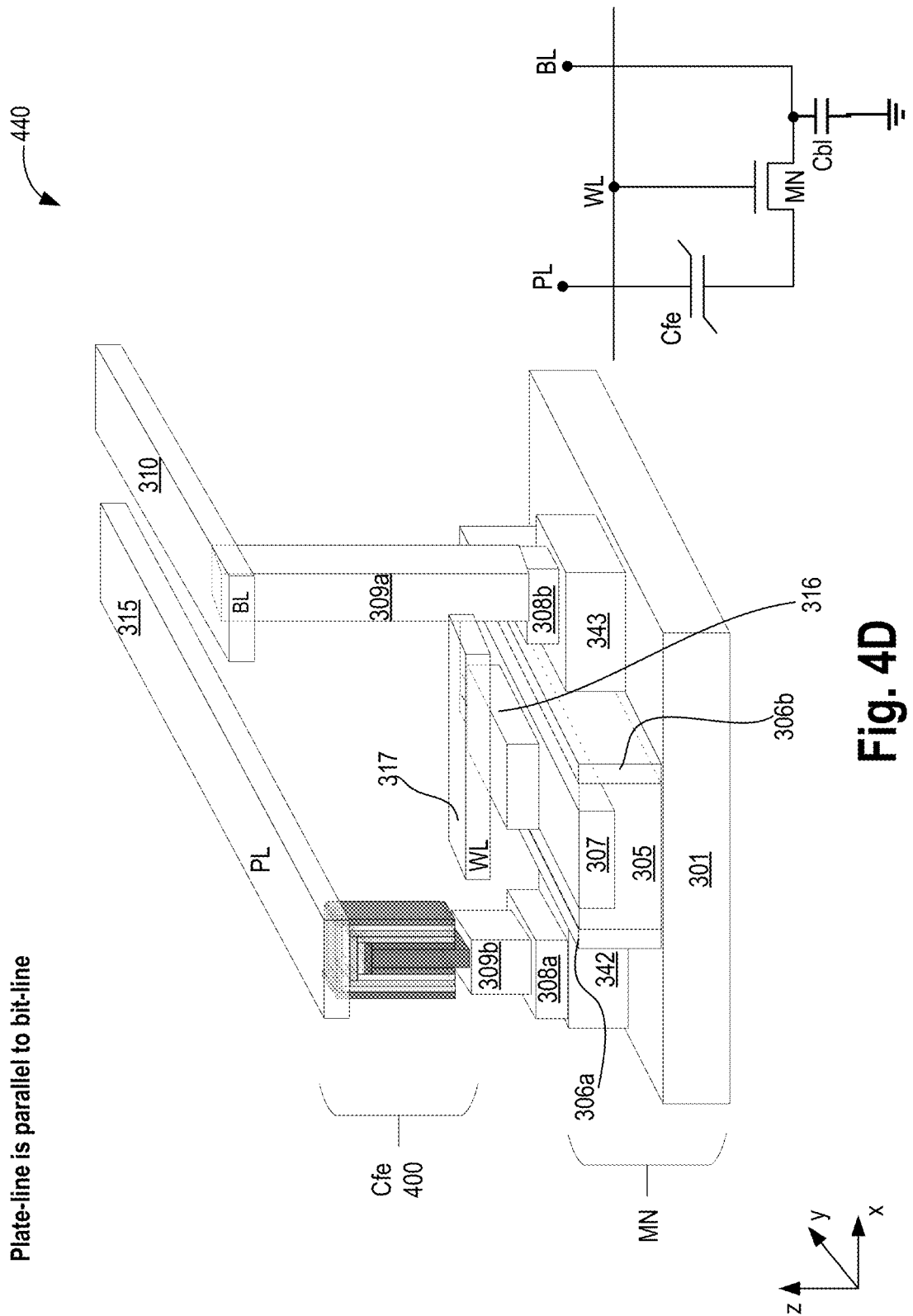
FIG. 4D illustrates a 3D view of a 1T1C FE bit-cell with the PL parallel to the BL, where the transistor is a non-planar transistor and where the capacitor is a non-planar capacitor, where the BL is at a higher metal level than the PL, in accordance with some embodiments.

In various embodiments, the choice of materials for FE pillar capacitor 400 are similar to the choice of material for the FE planar capacitor of FIG. 3A. For example, the materials for FE pillar capacitor 400 can be selected from the same group of materials listed for the FE planar capacitor FIG. 3A. For example, material for bottom electrode 401a corresponds to a bottom electrode or via 309b, material for conductive oxide 312b corresponds to first conductive oxide 412a, FE material 413 corresponds to FE material 313, material for second conductive oxide 312a corresponds to second conductive oxide 412b, and material for a top electrode or via 309a corresponds to top electrode 401b. In some embodiments, a first refractive inter-metallic layer (not shown) is formed between FE material 413 and first conductive oxide 412a. In some embodiments, a second refractive inter-metallic layer (not shown) is formed between FE material 413 and second conductive oxide 412b. In these cases, the first and second refractive inter-metallic layers are directly adjacent to their respective conductive oxide layers and to FE material 413. Refractive inter-metallic maintains the FE properties of the FE material 413. In the absence of refractive inter-metallic, ferroelectric material 413 (or the paraelectric material) of pillar capacitor 400 may lose its potency. In some embodiments, refractive inter-metallic comprises Ti and Al (e.g., TiAl compound). In some embodiments, refractive inter-metallic comprises one or more of Ta, W, and/or Co. Material discussed with reference to layers 311a and 311b can be used for the first and second refractive inter-metallic layers. The thicknesses of the layers of FE pillar capacitor 400 are of the same range as similar layers discussed in FIG. 3A for a planar FE capacitor. FIGS. 4B-D illustrates various 3D view of memory bit-cells with planar or non-planar transistors, and with non-planar (or pillar) capacitor. Note, the various components, structures, or layers of this 1T1C FE bit-cell are described with reference to FIGS. 3A-G.

FIG. 4B illustrates a 3D view of a 1T1C FE bit-cell 420 with the plate-line parallel to the bit-line, where the transistor is a planar transistor MN and where the capacitor is a non-planar capacitor 400, where the bit-line is at a higher metal level than the plate-line, in accordance with some embodiments.

FIG. 4C illustrates a 3D view of a 1T1C FE bit-cell 430 with the plate-line parallel to the bit-line, where the transistor is a non-planar transistor MN and where the capacitor is a non-planar capacitor 400, where the bit-line is at a lower metal level than the plate-line, in accordance with some embodiments.

FIG. 4D illustrates a 3D view of a 1T1C FE bit-cell 440 with the plate-line parallel to the bit-line, where the transistor is a non-planar transistor MN and where the capacitor is a non-planar capacitor 400, where the bit-line is at a higher metal level than the plate-line, in accordance with some embodiments.

Figure 5A:
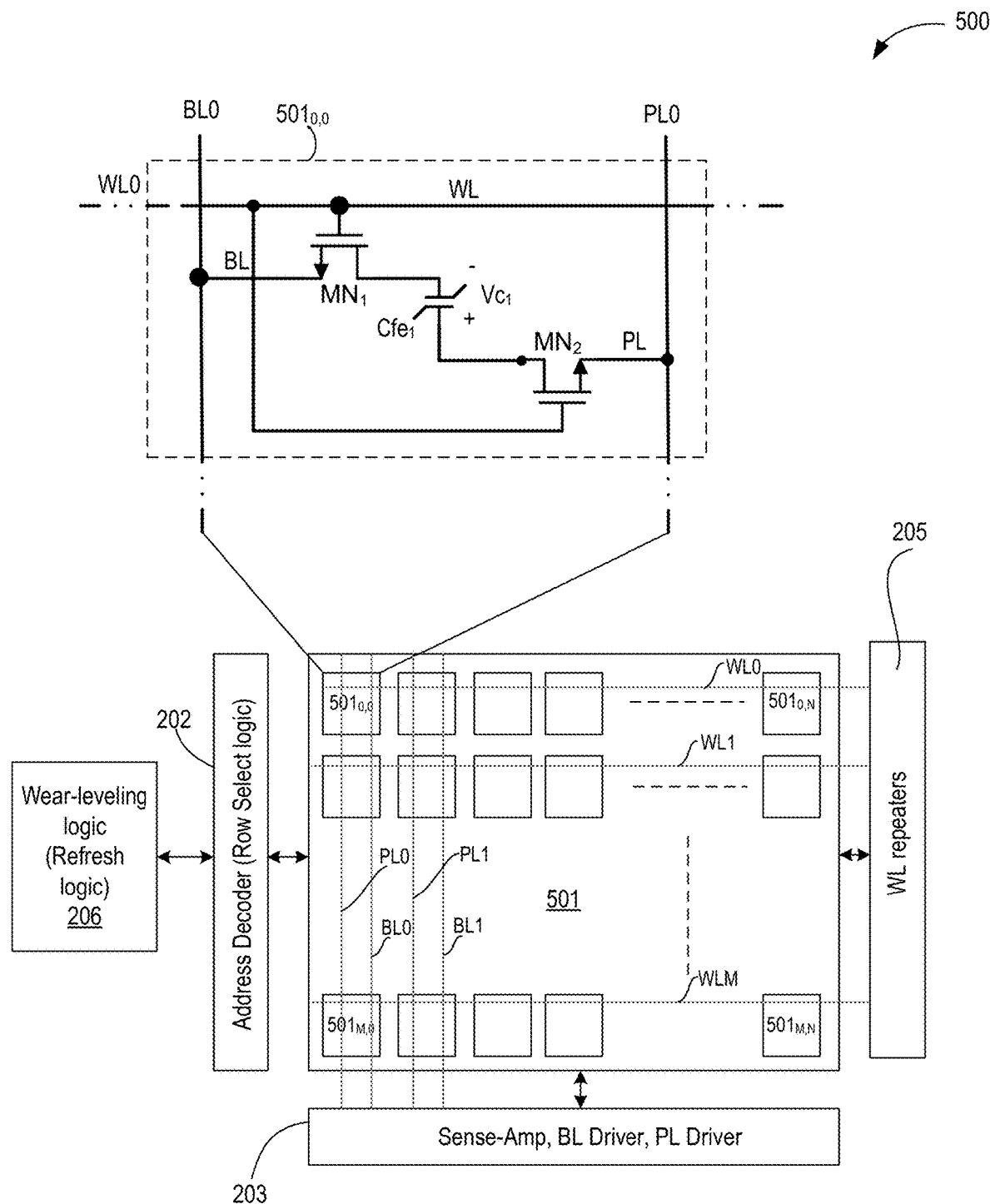
FIG. 5A illustrates an apparatus comprising memory and corresponding logic, wherein the memory comprises FE memory bit-cells, where an individual memory bit-cell includes two transistors and one capacitor (2T1C) with a PL parallel to a BL, in accordance with some embodiments.

FIG. 5A illustrates apparatus 500 comprising memory and corresponding logic, wherein the memory comprises FE memory bit-cells, where an individual memory bit-cell includes two transistors and one capacitor (2T1C) with a plate-line parallel to a bit-line, in accordance with some embodiments. Apparatus 500 is like apparatus 200 of FIG. 2A but for a different kind of memory bit-cell. In some embodiments, each memory bit-cell in memory array 501 is organized in rows and columns like in apparatus 200. For example, memory bit-cells $501_{0,0}$ through $501_{M,N}$ are organized in an array. In some embodiments, a memory bit-cell (e.g., $501_{0,0}$) comprises two transistors $MN_1$ and $MN_2$, and one capacitor Cfe1 comprising non-linear polar material. Capacitor Cfe1 can be a planar or non-planar capacitor as described with reference to various embodiments.

The gate terminals of n-type transistors $MN_1$ and $MN_2$ are controllable by WL (e.g., WL0). In some embodiments, BL (e.g., BL0) is coupled to a source or drain terminal of transistor $MN_1$. In some embodiments, PL (e.g., PL0) is coupled to the source or drain terminal of $MN_2$. While the various embodiments are illustrated with reference to n-type transistors, the embodiments are also applicable to p-type transistors or a combination of n-type or p-type transistors. A person skilled in the art would appreciate that when transistors of different conductivity type are used, than what is shown in FIG. 5A, then driving logic for BL, PL, and/or WL may also change for proper read and/or write operations. In various embodiments, PL is parallel to BL. In some embodiments, transistors $MN_1$ and $MN_2$ are fabricated in different layers of a die. For example, transistor $MN_1$ is fabricated on the frontend of the die while transistor $MN_2$ is fabricated in the backend of the die. On one such embodiment, the capacitor Cfe is fabricated between the frontend and the backend of the die. As such, a taller bit-cell is formed with the same x-y footprint as the footprint of a 1T1C memory bit-cell. In some embodiments, wear-leveling logic 206 provides one or more endurance mechanisms for the 2T1C memory bit-cells.

In some embodiments, in 2T1C bit-cell $501_{0,0}$, there is a select transistor on either side of the storage element, which is capacitor Cfe1. These two select transistors are $MN_1$ and $MN_2$ which are controllable by WL. To apply a signal for read or write operations along any BL or PL of memory array 501, the select transistors for the desired bit-cell is turned on. The select transistors see the applied field in proportion to the difference of voltage applied on BL, and PLs. The unselected bit-cell may not see the disturb field due to transistor $MN_2$. Transistor $MN_2$ masks the signal visibility from BL, and also from the PL, in accordance with various embodiments. In some embodiments, transistor $MN_1$ makes the visibility from the BL side for unselected bit-cells. This helps mitigate the disturb effects seen otherwise with the 1T1C configuration, where the PL voltage applied on an unselected bit-line in conjunction with the parasitic capacitance at the storage or internal node creates a disturb field effect. This disturb field effect stresses the long term retention characteristics of the programmed polarized state of the FE capacitor Cfe 1.

Figure 5B:
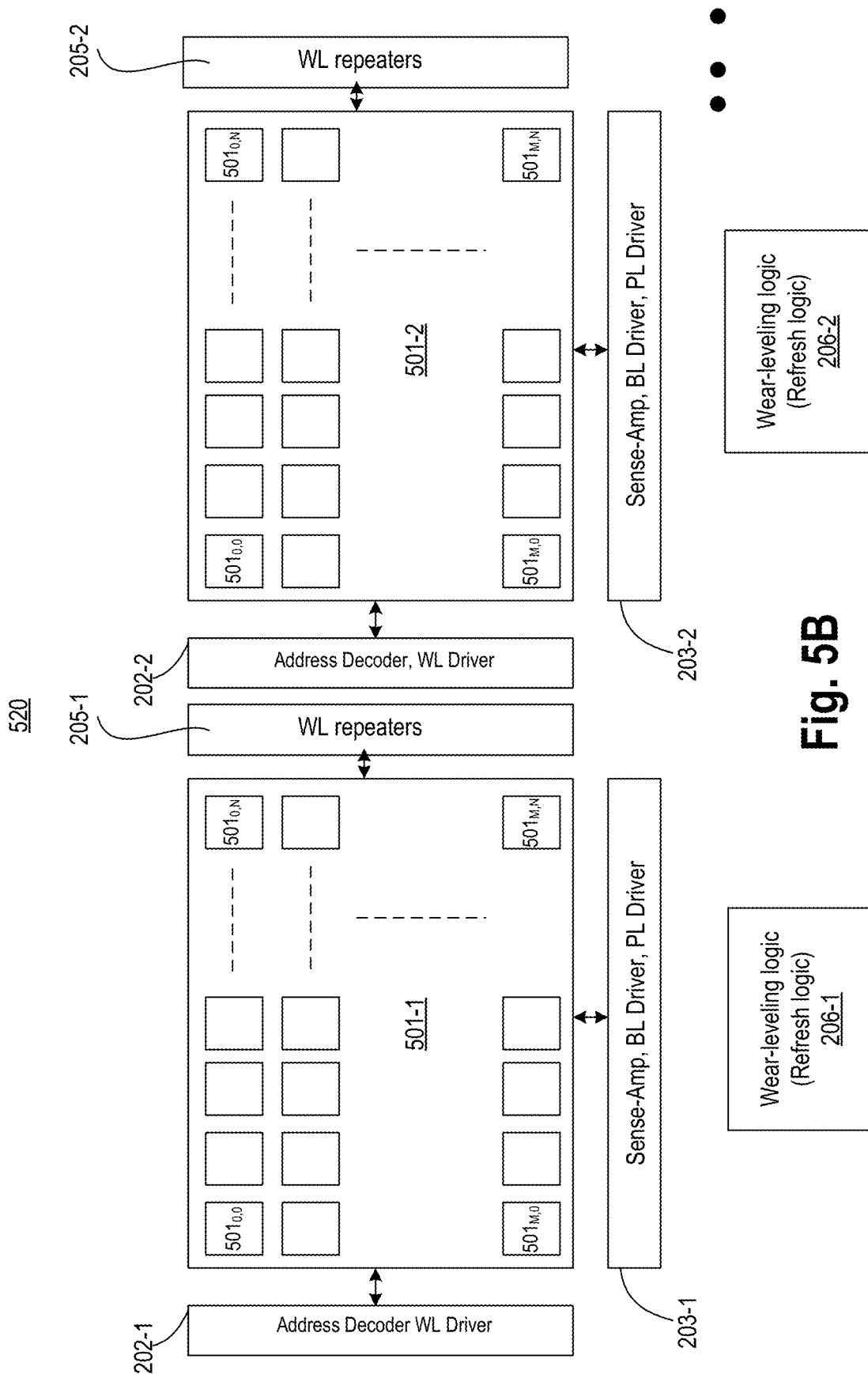
FIG. 5B illustrates an FE memory with word-line repeaters, wherein memory arrays of the FE memory have 2T1C bit-cells with the PL parallel to the BL, in accordance with some embodiments.

FIG. 5B illustrates apparatus 520 with FE memory with word-line repeaters, wherein memory arrays of the FE memory have 2T1C bit-cells with the plate-line parallel to the bit-line, in accordance with some embodiments. Apparatus 520 is like apparatus 240, but with memory arrays 501-1 and 501-2. Timing diagrams for read and write operations for 2T1C bit-cell is the same as timing diagrams for read and write operations for 1T1C bit-cell, respectively.

Figure 6A:
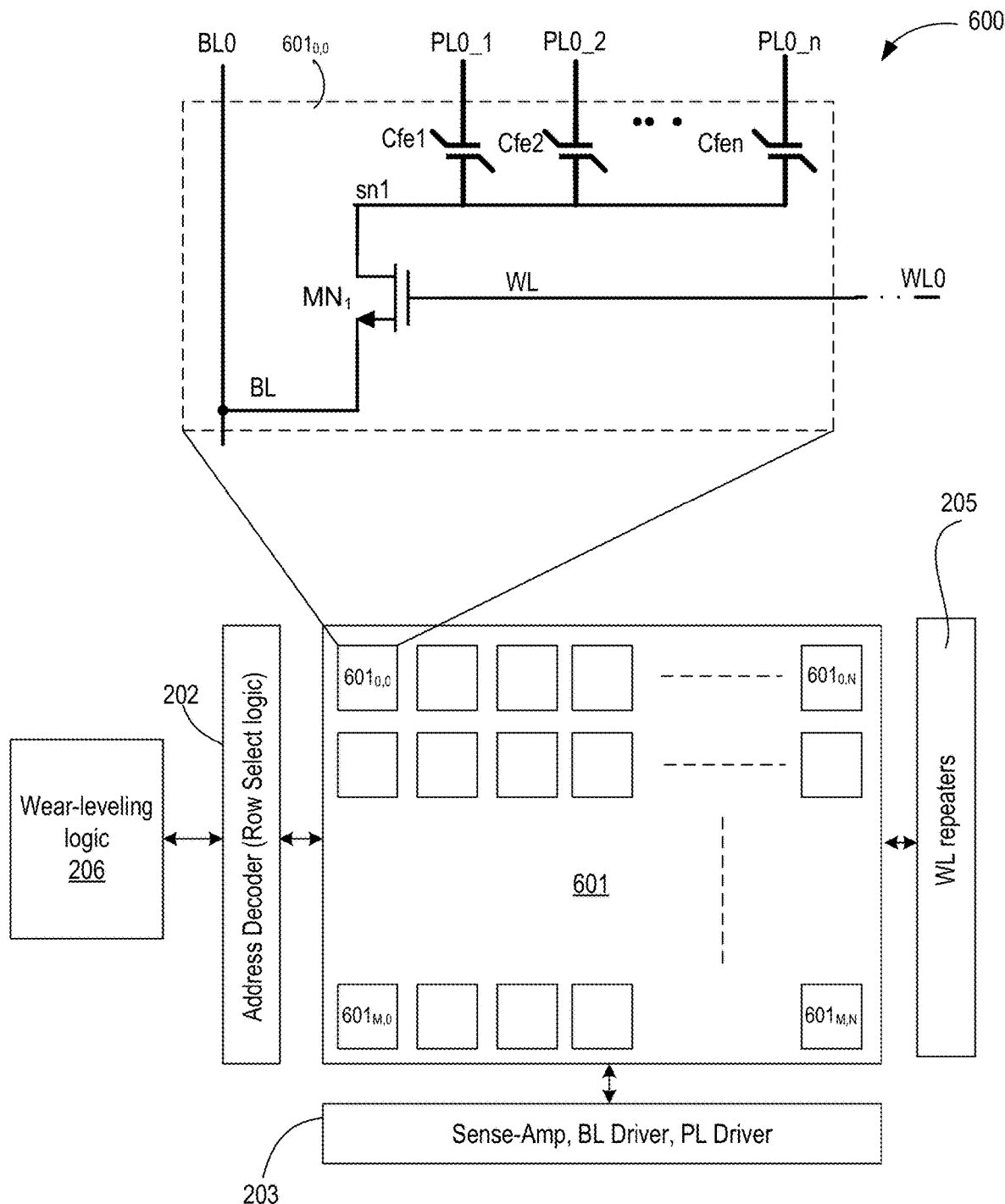
FIG. 6A illustrates an apparatus comprising memory and corresponding logic, wherein the memory comprises FE memory bit-cells, where an individual memory bit-cell includes one transistor and multiple capacitors (1TnC) with PLs parallel to a BL, where the corresponding logic is to apply word-line boosting, in accordance with some embodiments.

FIG. 6A illustrates apparatus 600 comprising memory and corresponding logic, wherein the memory comprises FE memory bit-cells, where an individual memory bit-cell includes one transistor and multiple capacitors (1TnC) with PLs parallel to a BL, where the corresponding logic is to apply word-line boosting, in accordance with some embodiments. Apparatus 600 is like apparatus 200 of FIG. 2A but for a different kind of memory bit-cell. In some embodiments, each memory bit-cell in memory array 601 is organized in rows and columns like in apparatus 200. For example, memory bit-cells $601_{0,0}$ through $601_{M,N}$ are organized in an array. In some embodiments, a memory bit-cell—(e.g., $601_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, through Cfen are stacked capacitors.

The gate terminal of transistors $MN_1$ is controllable by WL. In some embodiments, BL is coupled to a source or drain terminal of transistor $MN_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_$n$. In some embodiments, the plurality of capacitors is coupled to storage node sn1, which is coupled to a drain or source terminal of transistor $MN_1$. For example, a first terminal of capacitor Cfe1 is coupled to PL0_1 and a second terminal of capacitor Cfe1 is coupled to storage node sn1. Apparatus 200 illustrates one PL per column. Apparatus 800 will have n-number of PLs (e.g., PL0_1 through PL0_$n$) per column which are parallel to a BL for that column, in accordance with some embodiments.

While the various embodiments are illustrated with reference to an n-type transistor, the embodiments are also applicable to a p-type transistor or a combination of n-type or p-type transistors. A person skilled in the art would appreciate that when a transistor of a different conductivity type is used, than what is shown in FIG. 6A, then driving logic for BL, PLs, and/or WL may also change for proper read and/or write operations. In various embodiments, PLs are parallel to BL. For example, PL0_1, PL0_2, PL0_$n$ are parallel to BL. In some embodiments, transistor $MN_1$ is fabricated on the frontend of the die and capacitors are stacked over the transistor. For example, the capacitors are stacked along the z-direction. The capacitors can be planar or non-planar capacitors. As such, a taller bit-cell is formed with the same x-y footprint as the footprint of a 1T1C memory bit-cell. In some embodiments, the x-y footprint is determined by the size of transistor $MN_1$ and its connections to BL, WL, and storage node sn1.

In some embodiments, PL (e.g., PL0_1, PL0_2, . . . PL0_$n$) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In standby mode (e.g., low power mode), the 1TnC bit-cell is not refreshed as there is no disturb mechanism during standby. In some embodiments, wear-leveling logic 206 provides one or more endurance mechanisms for the 1TnC memory bit-cells. One of the endurance mechanisms involves refreshing of the data content in the capacitor(s).

In the 1TnC bit-cell case (e.g., bit-cell $601_{0,0}$) with PL parallel to BL, the activities seen on an unselected or un-intended bit-cell while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected cells, can create a field across the non-linear polar material based capacitors or devices of the unselected cells. The field across the unselected non-linear polar material based capacitors or devices is a function of the dielectric component of individual non-linear polar material based capacitors or devices and the total capacitance on the storage node sn1 of those bit-cells. Since in the 1TnC bit-cells the storage capacitor have much larger capacitance load, the activity seen on the unselected bit-line can result into almost all voltage getting dropped across the ferroelectric capacitors (e.g., Vfe=Vpl*(Cp/(Cfed+Cp), which creates a disturb effect, which in turn causes unintentional modification of the polarization stage of the ferroelectric capacitor.

Figure 6B:
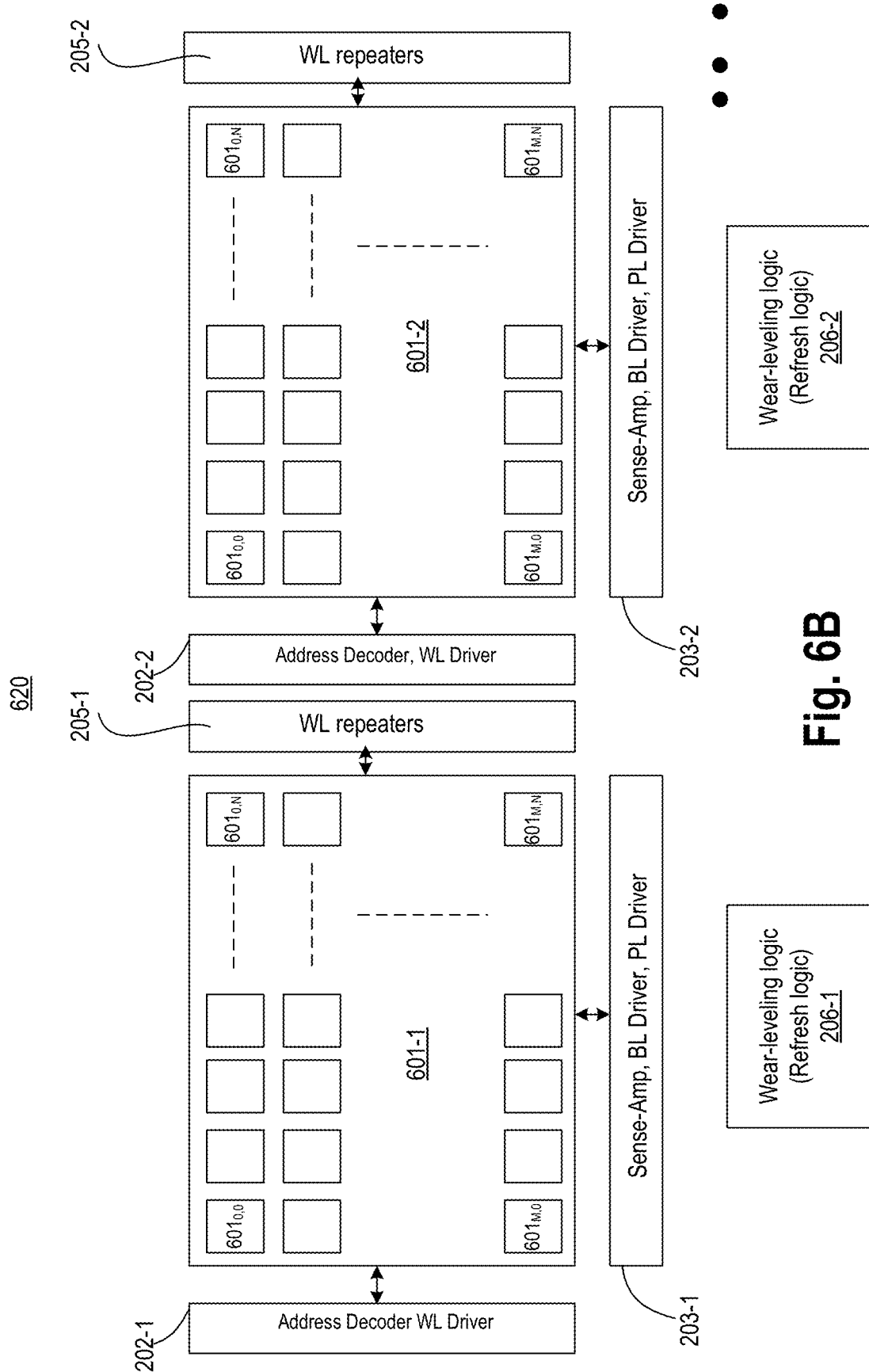
FIG. 6B illustrates an FE memory with word-line repeaters, wherein memory arrays of the FE memory have 1TnC bit-cells with the PL parallel to the BL, in accordance with some embodiments.

FIG. 6B illustrates apparatus 620 having FE memory with word-line repeaters, wherein memory arrays of the FE memory have 1TnC bit-cells with the PL parallel to the BL, in accordance with some embodiments. Apparatus 620 is like apparatus 240, but with memory arrays 601-1 and 601-2. Each memory array includes the memory bit-cells of FIG. 6A.

Figure 6C:
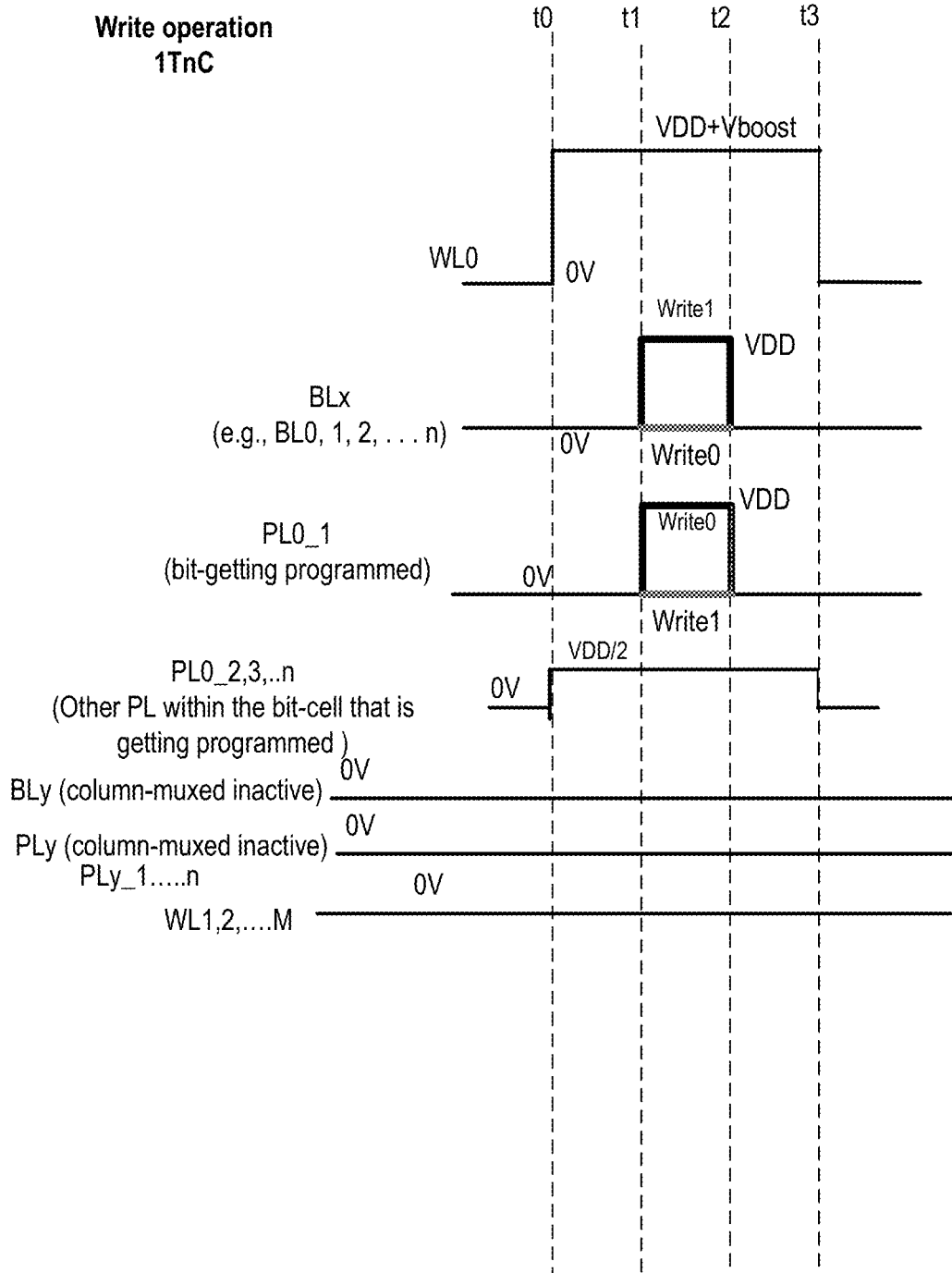
FIG. 6C illustrates a timing diagram for write operation for 1TnC FE memory bit-cells with plate-lines parallel to the bit-line, where the write operation involves word-line boosting, in accordance with some embodiments.

FIG. 6C illustrates timing diagram 630 for write operation for 1TnC FE memory bit-cells with plate-lines parallel to the bit-line, where the write operation involves word-line boosting, in accordance with some embodiments. In this case, PLs are parallel to the BL. Depending on whether logic 1 (Write 1) or logic 0 (Write 0) is being written to the selected capacitor with non-linear polar material, BL or PL associated with that capacitor of the bit-cell is asserted from 0V to Vdd (power supply level). Other column multiplexed BLs (e.g., BLy) and PLs (e.g., PLy) that are inactive are forced to 0V, in accordance with some embodiments.

In various embodiments, write operation begins when WL is asserted and boosted above Vdd. The boost level is Vboost which may be 10-50% of Vdd. In one example, Vboost is about equal to a threshold voltage of transistor $MN_1$ of the 1TnC bit-cell. WL boosting ensures that the full voltage swing is seen by the ferroelectric capacitors of the 1TnC bit-cell, negating the threshold (Vth) drop on the n-type transistor $MN_1$. WL boosting enables an overall lower voltage operation on the BL and PL drivers. This may use higher signal conditioning on the WL.

Since the select transistor $MN_1$ in these configurations is an n-channel device, it is good at passing the 0V and signals closer to 0V. The signal applied through the BL however, when it is at Vdd, may not pass through the transistor $MN_1$ in full. As such, there is a Vt drop across the transistor $MN_1$ if the WL is driven to Vdd. To help get the full range of signaling (e.g., 0 to Vdd) across the FE capacitor Cfe1, WL-boosting helps negate the Vt drop across the transistor such that BL when driven to Vdd, internal node will also see Vdd, as opposed to Vdd-Vt.

In this example, the asserted WL0 is boosted for write operation (e.g., to Vdd+Vboost), and then the selected BLx (e.g., BL0) and the selected PL (e.g., PL0_1) are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL1_0 is set to logic 0 to allow storage of logic 1 value in capacitor Cfe1. In some embodiments, to write a logic 0, BLx is kept at 0V when WL0 is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1.

Other PLs (e.g., PL0_2 through n) within the same selected bit-cell (e.g., $601_{0,0}$) which are not programming their respective capacitors are charged to Vdd/2. Like BLy, PL (e.g., PLy) for column multiplexed bit-cells remains at 0V while PL0_1 is being used to program Cfe1. Word-lines of unselected bit-cells is set to 0V (e.g., WL1, 2, through m are set to 0V when WL0 is selected).

When a particular bit-cell $601_{0,0}$ is being written to, the WL for unselected bit-cells (e.g., WL1 through WLm) remains at 0. Same is done for unselected BLs and PLs (e.g., BLy and PLy) by column multiplexers. In various embodiments, the BL or PLs are asserted and de-asserted within a pulse width of the boosted WL. In some embodiments, the voltage swing for the selected BL and PLs is 0 to Vdd. In some embodiments, the BL or PL pulse is generated after a predetermined or programmable time from when WL boost starts, and the BL or PL pulse ends within the WL pulse.

Figure 6D:
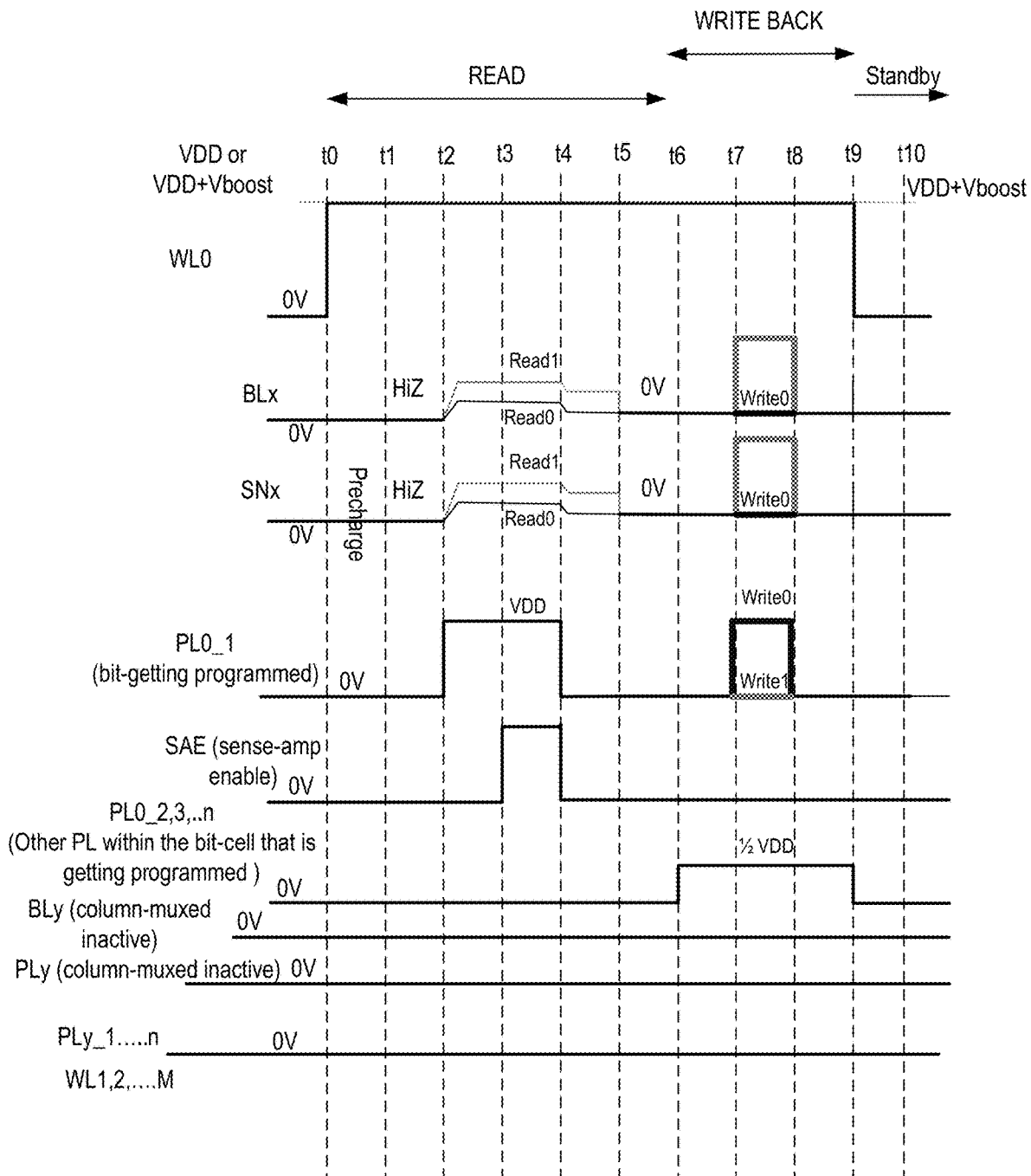
FIG. 6D illustrates a timing diagram for read operation for 1TnC FE memory bit-cells with plate-lines parallel to the bit-line, where the read operation involves word-line boosting, in accordance with some embodiments.

FIG. 6D illustrates timing diagram 640 for read operation for 1TnC FE memory bit-cells with plate-lines parallel to the bit-line, where the read operation involves word-line boosting, in accordance with some embodiments. In some embodiments, read operation begins by asserting the selected WL (e.g., WL0). In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window.

In some embodiments, BLx is set to 0V, and depending on whether a logic 1 or a logic 0 is written during writeback to the selected capacitor Cfe1 (via PL0_1), the selected bit-line is toggled. In this example, during writeback and during the pulse width of the boosted WL0, PL0_1 and BLx is set to Vdd to write a 0 to the capacitor Cfe1. The writeback scheme here is the same as the writeback scheme of FIG. 6C. In this scheme, the voltage swing on the selected capacitor is +/−Vdd.

In some embodiments, a selected PL (e.g., PL0_1) is asserted for the capacitor of the bit-cell which is being read (e.g., capacitor Cfe1). In this example, PL0_1 is asserted for a time period long enough for the sense amplifier to sense the value stored on the storage node coupled to the capacitor. In various embodiments, sense amplifier enable signal (SAE) is asserted within the pulse width of the selected PL (e.g., PL0_1). In some embodiments, to read data from the storage node, BL is first set or forced to zero volts and then allowed to float (e.g., BLx driver goes into high impedance state Z (HiZ)). In some embodiments, BL is precharged to a certain voltage or a programmable voltage. So, when the WL0 is selected, in conjunction with the PL voltage, a field is created across the FE capacitor.

Thereafter, the BL driver is configured in a high impedance stage, the selected BL is floated, which allows the sense amplifier to sense the voltage on the storage node via the BL. In some embodiments, the sense amplifier is configured to sense the voltage on the BL by comparing it to one or more thresholds. In some embodiments, when BLx charges to a first voltage level, a logic 0 is read (Read0). In some embodiments, when BLx charges to a second voltage level (higher than the first voltage level), a logic 1 is read (Read1). In some embodiments, after the sense amplifier is disabled (SAE is set to 0), the voltage on the selected BL is forced to zero volts. In some embodiments, after the selected BL is forced to 0V, the write back process begins. In some embodiments, the writeback process may not be needed if the read operation is not a destructive read.

In some embodiments, in the write back process, BL is charged to Vdd or set to 0V depending upon whether a logic 1 or a logic 0 is written back to the selected bit-cell. In some embodiments, the value written back to the bit-cell is the same value that the sense amplifier detects when reading the voltage on the BL. In some embodiments, the write back mechanism is like the write operation described with reference to FIG. 6C. In various embodiments, the WL for the unselected bit-cells is set to 0V (e.g., WL0, . . . WLm is set to 0 when WL1 is selected). In various embodiments, the BL and the PLs (e.g., PL0_2 through PL0_n) for the unselected bit-cells is also set to 0V. In some embodiments, wear-leveling logic 206 is used for memory endurance of memory array 1001.

Figure 7A:
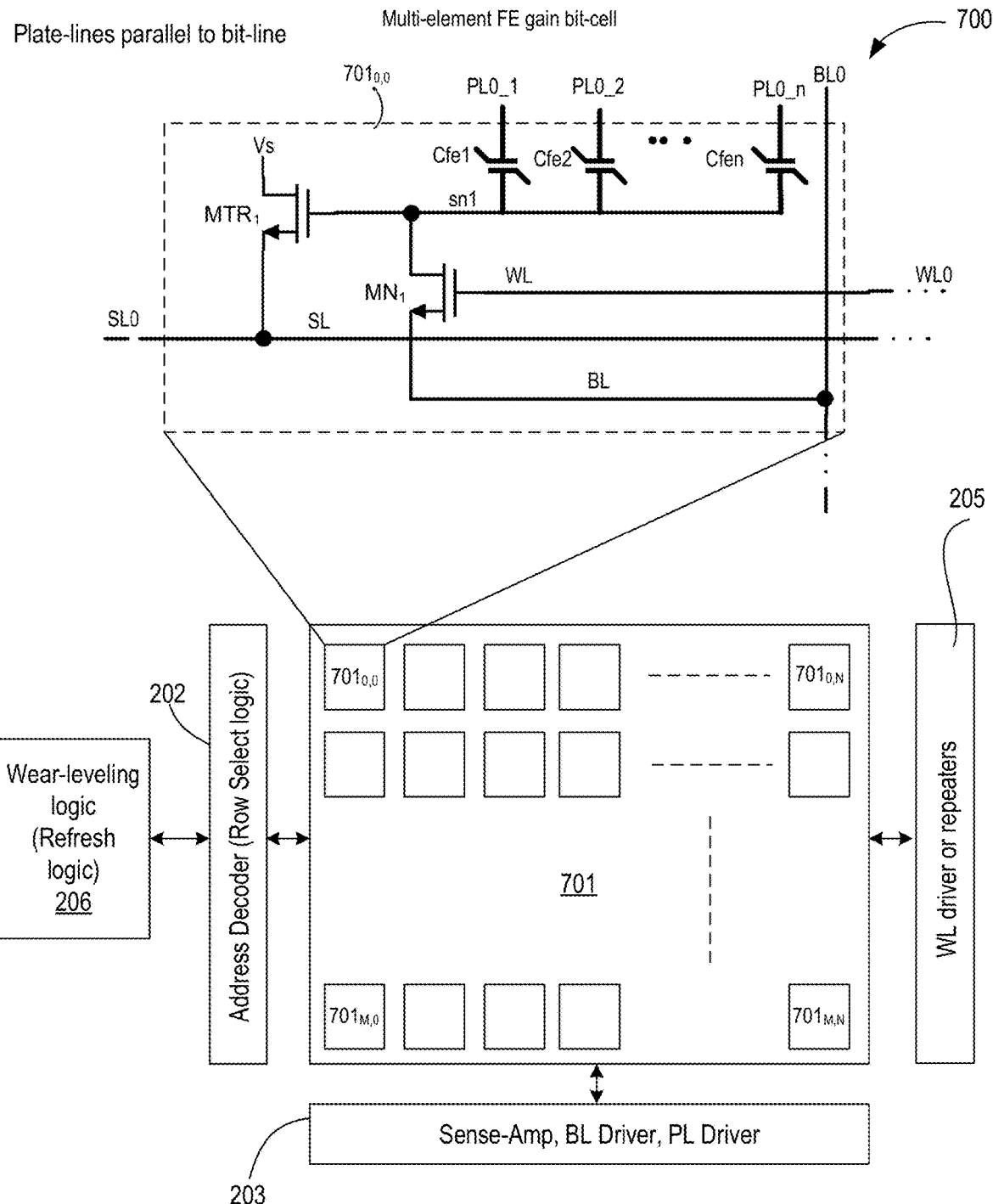
FIG. 7A illustrates an apparatus comprising memory and corresponding logic, wherein the memory comprises FE memory bit-cells, where an individual memory bit-cell is multi-element FE gain bit-cell with PLs parallel to a BL, where the corresponding logic is to apply word-line boosting, in accordance with some embodiments.

FIG. 7A illustrates apparatus 700 comprising memory and corresponding logic, wherein the memory comprises FE memory bit-cells, where an individual memory bit-cell is multi-element FE gain bit-cell with PLs parallel to a BL, where the corresponding logic is to apply word-line boosting, in accordance with some embodiments. Apparatus 700 is like apparatus 200 of FIG. 2A but for a different kind of memory bit-cell. In some embodiments, each memory bit-cell (e.g., $701_{0,0}$) in memory array 701 is organized in rows and columns like in apparatus 700. For example, memory bit-cells $701_{0,0}$ through $701_{M,N}$ are organized in an array.

In some embodiments, a bit-cell (e.g., $701_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen is coupled to a corresponding plate-line (PL). For example, the second terminal of Cfe1 is coupled to PL0_1, the second terminal of Cfe2 is coupled to PL0_2, and so on. Apparatus 700 has n-number of PLs (e.g., PL0_1 through PL0_n) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked allowing for tall bit-cells (e.g., higher in the z-direction) but with x-y footprint two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, ... PL_n) controls which cell within the same access transistor gets programmed, and the value of programming. In some embodiments, BL acts as a sense-line. The voltage on BL (e.g., sense voltage) can create disturbance on other bit-lines during read operation. To mitigate such disturbances, in some embodiments, multi-element FE gain bit-cell (e.g., 701$_{0,0}$) is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell (e.g., 701$_{0,0}$) is not refreshed as there is no disturb mechanism during standby. In some embodiments, multi-element FE gain bit-cell (e.g., 701$_{0,0}$) relies on isolating the read mode from BL or SL capacitance by isolating through access transistor $MN_1$, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node. i.e., when a read pulse of some polarity is applied at PL of the capacitor to be read, a non-zero voltage is applied on other PLs of multi-element FE gain bit-cell (e.g., 701$_{0,0}$), that matches the expected disturbance seen on the shared node. In one such example, the PL driver is configured to support driving different voltage levels on different PLs. In some embodiments, wear-leveling logic 206 provides one or more endurance mechanisms for the multi-element FE gain bit-cells. One of the endurance mechanisms involves refreshing of the data content in the capacitor(s).

Figure 7B:
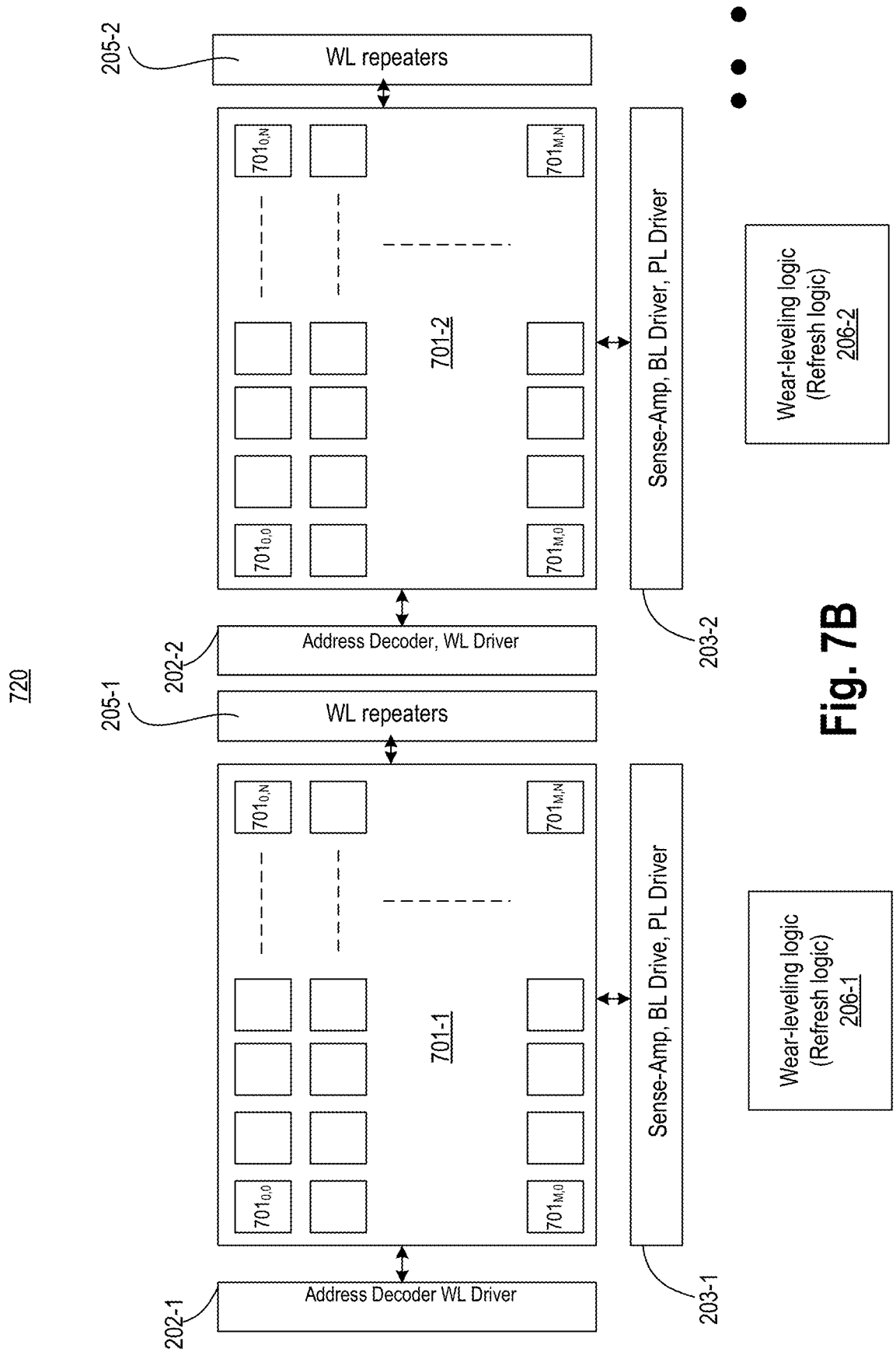
FIG. 7B illustrates an FE memory with word-line repeaters, wherein memory arrays of the FE memory have multi-element FE gain bit-cells with the PL parallel to the BL, in accordance with some embodiments.

FIG. 7B illustrates apparatus 720 having FE memory with word-line repeaters, wherein memory arrays of the FE memory have multi-element FE gain bit-cells with the PL parallel to the BL, in accordance with some embodiments. Apparatus 720 is like apparatus 240, but with memory arrays 701-1 and 701-2. Each memory array includes the memory bit-cells of FIG. 7A.

Figure 7C:
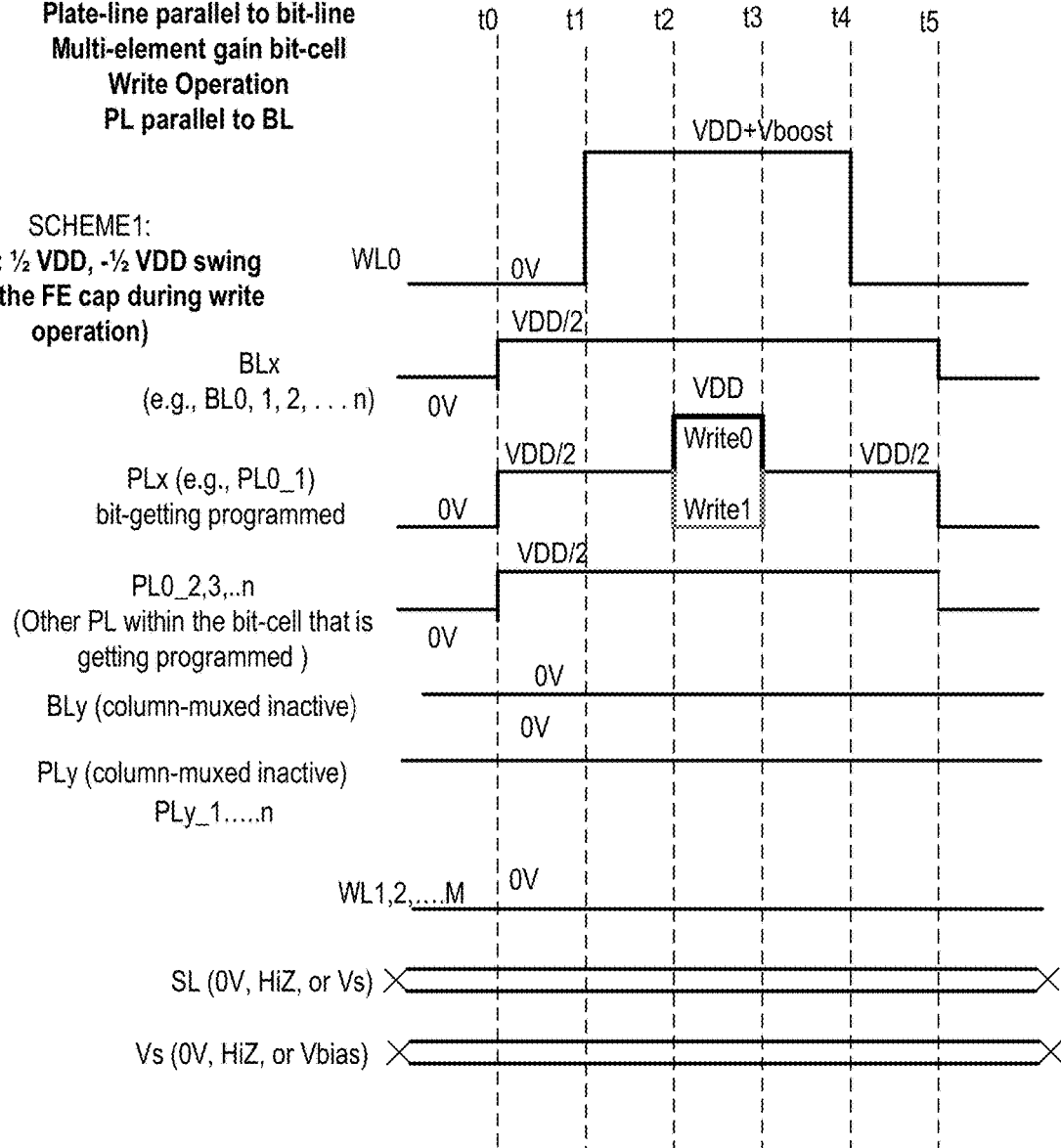
FIG. 7C illustrates a timing diagram for a first scheme for write operation for multi-element FE gain bit-cells with the PL parallel to the BL, in accordance with some embodiments.

FIG. 7C illustrates timing diagram 730 for a first scheme for write operation for multi-element FE gain bit-cells with the PL parallel to the BL, in accordance with some embodiments. In some embodiments, the voltage swing across the selected ferroelectric capacitor is Vdd during write operation (e.g., the swing is ½ Vdd to –½ Vdd). To write to a capacitor of a multi-element FE gain bit-cell (e.g., 701$_{0,0}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL0 to store a 0 or a 1 to that capacitor. In this example, PL0_1 is charged from 0V to Vdd/2 when BL is charged to Vdd/2. Then during the pulse width of the boosted WL0, PL0_1 is set to Vdd to write a 0 to capacitor Cfe1. In some embodiments, during the pulse width of the boosted WL0, PL0_1 is set to 0V to write a logic 1 to the capacitor Cfe1. Other PLs (e.g., PL0_2 through n) within the same selected bit-cell (e.g., 701$_{0,0}$) are charged to Vdd/2 like Blx. PL (e.g., PLy) for column multiplexed bit-cells remains at 0V while PL0_1 is being used to program Cfe1. Word-lines of unselected bit-cells is set to 0V (e.g., WL1, 2, through m are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 7D:
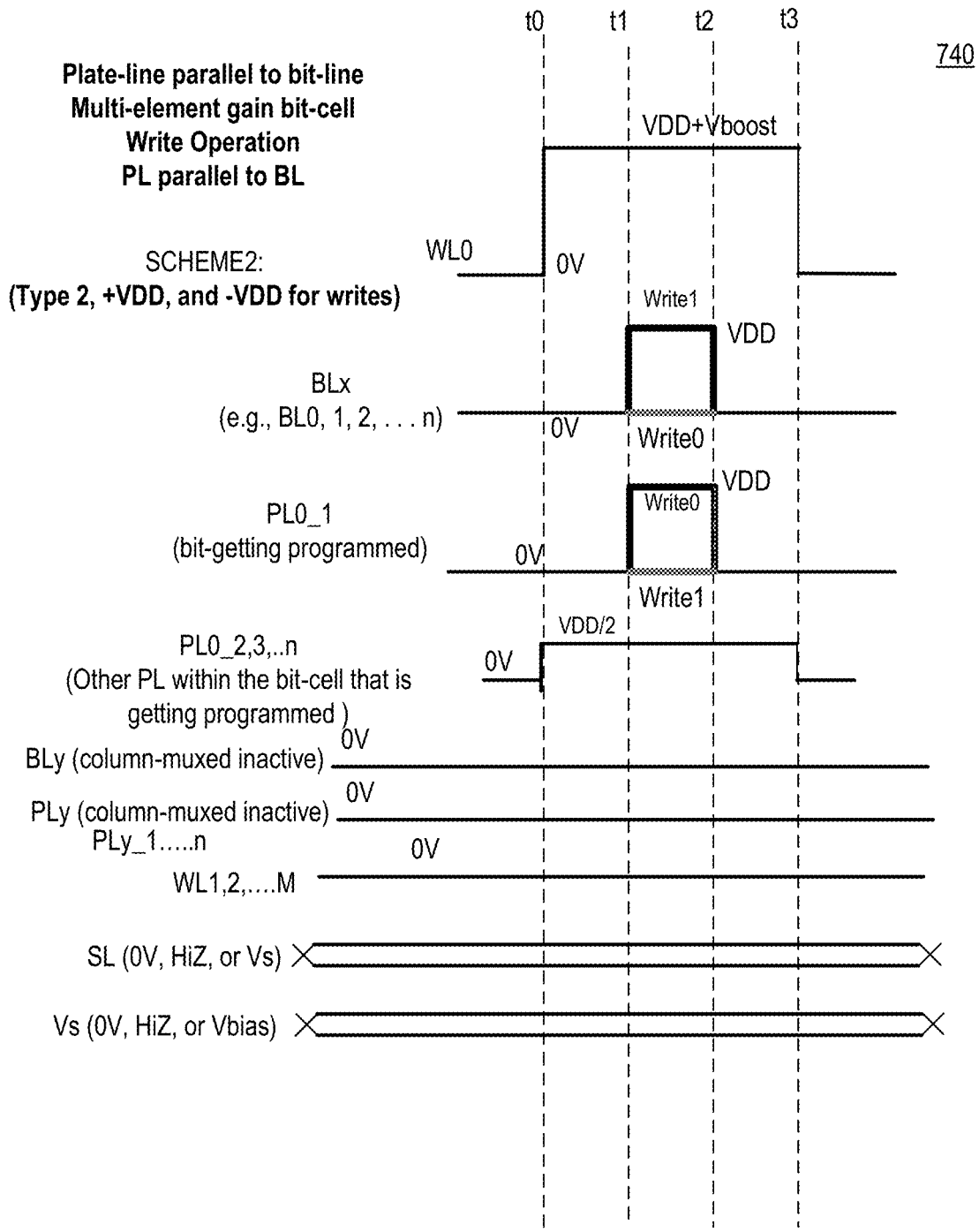
FIG. 7D illustrates a timing diagram for a second scheme for write operation for multi-element FE gain bit-cells with the PL parallel to the BL, in accordance with some embodiments.

FIG. 7D illustrates timing diagram 740 for a second scheme for write operation for multi-element FE gain bit-cells with the PL parallel to the BL, in accordance with some embodiments. Compared to scheme 1 described with reference to FIG. 7C, here instead of setting the selected BL (e.g., BLx) and the selected PL (e.g., PL0_1) to ½ Vdd, they are set to 0V. WL is boosted for write operation (e.g., to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiments, PL1_0 is set to logic 0 to allow storage of logic 1 value in capacitor Cfe1. In some embodiments, to write a logic 0, BLx is kept at 0V when WL0 is boosted. In one such embodiments, PL0_1 is set to logic 1 to allow storage of logic 1 value in capacitor Cfe1. The duration of pulse widths of BLx and PL0_1 is sufficient to change the polarization state of the selected capacitor Cfe1.

Other PLs (e.g., PL0_2 through n) within the same selected bit-cell (e.g., $701_{0,0}$) are charged to Vdd/2 like Blx. PL (e.g., PLy) for column multiplexed bit-cells remains at 0V while PL0_1 is being used to program Cfe1. By charging the PLy 0 ½Vdd reduces the disturb effect on the unselected bit-cells. Word-lines of unselected bit-cells is set to 0V (e.g., WL1, 2, through m are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 7E:
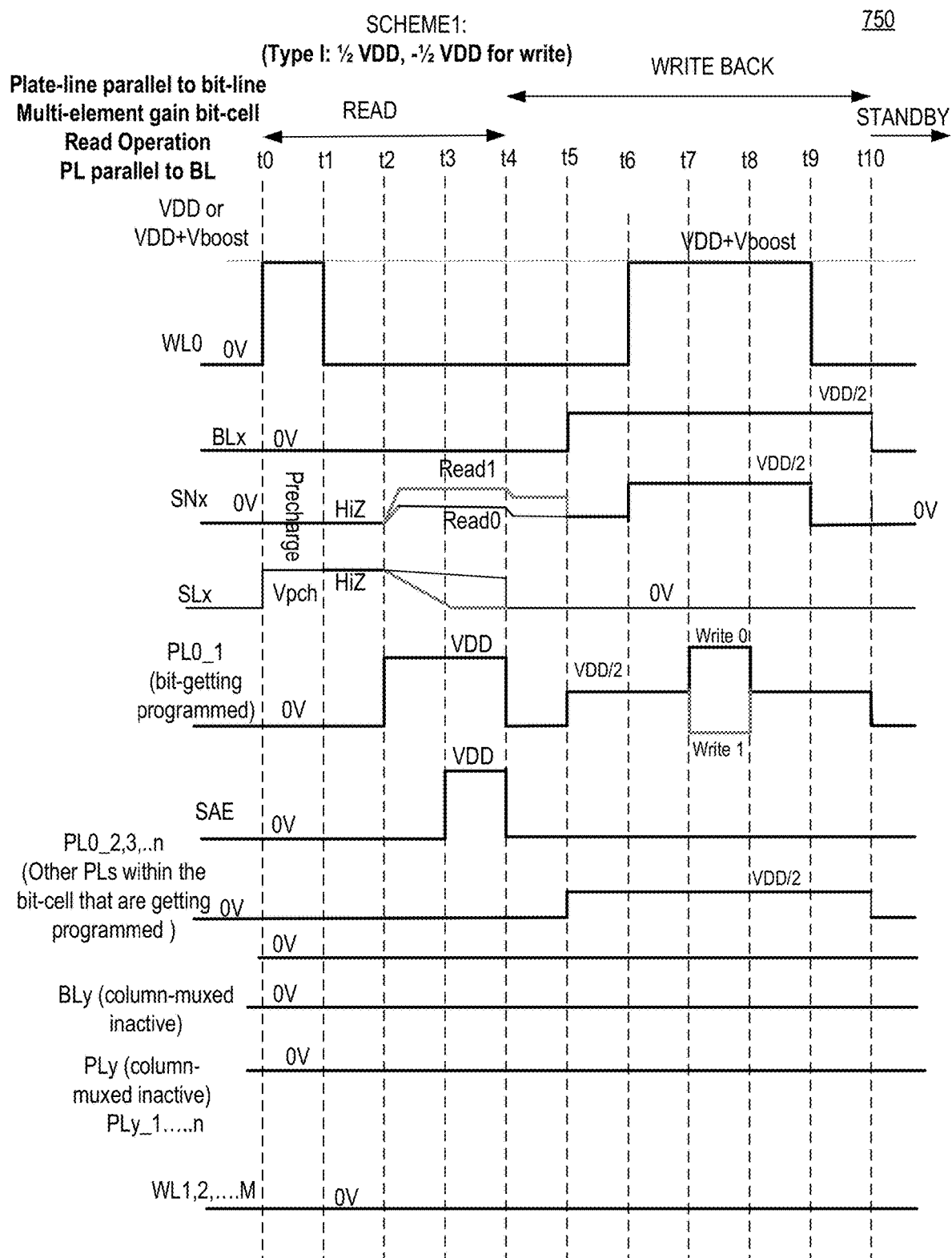
FIG. 7E illustrates a timing diagram for the first scheme read operation for multi-element FE gain bit-cells with the PL parallel to the BL, in accordance with some embodiments.

FIG. 7E illustrates timing diagram 750 for the first scheme read operation for multi-element FE gain bit-cells with the PL parallel to the BL, in accordance with some embodiments. In some embodiments, read operation begins by asserting the selected WL (e.g., WL0). In some embodiments, the selected WL is boosted for read operation. WL0 is boosted above Vdd to Vdd+Vboost level. In some embodiments, a writeback scheme is implemented after the read operation to ensure the read operation does not corrupt the data value stored in the selected bit-cell. In one such embodiment, the data which is read is also written back in the writeback time window after the read time window. In some embodiments, PL (e.g., PL0_1) is asserted for the bit-cell which is being read. Other unselected PLs (e.g., PL0_2, 3, through n) of the bit-cell (e.g., $701_{0,0}$) are kept at 0V during read operation, and then to Vdd/2 during writeback if the first scheme is followed.

The PL (e.g., PL0_1) for the selected capacitor (e.g., Cfe1) of the bit-cell (e.g., $701_{0,0}$) is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node sn1, BLx (e.g., BL0) is set or forced to zero volts during read operation, and then set to ½ Vdd just before WL0 is boosted for write back operation when the first scheme is followed. Write back operation for the first scheme is like the write operation discussed with reference to FIG. 7C. In some embodiments, the refresh mechanism is applied upon a read operation. This allows it to maintain the logic value in the bit-cell.

Referring to FIG. 7E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node (sense-line node) over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In the write back process, the selected bit-cell BLx (e.g., BL0) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 7C. Here, here, 'x' in PLx n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on. In some embodiments, during the read operation, plate-lines that are not used to program a capacitor are set to 0. For example, PLy (e.g., PLy_1 through n) are set to 0V while PL0_1 is being used to read from capacitor Cfe1. Here 'y' indicates all other PLs for unselected bit-cells.

Figure 7F:
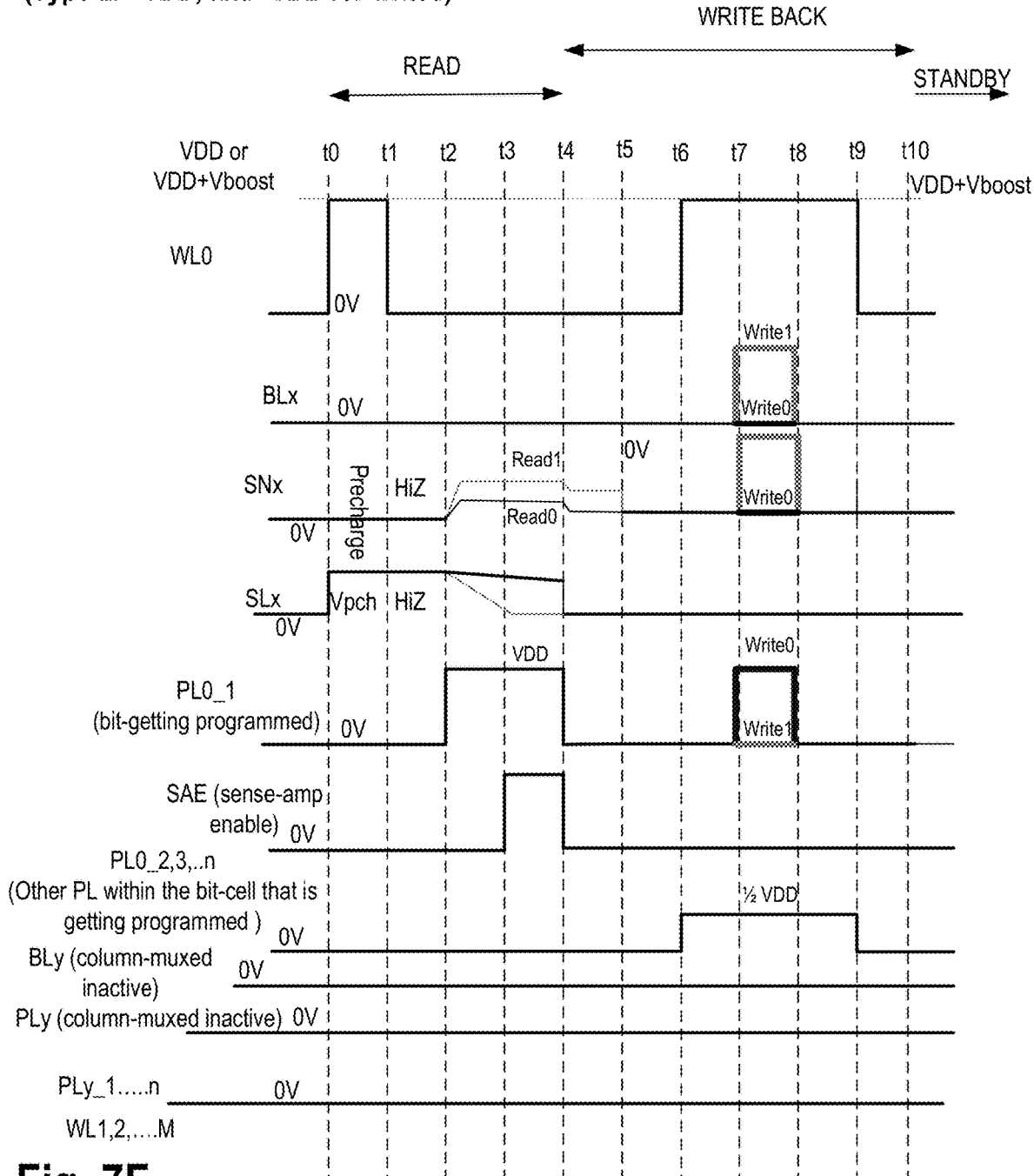
FIG. 7F illustrates a timing diagram for the second scheme read operation for multi-element FE gain bit-cells with the PL parallel to the BL, in accordance with some embodiments.

FIG. 7F illustrates timing diagram 760 for the second scheme read operation for multi-element FE gain bit-cells with the PL parallel to the BL, in accordance with some embodiments. Compared to timing diagrams 750, here the selected bit-line (BLx) is not set to ½ Vdd. In some embodiments, BLx is set to 0V, and depending on whether a logic 1 or a logic 0 is written during writeback to the selected capacitor Cfe1 (via PL0_1), the selected bit-line is toggled. In this example, during writeback and during the pulse width of the boosted WL0, PL0_1 and BLx is set to Vdd to write a 0 to the capacitor Cfe1. The writeback scheme here is same as the writeback scheme of FIG. 7D. In this scheme (second scheme), the voltage swing on the selected capacitor is +/−Vdd. In the scheme of FIG. 7E (first scheme), the voltage swing on the selected capacitor is +/−Vdd/2.

Figure 8A:
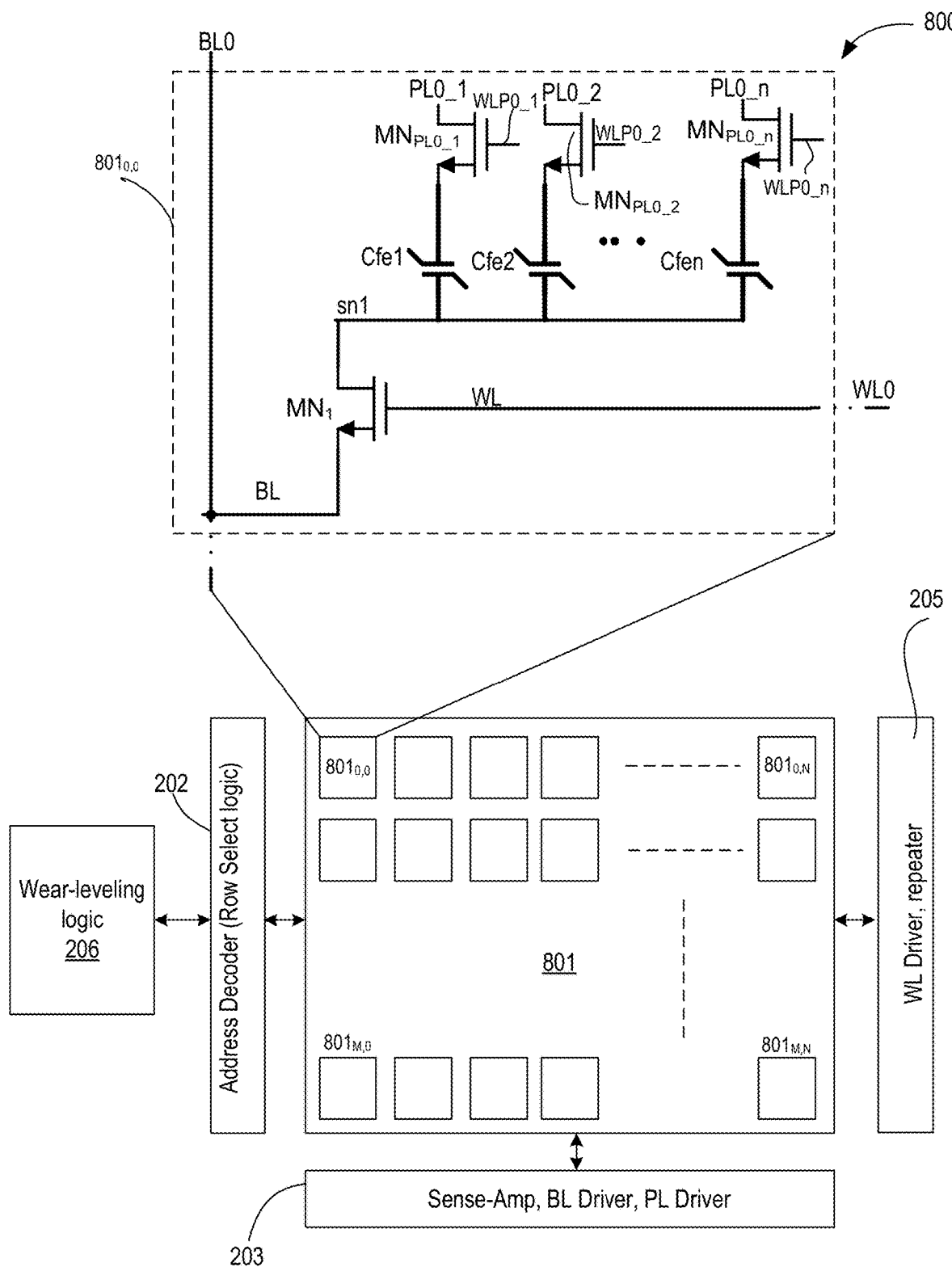
FIG. 8A illustrates an apparatus comprising memory and corresponding logic, wherein the memory comprises FE memory bit-cells, where an individual memory bit-cell includes 1TnC bit-cells with PLs parallel to a BL, and with individual switches coupled to the capacitors on the plate-line side, where the corresponding logic is to apply word-line boosting, in accordance with some embodiments.

FIG. 8A illustrates apparatus 800 comprising memory and corresponding logic, wherein the memory comprises FE memory bit-cells, where an individual memory bit-cell includes 1TnC bit-cells with PLs parallel to a BL, and with individual switches coupled to the capacitors on the plate-line side, where the corresponding logic is to apply word-line boosting, in accordance with some embodiments. Apparatus 800 is like apparatus 600, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in memory array 801 is organized in rows and columns like in apparatus 600, but with bit-lines running parallel to the plate-lines. For example, memory bit-cells $801_{0,0}$ through $801_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_n. In some embodiments, n-type transistor $MN_{PLB\_x}$ is coupled to compensation capacitor Cd and PLB_x. Each transistor (or switch) is controlled separately, in accordance with some embodiments. In some embodiments, transistor $MN_{PLO\_1}$ is controllable by WLP0_1, transistor $MN_{PLO\_2}$ is controllable by WLP0_2, and so on. Likewise, transistor $MN_{PLO\_n}$ is controllable by WLP0_n. Here, WLP0_1 .... WLP0_n are the extensions of an address space. In this case, depending upon which storage element is being programmed or read, the corresponding WLP0_1 ... WLP0_n are kept high (e.g., Vdd) whenever the plate-line voltage of 0V or Vdd is applied, while the unselected storage element sees 0V.

While the various embodiments are illustrated with reference to n-type transistors or switches, the embodiments are also applicable to a p-type transistor or a combination of n-type or p-type transistors. A person skilled in the art would appreciate that when a transistor of a different conductivity type is used, than what is shown in FIG. 8A, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, and $MN_{PLO\_n}$, are fabricated in the backend of the die. On one such embodiment, the capacitor Cfe is fabricated between the frontend and the backend of the die. In one example, capacitors Cfe are vertically stacked capacitors. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. These backed transistors or switches can be fabricated using any suitable technology such as IGZO (Indium gallium zinc oxide).

Figure 8B:
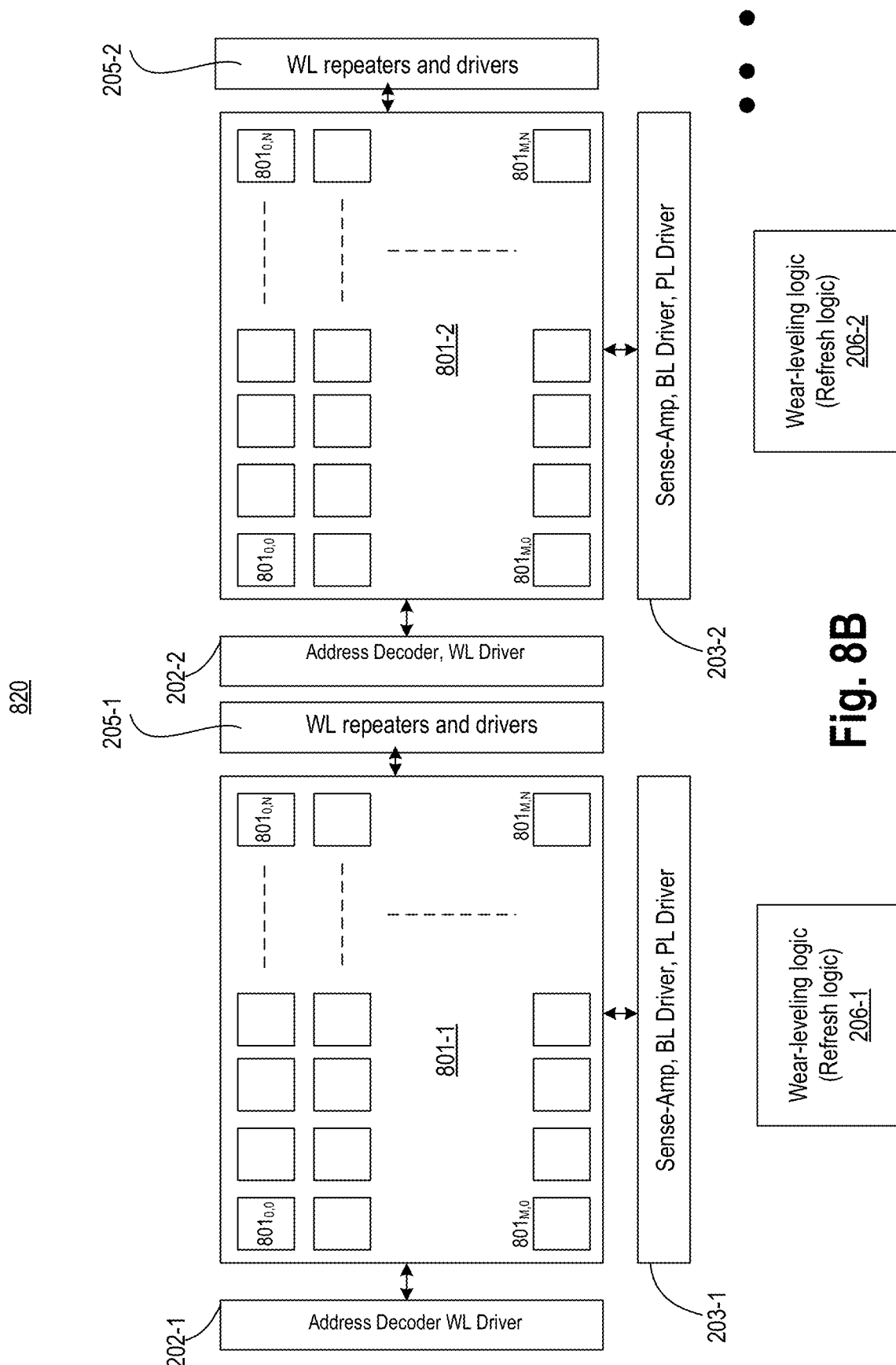
FIG. 8B illustrates an FE memory with word-line repeaters, wherein memory arrays of the FE memory 1TnC bit-cells of FIG. 8A, in accordance with some embodiments.

FIG. 8B illustrates apparatus 820 having FE memory with word-line repeaters, wherein memory arrays of the FE memory 1TnC bit-cells of FIG. 8A, in accordance with some embodiments. Apparatus 820 is like apparatus 240, but with memory arrays 801-1 and 801-2. Each memory array includes the memory bit-cells of FIG. 8A.

Figure 8C:
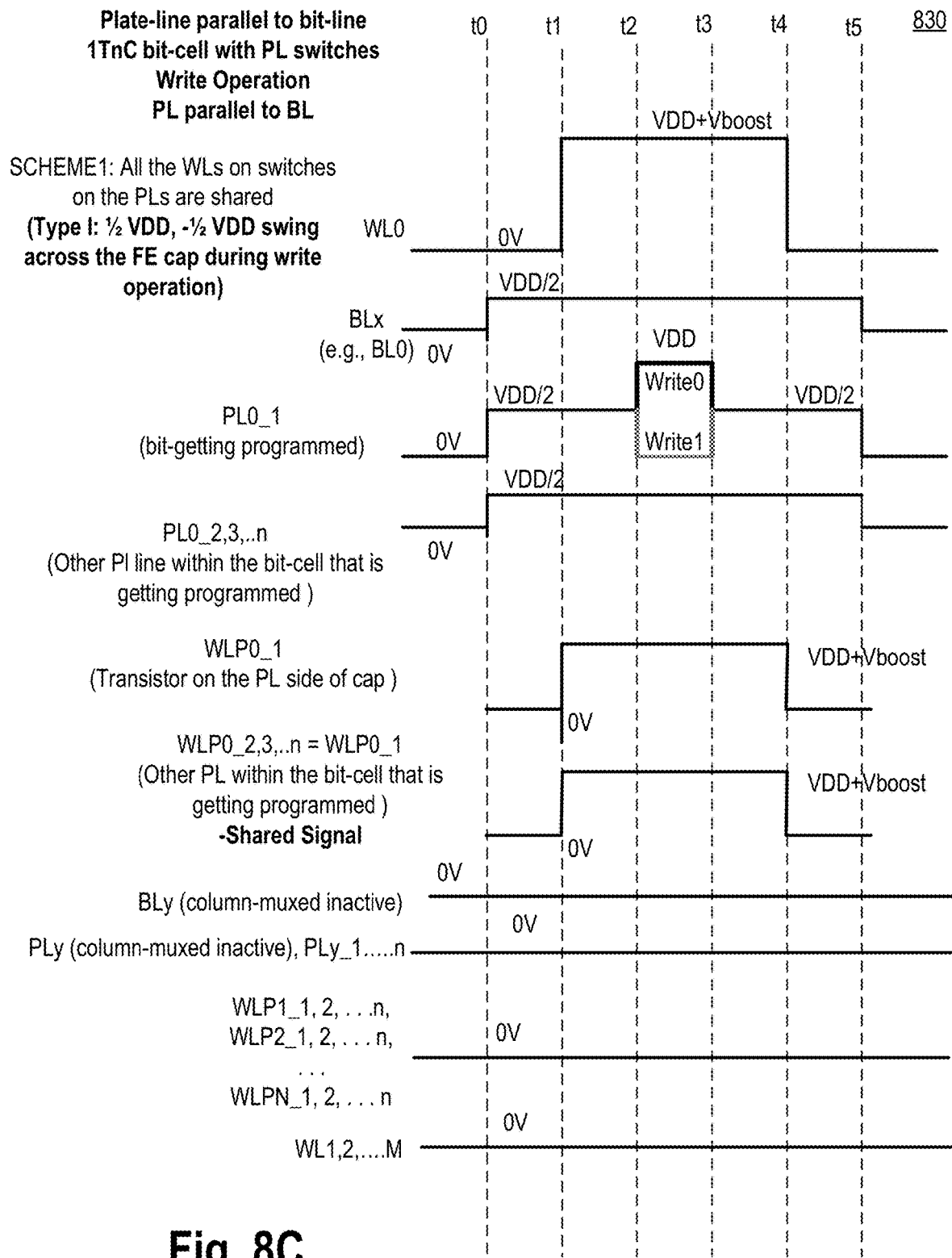
FIG. 8C illustrates a timing diagram for write operation for 1T1C bit-cells with the PL parallel to the BL and where the word-lines (WLPs) for switch transistors for multiple plate-lines within a bit-cell are driven by a same signal, in accordance with some embodiments.

FIG. 8C illustrates timing diagram 830 for write operation for 1T1C bit-cells with the PL parallel to the BL and where the word-lines (WLPs) for switch transistors for multiple plate-lines within a bit-cell are driven by a same signal, in accordance with some embodiments. In this scheme (first scheme) all WLPs for switch transistors are driven by the same signal per bit-cell, in accordance with some embodiments. For example, WLP0_1, WLP0_2, ... WLP0_n for bit-cell $801_{0,0}$ share the same signal driver. In some embodiments, the signals on WLPs for switch transistors for a bit-cell during the write operation are the same as the WL0 signal for that bit-cell.

To write to a capacitor of a multi-element FE gain bit-cell (e.g., $801_{0,o}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx (e.g., BL0) is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL to store a 0 or a 1 to that capacitor. In this example, PL0_1 is charged from 0V to Vdd/2 when BL0 is charged to Vdd/2. Then during the pulse width of the boosted WL, PL0_1 is set to Vdd to write a 0 to capacitor Cfe1. In some embodiments, during the pulse width of the boosted WL, PL0_1 is set to 0V to write a 1 to the capacitor Cfe1.

Other PLs (e.g., PL0_2 through n) within the same selected bit-cell (e.g., $901_{0,0}$) are charged to Vdd/2 like Blx. PL (e.g., PLy) for column multiplexed bit-cells remains at 0V while PL0_1 is being used to program Cfe1. Word-lines of unselected bit-cells are set to 0V (e.g., WL1, 2, through M are set to 0V when WL0 is selected).

In some embodiments, the voltage swing across the selected ferroelectric capacitor is Vdd during write operation (e.g., the swing is ½ Vdd to –½ Vdd). For example, during write 0, BL0 is Vdd/2 and PL0_1 is Vdd, which makes the voltage across the selected ferroelectric capacitor Cfe1 BL0–PL0_1=–Vdd/2. Likewise, during write 1, BL0 is Vdd/2 and PL0_1 is 0, which makes the voltage across the selected ferroelectric capacitor Cfe1 BL0–PL0_1=Vdd/2.

As illustrated, in this scheme WLPs to the switches follow the same signal as WL during the write operations, in accordance with some embodiments. For example, WPL0_1 associated with the capacitor Cfe1 to be programmed and other WLPs (e.g., WLP0_2 through WLP0_n) are also driven to the same value as WLP0_1). In various embodiments, WLPs for inactive or unselected bit-cells are set to 0V just like WLs for the unselected bit-cells.

Figure 8D:
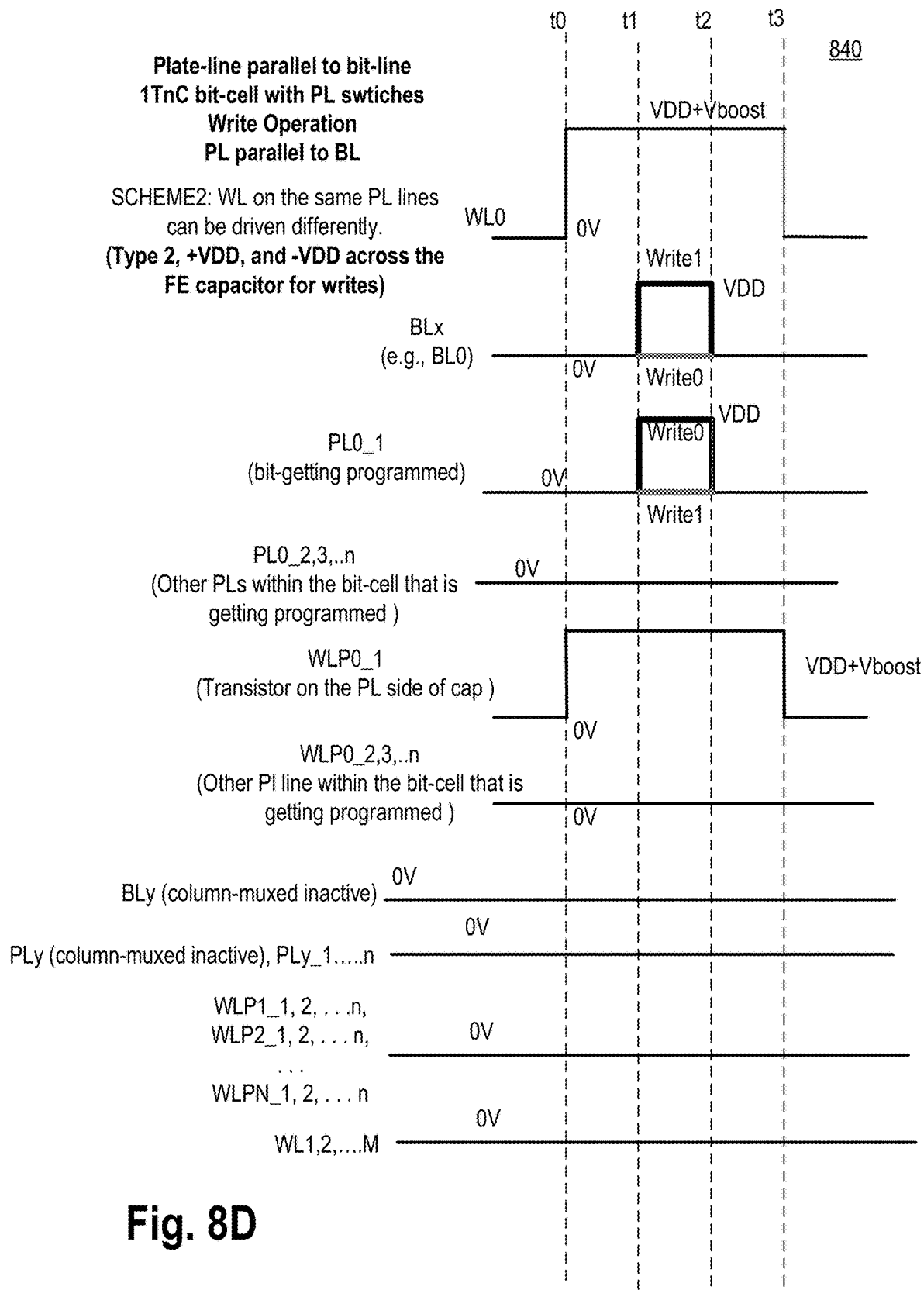
FIG. 8D illustrates a timing diagram for write operation for 1T1C bit-cells with the PL parallel to the BL and where the word-lines (WLPs) for switch transistors for multiple plate-lines within a bit-cell are driven by different signals, in accordance with some embodiments.

FIG. 8D illustrates timing diagram 840 for write operation for 1T1C bit-cells with the PL parallel to the BL and where the word-lines (WLPs) for switch transistors for multiple plate-lines within a bit-cell are driven by different signals, in accordance with some embodiments. Compared to scheme 1 described with reference to FIG. 8C, here the word-lines (WLPs) to the switches coupled to the plate-lines are driven by different signals. Further, instead of toggling the selected BLx (e.g., BL0) and the selected PL (e.g., PL0_1) to ½ Vdd and thereafter toggling the selected PL between 0V and Vdd for different write values, here both selected BL and selected PL are toggled between 0V and Vdd depending upon the write values.

In various embodiments, WL is boosted for write operation (e.g., WL0 is boosted to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL0_1 is set to logic 0 to allow storage of logic 1 value in capacitor Cfe1. In some embodiments, to write a logic 0, BLx is kept at 0V when WL is boosted. In one such embodiments, PL0_1 is set to logic 1 to allow storage of logic 1 value in capacitor Cfe1. The duration of pulse widths of BLx and PL0_1 is sufficient to change the polarization state of the selected capacitor Cfe1. All other plate-lines (e.g., PL0_2, PL0_3, ... PL0_n) remain at 0V when the selected PL (e.g., PL0_1) is being used to program a capacitor in the bit-cell.

In various embodiments, for this scheme, the transistor coupled to the capacitor being programmed is turned on during write operation, while other switches for unselected capacitors remain off. For example, WLP0_1 follows the same signal pattern as WL to turn on transistor $MN_{PL0\_1}$ to program capacitor Cfe1, while other WLPs (e.g., WLP0_2 through WLP0_n) are set to 0V to keep the n-type switches off. In various embodiments, other BLs which are unselected are set to 0V by a column multiplexer. In some embodiments, PLs of other unselected bit-cells and WLs of other unselected bit-cells are also kept at 0V to reduce any cross-noise.

Other PLs (e.g., PL0_2 through n) within the same selected bit-cell (e.g., $901_{0,0}$) are set to 0. PL (e.g., PLy) for column multiplexed bit-cells remains at 0V while PL0_1 is being used to program Cfe1. Word-lines of unselected bit-cells is set to 0V (e.g., WL1, 2, through M are set to 0V when WL0 is selected).

In some embodiments, the voltage swing across the selected ferroelectric capacitor is 2Vdd during write operation (e.g., the swing is Vdd to −Vdd). For example, during write 0, BL0 is 0 and PL0_1 is Vdd, which makes the voltage across the selected ferroelectric capacitor Cfe1 BL0−PL0_1=−Vdd. Likewise, during write 1, BL0 is Vdd and PL0_1 is 0, which makes the voltage across the selected ferroelectric capacitor Cfe1 BL0−PL0_1=Vdd.

As illustrated, in this scheme WLPs to the switches may not follow the same signal as WL during the write operations, in accordance with some embodiments. For example, WPL0_1 associated with the capacitor Cfe1 to be programmed and other WLPs (e.g., WLP0_2 through WLP0_n may not be driven to the same value as WLP0_1. In various embodiments, WLPs for inactive or unselected bit-cells are set to 0V just like WLs for the unselected bit-cells. Scheme 2 simplifies signal generation compared to scheme 1 where tri-level signaling is used (e.g., scheme 1 uses tri-level signaling in BL and PL). Here, 2-level signaling is used. Further, scheme 2 allows for a higher voltage swing on the ferroelectric capacitor for a given supply, which effectively enables lower voltage supply operation. While scheme 1 may share drivers for WLPs, here the drivers for WLPs may be independent from one another.

Figure 8E:
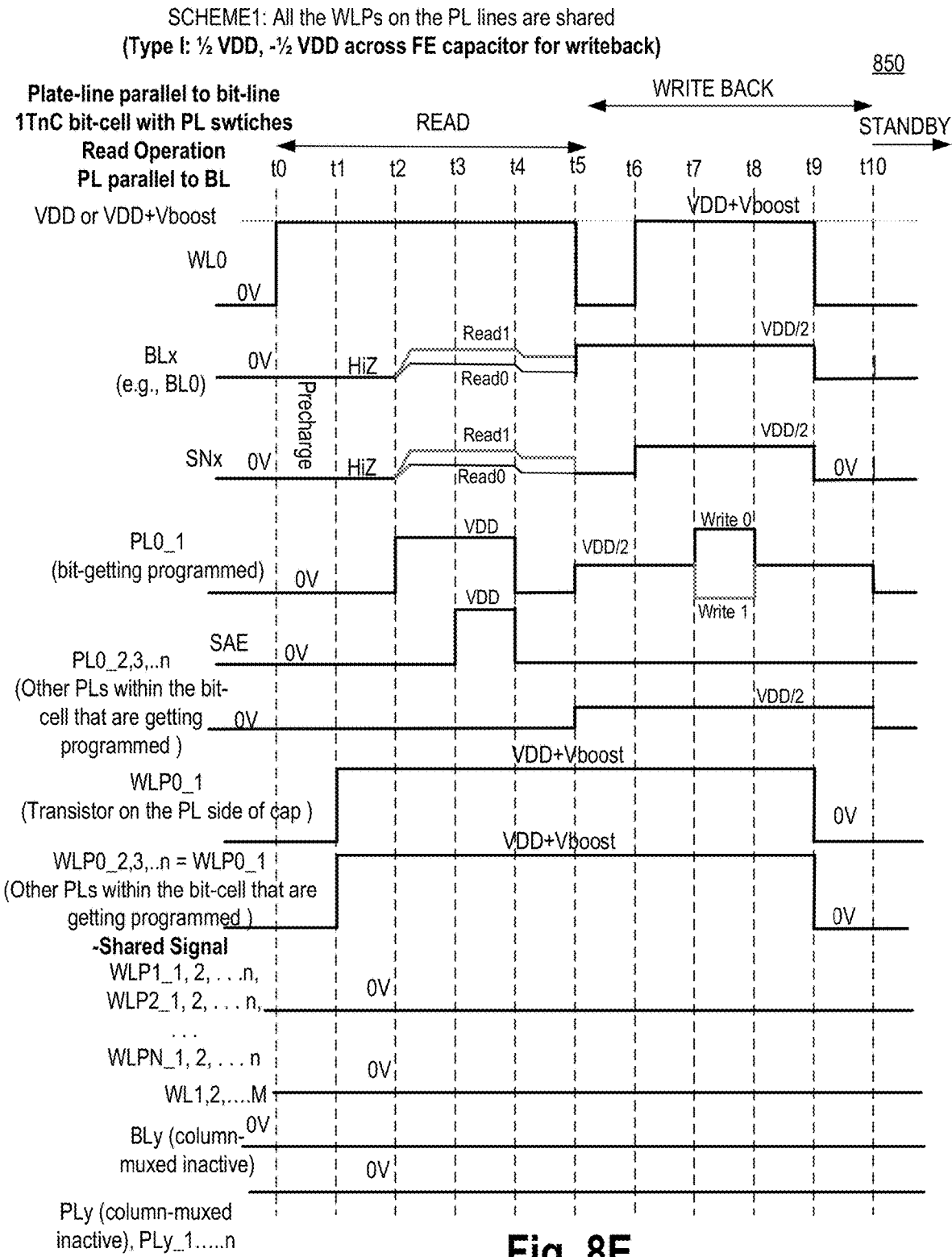
FIG. 8E illustrates a timing diagram for read operation for 1T1C bit-cells with the PL parallel to the BL and where the word-lines (WLPs) for switch transistors for multiple plate-lines within a bit-cell are driven by a same signal, in accordance with some embodiments.

FIG. 8E illustrates timing diagram 850 for read operation for 1T1C bit-cells with the PL parallel to the BL and where the word-lines (WLPs) for switch transistors for multiple plate-lines within a bit-cell are driven by a same signal, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL (e.g., PL0_1) is asserted for the bit-cell which is being read. Other unselected PLs (e.g., PL0_2, PL_3, ... PL0_n) of the bit-cell are kept at 0V during read operation, and then to Vdd/2 during writeback if the first scheme is followed. Here, here, 'x' in PLx n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on.

The PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BLx (e.g., BL0) is set or forced to zero volts during read operation, and then set to ½ Vdd just before WL is boosted for write back operation when the first scheme is followed. Writeback operation for the first scheme is like the write operation discussed with reference to FIG. 8C.

Referring to FIG. 8E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In various embodiments, selected BLx (e.g., BL0) follows similar characteristics as SNx during the read phase.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In various embodiments, the WLPs to the gates of the switches are driven by a same signal. In some embodiments, during the read operation (which includes the writeback), WLPs are asserted to a boosted level (e.g., Vdd+Vboost). In some embodiments, during the read operation, plate-lines that are not used to program a capacitor are set to 0. For example, PL0_2 through n, PL1_0 through n are set to 0V while PL0_1 is being used to read from capacitor Cfe1.

In some embodiments, WPL0_1 associated with the capacitor Cfe1 to be programmed and other WLPs (e.g., WLP0_2 through WLP0_n) are also driven to the same value as WLP0_1. In various embodiments, WLPs for inactive or unselected bit-cells are set to 0V just like WLs for the unselected bit-cells.

Figure 8F:
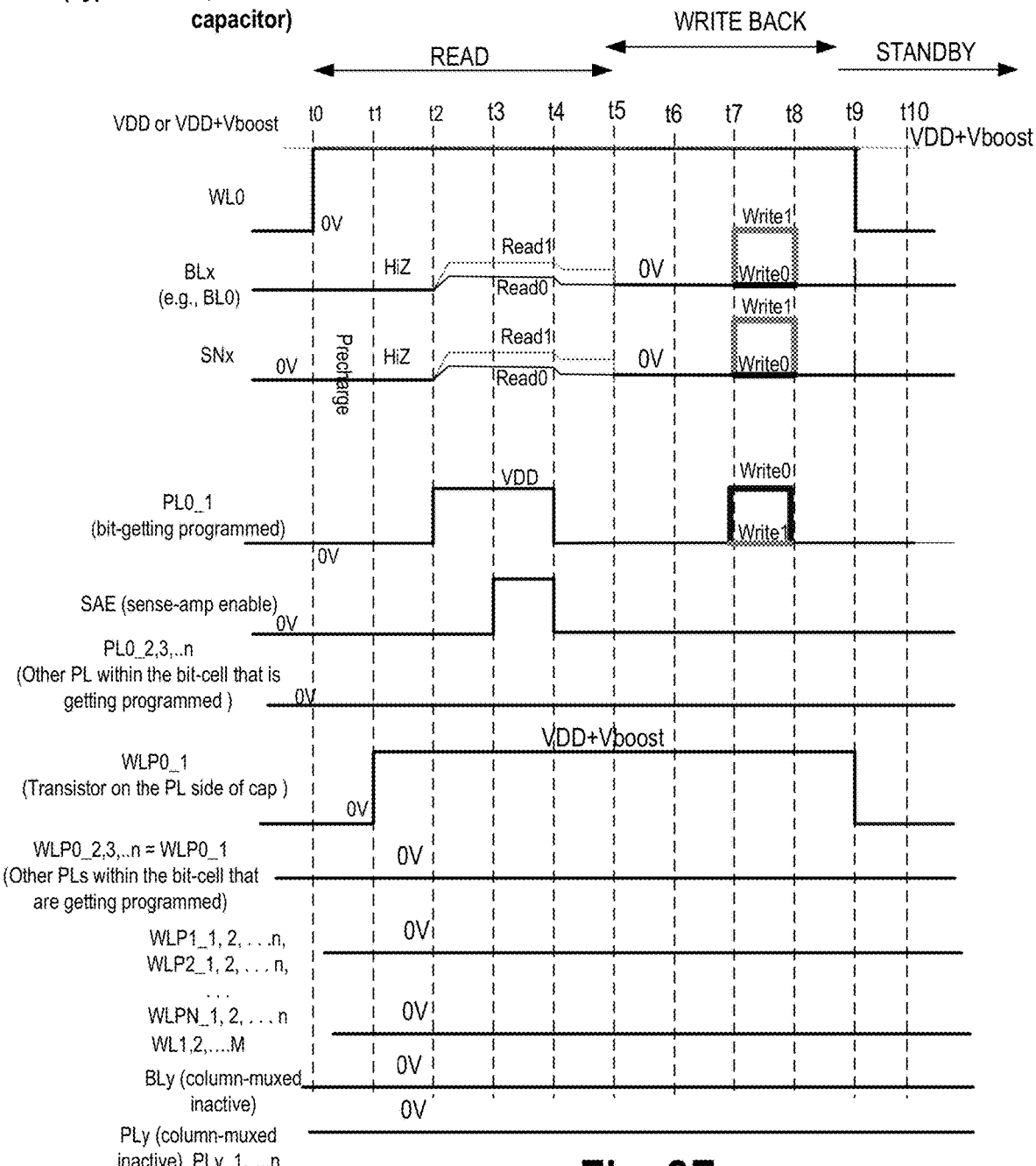
FIG. 8F illustrates a timing diagram for write operation for 1T1C bit-cells with the PL parallel to the BL and where the word-lines (WLPs) for switch transistors for multiple plate-lines within a bit-cell are driven by different signals, in accordance with some embodiments.

FIG. 8F illustrates timing diagram 860 for write operation for 1T1C bit-cells with the PL parallel to the BL and where the word-lines (WLPs) for switch transistors for multiple plate-lines within a bit-cell are driven by different signals, in accordance with some embodiments. Here, the writeback scheme is the same as that in FIG. 8D, in accordance with some embodiments. In various embodiments, the read scheme in timing diagram 860 is the same scheme as that of FIG. 8E, except for the signals on other WLPs of the unselected capacitors of the same bit-cell are driven to 0V as opposed to the same value.

Figure 9A:
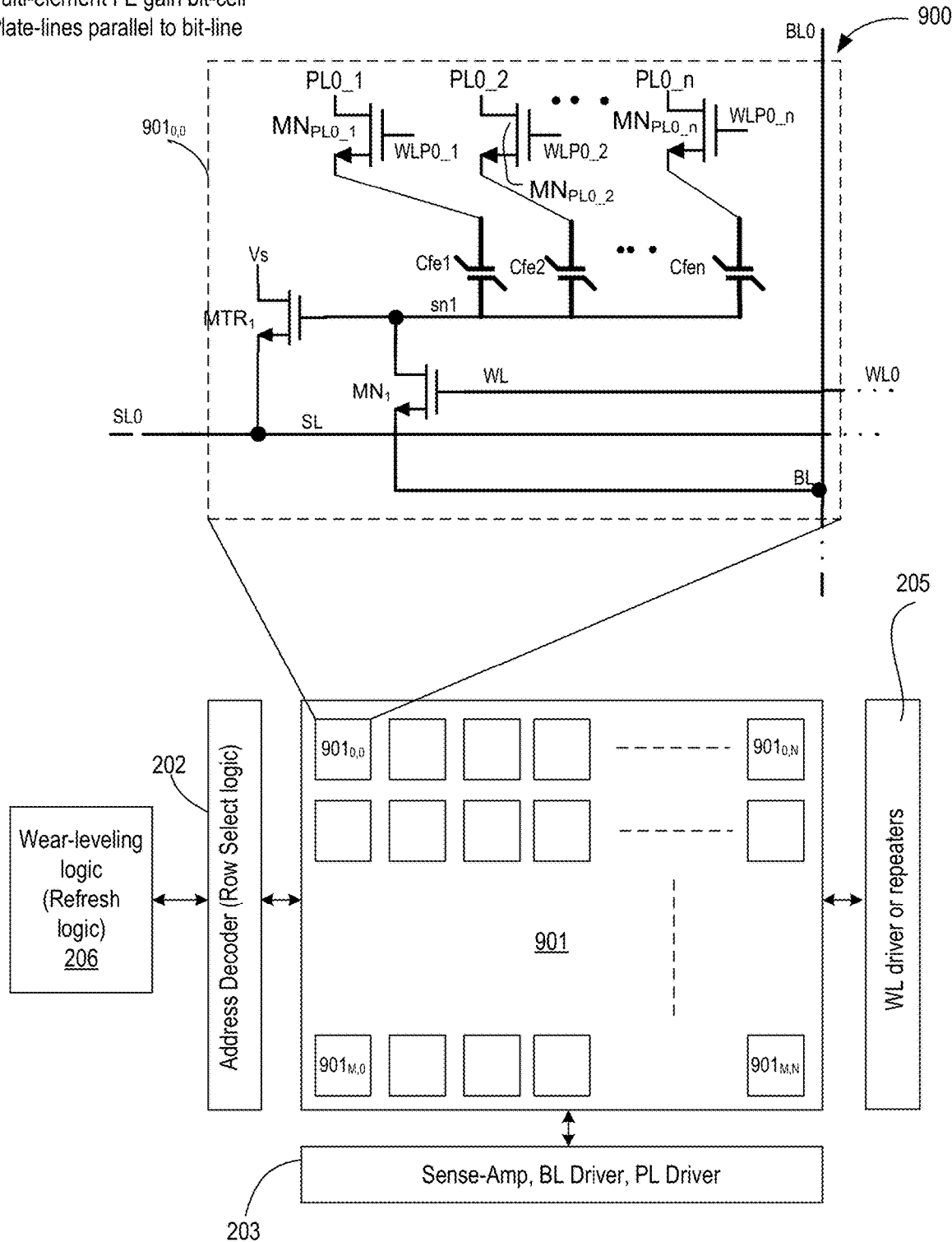
FIG. 9A illustrates an apparatus comprising memory and corresponding logic, wherein the memory comprises FE memory bit-cells, where an individual memory bit-cell includes multi-element FE gain bit-cells with PLs parallel to a BL, and with individual switches coupled to the capacitors on the plate-line side, where the corresponding logic is to apply word-line boosting, in accordance with some embodiments.

FIG. 9A illustrates apparatus 900 comprising memory and corresponding logic, wherein the memory comprises FE memory bit-cells, where an individual memory bit-cell includes multi-element FE gain bit-cells with PLs parallel to a BL, and with individual switches coupled to the capacitors on the plate-line side, where the corresponding logic is to apply word-line boosting, in accordance with some embodiments.

Apparatus 900 is like apparatus 700, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in memory array 901 is organized in rows and columns like in apparatus 700, but with bit-lines running parallel to the plate-lines. For example, memory bit-cells $901_{0,0}$ through $901_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_n. Each transistor (or switch) is controlled separately, in accordance with some embodiments. In some embodiments, transistor $MN_{PLO\_1}$ is controllable by WLP0_1, transistor $MN_{PLO\_2}$ is controllable by WLP0_2, and so on. Likewise, transistor $MN_{PLO\_n}$ is controllable by WLP0_n. Here, WLP0_1 . . . . WLP0_n are the extensions of an address space. In this case, depending upon which storage element is being programmed or read, the corresponding WLP0_1 . . . WLP0_n are kept high (e.g., Vdd) whenever the plate-line voltage of 0V or Vdd is applied, while the unselected storage element sees 0V.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 9A, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . and $MN_{PLO\_n}$ are fabricated in the backend of the die. On one such embodiment, the capacitor Cfe is fabricated between the frontend and the backend of the die. In one example, capacitors Cfe are vertically stacked capacitors. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. These backed transistors or switches can be fabricated using any suitable technology such as IGZO (Indium gallium zinc oxide).

Figure 9B:
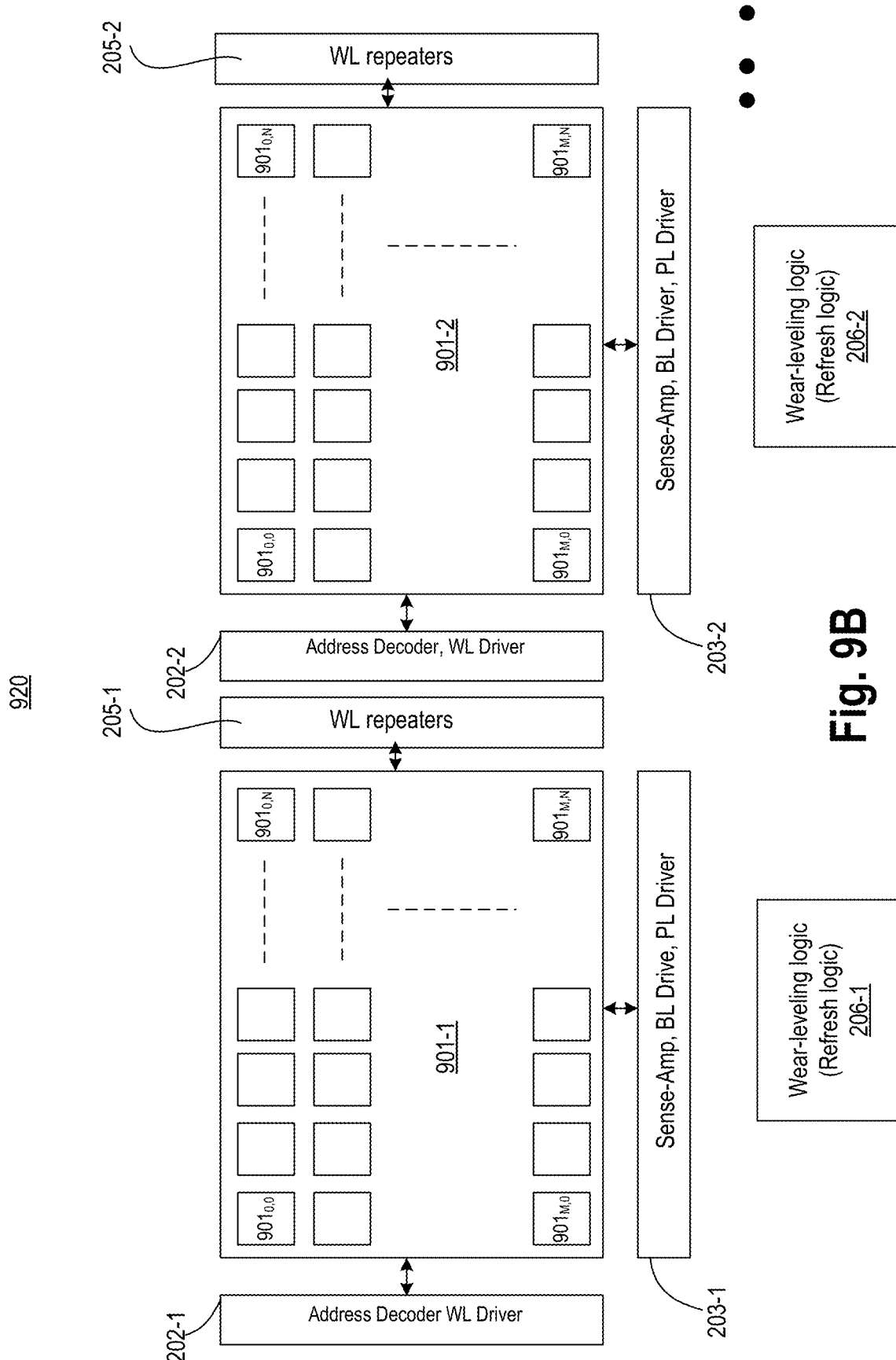
FIG. 9B illustrates an FE memory with word-line repeaters, wherein memory arrays of the multi-element FE gain bit-cells of FIG. 9A, in accordance with some embodiments.

FIG. 9B illustrates apparatus 920 having FE memory with word-line repeaters, wherein memory arrays of the multi-element FE gain bit-cells of FIG. 9A, in accordance with some embodiments. Apparatus 920 is like apparatus 240, but with memory arrays 901-1 and 901-2. Each memory array includes memory bit-cells of FIG. 9A.

Figure 9C:
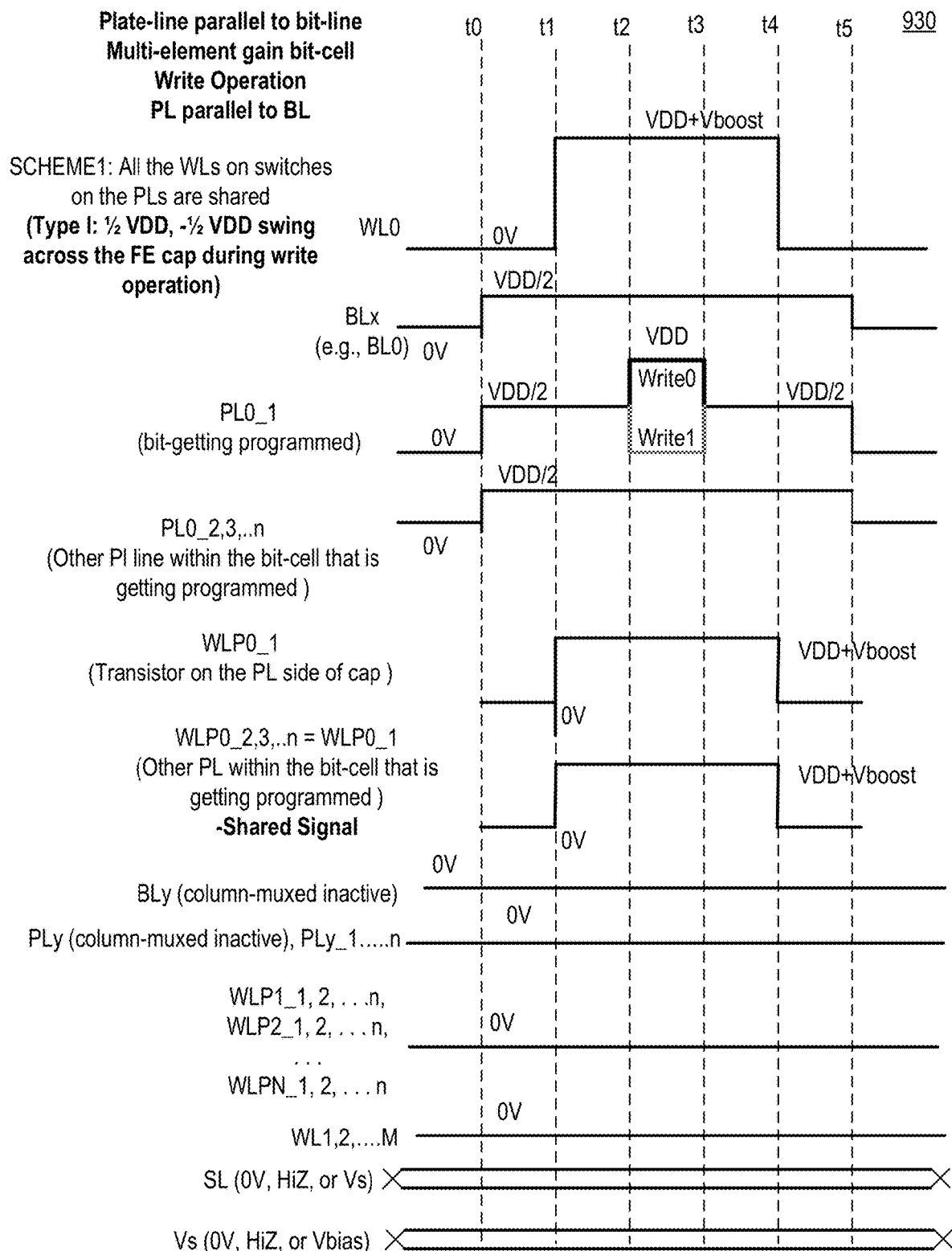
FIG. 9C illustrates a timing diagram for write operation for multi-element FE gain bit-cells with the PL parallel to the BL and where the word-lines (WLPs) for switch transistors for multiple plate-lines within a bit-cell are driven by a same signal, in accordance with some embodiments.

FIG. 9C illustrates timing diagram 930 for write operation for multi-element FE gain bit-cells with the PL parallel to the BL and where the word-lines (WLPs) for switch transistors for multiple plate-lines within a bit-cell are driven by a same signal, in accordance with some embodiments. In this scheme (first scheme) all WLPs for switch transistors are driven by a same signal per bit-cell, in accordance with some embodiments. For example, WLP0_1, WLP0_2, . . . WLP0_n for bit-cell $901_{0,0}$ share a same signal driver. In some embodiments, the signals on WLPs for switch transistors for a bit-cell during the write operation are same as the WL0 signal for that bit-cell.

To write to a capacitor of a multi-element FE gain bit-cell (e.g., $901_{0,0}$), WL to that bit-cell is boosted. For example, WL0 is boosted to Vdd+Vboost. In some embodiments, the BL (e.g., BLx) for multi-element FE gain bit-cell is set to ½ Vdd during the time the WL (e.g., WL0) is boosted. In some embodiments, the BLx (e.g., BL0) is set to ½ Vdd prior to the WL boosting. In some embodiments, BLx remains charged to ½ Vdd even after WL0 boosting ends (e.g., for one or more cycles). To program a particular capacitor of the multi-element FE gain bit-cell, the plate-line for that capacitor is first set to ½ Vdd and then set to Vdd or ground during the pulse width of the boosted WL to store a 0 or a 1 to that capacitor. In this example, PL0_1 is charged from 0V to Vdd/2 when BL0 is charged to Vdd/2. Then during the pulse width of the boosted WL, PL0_1 is set to Vdd to write a 0 to capacitor Cfe1. In some embodiments, during the pulse width of the boosted WL, PL0_1 is set to 0V to write a 1 to the capacitor Cfe1.

Other PLs (e.g., PL0_2 through n) within the same selected bit-cell (e.g., $901_{0,0}$) are charged to Vdd/2 like Blx. PL (e.g., PLy) for column multiplexed bit-cells remains at 0V while PL0_1 is being used to program Cfe1. Word-lines of unselected bit-cells is set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

In some embodiments, the voltage swing across the selected ferroelectric capacitor is Vdd during write operation (e.g., the swing is ½ Vdd to –½ Vdd). For example, during write 0, BL0 is Vdd/2 and PL0_1 is Vdd, which makes the voltage across the selected ferroelectric capacitor Cfe1 BL0–PL0_1=–Vdd/2. Likewise, during write 1, BL0 is Vdd/2 and PL0_1 is 0, which makes the voltage across the selected ferroelectric capacitor Cfe1 BL0–PL0_1=Vdd/2.

As illustrated, in this scheme WLPs to the switches follow the same signal as WL during the write operations, in accordance with some embodiments. For example, WPL0_1 associated with the capacitor Cfe1 to be programmed and other WLPs (e.g., WLP0_2 through WLP0_n are also driven to the same value as WLP0_1). In various embodiments, WLPs for inactive or unselected bit-cells are set to 0V just like WLs for the unselected bit-cells.

Figure 9D:
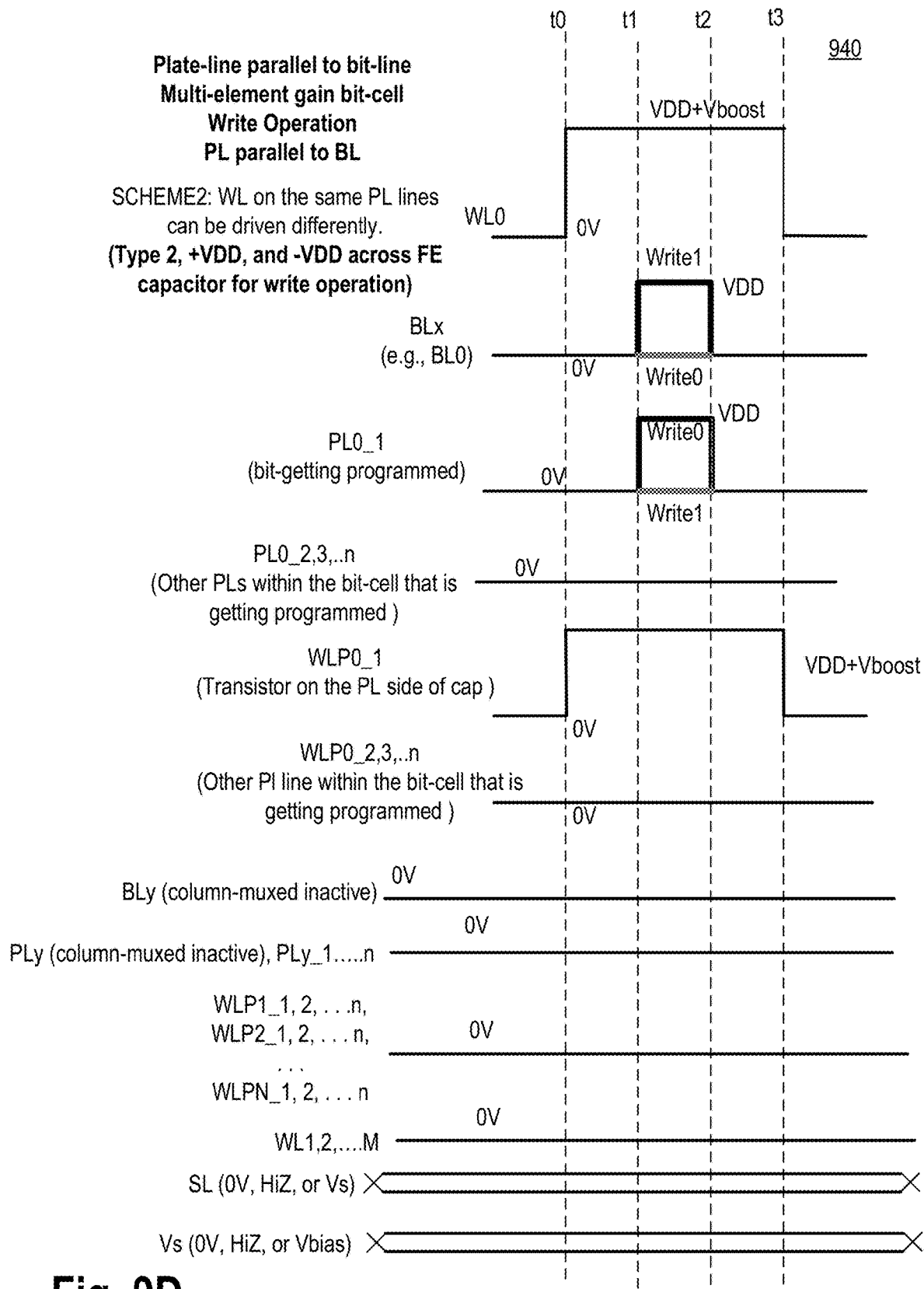
FIG. 9D illustrates a timing diagram for write operation for multi-element FE gain bit-cells with the PL parallel to the BL and where the word-lines (WLPs) for switch transistors for multiple plate-lines within a bit-cell are driven by different signals, in accordance with some embodiments.

FIG. 9D illustrates timing diagram 940 for write operation for multi-element FE gain bit-cells with the PL parallel to the BL and where the word-lines (WLPs) for switch transistors for multiple plate-lines within a bit-cell are driven by different signals, in accordance with some embodiments. Compared to scheme 1 described with reference to FIG. 9C, here the word-lines (WLPs) to the switches coupled to the plate-lines are driven by different signals. Further, instead of toggling the selected BLx (e.g., BL0) and the selected PL (e.g., PL0_1) to ½ Vdd and thereafter toggling the selected PL between 0V and Vdd for different write values, here both selected BL and selected PL are toggled between 0V and Vdd depending upon the write values.

In various embodiments, WL is boosted for write operation (e.g., WL0 is boosted to Vdd+Vboost), and then the selected BL and the selected PL are toggled to write a logic 1 or logic 0 to the capacitor of interest. In this example, BLx and PL0_1 are toggled. In some embodiments, to write a logic 1, BLx is toggled to Vdd when WL is boosted. In one such embodiment, PL0_1 is set to logic 0 to allow storage of logic 1 value in capacitor Cfe1. In some embodiments, to write a logic 0, BLx is kept at 0V when WL is boosted. In one such embodiment, PL0_1 is set to logic 1 to allow storage of logic 1 value in capacitor Cfe1. The duration of pulse widths of BLx and PL0_1 is sufficient to change the polarization state of the selected capacitor Cfe1. All other plate-lines (e.g., PL0_2, PL0_3, . . . PL0_$n$) remain at 0V when the selected PL (e.g., PL0_1) is being used to program a capacitor in the bit-cell.

In various embodiments, for this scheme, the transistor coupled to the capacitor being programmed is turned on during write operation, while other switches for unselected capacitors remain off. For example, WLP0_1 follows the same signal pattern as WL to turn on transistor $MN_{PL0\_1}$ to program capacitor Cfe1, while other WLPs (e.g., WLP0_2 through WLP0_$n$) are set to 0V to keep the n-type switches off. In various embodiments, other BLs which are unselected are set to 0V by a column multiplexer. In some embodiments, PLs of other unselected bit-cells and WLs of other unselected bit-cells are also kept at 0V to reduce any cross-noise.

Other PLs (e.g., PL0_2 through n) within the same selected bit-cell (e.g., $901_{0,0}$) are set to 0. PL (e.g., PLy) for column multiplexed bit-cells remains at 0V while PL0_1 is being used to program Cfe1. Word-lines of unselected bit-cells is set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

In some embodiments, the voltage swing across the selected ferroelectric capacitor is 2Vdd during write operation (e.g., the swing is Vdd to −Vdd). For example, during write 0, BL0 is 0 and PL0_1 is Vdd, which makes the voltage across the selected ferroelectric capacitor Cfe1 BL0−PL0_1=−Vdd. Likewise, during write 1, BL0 is Vdd and PL0_1 is 0, which makes the voltage across the selected ferroelectric capacitor Cfe1 BL0−PL0_1=Vdd.

As illustrated, in this scheme WLPs to the switches may not follow the same signal as WL during the write operations, in accordance with some embodiments. For example, WPL0_1 associated with the capacitor Cfe1 to be programmed and other WLPs (e.g., WLP0_2 through WLP0_$n$) may not be driven to the same value as WLP0_1. In various embodiments, WLPs for inactive or unselected bit-cells are set to 0V just like WLs for the unselected bit-cells. Scheme 2 simplifies signal generation compared to scheme 1 where tri-level signaling is used (e.g., scheme 1 uses tri-level signaling in BL and PL). Here, 2-level signaling is used. Further, scheme 2 allows for a higher voltage swing on the ferroelectric capacitor for a given supply, which effectively enables lower voltage supply operation. While scheme 1 may share drivers for WLPs, here the drivers for WLPs may be independent from one another.

Figure 9E:
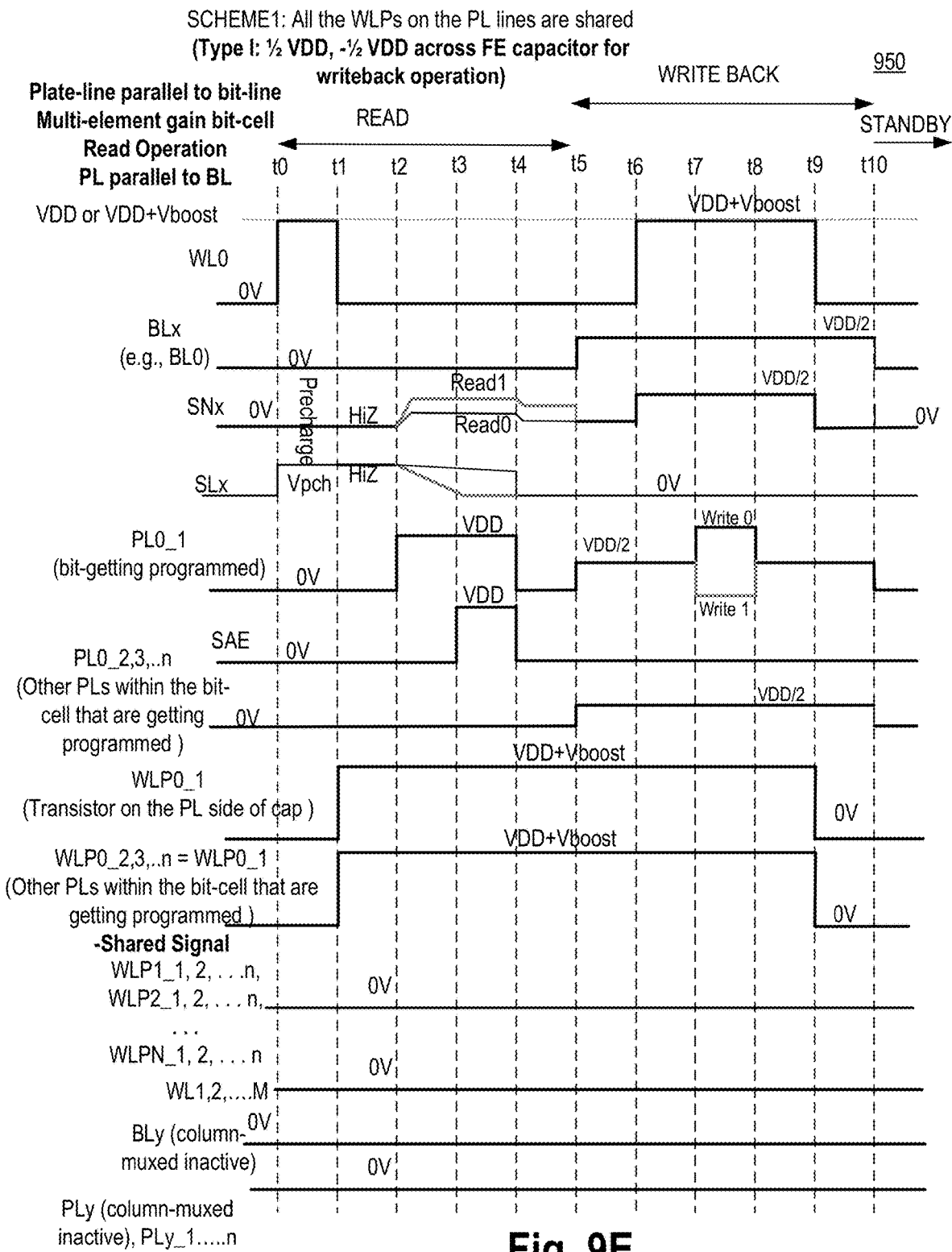
FIG. 9E illustrates a timing diagram for read operation for multi-element FE gain bit-cells with the PL parallel to the BL and where the word-lines (WLPs) for switch transistors for multiple plate-lines within a bit-cell are driven by a same signal, in accordance with some embodiments.

FIG. 9E illustrates timing diagrams 950 for read operation for multi-element FE gain bit-cells with the PL parallel to the BL and where the word-lines (WLPs) for switch transistors for multiple plate-lines within a bit-cell are driven by a same signal, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL (e.g., PL0_1) is asserted for the bit-cell which is being read. Other unselected PLs (e.g., PL0_2, PL_3, . . . PL0_$n$) of the bit-cell are kept at 0V during read operation, and then to Vdd/2 during writeback if the first scheme is followed. Here, here, 'x' in PLx_n indicates the same orientation as BL. For example, plate-lines PL0_1, PL0_2, and PL0_3 are parallel to BL0. Likewise, plate-lines PL1_1, PL1_2, and PL1_3 are parallel to BL1, and so on.

The PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts during read operation, and then set to ½ Vdd just before WL is boosted for write back operation when the first scheme is followed. Write back operation for the first scheme is like the write operation discussed with reference to FIG. 9C.

Referring to FIG. 9E, in some embodiments, storage node sn1 of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL (e.g., PL0_1) for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In various embodiments, the WLPs to the gates of the switches are driven by the same signal. In some embodiments, during the read operation (which includes the writeback), WLPs are asserted to a boosted level (e.g., Vdd+Vboost). In some embodiments, during the read operation, plate-lines that are not used to program a capacitor are set to 0. For example, PL0_2 through n, PL1_0 through n are set to 0V while PL0_1 is being used to read from capacitor Cfe1.

In some embodiments, WPL0_1 associated with the capacitor Cfe1 to be programmed and other WLPs (e.g., WLP0_2 through WLP0_n are also driven to the same value as WLP0_1). In various embodiments, WLPs for inactive or unselected bit-cells are set to 0V just like WLs for the unselected bit-cells.

Figure 9F:
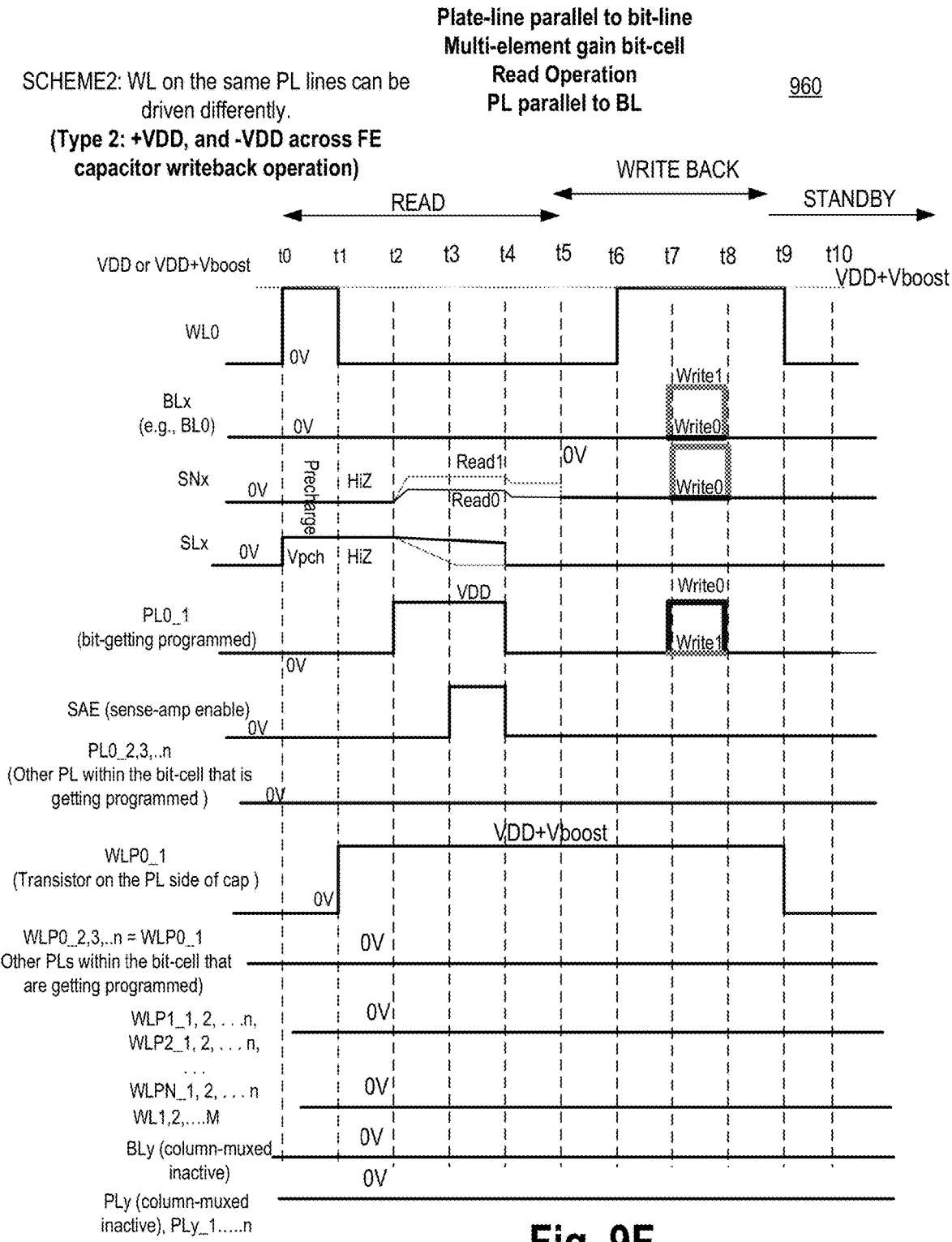
FIG. 9F illustrates a timing diagram for write operation for multi-element FE gain bit-cells with the PL parallel to the BL and where the word-lines (WLPs) for switch transistors for multiple plate-lines within a bit-cell are driven by different signals, in accordance with some embodiments.

FIG. 9F illustrate timing diagram 960 for write operation for multi-element FE gain bit-cells with the PL parallel to the BL and where the word-lines (WLPs) for switch transistors for multiple plate-lines within a bit-cell are driven by different signals, in accordance with some embodiments. Here, the writeback scheme is the same as that in FIG. 9D, in accordance with some embodiments. In various embodiments, the read scheme in timing diagram 960 is the same scheme as that in FIG. 9E, except for the signals on other WLPs of the unselected capacitors of the same bit-cell are driven to 0V as opposed to the same value.

Figure 10A:
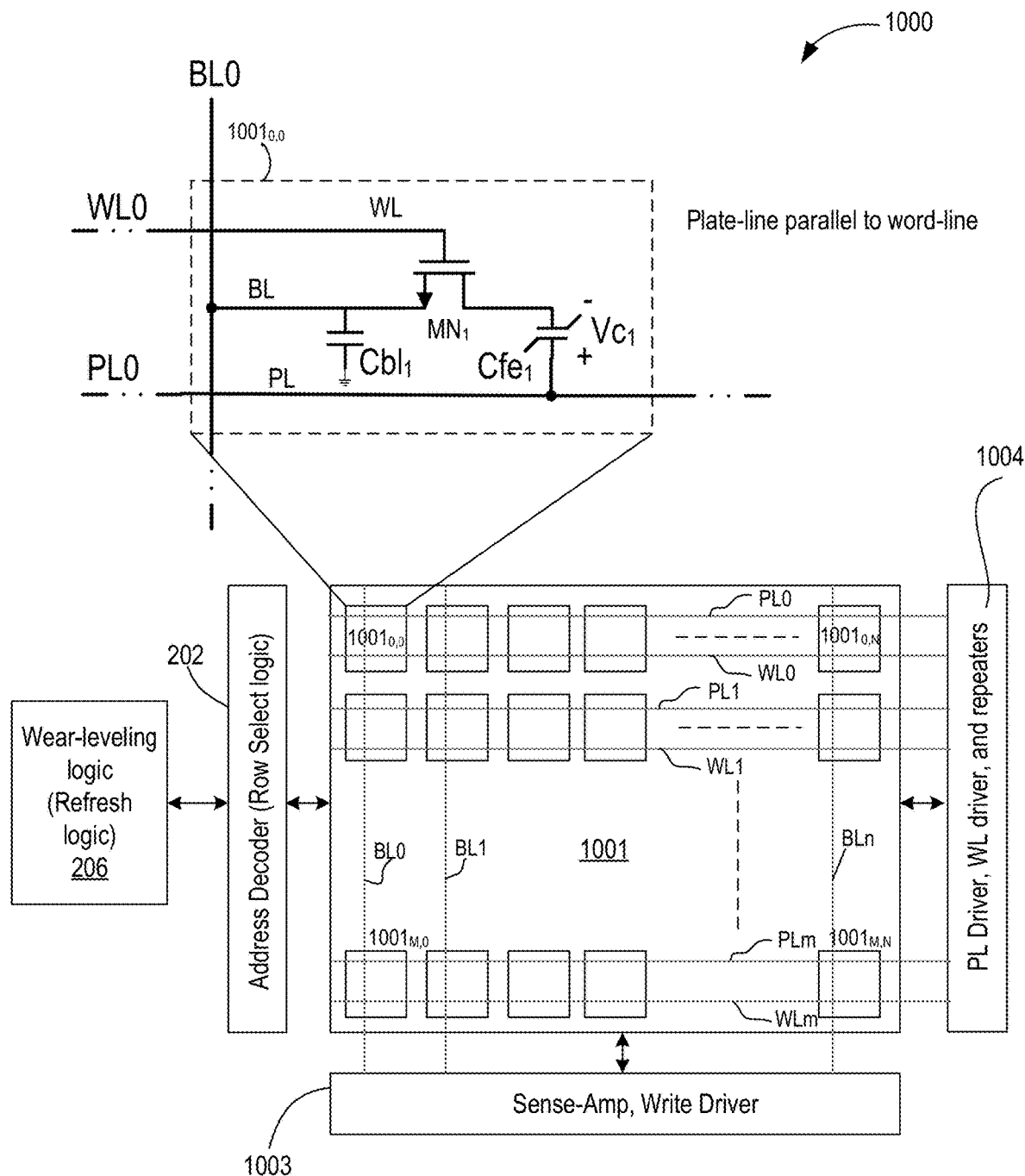
FIG. 10A illustrates an apparatus comprising memory and corresponding logic, wherein the memory comprises FE memory bit-cells, where an individual memory bit-cell includes one transistor and an FE capacitor with plate-line parallel to a word-line, where the corresponding logic is to apply word-line boosting, in accordance with some embodiments.

FIG. 10A illustrates apparatus 1000 comprising memory and corresponding logic, wherein the memory comprises FE memory bit-cells, where an individual memory bit-cell includes one transistor and an FE capacitor with plate-line parallel to a word-line, where the corresponding logic is to apply word-line boosting, in accordance with some embodiments.

Apparatus 1000 comprises M×N memory array 1001 of bit-cells, logic circuitry 202 for address decoding, and logic circuitry 1003 having sense amplifier, write drivers, and plate-line (PL) driver. The PLs PL0, PL1, through PLm are parallel to respective WLs WL0, WL1, through WLm, while BLs BL0, BL1, through BLn are orthogonal to PLs and WLs. In some embodiments, bit-cell $1001_{0,0}$ comprises a WL (e.g., WL0), a PL (PL0), and a BL (BL0). In some embodiments, bit-cell $1001_{0,0}$ comprises an n-type transistor $MN_1$, and FE capacitive structure $Cfe_1$. The gates of transistor $MN_1$ are coupled to a common WL (e.g., WL0). In various embodiments, one terminal of the FE capacitive structure $Cfe_1$ is coupled to a PL (e.g., PL0). The second terminal of the FE capacitive structure is coupled to the source or drain terminal of the transistor $MN_1$. In various embodiments, BL (e.g., BL0) is coupled to the source or drain terminal of first transistor $MN_1$. In some embodiments, a BL parasitic capacitor $Cbl_1$ is coupled to the source or drain terminal of the first transistor $MN_1$ and to a reference node (e.g., ground) such that the FE capacitor is not coupled to the same source or drain terminal. In some embodiments, the PL is parallel to the WL and orthogonal to the BL. In some embodiments, the FE capacitor is a planar capacitor. In some embodiments, the FE capacitor is a pillar or non-planar capacitor.

Logic circuitry 202 comprises address decoders for selecting a row of bit-cells and/or a particular bit-cell from M×N memory array 1001, where M and N are integers of same or different values. In some embodiments, logic circuitry 202 includes word-line drivers. In some embodiments, logic circuitry 203 comprises sense-amplifiers for reading the values from the selected bit-cell. Since the PL is parallel to the WL, in some embodiments, PL drivers and WL drivers are grouped together in logic 1004. In various embodiments, write drivers are used to write a particular value to a selected bit-cell. Here, a schematic of FE bit-cell $1001_{0,0}$ is illustrated. The same embodiments apply to other bit-cells of M×N array 1001.

In this example, a one-transistor one-capacitor (1T1C) bit cell is shown, but the embodiments are applicable to 1TnC bit-cell and multi-element FE gain bit-cell as described herein. As the PL is parallel to the WL, the BL drivers can be placed orthogonal to the region where the PL drivers and WL drivers are placed. In some embodiments, WL repeaters 205 are added to buffer the word-line signals along different memory arrays. In some embodiments, apparatus 1000 comprises wear-leveling logic 206 (also referred to as refresh logic) to refresh the contents of the memory bit-cells periodically or on a need-by-need basis.

In a PL parallel to WL topology, compared to the PL parallel to the BL topology, the inherent issue with the signal toggle associated with an unselected bit-cell seeing signal activity on the PL may not happen. Thus, the PL parallel to WL topology is more immune to disturb effects, as inherently in a 1T1C configuration. In the PL parallel to the WL, merely the selected cells see the activities on the PL and the WL. In this case, the BL activities on the un-selected bit-cells are masked by the transistors $MN_1$ of the un-selected bit-cells. In some embodiments, the PL parallel to WL topology helps enable longer retention, and promises non-volatility without requiring additional transistors as in the 2T1C bit-cell topology with PL parallel to the BL. In some embodiments, the PL parallel to WL topology also helps with amortizing the cost of PL switching. As PL switching causes more bit-cells to be read, the parasitic capacitance from the PL switching gets amortized across multiple bit-cells, as opposed to the case when the PL is parallel to the BL. In the bit-cell topology with PL parallel to the BL, PL capacitance switching cost is on a per bit-cell basis. In some examples, the bit-cell with PL parallel to WL topology comes with a cost of lower speed and lower array efficiency due to difficulties in implementing column-multiplexing technology. Thus, larger sense amplifier area may be used, which may adversely impact array efficiency. In some cases, the bit-cell with PL parallel to WL topology may use large PL drivers than for the case of bit-cells with PL parallel to the BL. In one such case, as every driver switches a greater number of ferroelectric capacitors, there may be loss in array efficiency.

Figure 10B:
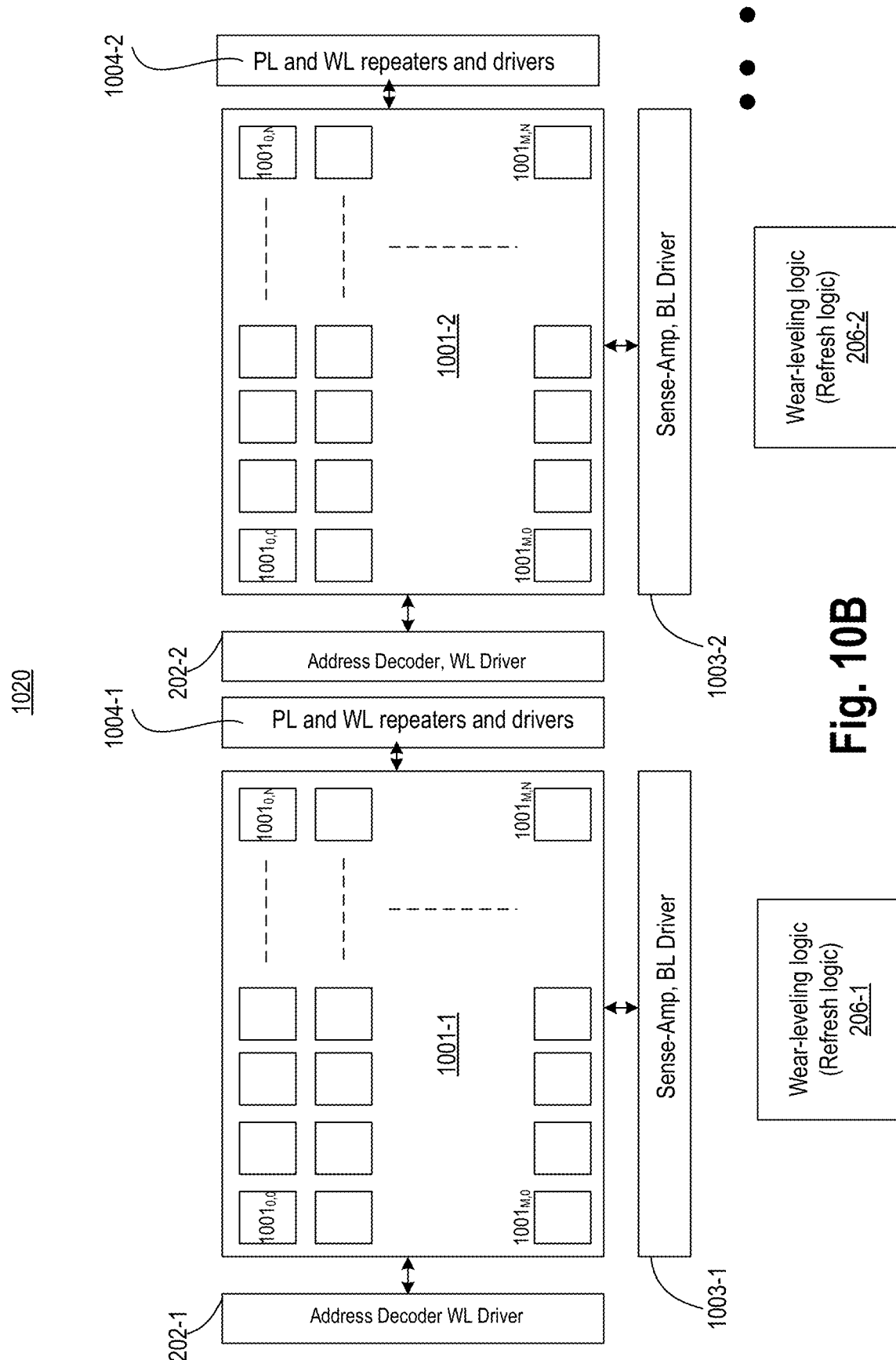
FIG. 10B illustrates an FE memory with word-line repeaters, wherein memory arrays of the FE memory have 1T1C bit-cells with the plate-line parallel to the word-line, in accordance with some embodiments.

FIG. 10B illustrates apparatus 1020 having FE memory with word-line repeaters, wherein memory arrays of the FE memory have 1T1C bit-cells with the plate-line parallel to the word-line, in accordance with some embodiments. Apparatus 1020 illustrates two instances of apparatus 1000. The two instances include first memory array 1001-1, logic circuitry 202-1 having first address decoder and/or WL driver, logic circuitry 1003-1 having first sense amplifier and BL driver, logic circuitry 1004-1 having PL and WL repeaters; and second memory array 1001-2, logic circuitry 202-2 having first address decoder and/or WL driver, logic circuitry 1003-2 having first sense amplifier and BL driver, and logic circuitry 1004-2 having PL and WL repeaters. In some embodiments, an individual instance of apparatus 1000 includes a corresponding wear-leveling logic 206 (e.g., wear-leveling logic 206-1 and wear-leveling logic 206-2).

In some embodiments, when the pulsing scheme described herein is combined with the refresh function by wear-leveling logic 206-1 and wear-leveling logic 206-2, disturb issues on unselected bit-cells are mitigated. While two memory arrays are shown (e.g., array 1001-1 and 1001-2), any number of arrays may be part of apparatus 1020. With PL parallel to the WL and orthogonal to the BL, logic circuitries 1004-1 and 1004-2 etc., having PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

FIG. 10C illustrates timing diagram 1030 for write operation for 1T1C FE memory bit-cells with plate-line parallel to the word-line, where the write operation involves word-line boosting, in accordance with some embodiments. In this case, PL is parallel to the WL. Depending on whether logic 1 (Write 1) or logic 0 (Write 0) is being written to the capacitor with non-linear polar material, BL or PL for that bit-cell is asserted from 0V to Vdd (power supply level). For example, BLx is initially forced to zero volts, and then pulsed to Vdd to write a logic 1, or continues to remain at 0V to write 0 to the bit-cell. In various embodiments, when BLx is set to write a logic 1 or a logic 0, the selected PL (e.g., PL1) is pulsed within the duration when BLx is set to write a logic 1 or a logic 0. For example, PL1 is pulsed within a pulse width of BLx during a logic write 1 operation.

In various embodiments, write operation begins when WL is asserted and boosted above Vdd. The boost level is Vboost which may be 10% to 50% of Vdd. In one example, Vboost is about 1× to 1.5× of a threshold voltage (Vt) of transistor MN of the 1T1C bit-cell.

Since, the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd-Vt.

For the bit-cell topology with PL parallel to the WL, the word-line boosting is used as otherwise it can lead to a buildup of a voltage level of approximately 2× Vdd, when BL line is at Vdd, and PL voltage rises from 0V to Vdd. Since, with WL at Vdd, the transistor $MN_1$ can be off with BL at Vdd, the storage node will sit at Vdd-Vt when PL is at 0V. After that when PL goes from 0V to Vdd, the internal node can jump to 2Vdd-Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and thus yield issues.

When a particular bit-cell (e.g., $1001_{0,0}$) is being written to (here cell associated with WL1), the WLs for unselected bit-cells (e.g., WL0, WL1, through WLm) remains at 0V. Same is done for unselected PLy (e.g., PL0, PL2, ... PLm) by column multiplexers. Column multiplexing may reduce an overhead of the peripheral circuitry (not shown). In some embodiments, column multiplexing may not be used to avoid any disturb effect on unselected bit-cells. In some embodiments, the unselected BLs (e.g., BLy) are set to a voltage between 0V and Vdd (e.g., Vdd/2) by column multiplexers. In some embodiments, the pulse width of the unselected BLs is substantially the same as the pulse width of the boosted WL (e.g., WL1).

In this example, the selected WL is WL0 and selected BL and PL are BLx (e.g., BL0) and PL0, respectively. In various embodiments, the BL and PL for the selected bit-cell are asserted and de-asserted within a pulse width of the boosted WL (e.g., WL0). In some embodiments, the voltage swing for BL and PL is between 0 to Vdd. In some embodiments, BL or PL pulse is generated after a predetermined or programmable time from when WL boost starts.

Figure 10D:
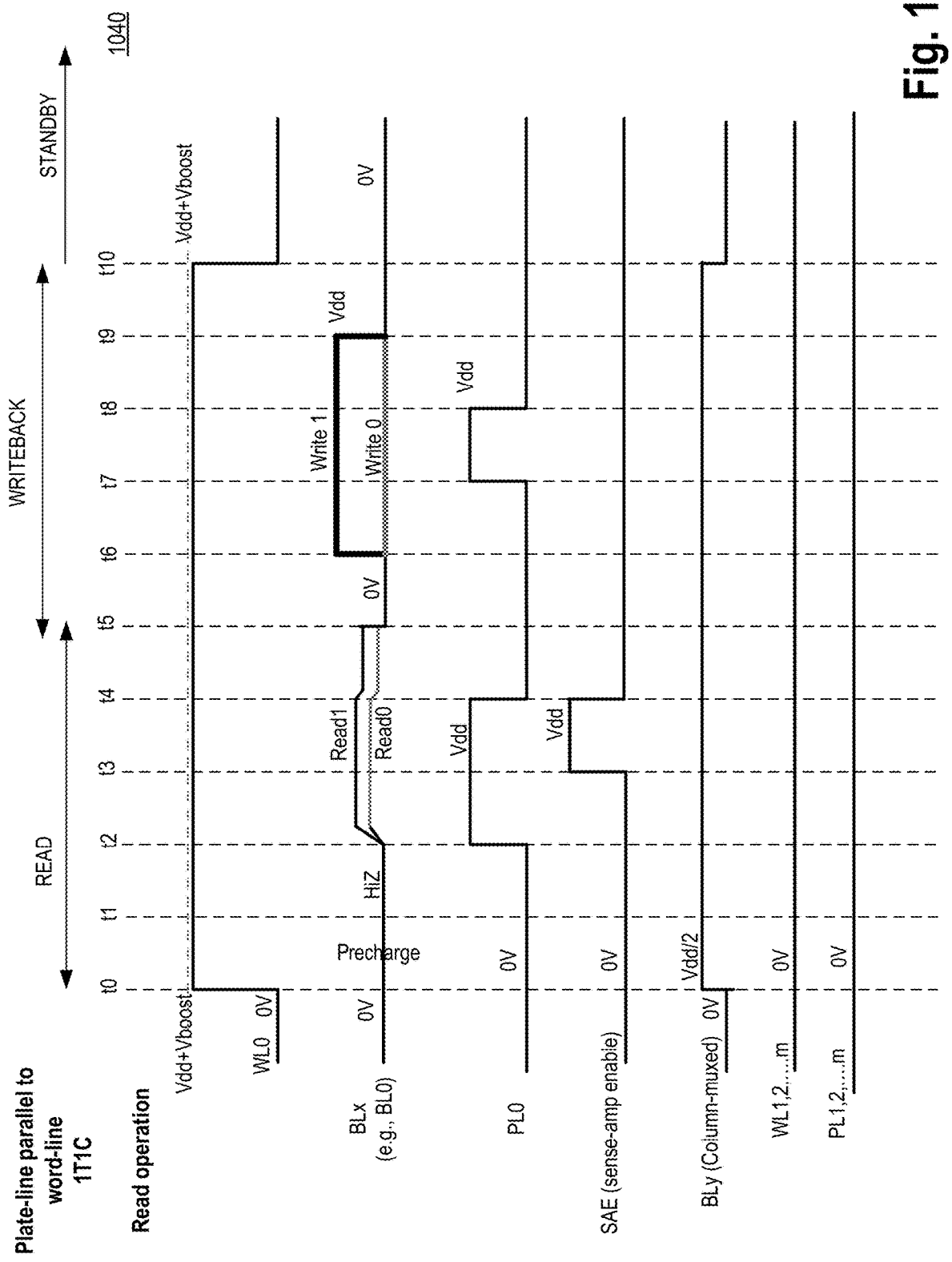
FIG. 10D illustrates a timing diagram for read operation for 1T1C FE memory bit-cells with the plate-line parallel to the word-line, where the read operation involves word-line boosting, in accordance with some embodiments.

FIG. 10D illustrates timing diagram 1040 for read operation for 1T1C FE memory bit-cells with the plate-line parallel to the word-line, where the read operation involves word-line boosting, in accordance with some embodiments. In some embodiments, read operation begins by asserting the selected WL. In some embodiments, the selected WL is boosted for read operation. Selected WL (e.g., WL0) is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL (e.g., PL0) is asserted for the bit-cell which is being read. PL0 is asserted for a time period long enough for the sense amplifier to sense the value stored on the storage node coupled to the capacitor. In various embodiments, sense amplifier enable signal (SAE) is asserted within the pulse width of the PL0. In some embodiments, to read data from the storage node, BL is first set or forced to zero volts and then allowed to float (e.g., BL driver goes into high impedance state Z (HiZ)). In some embodiments, BL0 is precharged to a certain voltage or a programmable voltage. So, when the WL is selected, in conjunction with the PL voltage, a field is created across the FE capacitor.

Thereafter, the BL driver is configured in high impedance state, the selected BL0 is floated, which allows the sense amplifier to sense the voltage on the storage node via the BL (e.g., BL0). In some embodiments, the sense amplifier is configured to sense the voltage on the BL by comparing it to one or more thresholds. In some embodiments, when BL (e.g., BL0) charges to a first voltage level, a logic 0 is read (Read0). In some embodiments, when BL (e.g., BL0) charges to a second voltage level (higher than the first voltage level), a logic 1 is read (Read1). In some embodiments, after the sense amplifier is disabled (SAE is set to 0, in this example), the voltage on the selected BL is forced to zero volts. In some embodiments, after the selected BL is forced to 0V, the write back process begins.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 10C. In various embodiments, the WL for the unselected bit-cells is set to 0V (e.g., WL1, WL2, ... WLm is set to 0 when the selected WL0 is selected). In various embodiments, the BL for the unselected bit-cells (e.g., BLy) is set between 0 and Vdd (e.g., Vdd/2) by column multiplexing, for example, during the read and writeback operations.

One reason for setting BLy to Vdd/2 is to minimize the disturb effects on the column-multiplexed BLs, as for them the PL voltage still toggles between 0V to Vdd. If BLy is set to Vdd/2, then the disturb fields are limited to +/−Vdd/2, in accordance with some embodiments. In some embodiments, to minimize the disturb effect it may not be desirable to do any column multiplexing itself, as it may mean loss of retention characteristic over long time scale to other bit-cells that are not getting programmed, as +/−Vdd/2 disturb may cause fast retention loss.

This is done to minimize the disturb effects on the column-muxed BLs, as for them the PL voltage still toggles between 0 to 1. If BLy is set to Vdd/2, then the disturb fields are limited to +/−Vdd/2. Note: in some embodiments, to minimize disturb affect one may not want to do any column muxing itself, as it means loss of retention characteristic over long time scale to other cells that are not getting programmed, as +/−Vdd/2 disturb may cause fast retention loss. In some embodiments, the PLs for the unselected bit-cell (e.g., PL1, PL2, . . . PLm) is set to 0V during read and writeback operations. In some embodiments, the WLs for the unselected bit-cell (e.g., WL1, WL2, . . . WLm) is set to 0V during read and writeback operations.

Figure 11A:
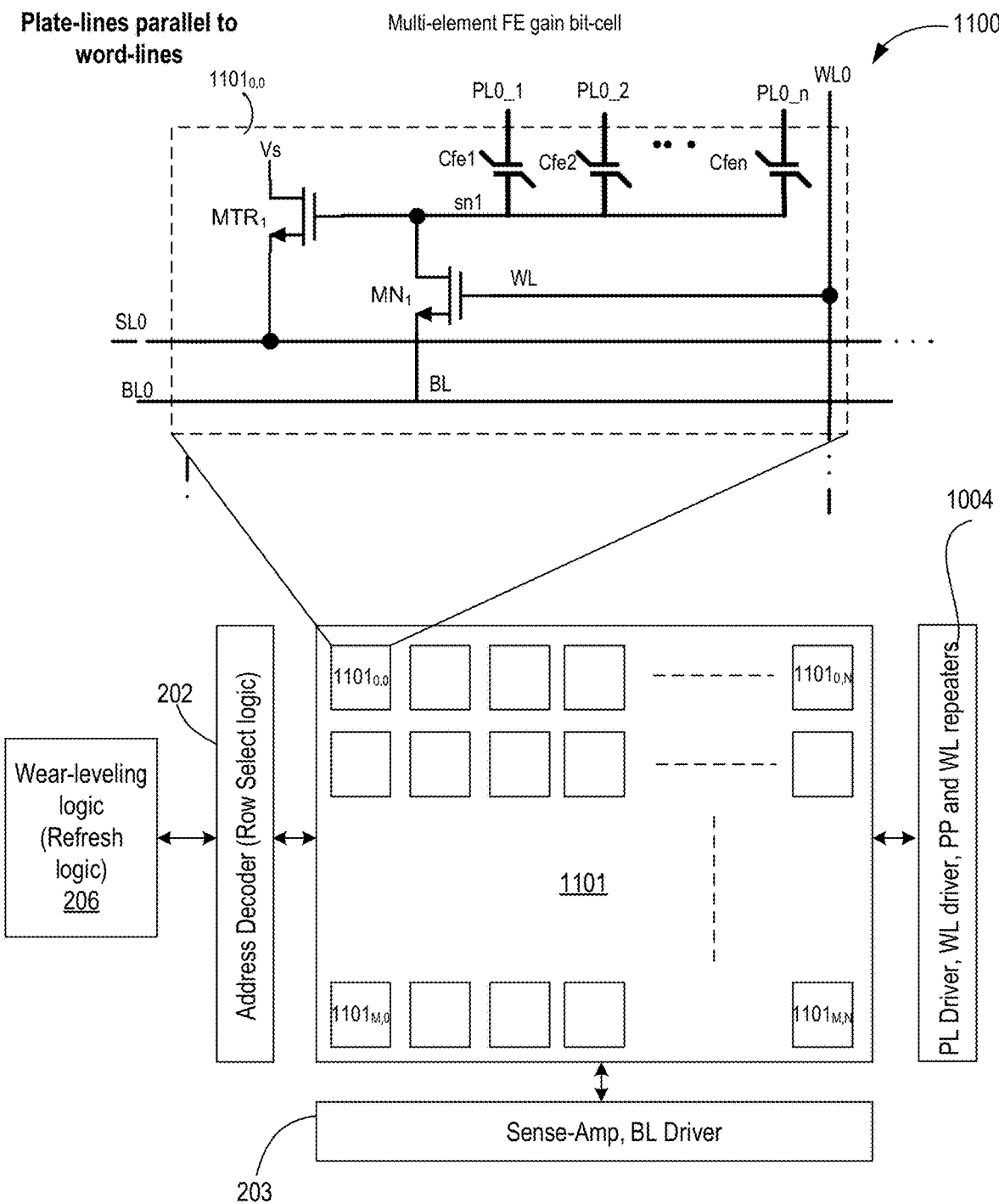
FIG. 11A illustrates an apparatus comprising memory and corresponding logic, wherein the memory comprises FE memory bit-cells, where an individual memory bit-cell is multi-element FE gain bit-cell with plate-lines parallel to a word-line, where the corresponding logic is to apply word-line boosting, in accordance with some embodiments.

FIG. 11A illustrates apparatus 1100 comprising memory and corresponding logic, wherein the memory comprises FE memory bit-cells, where an individual memory bit-cell is multi-element FE gain bit-cell with plate-lines parallel to a word-line, where the corresponding logic is to apply word-line boosting, in accordance with some embodiments. Apparatus 1100 is like apparatus 820 of FIG. 8B but for WL parallel to PLs. In some embodiments, each memory bit-cell in memory array 1101 is organized in rows and columns like in apparatus 820. For example, memory bit-cells $1101_{0,0}$ through $1101_{M,N}$ are organized in an array. Like in FIG. 10A, where WL is parallel to PL, PL drivers and WL drivers are lumped in logic 1004 orthogonal to BL drivers in logic circuitry 203, in accordance with some embodiments.

Figure 11B:
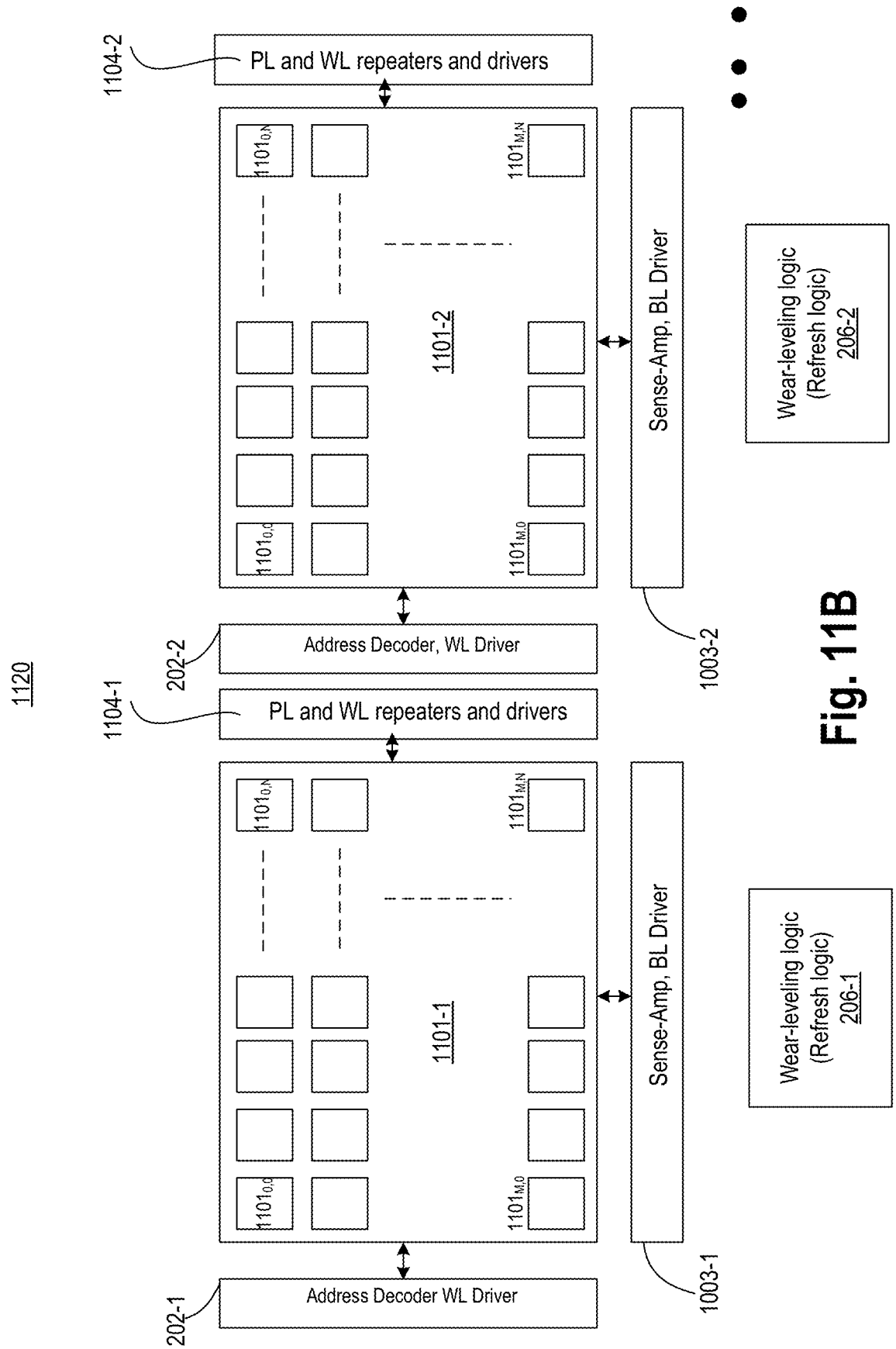
FIG. 11B illustrates an apparatus having FE memory with word-line repeaters, wherein memory arrays of the FE memory having multi-element FE gain bit-cells with the plate-lines parallel to the word-line, in accordance with some embodiments.

FIG. 11B illustrates apparatus 1120 having FE memory with word-line repeaters, wherein memory arrays of the FE memory have 1TnC bit-cells with the plate-lines parallel to the word-line, in accordance with some embodiments. Apparatus 1120 illustrates two instances of apparatus 1100. The two instances include first memory array 1101-1, logic circuitry 202-1 having first address decoder and/or WL driver, logic circuitry 1003-1 having first sense amplifier and BL driver, logic circuitry 1104-1 having PL and WL repeaters; second memory array 1101-2, logic circuitry 202-2 having first address decoder and/or WL driver, logic circuitry 1003-2 having first sense amplifier and BL driver, and logic circuitry 1104-2 having PL and WL repeaters. In some embodiments, an individual instance of apparatus 1100 includes a corresponding wear-leveling logic 206 (e.g., wear-leveling logic 206-1 and wear-leveling logic 206-2). In some embodiments, when the pulsing scheme described herein is combined with the refresh function by wear-leveling logic 206-1 and wear-leveling logic 206-2, disturbance issues on unselected bit-cells are mitigated. While two memory arrays are shown (e.g., memory arrays 1101-1 and 1101-2), any number of arrays may be part of apparatus 1120. With PL parallel to the WL and orthogonal to logic circuitries 1104-1, 1104-2 etc. having BL, PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

Figure 11C:
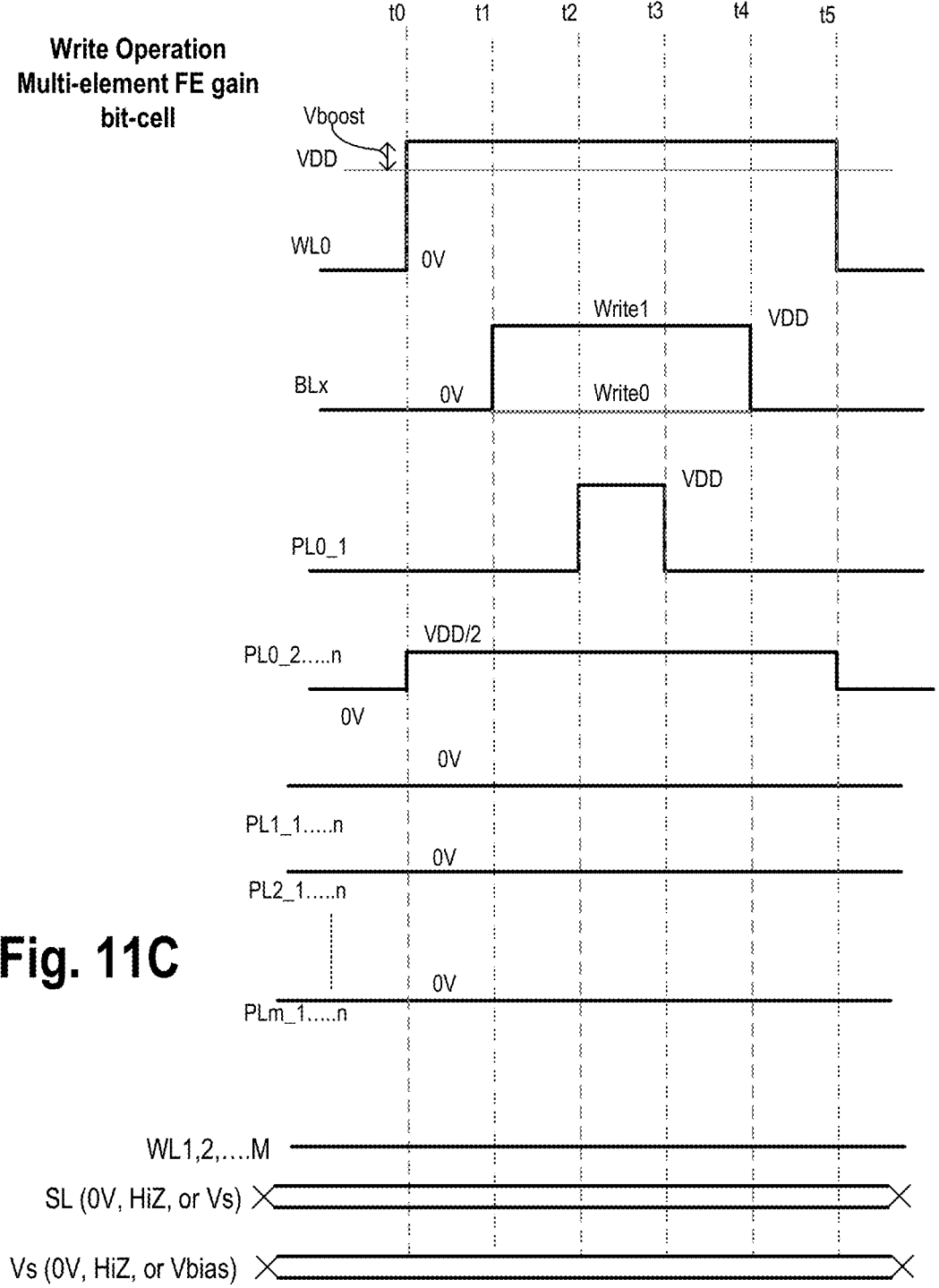
FIG. 11C illustrates a timing diagram for write operation for multi-element FE gain bit-cells with plate-line parallel to the word-line, where the write operation involves word-line boosting, in accordance with some embodiments.

FIG. 11C illustrates timing diagram 1130 for write operation for multi-element FE gain bit-cells with plate-line parallel to the word-line, where the write operation involves word-line boosting, in accordance with some embodiments. In this case, PLs are parallel to the WL. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., $1101_{0,0}$) is asserted from 0V to Vdd (power supply level). Other WLs or PLs not part of the bit-cell are forced to 0V. In some embodiments, other PLs (e.g., PL0_2, PL0_3, . . . PL0_n) of the selected bit-cell (e.g., $1101_{0,0}$) are set between 0 and Vdd (e.g., Vdd/2). In some embodiments, PL of the unselected bit-cells (e.g., PL1_0, . . . PL1_n to PLm_0, . . . PLm_n) are set to 0V. In some embodiments, the WLs for the unselected bit-cells (e.g., WL1, WL2, . . . WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor MN of the 1T1C bit-cell. Since, the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd-Vt.

For the bit-cell topology with PL parallel to the WL, the word-line boosting is used as otherwise it can lead to a buildup of a voltage level of approximately 2× Vdd on the storage node sn1, when BL line is at Vdd, and PL goes from 0V to Vdd. Since, with WL at Vdd, the transistor $MN_1$ can be off with BL at Vdd, the storage node sn1 will sit at Vdd-Vt when PL is at 0V. After that when PL goes from 0V to Vdd, the internal node can jump to 2Vdd-Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., $1101_{0,o}$) is being written to, the WL for unselected bit-cells (e.g., WL0 through WLm) remains at 0. Same is done for unselected PLs as illustrated. Timing diagram 1130 is a first order diagram without column multiplexing. A person skilled in the art would appreciate that column multiplexing is used for accessing memory bit-cells in an array. Here. all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce an overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, . . . PL0_n), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_n are forced to 0V, and likewise PL2_1, PL2_2, through PL2_n are forced to 0V, and so on).

PLs (e.g., PL0_2 through n) within the same selected bit-cell (e.g., 1101$_{0,o}$) are charged to Vdd/2, in accordance with various embodiments. In some embodiments, PL for unselected bit-cells remains at 0V while PL0_1 is being used to program capacitor Cfe1. Word-lines of unselected bit-cells are set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 11D:
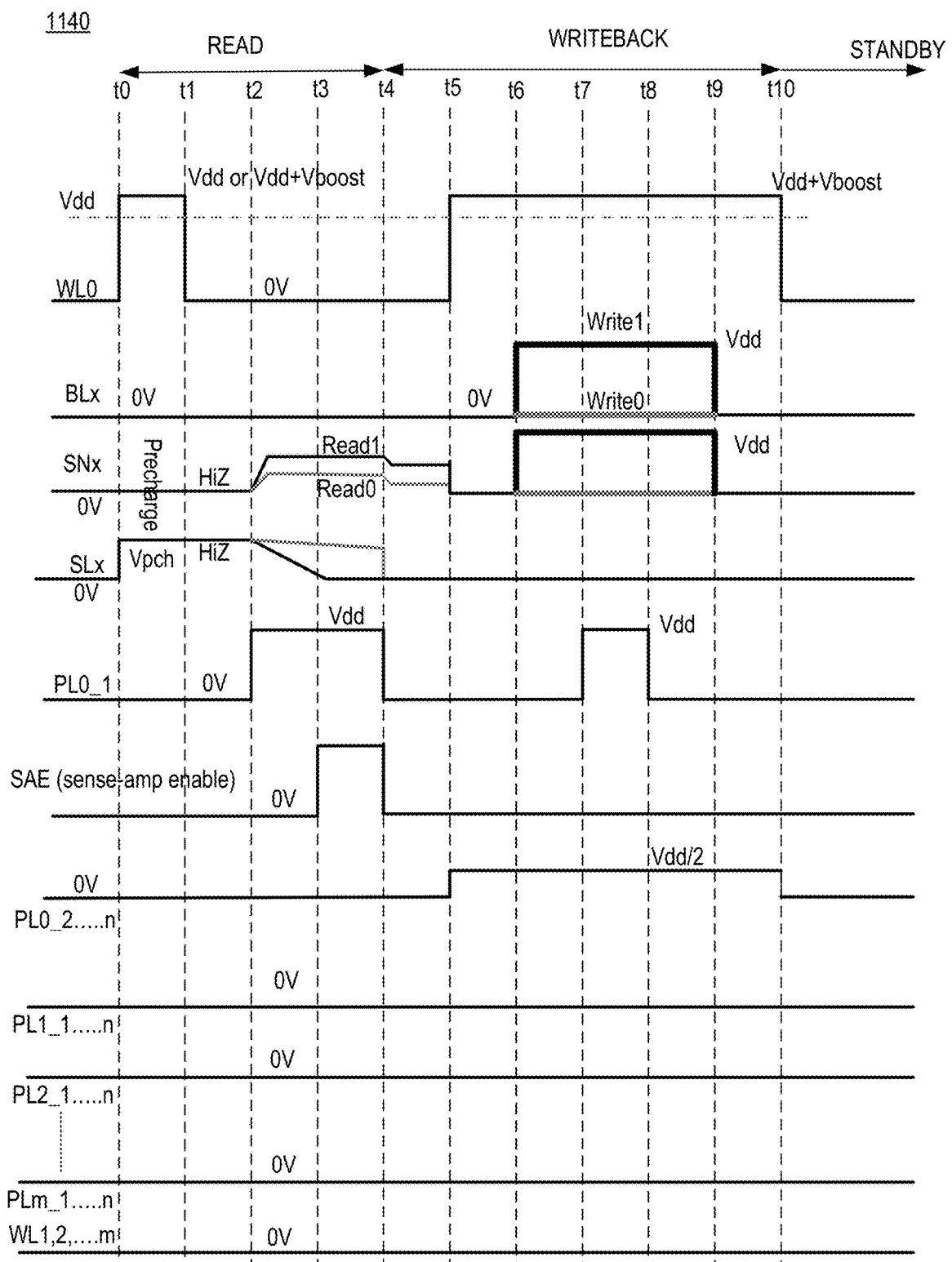
FIG. 11D illustrates a timing diagram for read operation for multi-element FE gain bit-cells with plate-line parallel to the word-line, where the read operation involves word-line boosting, in accordance with some embodiments.

FIG. 11D illustrates timing diagram 1140 for read operation for multi-element FE gain bit-cells with plate-line parallel to the word-line, where the read operation involves word-line boosting, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL for the desired FE capacitor is toggled, which results into voltage buildup on the SNx node. The voltage build-up on the SNx node may be different voltage levels depending upon whether the FE capacitor state was logic 0 or logic 1. Due to different voltage levels on the SNx node, the gain transistor MTR$_1$ may have different conduction properties, which reduces the voltage levels on the SLx node over time with different rates. For example, if SNx node voltage is corresponding to a logic 0 state, the conductance of the gain transistor MTR$_1$ could be lower, and SLx voltage may decay slowly. For a logic 1 state, the conductance of the gain transistor MTR$_1$ could be higher and may result into the SLx voltage going down faster. The time-sampling of this voltage relative to a reference expected value, results in detection of the state in which the FE capacitor was programmed. After reading the value, a write-back operation can be done to get the value restored to the FE capacitor, as reads are destructive reads in this configuration, in accordance with some embodiments.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 11C. Here, here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

Figure 12A:
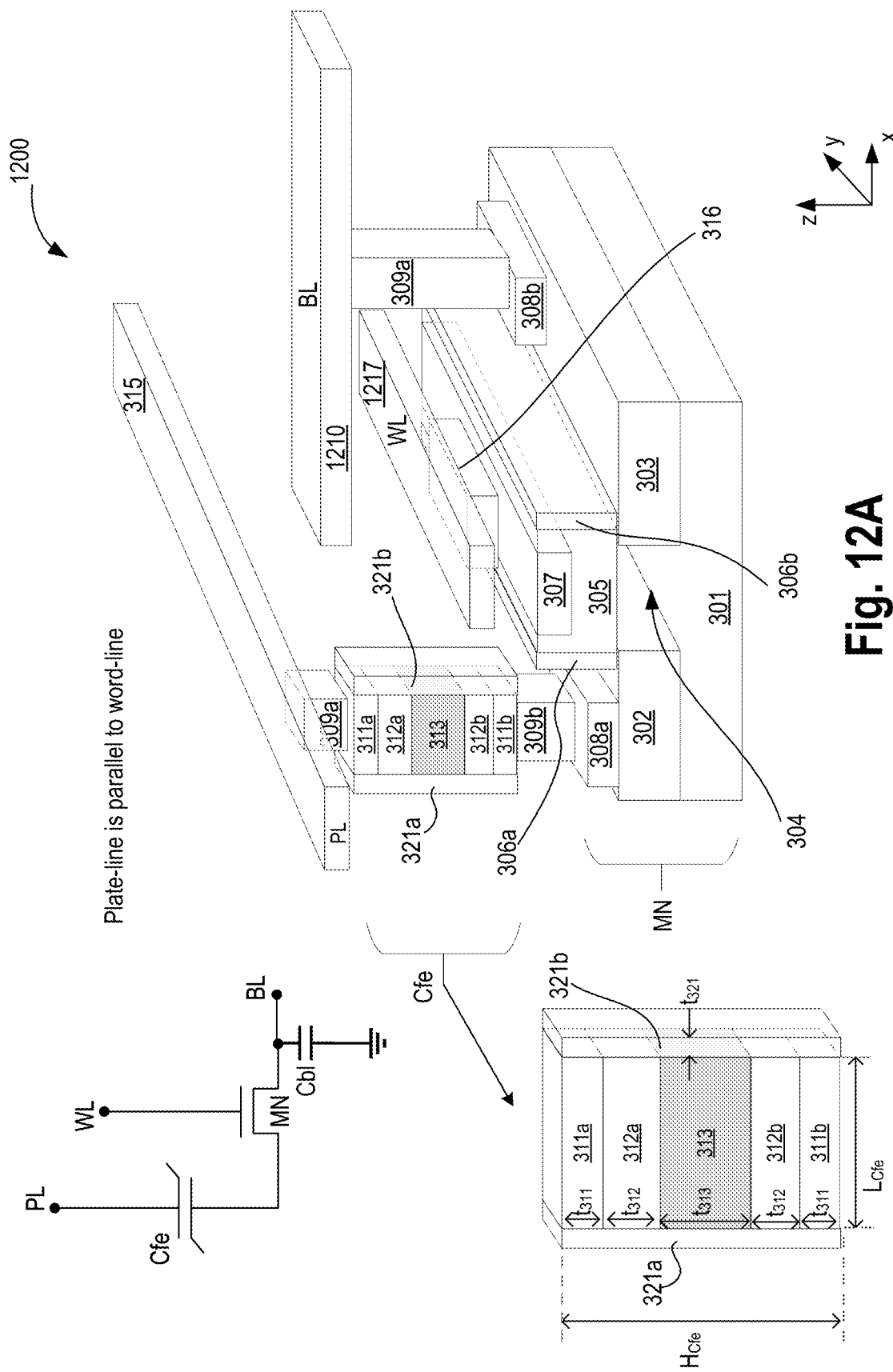
FIG. 12A illustrates a 3D view of a 1T1C FE bit-cell with the plate-line parallel to the word-line, where the transistor is a planar transistor and where the capacitor is a planar capacitor, where the bit-line is at a lower metal level than the plate-line, in accordance with some embodiments.

FIG. 12A illustrates a 3D view of a 1T1C FE bit-cell 1200 with the plate-line parallel to the word-line, where the transistor is a planar transistor and where the capacitor is a planar capacitor, where the bit-line is at a lower metal level than the plate-line, in accordance with some embodiments. 1T1C FE bit-cell 1200 is similar as 1T1C FE bit-cell 300 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 12B:
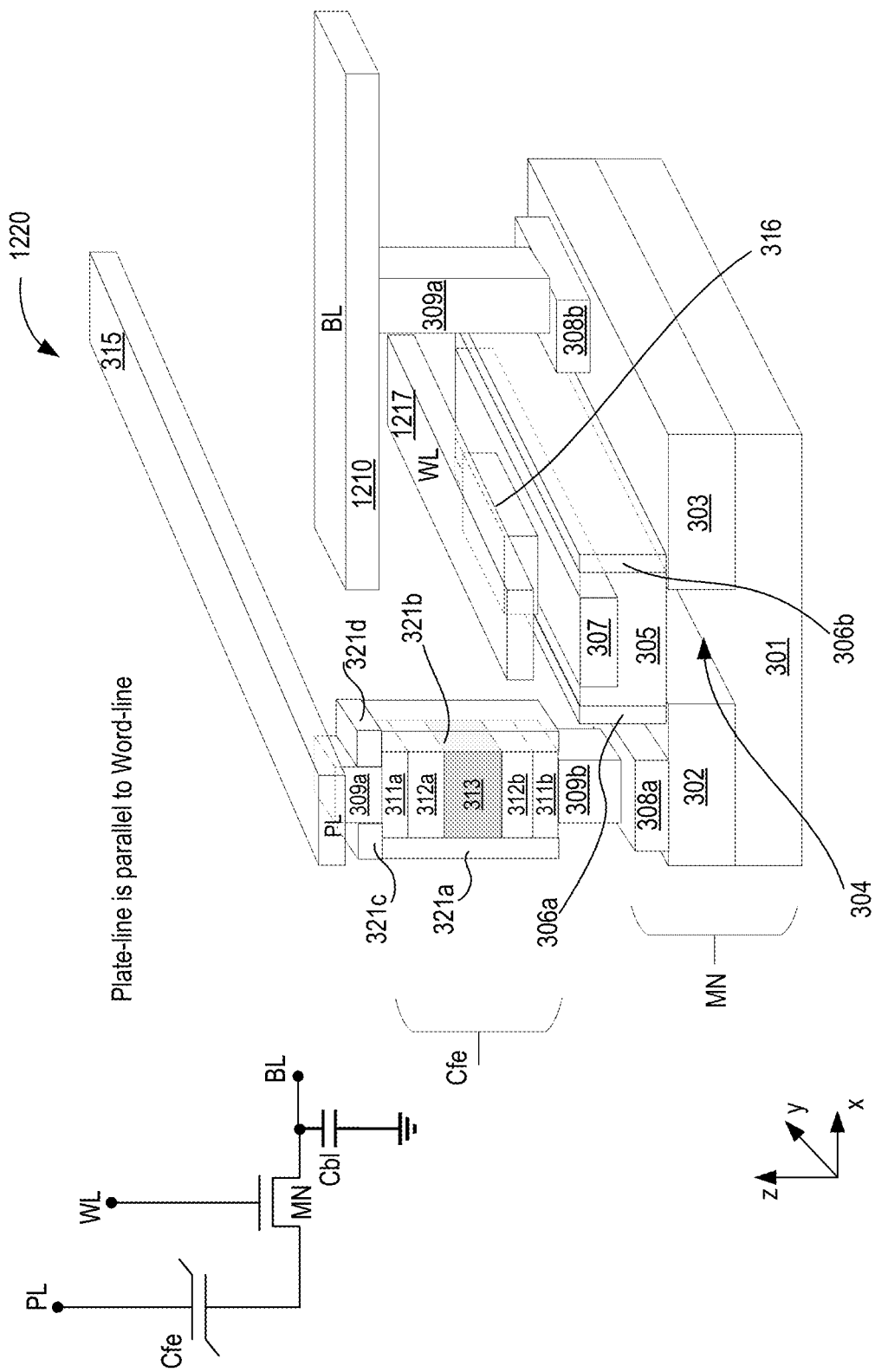
FIG. 12B illustrates a 3D view of a 1T1C FE bit-cell with the plate-line parallel to the word-line, where the transistor is a planar transistor and where the capacitor is a planar capacitor with partial encapsulation, where the bit-line is at a lower metal level than the plate-line, in accordance with some embodiments.

FIG. 12B illustrates a 3D view of 1T1C FE bit-cell 1220 with the PL parallel to the WL, where the transistor is a planar transistor and where the capacitor is a planar capacitor with partial encapsulation, where the bit-line is at a lower metal level than the plate-line, in accordance with some embodiments. 1T1C FE bit-cell 1220 is like 1T1C FE bit-cell 320 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 12C:
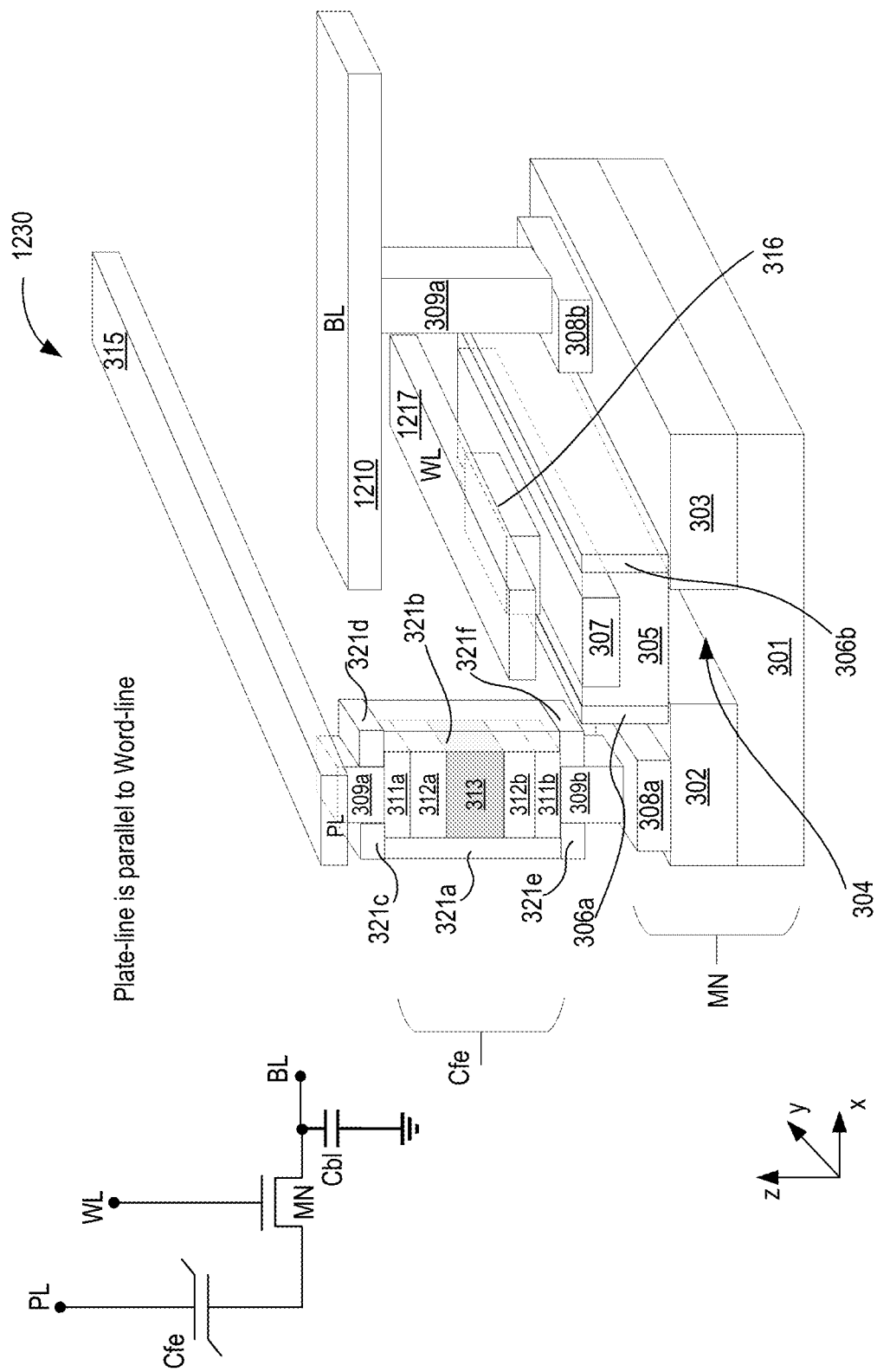
FIG. 12C illustrates a 3D view of a 1T1C FE bit-cell with the plate-line parallel to the word-line, where the transistor is a planar transistor and where the capacitor is a planar capacitor with full encapsulation, where the bit-line is at a lower metal level than the plate-line, in accordance with some embodiments.

FIG. 12C illustrates a 3D view of 1T1C FE bit-cell 1230 with the PL parallel to the WL, where the transistor is a planar transistor and where the capacitor is a planar capacitor with full encapsulation, where the bit-line is at a lower metal level than the plate-line, in accordance with some embodiments. 1T1C FE bit-cell 1230 is like 1T1C FE bit-cell 330 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 12D:
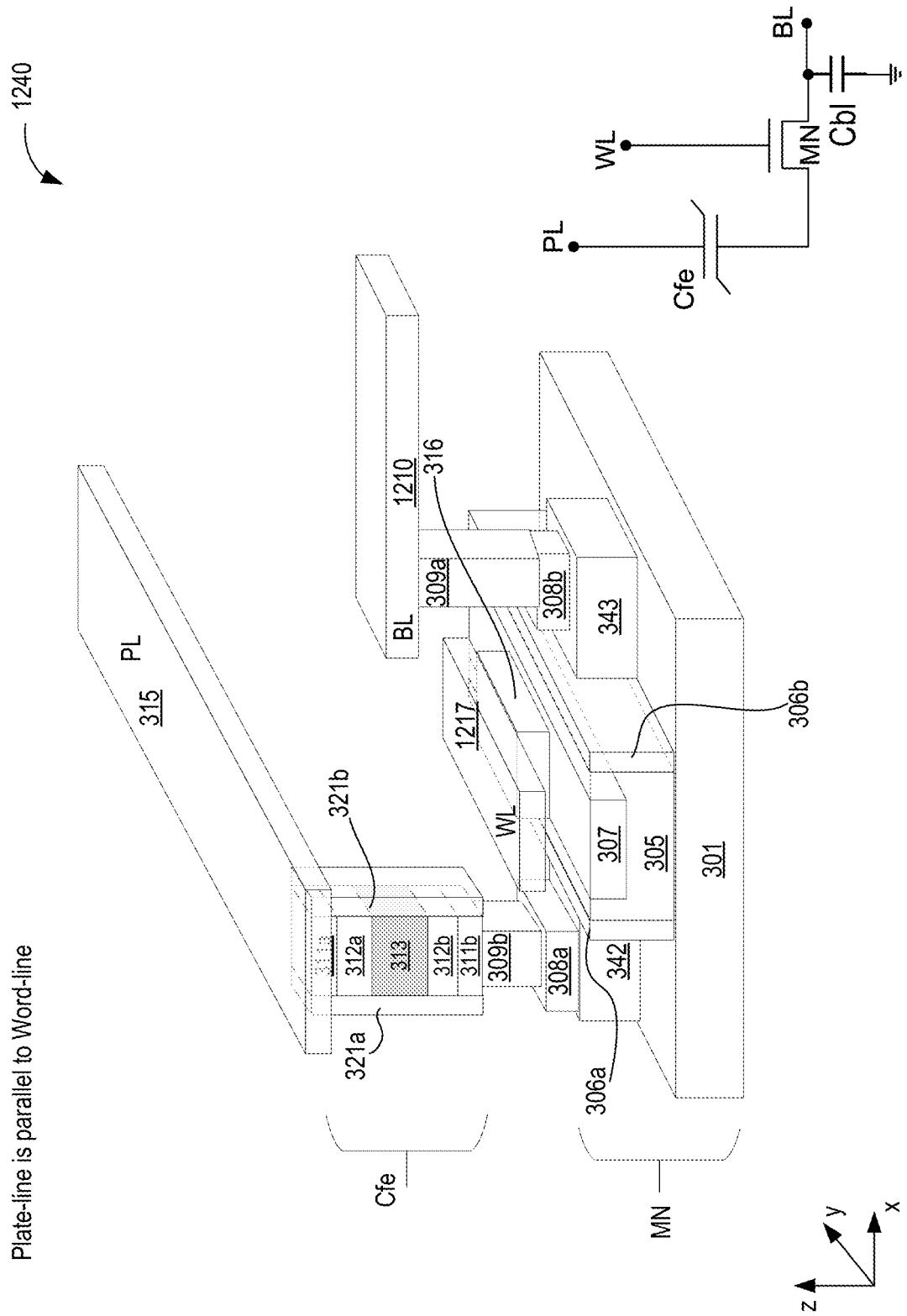
FIG. 12D illustrates a 3D view of 1T1C FE bit-cell with the plate-line parallel to the word-line, where the transistor is a non-planar transistor and where the capacitor is a planar capacitor, where the bit-line is at a lower metal level than the plate-line, in accordance with some embodiments.

FIG. 12D illustrates a 3D view of 1T1C FE bit-cell 1240 with the plate-line parallel to the word-line, where the transistor is a non-planar transistor and where the capacitor is a planar capacitor, where the bit-line is at a lower metal level than the plate-line, in accordance with some embodiments. 1T1C FE bit-cell 1240 is similar as 1T1C FE bit-cell 340 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 12E:
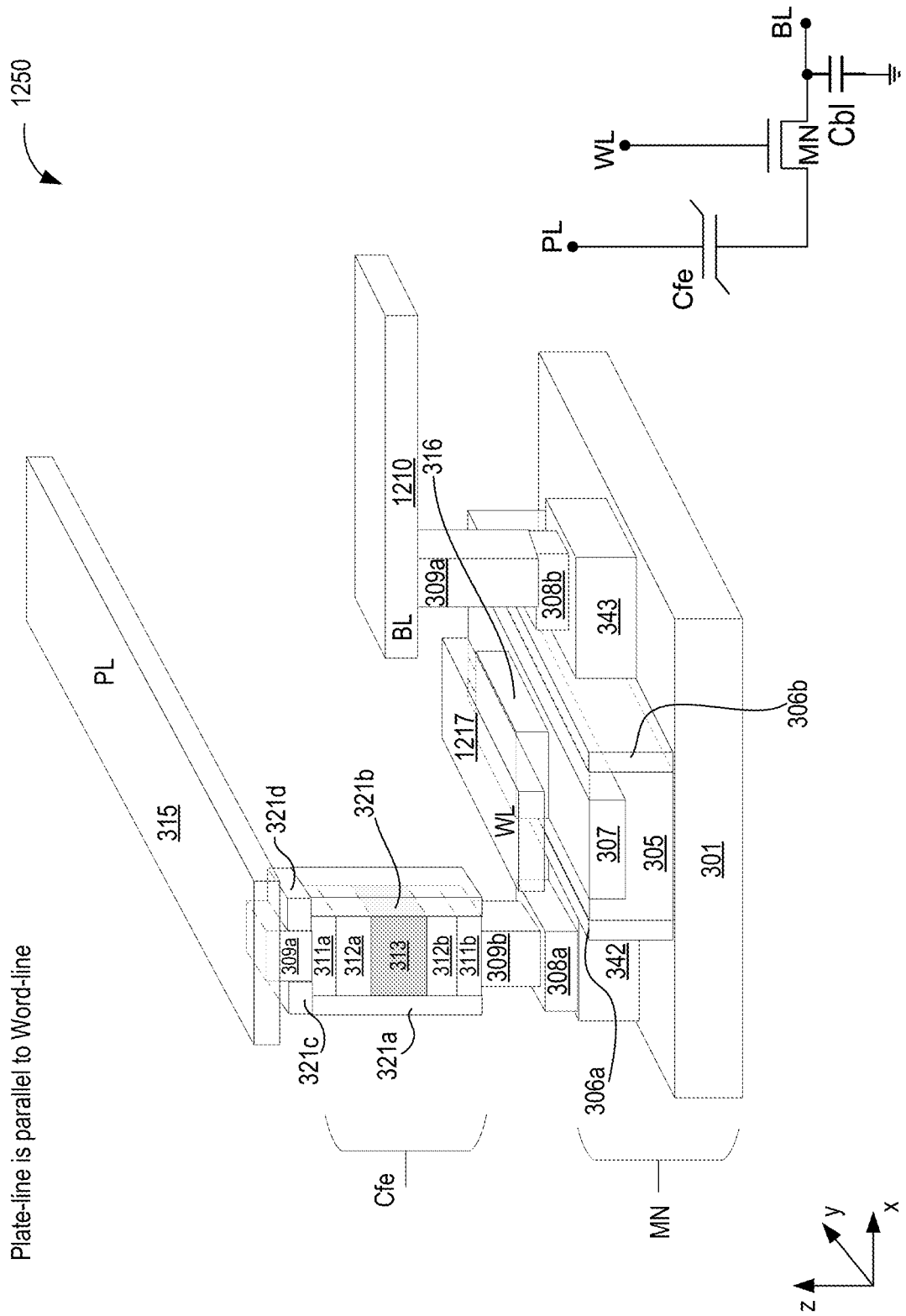
FIG. 12E illustrates a 3D view of a 1T1C FE bit-cell with the plate-line parallel to the word-line, where the transistor is a non-planar transistor and where the capacitor is a planar capacitor with partial encapsulation, where the bit-line is at a lower metal level than the plate-line, in accordance with some embodiments.

FIG. 12E illustrates a 3D view of a 1T1C FE bit-cell 1250 with the PL parallel to the WL, where the transistor is a non-planar transistor and where the capacitor is a planar capacitor with partial encapsulation, where the bit-line is at a lower metal level than the plate-line, in accordance with some embodiments. 1T1C FE bit-cell 1250 is like 1T1C FE bit-cell 350 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 12F:
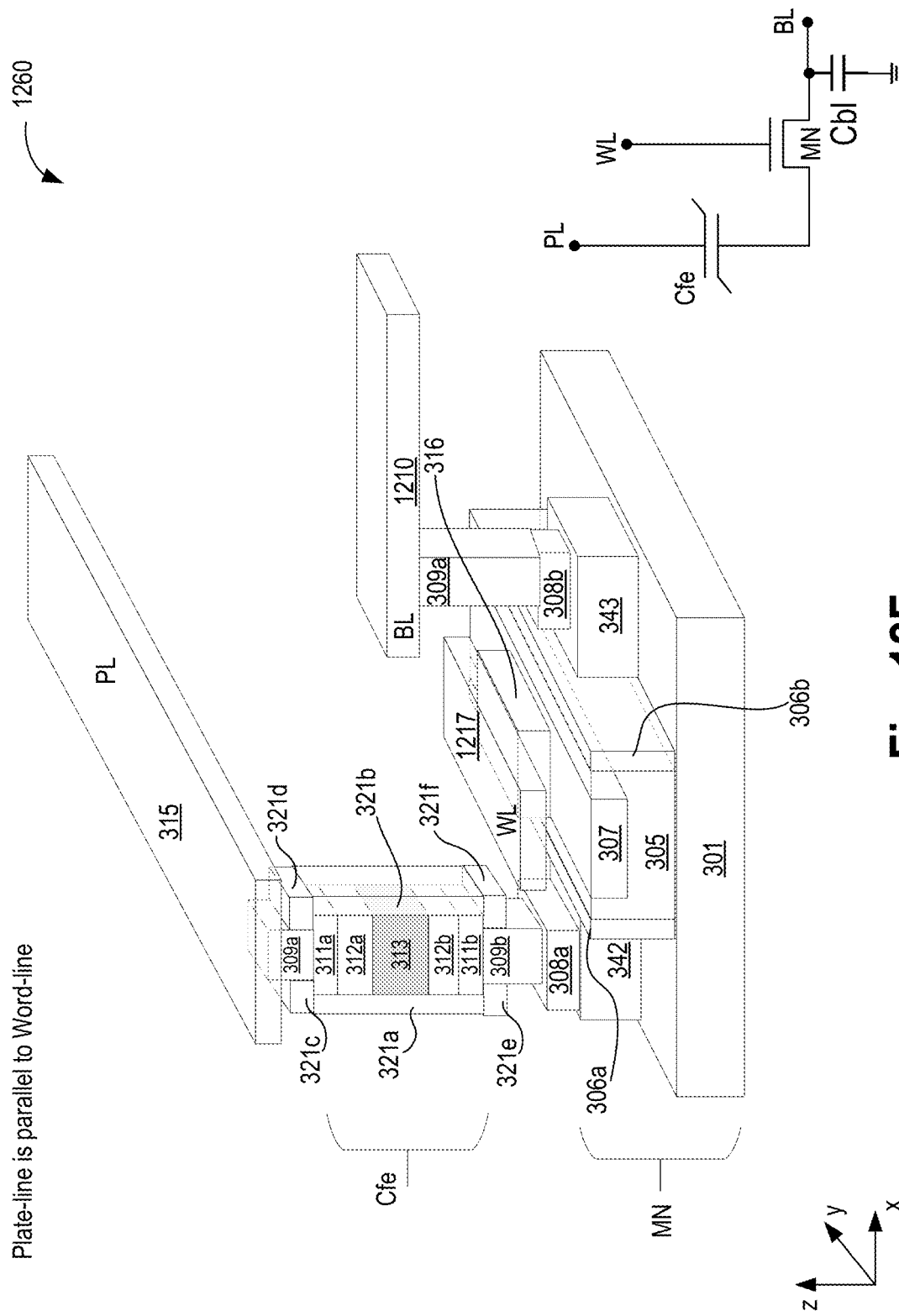
FIG. 12F illustrates a 3D view of a 1T1C FE bit-cell with the plate-line parallel to the word-line, where the transistor is a non-planar transistor and where the capacitor is a planar capacitor with full encapsulation, where the bit-line is at a lower metal level than the plate-line, in accordance with some embodiments.

FIG. 12F illustrates 3D view of a 1T1C FE bit-cell 1260 with the PL parallel to the WL, where the transistor is a non-planar transistor and where the capacitor is a planar capacitor with full encapsulation, where the bit-line is at a lower metal level than the plate-line, in accordance with some embodiments. 1T1C FE bit-cell 1260 is like 1T1C FE bit-cell 360 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 13A:
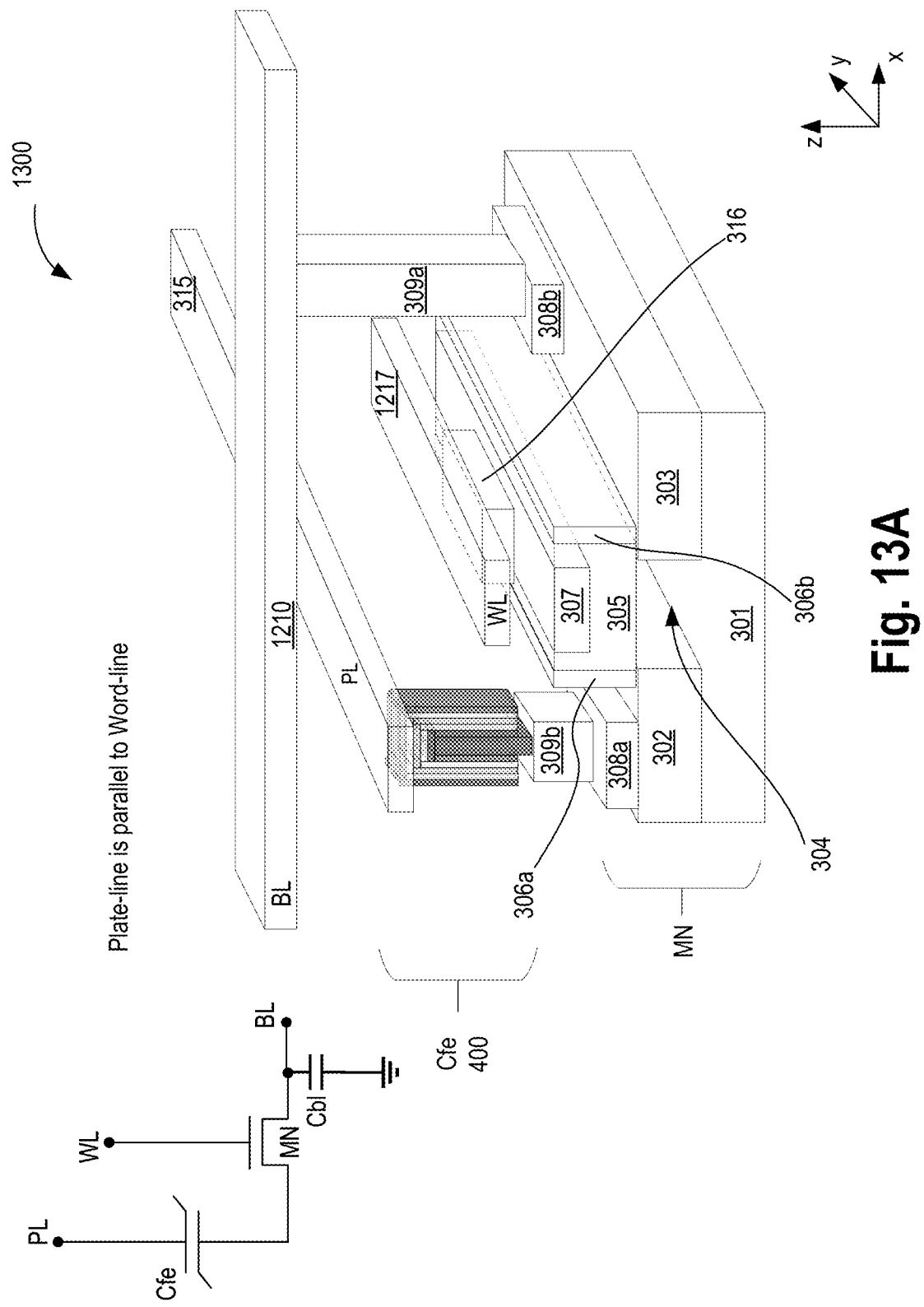
FIG. 13A illustrates a 3D view of a 1T1C FE bit-cell with the plate-line parallel to the word-line, where the transistor is a planar transistor and where the capacitor is a non-planar capacitor, where the bit-line is at a higher metal level than the plate-line, in accordance with some embodiments.

FIG. 13A illustrates 3D view of a 1T1C FE bit-cell 1300 with the PL parallel to the WL, where the transistor is a planar transistor and where the capacitor is a non-planar capacitor, where the bit-line is at a higher metal level than the plate-line, in accordance with some embodiments. 1T1C FE bit-cell 1300 is like 1T1C FE bit-cell 420 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 13B:
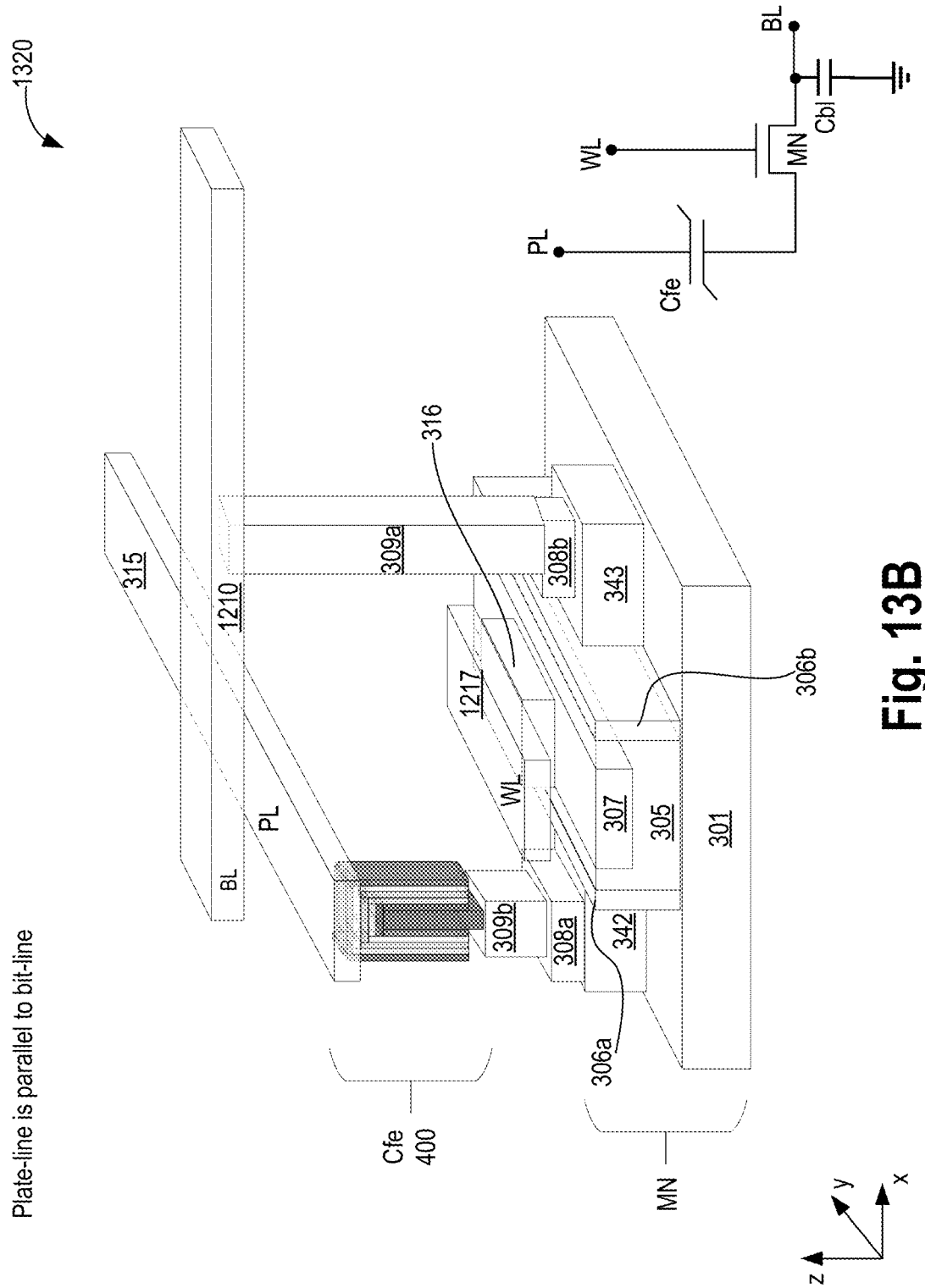
FIG. 13B illustrates a 3D view of a 1T1C FE bit-cell with the plate-line parallel to the word-line, where the transistor is a non-planar transistor and where the capacitor is a non-planar capacitor, where the bit-line is at a higher metal level than the plate-line, in accordance with some embodiments.

FIG. 13B illustrates 3D view of a 1T1C FE bit-cell 1320 with the PL parallel to the WL, where the transistor is a non-planar transistor and where the capacitor is a non-planar capacitor, where the bit-line is at a higher metal level than the plate-line, in accordance with some embodiments. 1T1C FE bit-cell 1320 is like 1T1C FE bit-cell 440 but with WL 1217 parallel to PL metal layer 315. In some embodiments, BL 1210 is orthogonal to WL 1217. In some embodiments, BL 1210 is replaced with BL 310, which is parallel to PL metal layer 315 and WL 1217.

Figure 14A:
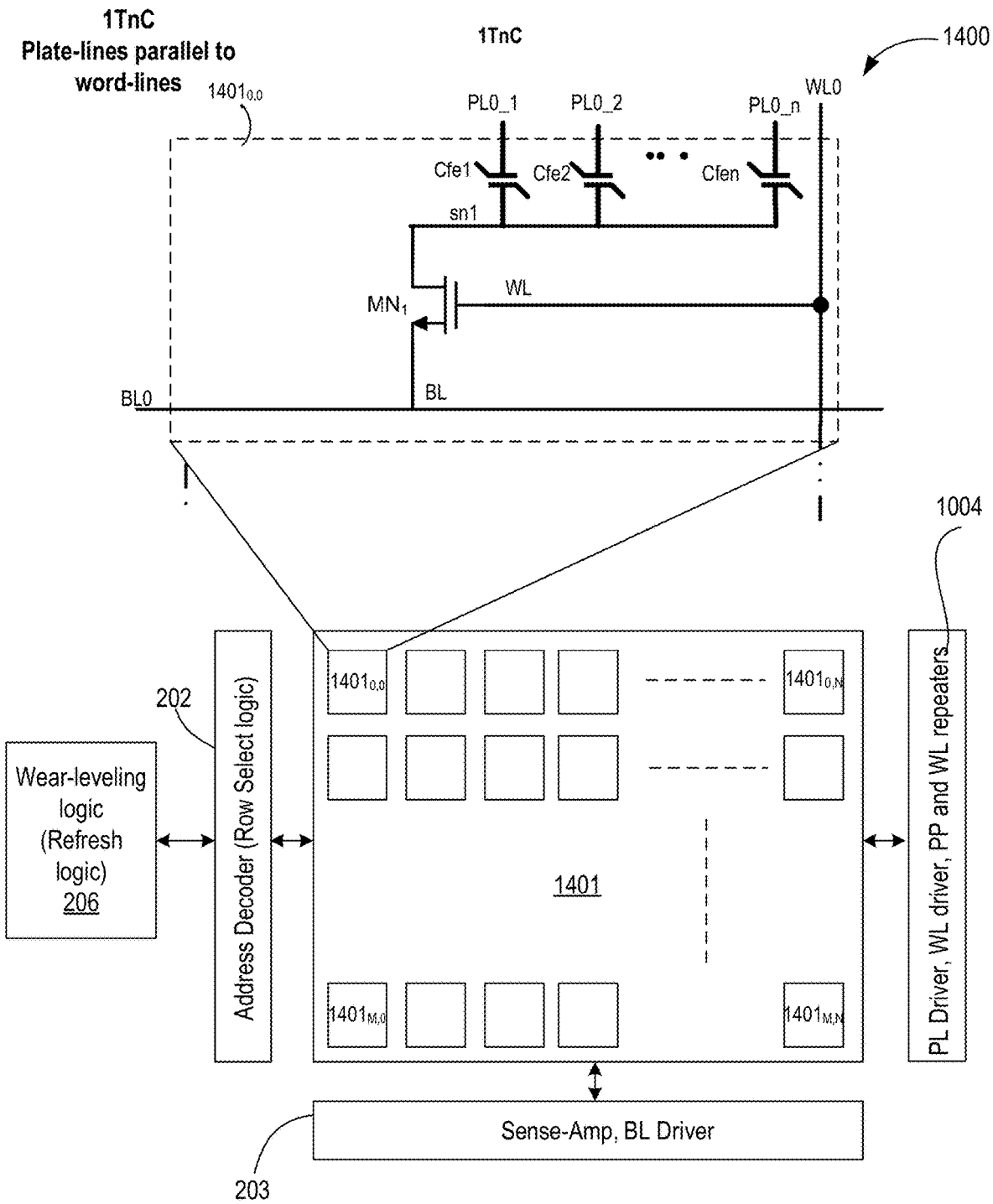
FIG. 14A illustrates an apparatus comprising memory and corresponding logic, wherein the memory comprises FE memory bit-cells, where an individual memory bit-cell is 1TnC bit-cell with plate-lines parallel to a word-line, where the corresponding logic is to apply word-line boosting, in accordance with some embodiments.

FIG. 14A illustrates apparatus 1400 comprising memory and corresponding logic, wherein the memory comprises FE memory bit-cells, where an individual memory bit-cell is 1TnC bit-cell with plate-lines parallel to a word-line, where the corresponding logic is to apply word-line boosting, in accordance with some embodiments. Apparatus 1400 is like apparatus 600 of FIG. 6B but for WL parallel to PLs. In some embodiments, each memory bit-cell in memory array 1401 is organized in rows and columns like in apparatus 600. For example, memory bit-cells 1401$_{0,0}$ through 1401$_{M,N}$ are organized in an array. Like in FIG. 10A, where WL is parallel to PL, PL drivers and WL drivers are lumped in logic 1004 orthogonal to BL drivers in logic circuitry 203, in accordance with some embodiments.

Figure 14B:
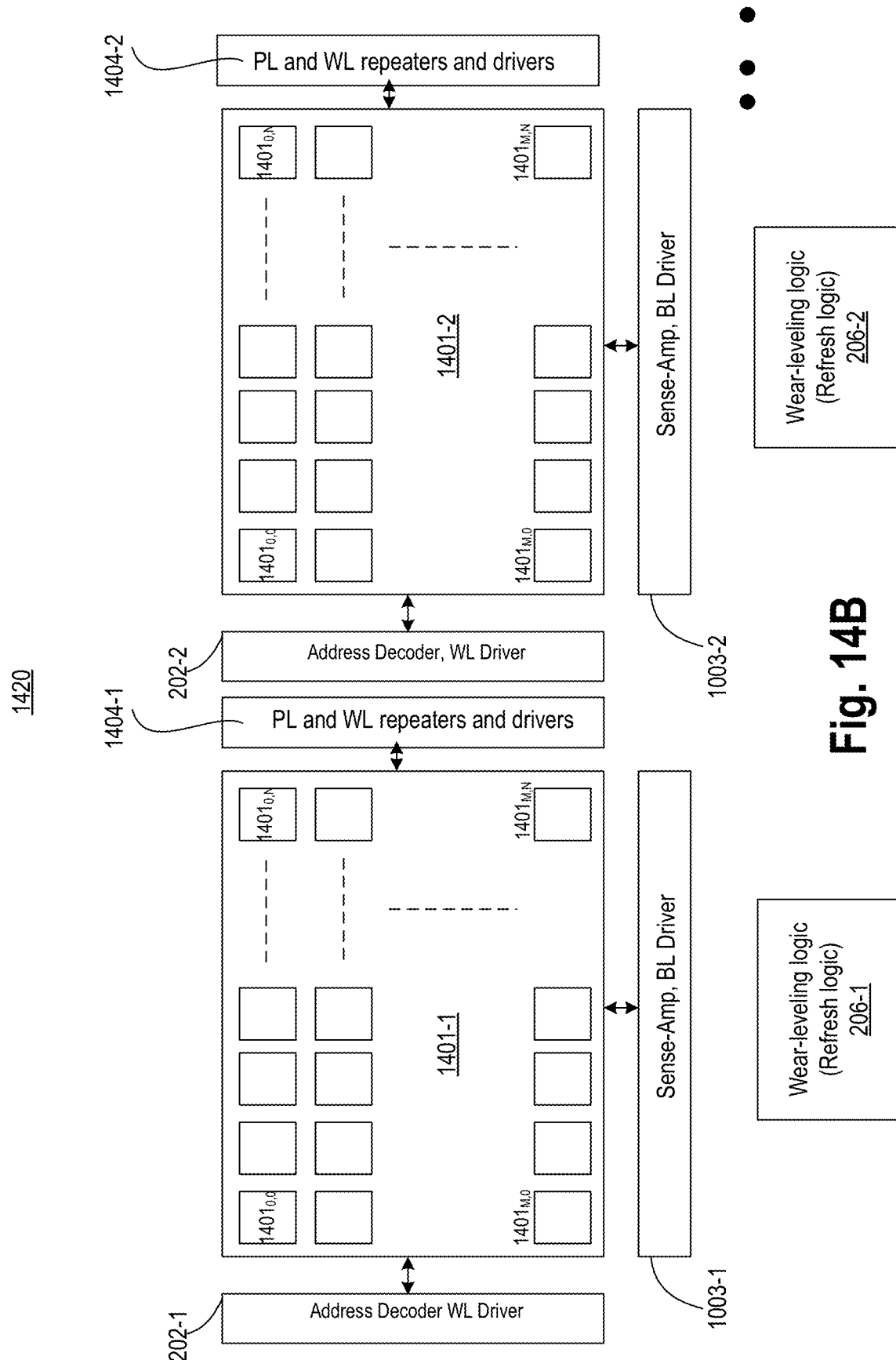
FIG. 14B illustrates an apparatus having FE memory with word-line repeaters, wherein memory arrays of the FE memory having 1TnC bit-cells with the plate-lines parallel to the word-line, in accordance with some embodiments.

FIG. 14B illustrates apparatus 1420 having FE memory with word-line repeaters, wherein memory arrays of the FE memory having 1TnC bit-cells with the plate-lines parallel to the word-line, in accordance with some embodiments. Apparatus 1420 illustrates two instances of apparatus 1400. The two instances include first memory array 1401-1, logic circuitry 202-1 having first address decoder and/or WL driver, logic circuitry 1003-1 having first sense amplifier and BL driver, logic circuitry 1404-1 having PL and WL repeaters; second memory array 1401-2, logic circuitry 202-2 having first address decoder and/or WL driver, logic circuitry 1003-2 having first sense amplifier and BL driver, and logic circuitry 1404-2 having PL and WL repeaters. In some embodiments, an individual instance of apparatus 1400 includes a corresponding wear-leveling logic 206 (e.g., wear-leveling logic 206-1 and wear-leveling logic 206-2). In some embodiments, when the pulsing scheme described herein is combined with the refresh function by wear-leveling logic 206-1 and wear-leveling logic 206-2, disturbance issues on unselected bit-cells are mitigated. While two memory arrays are shown (e.g., memory arrays 1401-1 and 1401-2), any number of arrays may be part of apparatus 1420. With PL parallel to the WL and orthogonal to logic circuitries 1404-1, 1404-2 etc. having BL, PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

Figure 14C:
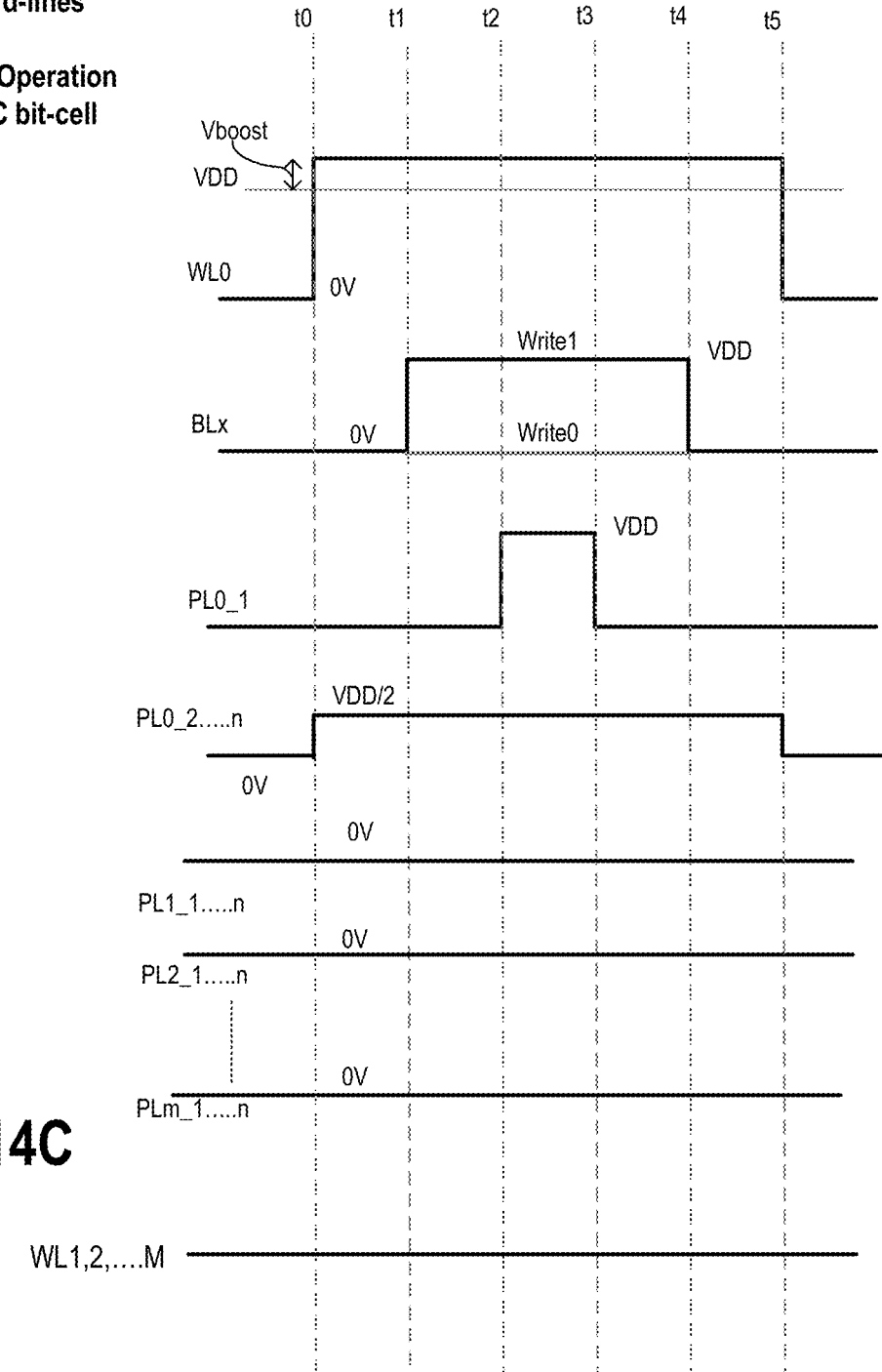
FIG. 14C illustrates a timing diagram for write operation for 1TnC bit-cells with plate-line parallel to the word-line, where the write operation involves word-line boosting, in accordance with some embodiments.

FIG. 14C illustrates timing diagram 1430 for write operation for 1TnC bit-cells with plate-line parallel to the word-line, where the write operation involves word-line boosting, in accordance with some embodiments. In this case, PLs are parallel to the WL. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., 1401$_{0,0}$) is asserted from 0V to Vdd (power supply level). Other WLs or PLs not part of the bit-cell are forced to 0V. In some embodiments, other PLs (e.g., PL0_2, PL0_3, ... PL0_n) of the selected bit-cell (e.g., 14010,0) are set between 0 and Vdd (e.g., Vdd/2). In some embodiments, PL of the unselected bit-cells (e.g., PL1_0, ... PL1_n to PLm_0, ... PLm_n) are set to 0V. In some embodiments, the WLs for the unselected bit-cells (e.g., WL1, WL2, ... WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor MN of the 1T1C bit-cell. Since, the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd-Vt.

For the bit-cell topology with PL parallel to the WL, the word-line boosting is used as otherwise it can lead to a buildup of a voltage level of approximately 2× Vdd on the storage node sn1, when BL line is at Vdd, and PL goes from 0V to Vdd. Since, with WL at Vdd, the transistor $MN_1$ can be off with BL at Vdd, the storage node sn1 will sit at Vdd-Vt when PL is at 0V. After that when PL goes from 0V to Vdd, the internal node can jump to 2Vdd-Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., 1401$_{0,0}$) is being written to, the WL for unselected bit-cells (e.g., WL0 through WLm) remains at 0. Same is done for unselected PLs as illustrated. Timing diagram 1430 is a first order diagram without column multiplexing. A person skilled in the art would appreciate that column multiplexing is used for accessing memory bit-cells in an array. Here. all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce an overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, ... PL0_$n$), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_$n$ are forced to 0V, and likewise PL2_1, PL2_2, through PL2_$n$ are forced to 0V, and so on).

PLs (e.g., PL0_2 through n) within the same selected bit-cell (e.g., $1401_{0,0}$) are charged to Vdd/2, in accordance with various embodiments. In some embodiments, PL for unselected bit-cells remains at 0V while PL0_1 is being used to program Cfe1. Word-lines of unselected bit-cells are set to 0V (e.g., WL1, 2, through M are set to 0V when WL0 is selected).

Figure 14D:
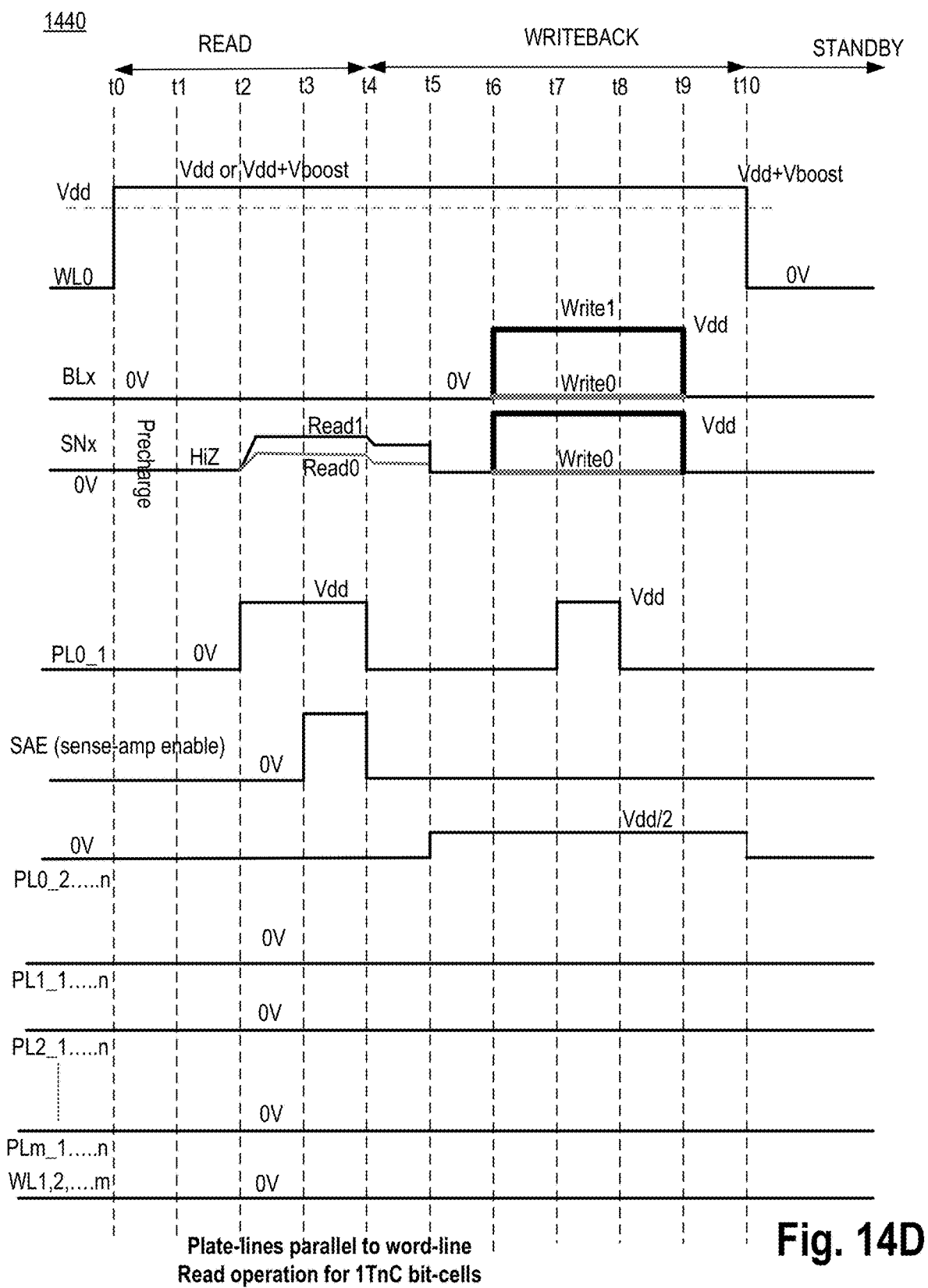
FIG. 14D illustrates a timing diagram for read operation 1TnC bit-cells with plate-line parallel to the word-line, where the read operation involves word-line boosting, in accordance with some embodiments.

FIG. 14D illustrates timing diagram 1440 for read operation 1TnC bit-cells with plate-line parallel to the word-line, where the read operation involves word-line boosting, in accordance with some embodiments. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL for the desired FE capacitor is toggled, which results into voltage buildup on the SNx node. The voltage build-up on the SNx node may be different voltage levels depending upon whether the FE capacitor state was logic 0 or logic 1. The time-sampling of this voltage relative to a reference expected value, results in detection of the state in which the FE capacitor was programmed. After reading the value, a write-back operation can be done to get the value restored to the FE capacitor, as reads are destructive read in this configuration, in accordance with some embodiments.

In the write back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write back mechanism is like the write operation described with reference to FIG. 14C. Here, here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

While various embodiments are described with reference to select transistors as being n-type transistors, the n-type transistors may be replaced with p-type transistors. In one such case, the logic associated with the transistors may be modified to achieve the correct polarity of the signals for proper function of the bit-cells.

Various embodiments illustrates the read mechanism where the BL is pre-charged to a 0V signal, and the PL across the FE capacitor is pulsed from 0 to Vdd and back to 0V resulting into a sense-signal with respect to having written a 0 state to the FE capacitor (voltage on the BL minus the voltage on the PL being –Ve). The sense-signal on the sense-line corresponds to whether the bit-cell was holding a prior state of 0 (same-state) or 1 (opposite state). In some embodiments, the scheme for read can be changed such that the BL is precharged to Vdd instead, and the PL is held at 0V. In this case, at the end of the precharge phase, the selected bit-cell may create a signal on the BL that will correspond to the bit-cell being written a logic 1 state instead (voltage on the BL minus the voltage on the PL being +ve). The sense-signal as generated on the BL in this case may still correspond to as if the bit-cell was holding a prior state of 0 (opposite-state) or 1 (same-state), with the voltage on BL changing from its precharged state by higher amount when it's an opposite state. This scheme can have the potential for better sense-margin, as the PL switching may not happen during the sense-phase, avoiding any potential coupling related sense-margin reduction. The scheme is also helpful for avoiding read disturbance due to the PL toggles on the bit-cells. Particularly in configurations where the unselected bit-cells can be exposed to the PL toggle, the scheme avoids coupling on the BL, as PL may not have to toggle.

In some embodiments, the way the cells are read can be periodically changed. For example, with the same state being 1 (write 1 during read, i.e., BL is precharged high, while keeping PL low), or same state being 0 (write 0 during read, i.e., BL is precharged low, and PL is toggled high) during the read phase. This can be done to improve the retention characteristics for the cells, as monotonic continuous reads requiring writes of the same polarity can hurt the disturb-induced effect on other bit-cells which gets negated due to the periodic inversion of the way the reads are done. This also can improve the artefact of imprint phenomenon, since a bit-cell even if it is holding a particular state, it may not continuously get written the same value since the read mechanism diversifies it between a read with same state or opposite state, thereby lowering imprint effects with the memory cell.

Figure 15:
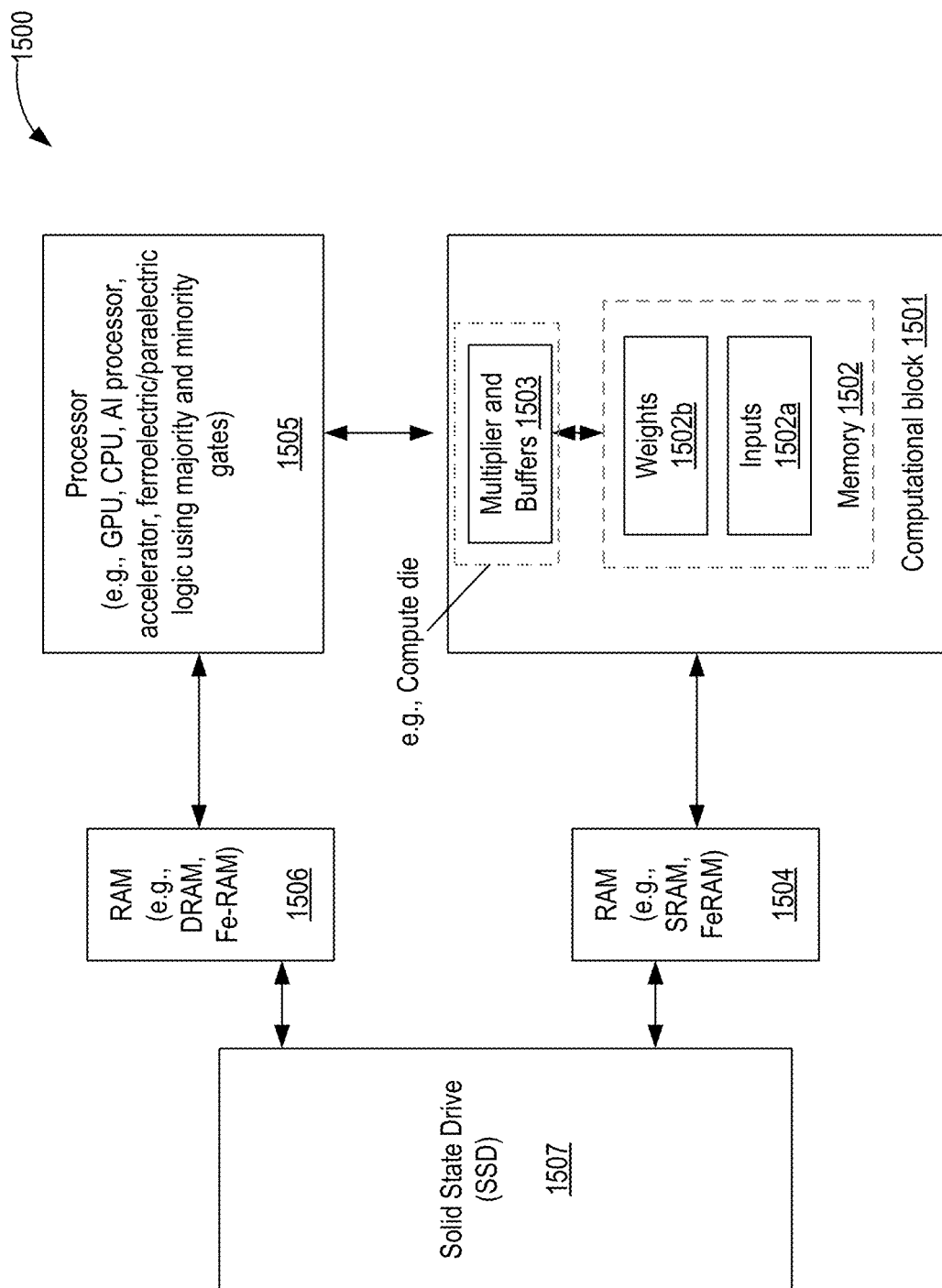
FIG. 15 illustrates a high-level architecture of an artificial intelligence (AI) machine comprising a compute die stacked with a memory die, wherein the compute die includes any one of the memory architectures and associated read/write schemes, in accordance with some embodiments.

FIG. 15 illustrates a high-level architecture of an artificial intelligence (AI) machine comprising a compute die stacked with a memory die, wherein the compute die includes any one of the memory architectures and associated read/write scheme, in accordance with some embodiments. AI machine 1500 comprises computational block 1501 or processor having random-access memory (RAM) 1502 and computational logic 1503; first random-access memory (RAM) 1504 (e.g., static RAM (SRAM), ferroelectric or paraelectric RAM (FeRAM), ferroelectric or paraelectric static random-access memory (FeSRAM)), main processor 1505, second random-access memory (RAM) 1506 (dynamic RAM (DRAM), FeRAM), and solid-state memory or drive (SSD)

1507. In some embodiments, some or all components of AI machine 1500 are packaged in a single package forming a system-on-chip (SoC). The SoC can be configured as a logic-on-logic configuration, which can be in a 3D configuration or a 2.5D configuration.

In some embodiments, computational block 1501 is packaged in a single package and then coupled to processor 1505 and memories 1504, 1506, and 1507 on a printed circuit board (PCB). In some embodiments, computational block 1501 is configured as a logic-on-logic configuration, which can be in a 3D configuration or a 2.5D configuration. In some embodiments, computational block 1501 comprises a special purpose compute die 1503 or microprocessor. For example, computational logic (e.g., compute die) 1503 is a compute chiplet that performs a function of an accelerator or inference. In some embodiments, RAM 1502 is DRAM which forms a special memory/cache for the special purpose compute die 1503. The DRAM can be embedded DRAM (eDRAM) such as 1T1C (one transistor and one capacitor) based memories. In some embodiments, RAM 1502 is ferroelectric or paraelectric RAM (Fe-RAM).

In some embodiments, computational logic 1503 is specialized for applications such as Artificial Intelligence, graph processing, and algorithms for data processing. In some embodiments, computational logic 1503 further has logic computational blocks, for example, for multipliers and buffers, a special data memory block (e.g., buffers) comprising DRAM, FeRAM, or a combination of them. In some embodiments, RAM 1502 has weights and inputs stored to improve the computational efficiency. The interconnects between processor 1505 (also referred to as special purpose processor), first RAM 1504 and computational logic 1503 are optimized for high bandwidth and low latency. The architecture of FIG. 15 allows efficient packaging to lower the energy, power, or cost and provides for ultra-high bandwidth between RAM 1502 and computational logic 1503 of computational block 1501.

In some embodiments, RAM 1502 is partitioned to store input data (or data to be processed) 1502*a* and weight factors 1502*b*. In some embodiments, input data 1502*a* is stored in a separate memory (e.g., a separate memory die) and weight factors 1502*b* are stored in a separate memory (e.g., separate memory die).

In some embodiments, computational logic or compute chiplet 1503 comprises matrix multiplier, adder, concatenation logic, buffers, and combinational logic. In various embodiments, computational logic (e.g., compute chiplet) 1503 performs multiplication operation on input data 1502*a* and weight factors 1502*b*. In some embodiments, weight factors 1502*b* are fixed weights. For example, processor 1505 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in RAM 1502. In various embodiments, the input data that is to be analyzed using a trained model, is processed by computational block 1501 with computed weight factors 1502*b* to generate an output (e.g., a classification result).

In some embodiments, first RAM 1504 is ferroelectric or paraelectric based SRAM. For example, a six transistor (6T) SRAM bit-cells having ferroelectric or paraelectric transistors are used to implement a non-volatile FeSRAM. In some embodiments, SSD 1507 comprises NAND flash cells. In some embodiments, SSD 1507 comprises NOR flash cells. In some embodiments, SSD 1507 comprises multi-threshold NAND flash cells.

In various embodiments, the non-volatility of FeRAM is used to introduce new features such as security, functional safety, and faster reboot time of AI machine 1500. The non-volatile FeRAM is a low power RAM that provides fast access to data and weights. FeRAM 1504 can also serve as a fast storage for computational block 1501 (which can be an inference die or an accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the non-linear polar materials described herein.

Figure 16:
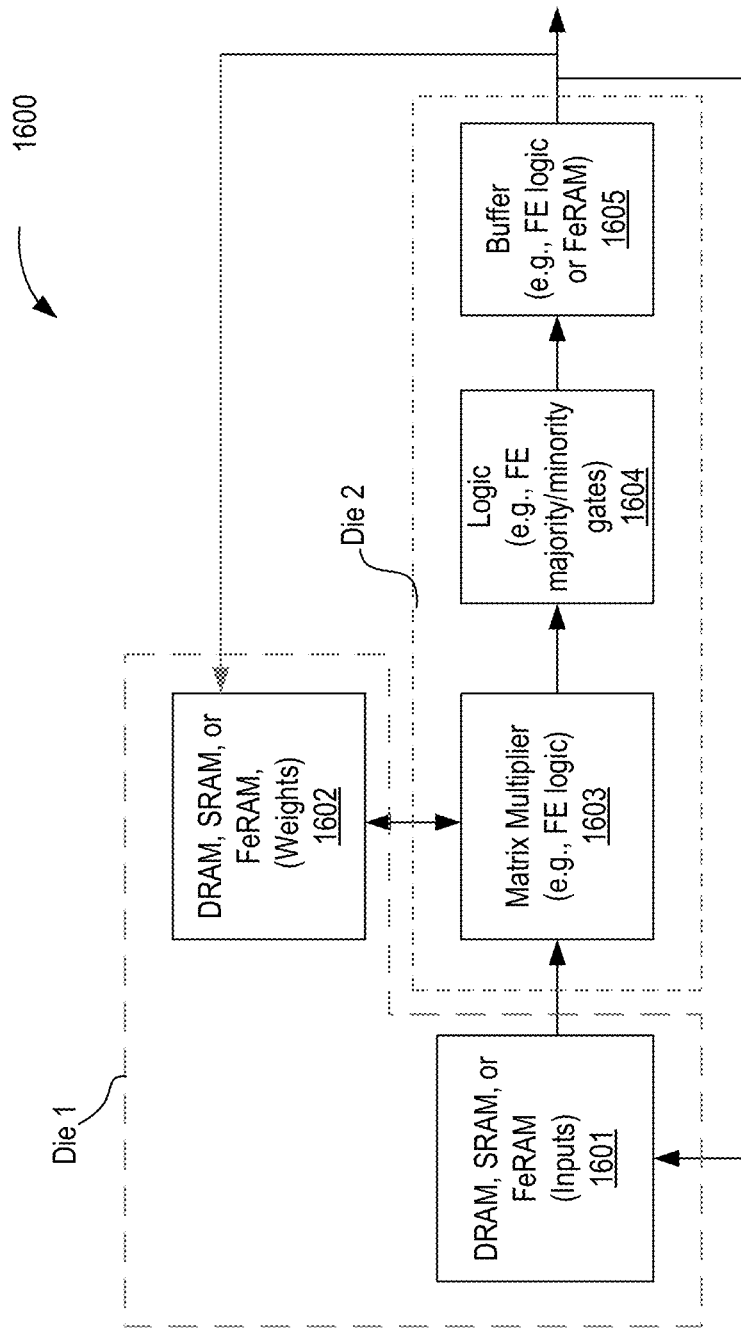
FIG. 16 illustrates an architecture of a computational block comprising a compute die stacked with a memory die, wherein the compute die includes any one of the memory architectures and associated read/write scheme, in accordance with some embodiments.

FIG. 16 illustrates an architecture of a computational block 1600 comprising a compute die stacked with a memory die, wherein the compute die includes any one of the memory architectures and associated read/write scheme, in accordance with some embodiments. Any of the blocks here can include the bit-cell of various embodiments. The architecture of FIG. 16 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die comprising memory 1601 to store input data and a second die comprising memory 1602 to store weight factors. In some embodiments, the memory die is a single die that is partitioned such that first partition or memory 1601 of the memory die is used to store input data and second partition or memory 1602 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1601 and 1602, or memory dies 1601 and 1602 include one or more of: DRAM, FE-SRAM, FE-DRAM, SRAM, and/or MRAM. In some embodiments, the input data stored in memory partition or die 1601 is the data to be analyzed by a trained model with fixed weights stored in memory partition or die 1602.

In some embodiments, the compute die comprises ferroelectric or paraelectric logic (e.g., majority, minority, and/or threshold gates) to implement matrix multiplier 1603, logic 1604, and temporary buffer 1605. Matrix multiplier 1603 performs multiplication operation on input data 'X' and weights 'W' to generate an output 'Y'. This output may be further processed by logic 1604. In some embodiments, logic 1604 performs a threshold operation, pooling and drop out operations, and/or concatenation operations to complete the AI logic primitive functions.

In some embodiments, the output of logic 1604 (e.g., processed output 'Y') is temporarily stored in buffer 1605. In some embodiments, buffer 1605 is memory such as one or more of: DRAM, Fe-SRAM, Fe-DRAM, MRAM, resistive RAM (Re-RAM) and/or SRAM. In some embodiments, buffer 1605 is part of the memory die (e.g., Die 1). In some embodiments, buffer 1605 performs the function of a re-timer. In some embodiments, the output of buffer 1605 (e.g., processed output 'Y') is used to modify the weights in memory partition or die 1602. In one such embodiment, computational block 1600 not only operates as an inference circuitry, but also as a training circuitry to train a model. In some embodiments, matrix multiplier 1603 includes an array of multiplier cells, wherein the DRAMs 1601 and 1602 include arrays of memory bit-cells, respectively, wherein each multiplier cell is coupled to a corresponding memory bit-cell of DRAM 1601 and/or DRAM 1602. In some embodiments, computational block 1600 comprises an interconnect fabric coupled to the array of multiplier cells such that each multiplier cell is coupled to the interconnect fabric.

Computational block 1600 provides reduced memory access for the compute die (e.g., die 2) by providing data locality for weights, inputs, and outputs. In one example, data from and to the AI computational blocks (e.g., matrix multiplier 1603) is locally processed within a same packaging unit. Computational block 1600 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 17:
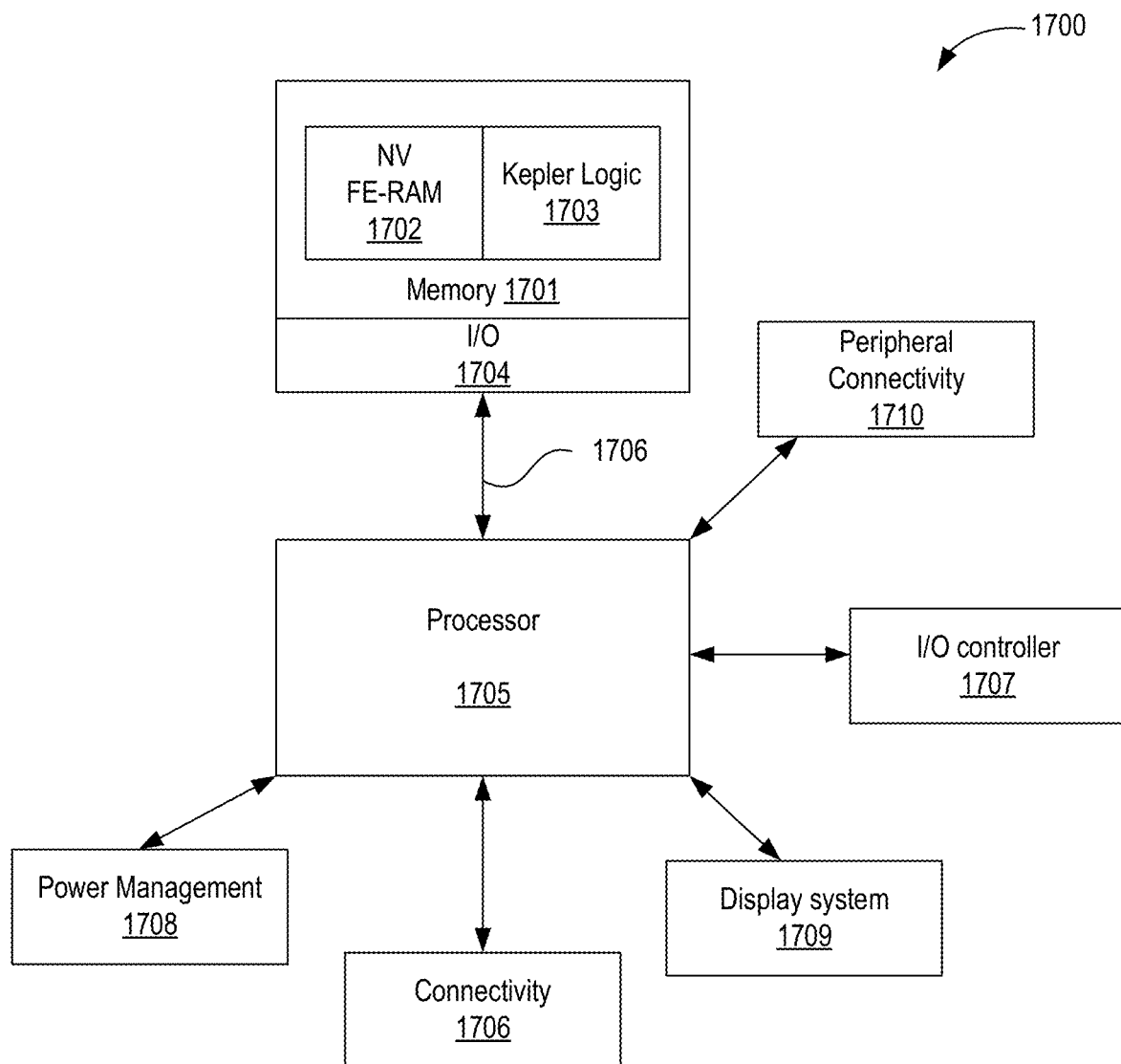
FIG. 17 illustrates a system-on-chip (SOC) that uses any one of the memory architectures and associated read/write scheme, in accordance with some embodiments.

FIG. 17 illustrates a system-on-chip (SOC) 1700 that uses any one of the memory architectures and associated read/write scheme, in accordance with some embodiments. SoC 1700 comprises memory 1701 having static random-access memory (SRAM) or FE based random-access memory FE-RAM, or any other suitable memory. The memory can be non-volatile (NV) or volatile memory. Memory 1701 may also comprise logic 1703 to control memory 1702. For example, write and read drivers are part of logic 1703. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1704. The interface may be double-data rate (DDR) compliant interface or any other suitable interface to communicate with a processor. Processor 1705 of SoC 1700 can be a single core or multiple core processor. Processor 1705 can be a general-purpose processor (CPU), a digital signal processor (DSP), or an Application Specific Integrated Circuit (ASIC) processor. In some embodiments, processor 1705 is an artificial intelligence (AI) processor (e.g., a dedicated AI processor, a graphics processor configured as an AI processor). In various embodiments, processor 1705 executes instructions that are stored in memory 1701.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1705 may be coupled to a number of other chip-lets that can be on the same die as SoC 1700 or on separate dies. These chip-lets include connectivity circuitry 1706, I/O controller 1707, power management 1708, and display system 1709, and peripheral connectivity circuitry 1706.

Connectivity circuitry 1706 represents hardware devices and software components for communicating with other devices. Connectivity circuitry 1706 may support various connectivity circuitries and standards. For example, connectivity circuitry 1706 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity circuitry 1706 may support non-cellular standards such as WiFi.

I/O controller 1707 represents hardware devices and software components related to interaction with a user. I/O controller 1707 is operable to manage hardware that is part of an audio subsystem and/or display subsystem. For example, input through a microphone or other audio device can provide input or commands for one or more applications or functions of SoC 1700. In some embodiments, I/O controller 1707 illustrates a connection point for additional devices that connect to SoC 1700 through which a user might interact with the system. For example, devices that can be attached to the SoC 1700 might include microphone devices, speaker or stereo systems, video systems or other display devices, keyboard or keypad devices, or other I/O devices for use with specific applications such as card readers or other devices.

Power management 1708 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1708 may accordingly put such logic into low power state without the worry of losing data. Power management may select a power state according to Advanced Configuration and Power Interface (ACPI) specification for one or all components of SoC 1700.

Display system 1709 represents hardware (e.g., display devices) and software (e.g., drivers) components that provide a visual and/or tactile display for a user to interact with the processor 1705. In some embodiments, display system

1709 includes a touch screen (or touch pad) device that provides both output and input to a user. Display system 1709 may include a display interface, which includes the particular screen or hardware device used to provide a display to a user. In some embodiments, the display interface includes logic separate from processor 1705 to perform at least some processing related to the display.

Peripheral connectivity 1710 may represent hardware devices and/or software devices for connecting to peripheral devices such as printers, chargers, cameras, etc. In some embodiments, peripheral connectivity 1710 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1700 includes a coherent cache or memory-side buffer chiplet (not shown) which include ferroelectric or paraelectric memory. The coherent cache or memory-side buffer chiplet can be coupled to processor 1705 and/or memory 1701 according to the various embodiments described herein (e.g., via silicon bridge or vertical stacking).

Figure 18:
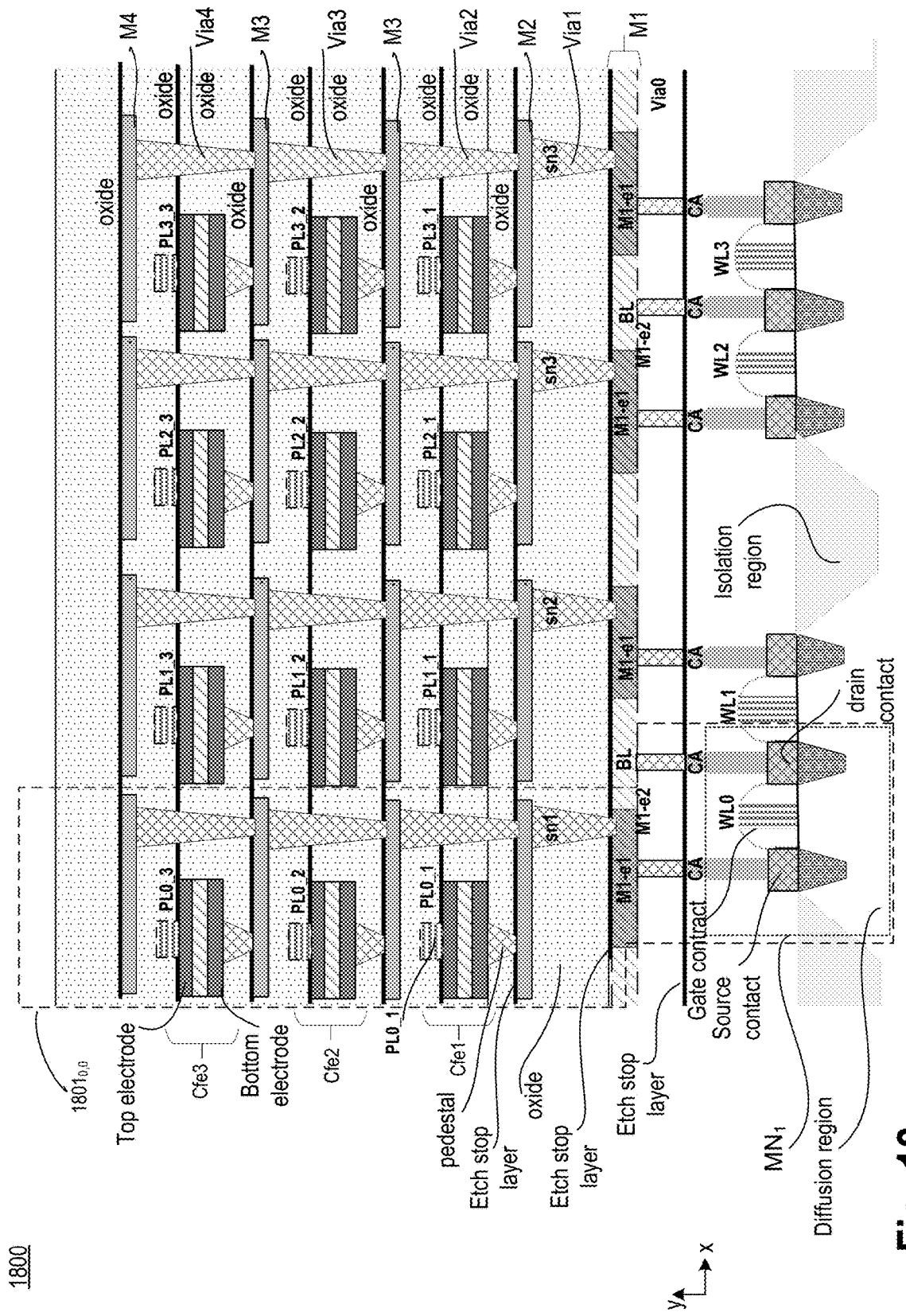
FIG. 18 illustrates a cross-sectional view of bit-cells with stacked planar non-linear polar material based capacitors, in accordance with some embodiments.

FIG. 18 illustrates a cross-sectional view 1800 of bit-cells with stacked planar non-linear polar material based capacitors, in accordance with some embodiments. In this example, four transistors are shown, each controlled by its respective WL on its gate terminal. The source and drain terminals of each transistor is coupled to respective contacts (CA). A pair of transistors are grouped together and separated from other pairs via isolation region. Etch stop layer is used in the fabrication of vias (via0) to connect the source and drain of the transistors to BLs on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the capacitor can be moved further up in the stack, where the capacitor level processing is done between different layers. In some embodiments, BL can be escaped on a different layer than shown. Here, bit-cell $1801_{0,0}$ illustrate one 1TnC bit-cell with planar stacked capacitors capacitor.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the planar ferroelectric or paraelectric capacitors are formed in a back-end of the die. In some embodiments, deposition of ILD is followed by surface polish. In some embodiments, PL is formed over top electrode of each capacitor. In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to PL and storage nodes (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack, in accordance with some embodiments. In some embodiments, one terminal of a capacitor is coupled to the storage node (e.g., sn1) and the other terminal of the capacitor is coupled to a PL.

In some embodiments, the bottom electrode of each capacitor is allowed to directly contact with the metal below. In this embodiment, the height of the stacked capacitors is lowered, and the fabrication process is simplified because the extra steps for forming the pedestals are removed.

In some embodiments, pedestals or vias are formed for both the top and bottom electrodes of the non-linear polar material based capacitor and/or the Cd capacitor. In this embodiment, the height of the stacked capacitors is raised, and the fabrication process adds an additional step of forming a top pedestal or via which contacts with a respective PL. In some embodiments, a similar structure of stacked capacitors can be used for the multi-element gain memory bit-cell.

Figure 19:
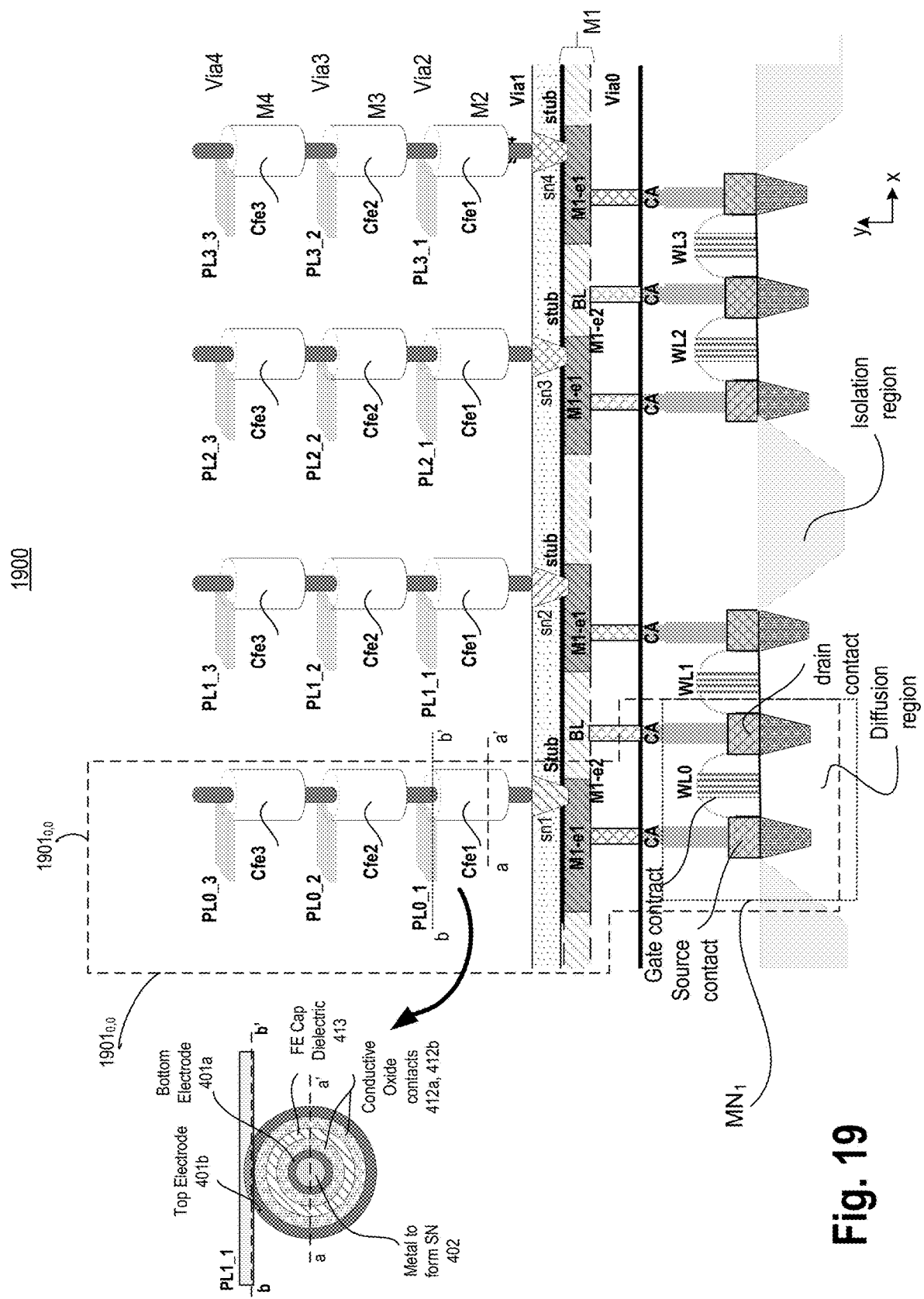
FIG. 19 illustrates a cross-sectional view of bit-cells with stacked non-planar non-linear polar material based capacitors, in accordance with some embodiments.

FIG. 19 illustrates cross-sectional view 1900 of bit-cells with stacked non-planar non-linear polar material based capacitors, in accordance with some embodiments. In this example four 1TnC bit-cells are shown, where 'n' is three. Each group of capacitors for a bit-cell (e.g., $1901_{0,0}$) has a column of shared metal passing through the center of the capacitors, where the shared metal is the storage node which is coupled to the stub and then to the source or drain terminal. Top electrode of each of the capacitor is partially adjacent to a respective plate-line. In this instance, the capacitors are formed between regions reserved for Via1 through Via5 (e.g., between M1 through M6 layers). In some embodiments, a similar structure of stacked capacitors can be used for the multi-element gain memory bit-cell.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left" "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a node; a capacitor comprising non-linear polar material, the capacitor having a first terminal coupled to the node and a second terminal coupled to a plate-line, wherein the capacitor is a pillar capacitor; a transistor coupled to the node and a bit-line, wherein the transistor is controllable by a word-line, wherein the plate-line is parallel to the bit-line; a refresh circuitry to refresh charge on the capacitor periodically; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the plate-line after the word-line is boosted and before the end of the boost on the word-line during a second write operation different from the first write operation.

Example 2: The apparatus of example 1, wherein the refresh circuitry comprises logic to improve memory endurance of the capacitor via wear leveling, wherein the wear leveling is applied during read or write operations.

Example 3: The apparatus of example 2, wherein the wear leveling includes a random wear leveling scheme.

Example 4: The apparatus of example 2, the refresh circuitry is to apply an outlier compensation scheme before or after the wear leveling.

Example 5: The apparatus of example 1, wherein the one or more circuitries is to force a first voltage on the plate-line during the first write operation.

Example 6: The apparatus of example 5, wherein the one or more circuitries is to force the first voltage on the bit-line during the first write operation.

Example 7: The apparatus of example 1, wherein the one or more circuitries is to initially force a voltage on the bit-line and subsequently allow the bit-line to float during the read operation, wherein the one or more circuitries is to boost the word-line above the voltage supply level during the read operation.

Example 8: The apparatus of example 7, wherein the one or more circuitries is to generate a third pulse on the plate-line after the word-line is boosted and before an end of the boost on the word-line during the read operation.

Example 9: The apparatus of example 1, wherein the transistor is a low leakage transistor.

Example 10: The apparatus of example 1 comprising a repeater coupled to the word-line.

Example 11: The apparatus of example 1, wherein the transistor is a first transistor, wherein the apparatus comprises a second transistor having a gate terminal coupled to the word-line, wherein the second terminal of the capacitor is coupled to the plate-line via the second transistor, wherein a source terminal of the second transistor is coupled to the plate-line, wherein a drain terminal of the second transistor coupled to the second terminal of the capacitor.

Example 12: The apparatus of example 1, wherein when the capacitor comprises: a first layer comprising a first conducting material, wherein the first layer is coupled to the first terminal of the capacitor; a second layer comprising a second conducting material, wherein the second layer is around the first layer; a third layer comprising the non-linear polar material, wherein the third layer is around the second layer; a fourth layer comprising the second conducting material, wherein the fourth layer is around the third layer; and a fifth layer comprising the first conducting material, wherein the plate-line is partially coupled to the fifth layer.

Example 13: The apparatus of example 12, wherein the first layer has a first circumference, wherein the second layer has a second circumference, wherein the third layer has a third circumference, wherein the fourth layer has a fourth circumference, wherein the fifth layer has a fifth circumference, wherein the fourth circumference is larger than the third circumference, wherein the third circumference is larger than the second circumference, and wherein the second circumference is larger than the first circumference.

Example 14: The apparatus of example 1, wherein the non-linear polar material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1−x Ex Oy, where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO] n, where 'n' is between 1 to 100.

Example 15: An apparatus comprising: a node; a capacitor comprising non-linear polar material, the capacitor having a first terminal coupled to the node and a second terminal coupled to a plate-line, wherein the capacitor is a planar capacitor; a transistor coupled to the node and a bit-line, wherein the transistor is controllable by a word-line, wherein the plate-line is parallel to the bit-line; a refresh circuitry to refresh charge on the capacitor periodically; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the plate-line after the word-line is boosted and before the end of the boost on the word-line during a second write operation different from the first write operation.

Example 16: The apparatus of example 15, wherein the refresh circuitry comprises logic to improve memory endurance of the capacitor via wear leveling, wherein the wear leveling is applied during read or write operations.

Example 17: The apparatus of example 16, wherein the wear leveling includes a random wear leveling scheme, wherein the refresh circuitry is to apply an outlier compensation scheme before or after the wear leveling.

Example 18: The apparatus of example 15, wherein the planar capacitor comprises: a first layer coupled to a bottom electrode which is coupled to the node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising the non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the plate-line is coupled to a portion of the fifth layer.

Example 19: A system comprising: a processor circuitry to execute one or more instructions; a memory to store the one or more instructions; and a communication interface to allow the processor circuitry to communicate with another device, wherein the memory includes an apparatus according to any one of examples 1 to 14.

Example 20: A system comprising: a processor circuitry to execute one or more instructions; a memory to store the one or more instructions; and a communication interface to allow the processor circuitry to communicate with another device, wherein the memory includes an apparatus according to any one of examples 15 to 18.

Example 1a: An apparatus comprising: a node; a capacitor comprising non-linear polar material, the capacitor having a first terminal coupled to the node and a second terminal coupled to a plate-line, wherein the capacitor is a pillar capacitor; a transistor coupled to the node and a bit-line, wherein the transistor is controllable by a word-line, wherein the plate-line is parallel to the word-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the plate-line after the word-line is boosted and before the end of the boost on the word-line during a second write operation different from the first write operation.

Example 2a: The apparatus of example 1a, wherein the one or more circuitries is to generate a third pulse on an unselected bit-line, wherein the third pulse has an amplitude less than a supply level but more than ground.

Example 3a: The apparatus of example 2a, wherein the third pulse has a pulse width which is substantially a pulse width on the word-line.

Example 4a: The apparatus of example 1a, wherein the one or more circuitries is to force a ground voltage on the bit-line during the second write operation.

Example 5a: The apparatus of example 1a, wherein the one or more circuitries is to initiate a writeback operation after the read operation.

Example 6a: The apparatus of example 1a, wherein the one or more circuitries is to initially force a voltage on the bit-line and subsequently allow the bit-line to float during the read operation.

Example 7a: The apparatus of example 6a, wherein the one or more circuitries is to generate a fourth pulse on the plate-line after the word-line is boosted and before an end of the boost on the word-line during the read operation, wherein the fourth pulse starts when the bit-line is allowed to float.

Example 8a: The apparatus of example 1a, wherein the one or more circuitries is to boost the word-line by about 0.3V above a voltage on the bit-line or the plate-line.

Example 9a: The apparatus of example 1a, wherein the one or more circuitries is to boost the word-line by about 1.5× of a threshold voltage of the transistor.

Example 10a: The apparatus of example 1a, wherein the transistor is a low leakage transistor.

Example 11a: The apparatus of example 1a comprising a repeater coupled to the plate-line.

Example 12a: The apparatus of example 1a, wherein the transistor is a first transistor, wherein the apparatus comprises a second transistor having a gate terminal coupled to the word-line, wherein the second terminal of the capacitor is coupled to the plate-line via the second transistor, wherein a source terminal of the second transistor is coupled to the plate-line, wherein a drain terminal of the second transistor coupled to the second terminal of the capacitor.

Example 13a: The apparatus of example 1a, wherein when the capacitor comprises: a first layer comprising a first conducting material, wherein the first layer is coupled to the first terminal of the capacitor; a second layer comprising a second conducting material, wherein the second layer is around the first layer; a third layer comprising the non-linear polar material, wherein the third layer is around the second layer; a fourth layer comprising a second conducting material, wherein the fourth layer is around the third layer; and a fifth layer comprising a second conducting material, wherein the plate-line is partially coupled to the fifth layer.

Example 14a: The apparatus of example 13a, wherein the first layer has a first circumference, wherein the second layer has a second circumference, wherein the third layer has a third circumference, wherein the fourth layer has a fourth circumference, wherein the fifth layer has a fifth circumference, wherein the fourth circumference is larger than the third circumference, wherein the third circumference is larger than the second circumference, wherein the second circumference is larger than the first circumference.

Example 15a: The apparatus of example 1a, wherein the non-linear polar material includes one of ferroelectric material, paraelectric material, or non-linear dielectric.

Example 16a: An apparatus comprising: a node; a capacitor comprising non-linear polar material, the capacitor having a first terminal coupled to the node and a second terminal coupled to a plate-line, wherein the capacitor is a planar capacitor; a transistor coupled to the node and a bit-line, wherein the transistor is controllable by a word-line, wherein the plate-line is parallel to the word-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the plate-line after the word-line is boosted and before the end of the boost on the word-line during a second write operation different from the first write operation.

Example 17a: The apparatus of example 16a, wherein the capacitor comprises: a first layer coupled to a bottom electrode which is coupled to the node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising the non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the plate-line is coupled to a portion of the fifth layer.

Example 18a: The apparatus of example 17a, wherein: the first refractive inter-metallic material and the second refractive inter-metallic material include one or more of Ta, Ti, Al, W, Ni, Ga, Mn, Fe, B, C, N or Co; and the first conductive oxide and the second conductive oxide include one or more of: Ir, In, Fe, Ru, Pd, Os, or Re, wherein the apparatus comprises a sixth layer extending along a y-plane, wherein the sixth layer is adjacent to side walls of the first layer, the second layer, the third layer, and the fourth layer, wherein the sixth layer includes one of: Ti—Al—O, Al2O3, or MgO.

Example 19a: A system comprising: a processor circuitry to execute one or more instructions; a memory coupled to the processor circuitry, wherein the memory is to store the one or more instructions; and a communication interface to allow the processor circuitry to communicate with another device, wherein the memory comprises an array of bit-cells, wherein an individual bit-cell includes: a node; a capacitor comprising non-linear polar material, the capacitor having a first terminal coupled to the node and a second terminal coupled to a plate-line, wherein the capacitor is a pillar capacitor; and a transistor coupled to the node and a bit-line, wherein the transistor is controllable by a word-line, wherein the plate-line is parallel to the word-line, wherein the memory comprises: one or more circuitries to boost the word-line above a voltage supply level during a write operation and a read operation, wherein the one or more circuitries is to generate a first pulse on the bit-line after the word-line is boosted and before an end of the boost on the word-line, and wherein the one or more circuitries is to generate a second pulse on an unselected bit-line, wherein the second pulse has a duration which is substantially a duration of the first pulse.

Example 20a: The system of example 19a, wherein the one or more circuitries is to boost the word-line by about 1.5× of a threshold voltage of the transistor, and wherein an amplitude of the second pulse is between a supply level and ground.

Example 1b: An apparatus comprising: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a transistor coupled to the node and a bit-line, wherein the transistor is controllable by a word-line, wherein the first plate-line and the second plate-line are parallel to the bit-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line after the word-line is boosted and before the end of the boost on the word-line during a second write operation different from the first write operation.

Example 2b: The apparatus of example 1b, wherein the one or more circuitries is to generate a third pulse on the second plate-line, wherein the third pulse has an amplitude less than a supply level but more than ground.

Example 3b: The apparatus of example 2b, wherein the third pulse has a pulse width which is substantially a pulse width on the word-line.

Example 4b: The apparatus of example 1b, wherein the one or more circuitries is to force a ground voltage on the bit-line during the second write operation.

Example 5b: The apparatus of example 1b, wherein the one or more circuitries is to initiate a writeback operation after the read operation.

Example 6b: The apparatus of example 1b, wherein the one or more circuitries is to initially force a voltage on the bit-line and subsequently allow the bit-line to float during the read operation.

Example 7b: The apparatus of example 6b, wherein the one or more circuitries is to generate a fourth pulse on the first plate-line after the word-line is boosted and before an end of the boost on the word-line during the read operation, wherein the fourth pulse starts when the bit-line is allowed to float.

Example 8b: The apparatus of example 7b, wherein the one or more circuitries is to drive a ground voltage on second plate-line when the one or more circuitries is to generate the fourth pulse on the first plate-line.

Example 9b: The apparatus of example 1b, wherein the one or more circuitries is to boost the word-line by about 0.3V above the voltage supply level.

Example 10b: The apparatus of example 1b, wherein the one or more circuitries is to boost the word-line by about 1.5× of a threshold voltage of the transistor.

Example 11b: The apparatus of example 1b comprising a repeater coupled to the word-line.

Example 12b: The apparatus of example 1b, wherein when the first capacitor comprises: a first layer comprising a first conducting material, wherein the first layer is coupled to the first terminal of the first capacitor; a second layer comprising a second conducting material, wherein the second layer is around the first layer; a third layer comprising the non-linear polar material, wherein the third layer is around the second layer; a fourth layer comprising a second conducting material, wherein the fourth layer is around the third layer; and a fifth layer comprising a second conducting material, wherein the first plate-line is partially coupled to the fifth layer.

Example 13b: The apparatus of example 12b, wherein the first layer has a first circumference, wherein the second layer has a second circumference, wherein the third layer has a third circumference, wherein the fourth layer has a fourth circumference, wherein the fifth layer has a fifth circumference, wherein the fourth circumference is larger than the third circumference, wherein the third circumference is larger than the second circumference, wherein the second circumference is larger than the first circumference.

Example 14b: The apparatus of example 1b, wherein the non-linear polar material includes one of ferroelectric material, paraelectric material, or non-linear dielectric.

Example 15b: An apparatus comprising: a node; a first capacitor comprising non-linear polar material, the first capacitor having a first terminal coupled to the node and a second terminal coupled to a first plate-line, wherein the first capacitor is a first planar capacitor; a second capacitor comprising non-linear polar material, the second capacitor having a first terminal coupled to the node and a second terminal coupled to a second plate-line, wherein the second capacitor is a second planar capacitor; a transistor coupled to the node and a bit-line, wherein the transistor is controllable by a word-line, wherein the first plate-line and the second plate-line is parallel to the bit-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line after the word-line is boosted and before the end of the boost on the word-line during a second write operation different from the first write operation.

Example 16b: The apparatus of example 15b, wherein the first capacitor comprises: a first layer coupled to a bottom electrode which is coupled to the node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising the non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the first plate-line is coupled to a portion of the fifth layer.

Example 17b: The apparatus of example 16b, wherein: the first refractive inter-metallic material and the second refractive inter-metallic material include one or more of Ta, Ti, Al, W, Ni, Ga, Mn, Fe, B, C, N or Co; and the first conductive oxide and the second conductive oxide include one or more of: Ir, In, Fe, Ru, Pd, Os, or Re, wherein the apparatus comprises a sixth layer extending along a y-plane, wherein the sixth layer is adjacent to side walls of the first layer, the second layer, the third layer, and the fourth layer, wherein the sixth layer includes one of: Ti—Al—O, Al2O3, or MgO.

Example 18b: The apparatus of example 15b, wherein the one or more circuitries is to generate a third pulse on the second plate-line, wherein the third pulse has an amplitude less than a supply level but more than ground.

Example 19b: A system comprising: a processor circuitry to execute one or more instructions; a memory coupled to the processor circuitry, wherein the memory is to store the one or more instructions; and a communication interface to allow the processor circuitry to communicate with another device, wherein the memory comprises an array of bit-cells, wherein an individual bit-cell includes: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; and a transistor coupled to the node and a bit-line, wherein the transistor is controllable by a word-line, wherein the first plate-line and the second plate-line are parallel to the bit-line, and wherein the memory includes: one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line after the word-line is boosted and before the end of the boost on the word-line during a second write operation different from the first write operation.

Example 20b: The system of example 19b, wherein: the one or more circuitries is to boost the word-line by about 1.5× of a threshold voltage of the transistor; an amplitude of the second pulse is between a supply level and ground; generate a third pulse on the second plate-line; and the third pulse has an amplitude less than a supply level but more than ground.

Example 1c: An apparatus comprising: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a transistor coupled to the node and a bit-line, wherein the transistor is controllable by a word-line, wherein the first plate-line and the second plate-line are parallel to the word-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line within the first pulse.

Example 2c: The apparatus of example 1c, wherein the one or more circuitries is to force a ground voltage on the bit-line during a second write operation different from the first write operation, wherein the one or more circuitries is to generate the second pulse on the first plate-line after the word-line is boosted and before an end of the boost on the word-line during the second write operation.

Example 3c: The apparatus of example 1c, wherein the one or more circuitries is to generate a third pulse on the second plate-line, wherein the third pulse has an amplitude less than a supply level but more than ground.

Example 4c: The apparatus of example 3c, wherein the third pulse has a pulse width which is substantially a pulse width on the word-line.

Example 5c: The apparatus of example 1c, wherein the one or more circuitries is to initiate a writeback operation after the read operation.

Example 6c: The apparatus of example 1c, wherein the one or more circuitries is to initially force a voltage on the bit-line and subsequently allow the bit-line to float during the read operation.

Example 7c: The apparatus of example 6c, wherein the one or more circuitries is to generate a fourth pulse on the first plate-line after the word-line is boosted and before an end of the boost on the word-line during the read operation, wherein the fourth pulse starts when the bit-line is allowed to float.

Example 8c: The apparatus of example 7c, wherein the one or more circuitries is to drive a ground voltage on second plate-line when the one or more circuitries is to generate the fourth pulse on the first plate-line.

Example 9c: The apparatus of example 1c, wherein the one or more circuitries is to boost the word-line by about 0.3V above the voltage supply level.

Example 10c: The apparatus of example 1c, wherein the one or more circuitries is to boost the word-line by about 1.5× of a threshold voltage of the transistor.

Example 11c: The apparatus of example 1c comprising a first repeater coupled to the first plate-line, and a second repeater coupled to the second plate-line.

Example 12c: The apparatus of example 1c, wherein when the first capacitor comprises: a first layer comprising a first conducting material, wherein the first layer is coupled to the first terminal of the first capacitor; a second layer comprising a second conducting material, wherein the second layer is around the first layer; a third layer comprising the non-linear polar material, wherein the third layer is around the second layer; a fourth layer comprising a second conducting material, wherein the fourth layer is around the third layer; and a fifth layer comprising a second conducting material, wherein the first plate-line is partially coupled to the fifth layer.

Example 13c: The apparatus of example 12c, wherein the first layer has a first circumference, wherein the second layer has a second circumference, wherein the third layer has a third circumference, wherein the fourth layer has a fourth circumference, wherein the fifth layer has a fifth circumference, wherein the fourth circumference is larger than the third circumference, wherein the third circumference is larger than the second circumference, wherein the second circumference is larger than the first circumference.

Example 14c: The apparatus of example 1c, wherein the non-linear polar material includes one of a ferroelectric material, paraelectric material, or a non-linear dielectric.

Example 15c: An apparatus comprising: a node; a first capacitor comprising non-linear polar material, the first capacitor having a first terminal coupled to the node and a second terminal coupled to a first plate-line, wherein the first capacitor is a first planar capacitor; a second capacitor comprising non-linear polar material, the second capacitor having a first terminal coupled to the node and a second terminal coupled to a second plate-line, wherein the first capacitor is a first planar capacitor; a transistor coupled to the node and a bit-line, wherein the transistor is controllable by a word-line, wherein the first plate-line and the second plate-line are parallel to the word-line; and one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line within the first pulse.

Example 16c: The apparatus of example 15c, wherein the first capacitor comprises: a first layer coupled to a bottom electrode which is coupled to the node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising the non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material, wherein the first plate-line is coupled to a portion of the fifth layer.

Example 17c: The apparatus of example 16c, wherein: the first refractive inter-metallic material and the second refractive inter-metallic material include one or more of Ta, Ti, Al, W, Ni, Ga, Mn, Fe, B, C, N or Co; and the first conductive oxide and the second conductive oxide include one or more of: Jr, In, Fe, Ru, Pd, Os, or Re, wherein the apparatus comprises a sixth layer extending along a y-plane, wherein the sixth layer is adjacent to side walls of the first layer, the second layer, the third layer, and the fourth layer, wherein the sixth layer includes one of: Ti—Al—O, Al2O3, or MgO.

Example 18c: The apparatus of example 15c, wherein: the one or more circuitries is to force a ground voltage on the bit-line during a second write operation different from the first write operation, wherein the one or more circuitries is to generate the second pulse on the first plate-line after the word-line is boosted and before an end of the boost on the word-line during the second write operation; and the one or more circuitries is to generate a third pulse on the second plate-line, wherein the third pulse has an amplitude less than a supply level but more than ground.

Example 19c: A system comprising: a processor circuitry to execute one or more instructions; a memory coupled to the processor circuitry, wherein the memory is to store the one or more instructions; and a communication interface to allow the processor circuitry to communicate with another device, wherein the memory comprises an array of bit-cells, wherein an individual bit-cell includes: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; and a transistor coupled to the node and a bit-line, wherein the transistor is controllable by a word-line, wherein the first plate-line and second plate-line are parallel to the word-line, and wherein the memory includes: one or more circuitries to boost the word-line above a voltage supply level during a write operation and a read operation, wherein the one or more circuitries is to generate a first pulse on the bit-line after the word-line is boosted and before an end of the boost on the word-line during a first write operation, and wherein the one or more circuitries is to generate a second pulse on the first plate-line within the first pulse.

Example 20c: The system of example 19c, wherein: the one or more circuitries is to boost the word-line by about 1.5× of a threshold voltage of the transistor; an amplitude of the second pulse is between a supply level and ground; generate a third pulse on the second plate-line; and the third pulse has an amplitude less than a supply level but more than ground.

Example 1d: An apparatus comprising: a node; a first capacitor comprising non-linear polar material, the first capacitor having a first terminal coupled to the node; a second capacitor comprising the non-linear polar material, the second capacitor having a first terminal coupled to the node; a select transistor coupled to the node and a bit-line, wherein the select transistor is controllable by a word-line; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a write operation, wherein the one or more circuitries is to control the first plate-line, the second plate-line, the first control, the second control, and the bit-line during the write operation.

Example 2d: The apparatus of example 1d, wherein the one or more circuitries is to generate a first pulse on the bit-line, wherein the first pulse has an amplitude lower than the voltage supply level.

Example 3d: The apparatus of example 2d, wherein the one or more circuitries is to generate a second pulse on the first plate-line, wherein the second pulse starts and ends substantially when the first pulse starts and ends, wherein the second pulse has an initial amplitude which is substantially equal to the amplitude of the first pulse, and wherein the second pulse has an ending amplitude which is substantially equal to the amplitude of the first pulse.

Example 4d: The apparatus of example 3d, wherein the one or more circuitries is to generate a third pulse on the first plate-line after the word-line is boosted and before an end of the boost on the word-line during a first write operation, wherein an amplitude of the third pulse is substantially equal to the voltage supply level.

Example 5d: The apparatus of example 4d, wherein the one or more circuitries is to generate a fourth pulse on the first plate-line after the word-line is boosted and before an end of the boost on the word-line during a second write operation, wherein an amplitude of the fourth pulse is substantially equal to a ground level, wherein the second write operation is differential from the first write operation.

Example 6d: The apparatus of example 3d, wherein the one or more circuitries is to set a fifth pulse on the second plate-line, wherein the fifth pulse has an amplitude lower than the voltage supply level, wherein the fifth pulse has a pulse width which is substantially a pulse width of the first pulse.

Example 7d: The apparatus of example 1d, wherein the one or more circuitries is to generate a sixth pulse on the first control, wherein the sixth pulse has a pulse width which is same as a pulse width on the word-line.

Example 8d: The apparatus of example 7d, wherein the one or more circuitries is to generate a seventh pulse on the second control, wherein the seventh pulse has a pulse width which is same as the pulse width on the word-line.

Example 9d: The apparatus of example 8d, wherein the sixth pulse and the seventh pulse have an amplitude which is substantially equal to the boosted word-line.

Example 10d: The apparatus of example 1d, wherein the one or more circuitries is to boost the word-line by about 0.3V above the voltage supply level.

Example 11d: The apparatus of example 1d, wherein the one or more circuitries is to boost the word-line by about 1.5× of a threshold voltage of the select transistor.

Example 12d: The apparatus of example 1d, wherein the select transistor is on a frontend of a die, and wherein the first switch and the second switch are on a backend of the die.

Example 13d: The apparatus of example 1d, wherein the first capacitor and the second capacitor are planar capacitors or non-planar capacitors.

Example 14d: The apparatus of example 1d, wherein the first capacitor and the second capacitor are vertically stacked.

Example 15d: The apparatus of example 1d comprising a refresh circuitry to refresh charges on the first capacitor and the second capacitor.

Example 16d: The apparatus of example 1d, wherein the bit-line is parallel to the first plate-line and the second plate-line.

Example 17d: The apparatus of example 1d, wherein the non-linear polar material is one of: ferroelectric material, paraelectric material, or non-linear dielectric.

Example 18d: An apparatus comprising: a node; a plurality of capacitors coupled to the node, wherein an individual capacitor of the plurality of capacitors comprises non-linear polar material; a select transistor coupled to the node and a bit-line, wherein the select transistor is controllable by a word-line; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a write operation, wherein the one or more circuitries is to control the individual control, the individual plate-line, and the bit-line during the write operation.

Example 19d: The apparatus of example 18d, wherein the plurality of switches is controlled by a plurality of controls, wherein the plurality of controls are boosted above the voltage supply level during the write operation, wherein the bit-line is parallel to the plurality of plate-lines.

Example 20d: A system comprising: a processor circuitry to execute one or more instructions; a communication interface to allow the processor circuitry to communicate with another device; and a memory coupled to the processor circuitry, wherein the memory comprises an apparatus according to any one of examples 1d to 17d.

Example 21d: A system comprising: a processor circuitry to execute one or more instructions; a communication interface to allow the processor circuitry to communicate with another device; and a memory coupled to the processor circuitry, wherein the memory comprises an apparatus according to any one of examples 18d to 19d.

Example 1e: An apparatus comprising: a node; a first capacitor comprising non-linear polar material, the first capacitor having a first terminal coupled to the node; a second capacitor comprising the non-linear polar material, the second capacitor having a first terminal coupled to the node; a select transistor coupled to the node and a bit-line, wherein the select transistor is controllable by a word-line; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a read operation, wherein the one or more circuitries is to control the first plate-line, the second plate-line, the first control, the second control, and the bit-line during the read operation.

Example 2e: The apparatus of example 1e, wherein the one or more circuitries is to initially force a voltage on the bit-line and subsequently allow the bit-line to float during the read operation.

Example 3e: The apparatus of example 2e, wherein the one or more circuitries is to generate a first pulse on the first plate-line after the word-line is boosted and before an end of the boost on the word-line during the read operation, wherein the first pulse starts when the bit-line is allowed to float.

Example 4e: The apparatus of example 3e, wherein the one or more circuitries is to force a 0V on the second plate-line during the read operation.

Example 5e: The apparatus of example 3e, wherein the one or more circuitries is to assert a sense amplifier enable within a pulse width of the first pulse.

Example 6e: The apparatus of example 1e, wherein the one or more circuitries is to toggle the word-line from a boosted level to ground, and then back to a boosted level for a writeback operation.

Example 7e: The apparatus of example 1e, wherein: the one or more circuitries is to generate a third pulse on the first control for a duration of the read operation, wherein the third pulse has an amplitude substantially same as an amplitude of the boosted word-line; and the one or more circuitries is to generate a fourth pulse on the second control for a duration of the read operation, wherein the fourth pulse has an amplitude substantially same as an amplitude of the boosted word-line.

Example 8e: The apparatus of example 1e, wherein the one or more circuitries is to generate a fifth pulse on the bit-line during a writeback operation, wherein the fifth pulse has an amplitude lower than the voltage supply level, wherein the writeback operation is part of the read operation.

Example 9e: The apparatus of example 8e, wherein the one or more circuitries is to generate a sixth pulse on the first plate-line, wherein the sixth pulse starts and ends substantially when the fifth pulse starts and ends, wherein the sixth pulse has an initial amplitude which is substantially equal to the amplitude of the fifth pulse, and wherein the sixth pulse has an ending amplitude which is substantially equal to the amplitude of the fifth pulse.

Example 10e: The apparatus of example 9e, wherein the one or more circuitries is to generate a third pulse on the first plate-line after the word-line is boosted and before the end of the boost on the word-line during a first writeback operation, wherein an amplitude of the third pulse is substantially equal to the voltage supply level.

Example 11e: The apparatus of example 10e, wherein the one or more circuitries is to generate a seventh pulse on the first plate-line after the word-line is boosted and before the end of the boost on the word-line during a second writeback operation, wherein an amplitude of the seventh pulse is substantially equal to a ground level, wherein the second writeback operation is different from the first writeback operation.

Example 12e: The apparatus of example 11e, wherein the one or more circuitries is to set an eighth pulse on the second plate-line during the writeback operation, wherein the eighth pulse has an amplitude lower than the voltage supply level but above a ground level, wherein the eighth pulse has a pulse width which is substantially a pulse width of the fifth pulse.

Example 13e: The apparatus of example 1e, wherein the one or more circuitries is to boost the word-line by about 0.3V above the voltage supply level.

Example 14e: The apparatus of example 1e, wherein the one or more circuitries is to boost the word-line by about 1.5× of a threshold voltage of the select transistor.

Example 15e: The apparatus of example 1e, wherein the select transistor is on a frontend of a die, and wherein the first switch and the second switch are on a backend of the die.

Example 16e: The apparatus of example 1e, wherein: the first capacitor and the second capacitor are planar capacitors or non-planar capacitors; and the first capacitor and the second capacitor are vertically stacked.

Example 17e: The apparatus of example 1e comprising a refresh circuitry to refresh charges on the first capacitor and the second capacitor.

Example 18e: The apparatus of example 1e, wherein the bit-line is parallel to the first plate-line and the second plate-line, and wherein the non-linear polar material is one of: ferroelectric material, paraelectric material, or non-linear dielectric.

Example 19e: An apparatus comprising: a node; a plurality of capacitors coupled to the node, wherein an individual capacitor of the plurality of capacitors comprises non-linear polar material; a select transistor coupled to the node and a bit-line, wherein the select transistor is controllable by a word-line; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a read operation, wherein the one or more circuitries is to control the individual control, the individual plate-line, and the bit-line during the read operation, wherein the select transistor is on a frontend of a die, and wherein the plurality of switches are on a backend of the die.

Example 20e: A system comprising: a processor circuitry to execute one or more instructions; a communication interface to allow the processor circuitry to communicate with another device; and a memory coupled to the processor circuitry, wherein the memory comprises an apparatus according to any one of examples 1e to 18e.

Example 1f: An apparatus comprising: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a first switch coupled to the first capacitor and a first plate-line, the first switch controllable by a first control; a second switch coupled to the second capacitor and a second plate-line, the second switch controllable by a second control; a second transistor having a gate terminal coupled to the first node, and a source terminal coupled to a sense-line and a drain terminal coupled to the second node; and one or more circuitries to boost the word-line above a voltage supply level during a write operation, wherein the one or more circuitries is to control the first plate-line, the second plate-line, the first control, the second control, and the bit-line during the write operation.

Example 2f: The apparatus of example 1f, wherein the one or more circuitries is to generate a first pulse on the bit-line, wherein the first pulse has an amplitude lower than the voltage supply level.

Example 3f: The apparatus of example 2f. wherein the one or more circuitries is to generate a second pulse on the first plate-line, wherein the second pulse starts and ends substantially when the first pulse starts and ends, wherein the second pulse has an initial amplitude which is substantially equal to the amplitude of the first pulse, and wherein the second pulse has an ending amplitude which is substantially equal to the amplitude of the first pulse.

Example 4f: The apparatus of example 3f, wherein the one or more circuitries is to generate a third pulse on the first plate-line after the word-line is boosted and before an end of the boost on the word-line during a first write operation, wherein an amplitude of the third pulse is substantially equal to the voltage supply level.

Example 5f: The apparatus of example 4f, wherein the one or more circuitries is to generate a fourth pulse on the first plate-line after the word-line is boosted and before an end of the boost on the word-line during a second write operation, wherein an amplitude of the fourth pulse is substantially equal to a ground level, wherein the second write operation is differential from the first write operation.

Example 6f: The apparatus of example 3f, wherein the one or more circuitries is to set a fifth pulse on the second plate-line, wherein the fifth pulse has an amplitude lower than the voltage supply level, wherein the fifth pulse has a pulse width which is substantially a pulse width of the first pulse.

Example 7f: The apparatus of example 1f, wherein the one or more circuitries is to generate a sixth pulse on the first control, wherein the sixth pulse has a pulse width which is same as a pulse width on the word-line.

Example 8f: The apparatus of example 7f, wherein the one or more circuitries is to generate a seventh pulse on the second control, wherein the seventh pulse has a pulse width which is same as the pulse width on the word-line.

Example 9f: The apparatus of example 8f, wherein the sixth pulse and the seventh pulse have an amplitude which is substantially equal to the boosted word-line.

Example 10f: The apparatus of example 1f, wherein the one or more circuitries is to boost the word-line by about 0.3V above the voltage supply level.

Example 11f: The apparatus of example 1f, wherein the one or more circuitries is to boost the word-line by about 1.5× of a threshold voltage of the first transistor.

Example 12f: The apparatus of example 1f, wherein the first transistor is on a frontend of a die, and wherein the first switch and the second switch are on a backend of the die.

Example 13f: The apparatus of example 1f, wherein: the first capacitor and the second capacitor are planar capacitors or non-planar capacitors; the first capacitor and the second capacitor are vertically stacked; the second node is biased, put on high-impedance state, or set to 0V; and the sense-line is biased, put on high-impedance state, or set to 0V.

Example 14f: The apparatus of example if comprising a refresh circuitry to refresh charges on the first capacitor and the second capacitor.

Example 15f: The apparatus of example 1f, wherein the bit-line is parallel to the first plate-line and the second plate-line.

Example 16f: The apparatus of example 1f, wherein the non-linear polar material is one of: ferroelectric material, paraelectric material, or non-linear dielectric.

Example 17f: An apparatus comprising: a first node; a second node; a plurality of capacitors coupled to the first node, wherein an individual capacitor of the plurality of capacitors comprises non-linear polar material; a first transistor coupled to the first node and a bit-line, wherein the first transistor is controllable by a word-line; a second transistor having a gate terminal coupled to the first node, and a source terminal coupled to a sense-line and a drain terminal coupled to the second node; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a write operation, wherein the one or more circuitries is to control the individual control, the individual plate-line, and the bit-line during the write operation.

Example 18f: The apparatus of example 17f, wherein: the plurality of switches is controlled by a plurality of controls; the plurality of controls is boosted above the voltage supply level during the write operation; the bit-line is parallel to the plurality of plate-lines; the second node is biased, put on high-impedance state, or set to 0V; and the sense-line is biased, put on high-impedance state, or set to 0V.

Example 19f: A system comprising: a processor circuitry to execute one or more instructions; a communication interface to allow the processor circuitry to communicate with another device; and a memory coupled to the processor circuitry, wherein the memory comprises an apparatus according to any one of examples 1f to 16f.

Example 19f: A system comprising: a processor circuitry to execute one or more instructions; a communication interface to allow the processor circuitry to communicate with another device; and a memory coupled to the processor circuitry, wherein the memory comprises an apparatus according to any one of examples 17f to 18f.

Example 1g: An apparatus comprising: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a first switch coupled to the first capacitor and a first plate-line, the first switch controllable by a first control; a second switch coupled to the second capacitor and a second plate-line, the second switch controllable by a second control; a second transistor having a gate terminal coupled to the first node, and a source terminal coupled to a sense-line and a drain terminal coupled to the second node; and one or more circuitries to boost the word-line above a voltage supply level during a read operation, wherein the one or more circuitries is to control the first plate-line, the second plate-line, the first control, the second control, and the bit-line during the read operation.

Example 2g: The apparatus of example 1g, wherein the one or more circuitries is to initially force a voltage on the bit-line and subsequently allow the bit-line to float during the read operation.

Example 3g: The apparatus of example 2g, wherein the one or more circuitries is to generate a first pulse on the first plate-line after the word-line is boosted and before an end of the boost on the word-line during the read operation, wherein the first pulse starts when the bit-line is allowed to float.

Example 4g: The apparatus of example 3g, wherein the one or more circuitries is to force a 0V on the second plate-line during the read operation.

Example 5g: The apparatus of example 3g, wherein the one or more circuitries is to assert a sense amplifier enable within a pulse width of the first pulse.

Example 6g: The apparatus of example 1g, wherein the one or more circuitries is to toggle the word-line from a boosted level to ground, and then back to a boosted level for a writeback operation.

Example 7g: The apparatus of example 1g, wherein: the one or more circuitries is to generate a third pulse on the first control for a duration of the read operation, wherein the third pulse has an amplitude substantially same as an amplitude of the boosted word-line; and the one or more circuitries is to generate a fourth pulse on the second control for a duration of the read operation, wherein the fourth pulse has an amplitude substantially same as an amplitude of the boosted word-line.

Example 8g: The apparatus of example 1g, wherein the one or more circuitries is to generate a fifth pulse on the bit-line during a writeback operation, wherein the fifth pulse has an amplitude lower than the voltage supply level, wherein the writeback operation is part of the read operation.

Example 9g: The apparatus of example 8g, wherein the one or more circuitries is to generate a sixth pulse on the first plate-line, wherein the sixth pulse has an initial amplitude which is substantially equal to the amplitude of the fifth pulse, and wherein the sixth pulse has an ending amplitude which is substantially equal to the amplitude of the fifth pulse.

Example 10g: The apparatus of example 9g, wherein the one or more circuitries is to generate a third pulse on the first plate-line after the word-line is boosted and before an end of the boost on the word-line during a first writeback operation, wherein an amplitude of the third pulse is substantially equal to the voltage supply level.

Example 11g: The apparatus of example 10g, wherein the one or more circuitries is to generate a seventh pulse on the first plate-line after the word-line is boosted and before the end of the boost on the word-line during a second writeback operation, wherein an amplitude of the seventh pulse is substantially equal to a ground level, wherein the second writeback operation is different from the first writeback operation.

Example 12g: The apparatus of example 11g, wherein the one or more circuitries is to set an eighth pulse on the second plate-line during the writeback operation, wherein the eighth pulse has an amplitude lower than the voltage supply level but above a ground level, wherein the eighth pulse has a pulse width which is substantially a pulse width of the fifth pulse.

Example 13g: The apparatus of example 1g, wherein: the one or more circuitries is to boost the word-line by about 1.5× of a threshold voltage of the first transistor; and the first transistor is on a frontend of a die, and wherein the first switch and the second switch are on a backend of the die.

Example 14g: The apparatus of example 1g, wherein: the first capacitor and the second capacitor are planar capacitors or non-planar capacitors; and the first capacitor and the second capacitor are vertically stacked.

Example 15g: The apparatus of example 1g comprising a refresh circuitry to refresh charges on the first capacitor and the second capacitor.

Example 16g: The apparatus of example 1g, wherein the bit-line is parallel to the first plate-line and the second plate-line, and wherein the non-linear polar material is one of: ferroelectric material, paraelectric material, or non-linear dielectric.

Example 17g: An apparatus comprising: a first node; a second node; a plurality of capacitors coupled to the first node, wherein an individual capacitor of the plurality of capacitors comprises non-linear polar material; a first transistor coupled to the first node and a bit-line, wherein the first transistor is controllable by a word-line; a second transistor having a gate terminal coupled to the first node, and a source terminal coupled to a sense-line and a drain terminal coupled to the second node; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a read operation, wherein the one or more circuitries is to control the individual control, the individual plate-line, and the bit-line during the read operation.

Example 18g: The apparatus of example 17g, wherein: the plurality of switches is controlled by a plurality of controls; the plurality of controls is boosted above the voltage supply level during the read operation; the bit-line is parallel to the plurality of plate-lines; the second node is biased, put on high-impedance state, or set to 0V; and the sense-line is biased, put on high-impedance state, or set to 0V.

Example 19g: A system comprising: a processor circuitry to execute one or more instructions; a communication interface to allow the processor circuitry to communicate with another device; and a memory coupled to the processor circuitry, wherein the memory comprises an apparatus according to any one of examples 1g to 16g.

Example 19g: A system comprising: a processor circuitry to execute one or more instructions; a communication interface to allow the processor circuitry to communicate with another device; and a memory coupled to the processor circuitry, wherein the memory comprises an apparatus according to any one of examples 17g to 18g.

Example 1h: An apparatus comprising: a first node; a second node; a first capacitor comprising non-linear polar material, the first capacitor having a first terminal coupled to the first node and a second terminal coupled to a first plate-line; a second capacitor comprising the non-linear polar material, the second capacitor having a first terminal coupled to the first node and a second terminal coupled to a second plate-line; a first transistor coupled to the first node and a bit-line, wherein the first transistor is controllable by a word-line, wherein the first plate-line and the second plate-line are parallel to the word-line; a second transistor having a gate terminal coupled to the first node, and a source terminal coupled to a sense-line and a drain terminal coupled to the second node; and one or more circuitries to boost the word-line during a write operation.

Example 2h: The apparatus of example 1h, wherein the one or more circuitries is to boost the word-line above a voltage supply level, wherein the one or more circuitries is to generate a first pulse on the bit-line after the word-line is boosted and before an end of the boost on the word-line during a first write operation.

Example 3h: The apparatus of example 2h, wherein the one or more circuitries is to generate a second pulse on the first plate-line after the word-line is boosted and before the end of the boost on the word-line during a second write operation different from the first write operation.

Example 4h: The apparatus of example 2h, wherein the one or more circuitries is to generate a third pulse on the second plate-line, wherein an amplitude of the third pulse is lower than an amplitude on the word-line.

Example 5h: The apparatus of example 4h, wherein the amplitude of the third pulse is half of a supply voltage level.

Example 6h: The apparatus of example 1h, wherein unselected plate-lines and word-lines are set to ground voltage during the write operation.

Example 7h: The apparatus of example 1h, wherein the one or more circuitries include a repeater for the first plate-line and the second plate-line.

Example 8h: The apparatus of example 1h, wherein the first capacitor and the second capacitor are planar capacitors that are vertically stacked.

Example 9h: The apparatus of example 1h, wherein the first capacitor comprises: a first layer coupled to the first terminal of the first capacitor, wherein the first layer in on a first metal layer which extends out to couple to a first via; a second layer around the first layer; a third layer comprising the non-linear polar material, wherein the third layer is around the second layer; a fourth layer around the third layer; and a fifth layer, wherein the first plate-line is partially coupled to the fifth layer.

Example 10h: The apparatus of example 9h, wherein the second capacitor comprises: a first layer coupled to the first terminal of the second capacitor, wherein the first layer of the second capacitor in on a second metal layer which extends out to couple to a second via, wherein the second via is on the first via; a second layer around the first layer of the second capacitor; a third layer comprising the non-linear polar material, wherein the third layer of the second capacitor is around the second layer of the second capacitor; a fourth layer around the third layer of the second capacitor; and a fifth layer, wherein the second plate-line is partially coupled to the fifth layer of the second capacitor.

Example 11h: The apparatus of example 1h, wherein the first transistor and the second transistor are of a same conductivity type.

Example 12h: The apparatus of example 1h, wherein the first transistor and the second transistor are one of planar transistors or non-planar transistors.

Example 13h: The apparatus of example 1h, wherein the sense-line is set to one of: 0V, a high-impedance state, or a bias voltage, and wherein the second node is set to one of: 0V, a high-impedance state, or a bias voltage.

Example 14h: The apparatus of example 1h, wherein the non-linear polar material includes one of: ferroelectric material, paraelectric material, or non-linear dielectric.

Example 15h: An apparatus comprising: a multi-element gain bit-cell comprising: a first capacitor having non-linear polar material, the first capacitor having a first terminal coupled to a node and a second terminal coupled to a first plate-line; a second capacitor comprising the non-linear polar material, the second capacitor having a first terminal coupled to the node and a second terminal coupled to a second plate-line; and two transistors connected to the node, wherein a first transistor of the two transistors is controlled by a voltage on the node, while a second transistor of the two transistors is controlled by a word-line, wherein the second transistor is coupled to a bit-line; and one or more circuitries to control the bit-line, word-line, the first plate-line, and the second plate-line to perform a write operation on the multi-element gain bit-cell.

Example 16h: The apparatus of example 15h, wherein the one or more circuitries to boost the word-line during a write operation.

Example 17h: The apparatus of example 15h, wherein unselected plate-lines and word-lines are set to ground voltage during the write operation.

Example 18h: A system comprising: a processor circuitry to execute one or more instructions; a memory coupled to the processor circuitry, wherein the memory is to store the one or more instructions; a communication interface to allow the processor circuitry to communicate with another device, wherein the memory includes an apparatus according to any one of examples 1h to 14h.

Example 18h: A system comprising: a processor circuitry to execute one or more instructions; a memory coupled to the processor circuitry, wherein the memory is to store the one or more instructions; a communication interface to allow the processor circuitry to communicate with another device, wherein the memory includes an apparatus according to any one of examples 15h to 17h.

Example 1i: An apparatus comprising: a first node; a second node; a first capacitor comprising non-linear polar material, the first capacitor having a first terminal coupled to the first node and a second terminal coupled to a first plate-line; a second capacitor comprising the non-linear polar material, the second capacitor having a first terminal coupled to the first node and a second terminal coupled to a second plate-line; a first transistor coupled to the first node and a bit-line, wherein the first transistor is controllable by a word-line, wherein the first plate-line and the second plate-line are parallel to the word-line; a second transistor having a gate terminal coupled to the first node, and a source terminal coupled to a sense-line and a drain terminal coupled to the second node; and one or more circuitries to boost the word-line during a read operation.

Example 2i: The apparatus of example 1i, wherein the one or more circuitries is to boost the word-line above a voltage supply level for a first time period and then discharged to ground, wherein the one or more circuitries is to boost the word-line above the voltage supply level during a writeback operation, wherein the writeback operation is part of the read operation.

Example 3i: The apparatus of example 1i, wherein the one or more circuitries is to initially force a voltage on the bit-line and subsequently allow the bit-line to float during the read operation.

Example 4i: The apparatus of example 3i, wherein the one or more circuitries is to allow the bit-line to float when the boosted word-line is discharged to ground.

Example 5i: The apparatus of example 1i, wherein the one or more circuitries is to pre-charge the sense-line, thereafter the one or more circuitries is to put the sense-line in a high-impedance state.

Example 6i: The apparatus of example 2i, wherein the one or more circuitries is to generate a first pulse on the first plate-line after the word-line is boosted and discharged during the read operation, wherein the first pulse starts when the bit-line is allowed to float.

Example 7i: The apparatus of example 7i, wherein the one or more circuitries is to force a 0V on the second plate-line during the read operation.

Example 8i: The apparatus of example 7i, wherein the one or more circuitries is to assert a sense amplifier enable within a pulse width of the first pulse.

Example 9i: The apparatus of example 2i, wherein the one or more circuitries is to generate a second pulse on the bit-line after the word-line is boosted and before an end of the boost on the word-line during the writeback operation for a first write operation.

Example 10i: The apparatus of example 9i, wherein the one or more circuitries is to generate a third pulse on the first plate-line after the word-line is boosted and before the end of the boost on the word-line during the writeback operation for a second write operation different from the first write operation.

Example 11i: The apparatus of example 9i, wherein the one or more circuitries is to generate a fourth pulse on the second plate-line, wherein an amplitude of the third pulse is lower than an amplitude on the word-line.

Example 12i: The apparatus of example 11i, wherein the amplitude of the fourth pulse is half of a supply voltage level.

Example 13i: The apparatus of example 1i, wherein unselected plate-lines and word-lines are set to ground voltage during the read operation.

Example 14i: The apparatus of example 1i, wherein the one or more circuitries include a repeater for the first plate-line and the second plate-line.

Example 15i: The apparatus of example 1i, wherein the first capacitor and the second capacitor are planar capacitors that are vertically stacked.

Example 16i: The apparatus of example 1i, wherein: the first transistor and the second transistor are of a same conductivity type; and the first transistor and the second transistor are one of planar transistors or non-planar transistors.

Example 17i: The apparatus of example 2i, wherein during the writeback operation, the one or more circuitries is to set the sense-line to one of: 0V, a high-impedance state, or a bias voltage, wherein during the writeback operation, the one or more circuitries is to set the second node to one of: 0V, a high-impedance state, or a bias voltage.

Example 18i: The apparatus of example 1i, wherein the non-linear polar material includes one of: ferroelectric material, paraelectric material, or non-linear dielectric.

Example 19i: An apparatus comprising: a multi-element gain bit-cell comprising: a first capacitor having non-linear polar material, the first capacitor having a first terminal coupled to a node and a second terminal coupled to a first plate-line; a second capacitor comprising the non-linear polar material, the second capacitor having a first terminal coupled to the node and a second terminal coupled to a second plate-line; and two transistors connected to the node, wherein a first transistor of the two transistors is controlled by a voltage on the node, while a second transistor of the two transistors is controlled by a word-line, wherein the second transistor is coupled to a bit-line; and one or more circuitries to control the bit-line, word-line, the first plate-line, and the second plate-line to perform a read operation on the multi-element gain bit-cell.

Example 20i: A system comprising: a processor circuitry to execute one or more instructions; a memory coupled to the processor circuitry, wherein the memory is to store the one or more instructions; a communication interface to allow the processor circuitry to communicate with another device, wherein the memory includes an apparatus according to any one of examples 1i to 18i.

Example 1j: An apparatus comprising: a node; a first capacitor comprising non-linear polar material, the first capacitor having a first terminal coupled to the node; a second capacitor comprising the non-linear polar material, the second capacitor having a first terminal coupled to the node; a select transistor coupled to the node and a bit-line, wherein the select transistor is controllable by a word-line; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a write operation, wherein the one or more circuitries is to cause a voltage drop across one of the first capacitor or the second capacitor, between two different write operations, to be the voltage supply level.

Example 2j: The apparatus of example 1j, wherein the write operation includes a first write operation and a second write operation, wherein the one or more circuitries is to generate a first pulse on the bit-line for a first write operation, wherein the first pulse has an amplitude of the voltage supply level.

Example 3j: The apparatus of example 2j, wherein the one or more circuitries is to apply a 0V on the bit-line for a second write operation different from the first write operation.

Example 4j: The apparatus of example 3j, wherein the one or more circuitries is to apply a second pulse on the first plate-line for the second write operation, wherein the second pulse has an amplitude of the voltage supply level.

Example 5j: The apparatus of example 3j, wherein the one or more circuitries is to apply a 0V on the first plate-line for the first write operation.

Example 6j: The apparatus of example 4j, wherein the second pulse starts and ends substantially when the first pulse starts and ends.

Example 7j: The apparatus of example 1j, wherein the one or more circuitries is to generate a third pulse on the first control, wherein the third pulse has a pulse width which is same as a pulse width on the word-line.

Example 8j: The apparatus of example 7j, wherein the one or more circuitries is to apply a 0V on the second control.

Example 9j: The apparatus of example 7j, wherein the third pulse has an amplitude which is substantially equal to the boosted word-line.

Example 10j: The apparatus of example 1j, wherein the one or more circuitries is to boost the word-line by about 0.3V above the voltage supply level.

Example 11j: The apparatus of example 1j, wherein the one or more circuitries is to boost the word-line by about 1.5× of a threshold voltage of the select transistor.

Example 12j: The apparatus of example 1j, wherein the select transistor is on a frontend of a die, and wherein the first switch and the second switch are on a backend of the die.

Example 13j: The apparatus of example 1j, wherein the first capacitor and the second capacitor are planar capacitors or non-planar capacitors.

Example 14j: The apparatus of example 1j, wherein the first capacitor and the second capacitor are vertically stacked.

Example 15j: The apparatus of example 1j comprising a refresh circuitry to refresh charges on the first capacitor and the second capacitor.

Example 16j: The apparatus of example 1j, wherein the bit-line is parallel to the first plate-line and the second plate-line.

Example 17j: The apparatus of example 1j, wherein the non-linear polar material is one of: ferroelectric material, paraelectric material, or non-linear dielectric.

Example 18j: An apparatus comprising: a node; a plurality of capacitors coupled to the node, wherein an individual capacitor of the plurality of capacitors comprises non-linear polar material; a select transistor coupled to the node and a bit-line, wherein the select transistor is controllable by a word-line; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a write operation, wherein the one or more circuitries is to cause a voltage drop across one of the individual capacitor of the plurality of capacitors, between two different write operations, to be the voltage supply level or negative voltage supply level, and wherein the one or more circuitries is to control the individual control, the individual plate-line, and the bit-line during the write operation.

Example 19j: The apparatus of example 18j, wherein the plurality of switches is controlled by a plurality of controls, wherein the individual control is boosted above the voltage supply level during the write operation, wherein the bit-line is parallel to the plurality of plate-lines.

Example 20j: A system comprising: a processor circuitry to execute one or more instructions; a communication interface to allow the processor circuitry to communicate with another device; and a memory coupled to the processor circuitry, wherein the memory comprises an apparatus according to any one of examples 1j to 17j.

Example 1k: An apparatus comprising: a node; a first capacitor comprising non-linear polar material, the first capacitor having a first terminal coupled to the node; a second capacitor comprising the non-linear polar material, the second capacitor having a first terminal coupled to the node; a select transistor coupled to the node and a bit-line, wherein the select transistor is controllable by a word-line; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a read operation, wherein the one or more circuitries is to cause a voltage drop across one of the first capacitor or the second capacitor, between two different write operations, to be the voltage supply level or a negative of the voltage supply level, and wherein the two different write operations are part of a writeback operation which is part of the read operation.

Example 2k: The apparatus of example 1k, wherein the one or more circuitries is to initially force a voltage on the bit-line and subsequently allow the bit-line to float during the read operation.

Example 3k: The apparatus of example 2k, wherein the one or more circuitries is to generate a first pulse on the first plate-line after the word-line is boosted and before an end of the boost on the word-line during the read operation, wherein the first pulse starts when the bit-line is allowed to float.

Example 4k: The apparatus of example 3k, wherein the one or more circuitries is to force a 0V on the second plate-line during the read operation.

Example 5k: The apparatus of example 3k, wherein the one or more circuitries is to assert a sense amplifier enable within a pulse width of the first pulse.

Example 6k: The apparatus of example 1k, wherein the one or more circuitries is to toggle the word-line from a boosted level to ground after the writeback operation completes.

Example 7k: The apparatus of example 1k, wherein: the one or more circuitries is to generate a third pulse on the first control for a duration of the read operation, wherein the third pulse has an amplitude substantially same as an amplitude of the boosted word-line; and the one or more circuitries is to set a ground voltage on the second control for a duration of the read operation.

Example 8k: The apparatus of example 1k, wherein the one or more circuitries is to generate a fifth pulse on the bit-line during a writeback operation for a first write operation, wherein the fifth pulse has an amplitude of the voltage supply level.

Example 9k: The apparatus of example 8k, wherein the one or more circuitries is to generate a sixth pulse on the first plate-line for a second write operation different from the first write operation.

Example 10k: The apparatus of example 1k, wherein the one or more circuitries is to boost the word-line by about 0.3V above the voltage supply level.

Example 11k: The apparatus of example 1k, wherein the one or more circuitries is to boost the word-line by about 1.5× of a threshold voltage of the select transistor.

Example 12k: The apparatus of example 1k, wherein the select transistor is on a frontend of a die, and wherein the first switch and the second switch are on a backend of the die.

Example 13k: The apparatus of example 1k, wherein: the first capacitor and the second capacitor are planar capacitors or non-planar capacitors; and the first capacitor and the second capacitor are vertically stacked.

Example 14k: The apparatus of example 1k comprising a refresh circuitry to refresh charges on the first capacitor and the second capacitor.

Example 15k: The apparatus of example 1k, wherein the bit-line is parallel to the first plate-line and the second plate-line, and wherein the non-linear polar material is one of: ferroelectric material, paraelectric material, or non-linear dielectric.

Example 16k: An apparatus comprising: a node; a plurality of capacitors coupled to the node, wherein an individual capacitor of the plurality of capacitors comprises non-linear polar material; a select transistor coupled to the node and a bit-line, wherein the select transistor is controllable by a word-line; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a read operation, wherein the one or more circuitries is to cause a voltage drop across the individual capacitor, between two different write operations, to be the voltage supply level or a negative voltage supply level, and wherein the two different write operations are part of a writeback operation which is part of the read operation, and wherein the one or more circuitries is to control the individual control, the individual plate-line, and the bit-line during the read operation.

Example 17k: The apparatus of example 16k, wherein the bit-line is parallel to the individual plate-line and the individual plate-line, and wherein the non-linear polar material is one of: ferroelectric material, paraelectric material, or non-linear dielectric.

Example 18k: The apparatus of example 16k, wherein the one or more circuitries is to initially force a voltage on the bit-line and subsequently allow the bit-line to float during the read operation.

Example 19k: A system comprising: a processor circuitry to execute one or more instructions; a communication interface to allow the processor circuitry to communicate with another device; and a memory coupled to the processor circuitry, wherein the memory comprises an apparatus according to any one of examples 1k to 15k, wherein the one or more circuitries is to ensure maximum electrical field across the individual capacitor, between two different write operations.

Example 1l: An apparatus comprising: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a second transistor having a gate terminal coupled to the first node, and a source terminal coupled to a sense-line and a drain terminal coupled to the second node; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a write operation, wherein the one or more circuitries is to cause a voltage drop across one of the first capacitor or the second capacitor, between two different write operations, to be the voltage supply level or a negative voltage supply level.

Example 2l: The apparatus of example 1j, wherein the write operation includes a first write operation and a second write operation, wherein the one or more circuitries is to generate a first pulse on the bit-line for a first write operation, wherein the first pulse has an amplitude of the voltage supply level.

Example 3l: The apparatus of example 2l, wherein the one or more circuitries is to apply a 0V on the bit-line for the second write operation different from the first write operation.

Example 4l: The apparatus of example 3l, wherein the one or more circuitries is to apply a second pulse on the first plate-line for the second write operation, wherein the second pulse has an amplitude of the voltage supply level.

Example 5l: The apparatus of example 3l, wherein the one or more circuitries is to apply a 0V on the first plate-line for the first write operation.

Example 6l: The apparatus of example 4l, wherein the second pulse starts and ends substantially when the first pulse starts and ends.

Example 7l: The apparatus of example 1l, wherein the one or more circuitries is to generate a third pulse on the first control, wherein the third pulse has a pulse width which is same as a pulse width on the word-line.

Example 8l: The apparatus of example 7l, wherein the one or more circuitries is to apply a 0V on the second control.

Example 9l: The apparatus of example 7l, wherein the third pulse has an amplitude which is substantially equal to the boosted word-line.

Example 10l: The apparatus of example 1l, wherein the one or more circuitries is to boost the word-line by about 0.3V above the voltage supply level.

Example 11l: The apparatus of example 1l, wherein the one or more circuitries is to boost the word-line by about 1.5× of a threshold voltage of the first transistor.

Example 12l: The apparatus of example 1l, wherein: the first transistor is on a frontend of a die, and wherein the first switch and the second switch are on a backend of the die; the first capacitor and the second capacitor are planar capacitors or non-planar capacitors; the second node is biased, put on high-impedance state, or set to 0V; and the sense-line is biased, put on high-impedance state, or set to 0V.

Example 13l: The apparatus of example 1l, wherein the first capacitor and the second capacitor are vertically stacked.

Example 14l: The apparatus of example 1l comprising a refresh circuitry to refresh charges on the first capacitor and the second capacitor.

Example 15l: The apparatus of example 1l, wherein the bit-line is parallel to the first plate-line and the second plate-line.

Example 16l: The apparatus of example 1l, wherein the non-linear polar material is one of: ferroelectric material, paraelectric material, or non-linear dielectric.

Example 17l: An apparatus comprising: a first node; a second node; a plurality of capacitors coupled to the first node, wherein an individual capacitor of the plurality of capacitors comprises non-linear polar material; a first transistor coupled to the first node and a bit-line, wherein the first transistor is controllable by a word-line; a second transistor having a gate terminal coupled to the first node, and a source terminal coupled to a sense-line and a drain terminal coupled to the second node; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a write operation, wherein the one or more circuitries is to cause a voltage drop across the individual capacitor of a plurality of capacitors, between two different write operations, to be the voltage supply level or a negative voltage supply level, and wherein the one or more circuitries is to control the individual control, the individual plate-line, and the bit-line during the write operation.

Example 18l: The apparatus of example 17l, wherein the plurality of switches is controlled by a plurality of controls, wherein the individual control is boosted above the voltage supply level during the write operation, wherein the bit-line is parallel to the plurality of plate-lines.

Example 19l: The apparatus of example 17l, wherein: the second node is biased, put on high-impedance state, or set to 0V; and the sense-line is biased, put on high-impedance state, or set to 0V.

Example 20l: A system comprising: a processor circuitry to execute one or more instructions; a communication interface to allow the processor circuitry to communicate with another device; and a memory coupled to the processor circuitry, wherein the memory comprises: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a second transistor having a gate terminal coupled to the first node, and a source terminal coupled to a sense-line and a drain terminal coupled to the second node; a first switch coupled to the first capacitor and a first plate-line, the first switch controllable by a first control; a second switch coupled to the second capacitor and a second plate-line, the second switch controllable by a second control; and one or more circuitries to boost the word-line above a voltage supply level during a write operation, wherein the one or more circuitries is to ensure a maximum electrical field across the first capacitor or the second capacitor, between two different write operations.

Example 1m: An apparatus comprising: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a first switch coupled to the first capacitor and a first plate-line, the first switch controllable by a first control; a second switch coupled to the second capacitor and a second plate-line, the second switch controllable by a second control; a second transistor having a gate terminal coupled to the first node, and a source terminal coupled to a sense-line and a drain terminal coupled to the second node; and one or more circuitries to boost the word-line above a voltage supply level during a read operation, wherein the one or more circuitries is to cause a voltage drop across one of the first capacitor or the second capacitor, between two different write operations, to be the voltage supply level, and wherein the two different write operations are part of a writeback operation which is part of the read operation.

Example 2m: The apparatus of example 1m, wherein the one or more circuitries is to initially force a voltage on the bit-line and subsequently allow the bit-line to float during the read operation.

Example 3m: The apparatus of example 2m, wherein the one or more circuitries is to generate a first pulse on the first plate-line after the word-line is boosted and before an end of the boost on the word-line during the read operation, wherein the first pulse starts when the bit-line is allowed to float.

Example 5m: The apparatus of example 3m, wherein the one or more circuitries is to force a 0V on the second plate-line during the read operation.

Example 6m: The apparatus of example 3m, wherein the one or more circuitries is to assert a sense amplifier enable within a pulse width of the first pulse.

Example 6m: The apparatus of example 1m, wherein the one or more circuitries is to toggle the word-line from a boosted level to ground after the writeback operation completes.

Example 7m: The apparatus of example 1, wherein: the one or more circuitries is to generate a third pulse on the first control for a duration of the read operation, wherein the third pulse has an amplitude substantially same as an amplitude of the boosted word-line; and the one or more circuitries is to set a ground voltage on the second control for a duration of the read operation.

Example 8m: The apparatus of example 1m, wherein the one or more circuitries is to generate a fifth pulse on the bit-line during a writeback operation for a first write operation, wherein the fifth pulse has an amplitude of the voltage supply level.

Example 9m: The apparatus of example 8m, wherein the one or more circuitries is to generate a sixth pulse on the first plate-line for a second write operation different from the first write operation.

Example 10m: The apparatus of example 1m, wherein the one or more circuitries is to boost the word-line by about 0.3V above the voltage supply level.

Example 11m: The apparatus of example 1m, wherein the one or more circuitries is to boost the word-line by about 1.5× of a threshold voltage of the first transistor.

Example 12m: The apparatus of example 1m, wherein the first transistor is on a frontend of a die, and wherein the first switch and the second switch are on a backend of the die.

Example 13m: The apparatus of example 1m, wherein: the first capacitor and the second capacitor are planar capacitors or non-planar capacitors; the first capacitor and the second capacitor are vertically stacked; the second node is biased, put on high-impedance state, or set to 0V; and the sense-line is biased, put on high-impedance state, or set to 0V.

Example 14m: The apparatus of example 1m comprising a refresh circuitry to refresh charges on the first capacitor and the second capacitor.

Example 15m: The apparatus of example 1m, wherein the bit-line is parallel to the first plate-line and the second plate-line, and wherein the non-linear polar material is one of: ferroelectric material, paraelectric material, or non-linear dielectric.

Example 16m: An apparatus comprising: a first node; a second node; a plurality of capacitors coupled to the first node, wherein an individual capacitor of the plurality of capacitors comprises non-linear polar material; a first transistor coupled to the first node and a bit-line, wherein the first transistor is controllable by a word-line; a second transistor having a gate terminal coupled to the first node, and a source terminal coupled to a sense-line and a drain terminal coupled to the second node; a plurality of switches coupled to the plurality of capacitors, wherein an individual switch is controllable by an individual control; a plurality of plate-lines coupled to the plurality of switches, wherein an individual plate-line is coupled to the individual switch; and one or more circuitries to boost the word-line above a voltage supply level during a read operation, wherein the one or more circuitries is to cause a voltage drop across the individual capacitor, between two different write operations, to be the voltage supply level, and wherein the two different write operations are part of a writeback operation which is part of the read operation.

Example 17m: The apparatus of example 16m, wherein the bit-line is parallel to the individual plate-line and the individual plate-line, and wherein the non-linear polar material is one of: ferroelectric material, paraelectric material, or non-linear dielectric.

Example 18m: The apparatus of example 16m, wherein the one or more circuitries is to initially force a voltage on the bit-line and subsequently allow the bit-line to float during the read operation.

Example 19m: A system comprising: a processor circuitry to execute one or more instructions; a communication interface to allow the processor circuitry to communicate with another device; and a memory coupled to the processor circuitry, wherein the memory comprises: a first node; a second node; a first capacitor comprising non-linear polar material, the first capacitor having a first terminal coupled to the first node; a second capacitor comprising the non-linear polar material, the second capacitor having a first terminal coupled to the first node; a first transistor coupled to the first node and a bit-line, wherein the first transistor is controllable by a word-line; a first switch coupled to the first capacitor and a first plate-line, the first switch controllable by a first control; a second switch coupled to the second capacitor and a second plate-line, the second switch controllable by a second control; a second transistor having a gate terminal coupled to the first node, and a source terminal coupled to a sense-line and a drain terminal coupled to the second node; and one or more circuitries to boost the word-line above a voltage supply level during a read operation, wherein the one or more circuitries is to cause a voltage drop across one of the first capacitor or the second capacitor, between two different write operations, to be the voltage supply level, and wherein the two different write operations are part of a writeback operation which is part of the read operation.

Example 20m: The system of example 19m, wherein: the one or more circuitries is to initially force a voltage on the bit-line and subsequently allow the bit-line to float during the read operation; the one or more circuitries is to generate a first pulse on the first plate-line after the word-line is boosted and before an end of the boost on the word-line during the read operation; the first pulse starts when the bit-line is allowed to float; the second node is biased, put on a high-impedance state, or set to 0V; the sense-line is biased, put on a high-impedance state, or set to 0V; and the bit-line is parallel to the first plate-line and the second plate-line.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first node;
   a second node;
   a first capacitor comprising non-linear polar material, the first capacitor having a first terminal coupled to the first node;
   a second capacitor comprising the non-linear polar material, the second capacitor having a first terminal coupled to the first node;
   a first transistor coupled to the first node and a bit-line, wherein the first transistor is controllable by a word-line;
   a first switch coupled to the first capacitor and a first plate-line, the first switch controllable by a first control;
   a second switch coupled to the second capacitor and a second plate-line, the second switch controllable by a second control;
   a second transistor having a gate terminal coupled to the first node, and a source terminal coupled to a sense-line and a drain terminal coupled to the second node; and
   one or more circuitries to boost the word-line above a voltage supply level during a read operation, wherein the one or more circuitries is to cause a voltage drop across one of the first capacitor or the second capacitor, between two different write operations, to be the voltage supply level, and wherein the two different write operations are part of a writeback operation which is part of the read operation.

2. The apparatus of claim 1, wherein the one or more circuitries is to initially force a voltage on the bit-line and subsequently allow the bit-line to float during the read operation.

3. The apparatus of claim 2, wherein the one or more circuitries is to generate a first pulse on the first plate-line after the word-line is boosted and before an end of the boost on the word-line during the read operation, and wherein the first pulse starts when the bit-line is allowed to float.

4. The apparatus of claim 3, wherein the one or more circuitries is to force a 0V on the second plate-line during the read operation.

5. The apparatus of claim 3, wherein the one or more circuitries is to assert a sense amplifier enable within a pulse width of the first pulse.

6. The apparatus of claim 1, wherein the one or more circuitries is to toggle the word-line from a boosted level to ground after the writeback operation completes.

7. The apparatus of claim 1, wherein:
   the one or more circuitries is to generate a third pulse on the first control for a duration of the read operation, wherein the third pulse has an amplitude substantially same as an amplitude of the boosted word-line; and
   the one or more circuitries is to set a ground voltage on the second control for a duration of the read operation.

8. The apparatus of claim 1, wherein the one or more circuitries is to generate a fifth pulse on the bit-line during a writeback operation for a first write operation, and wherein the fifth pulse has an amplitude of the voltage supply level.

9. The apparatus of claim 8, wherein the one or more circuitries is to generate a sixth pulse on the first plate-line for a second write operation different from the first write operation.

10. The apparatus of claim 1, wherein the one or more circuitries is to boost the word-line by about 0.3V above the voltage supply level.

11. The apparatus of claim 1, wherein the one or more circuitries is to boost the word-line by about 1.5× of a threshold voltage of the first transistor.

12. The apparatus of claim 1, wherein the first transistor is on a frontend of a die, and wherein the first switch and the second switch are on a backend of the die.

13. The apparatus of claim 1, wherein:
   the first capacitor and the second capacitor are planar capacitors or non-planar capacitors;
   the first capacitor and the second capacitor are vertically stacked;
   the second node is biased, put on high-impedance state, or set to 0V; and
   the sense-line is biased, put on high-impedance state, or set to 0V.

14. The apparatus of claim 1 comprising a refresh circuitry to refresh charges on the first capacitor and the second capacitor.

15. The apparatus of claim 1, wherein the bit-line is parallel to the first plate-line and the second plate-line, and wherein the non-linear polar material is one of: ferroelectric material, paraelectric material, or non-linear dielectric.

16. An apparatus comprising:
   a first node;
   a second node;
   a plurality of capacitors coupled to the first node, wherein an individual capacitor of the plurality of capacitors comprises non-linear polar material;
   a first transistor coupled to the first node and a bit-line, wherein the first transistor is controllable by a word-line;
   a second transistor having a gate terminal coupled to the first node, and a source terminal coupled to a sense-line and a drain terminal coupled to the second node;
   a plurality of switches coupled to the plurality of capacitors, wherein an individual switch is controllable by an individual control;
   a plurality of plate-lines coupled to the plurality of switches, wherein an individual plate-line is coupled to the individual switch; and
   one or more circuitries to boost the word-line above a voltage supply level during a read operation, wherein the one or more circuitries is to cause a voltage drop across the individual capacitor, between two different write operations, to be the voltage supply level, and wherein the two different write operations are part of a writeback operation which is part of the read operation.

17. The apparatus of claim 16, wherein the bit-line is parallel to the individual plate-line, and wherein the non-linear polar material is one of: ferroelectric material, paraelectric material, or non-linear dielectric.

18. The apparatus of claim 16, wherein the one or more circuitries is to initially force a voltage on the bit-line and subsequently allow the bit-line to float during the read operation.

19. A system comprising:
a processor circuitry to execute one or more instructions;
a communication interface to allow the processor circuitry to communicate with another device; and
a memory coupled to the processor circuitry, wherein the memory comprises:
a first node;
a second node;
a first capacitor comprising non-linear polar material, the first capacitor having a first terminal coupled to the first node;
a second capacitor comprising the non-linear polar material, the second capacitor having a first terminal coupled to the first node;
a first transistor coupled to the first node and a bit-line, wherein the first transistor is controllable by a word-line;
a first switch coupled to the first capacitor and a first plate-line, the first switch controllable by a first control;
a second switch coupled to the second capacitor and a second plate-line, the second switch controllable by a second control;
a second transistor having a gate terminal coupled to the first node, and a source terminal coupled to a sense-line and a drain terminal coupled to the second node; and
one or more circuitries to boost the word-line above a voltage supply level during a read operation, wherein the one or more circuitries is to cause a voltage drop across one of the first capacitor or the second capacitor, between two different write operations, to be the voltage supply level, and wherein the two different write operations are part of a writeback operation which is part of the read operation.

20. The system of claim 19, wherein:
the one or more circuitries is to initially force a voltage on the bit-line and subsequently allow the bit-line to float during the read operation;
the one or more circuitries is to generate a first pulse on the first plate-line after the word-line is boosted and before an end of the boost on the word-line during the read operation;
the first pulse starts when the bit-line is allowed to float;
the second node is biased, put on a high-impedance state, or set to 0V;
the sense-line is biased, put on a high-impedance state, or set to 0V; and
the bit-line is parallel to the first plate-line and the second plate-line.

* * * * *